US012640201B2

(12) United States Patent　　　　(10) Patent No.: US 12,640,201 B2
Ogiwara et al.　　　　　　　　　　(45) Date of Patent:　　May 26, 2026

(54) MEMORY DEVICE STORING A FIRST, SECOND, AND THIRD BIT

(71) Applicant: Kioxia Corporation, Tokyo (JP)

(72) Inventors: Ryu Ogiwara, Yokohama Kanagawa (JP); Hidehiro Shiga, Yokohama Kanagawa (JP); Daisaburo Takashima, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 164 days.

(21) Appl. No.: 18/603,281

(22) Filed: Mar. 13, 2024

(65) Prior Publication Data

US 2024/0321352 A1　　Sep. 26, 2024

(30) Foreign Application Priority Data

Mar. 20, 2023　(JP) ................................. 2023-044207

(51) Int. Cl.
　　*G11C 13/00*　　　　(2006.01)
(52) U.S. Cl.
　　CPC ........ *G11C 13/004* (2013.01); *G11C 13/0004* (2013.01); *G11C 13/0064* (2013.01)
(58) Field of Classification Search
　　CPC .............. G11C 13/004; G11C 13/0004; G11C 13/0064; G11C 2013/0054; G11C 11/1673
　　See application file for complete search history.

(56) References Cited

U.S. PATENT DOCUMENTS

| | | | |
|---|---|---|---|
| 2016/0358651 A1* | 12/2016 | Shih ................... | G11C 13/0038 |
| 2019/0088319 A1* | 3/2019 | Ogiwara ............. | G11C 11/5685 |
| 2020/0051640 A1* | 2/2020 | Futatsuyama ...... | G11C 16/3427 |
| 2022/0020818 A1* | 1/2022 | Kim ....................... | H10B 63/34 |
| 2022/0108729 A1* | 4/2022 | Ogiwara ............. | G11C 13/004 |

FOREIGN PATENT DOCUMENTS

JP　　　　　2022061691 A　　　4/2022

* cited by examiner

*Primary Examiner* — Jerome Leboeuf
(74) *Attorney, Agent, or Firm* — Holtz, Holtz & Volek PC

(57) ABSTRACT

According to one embodiment, a device includes: a memory cell coupled to a bit line and configured to store first data including first, second, and third bits; and a sense amplification circuit configured to perform a first comparison between a bit line voltage and a first reference voltage, and a second comparison between the bit line voltage and a second reference voltage lower than the first reference voltage, and to read the first data from the memory cell based on results of the first and second comparisons. The sense amplification circuit is configured to retain second data having a first code in response to the bit line voltage becoming equal to or lower than the first reference voltage during a first period from a start of operation to a first time point, and retain the first data after the first period.

8 Claims, 70 Drawing Sheets

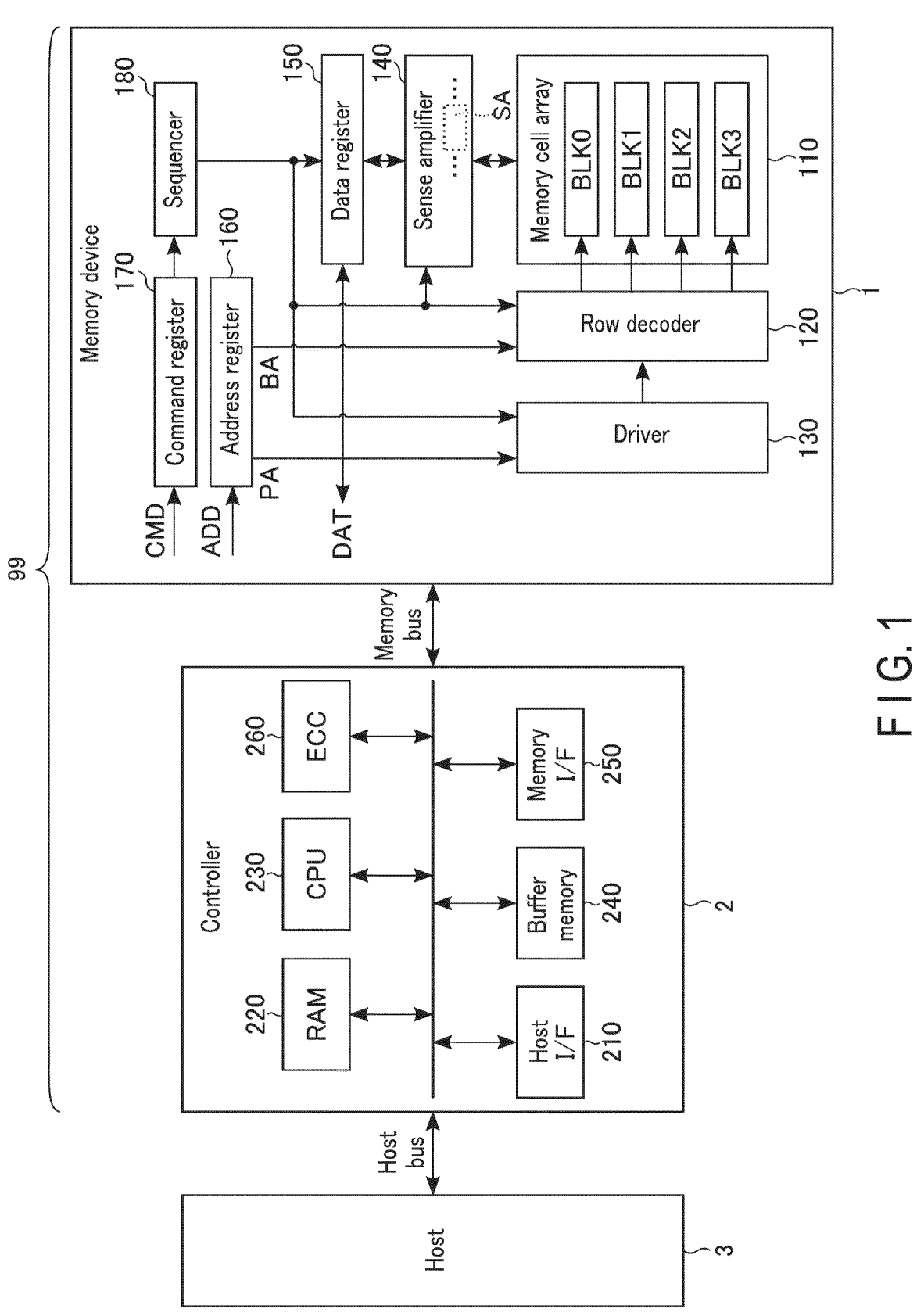
F I G. 1

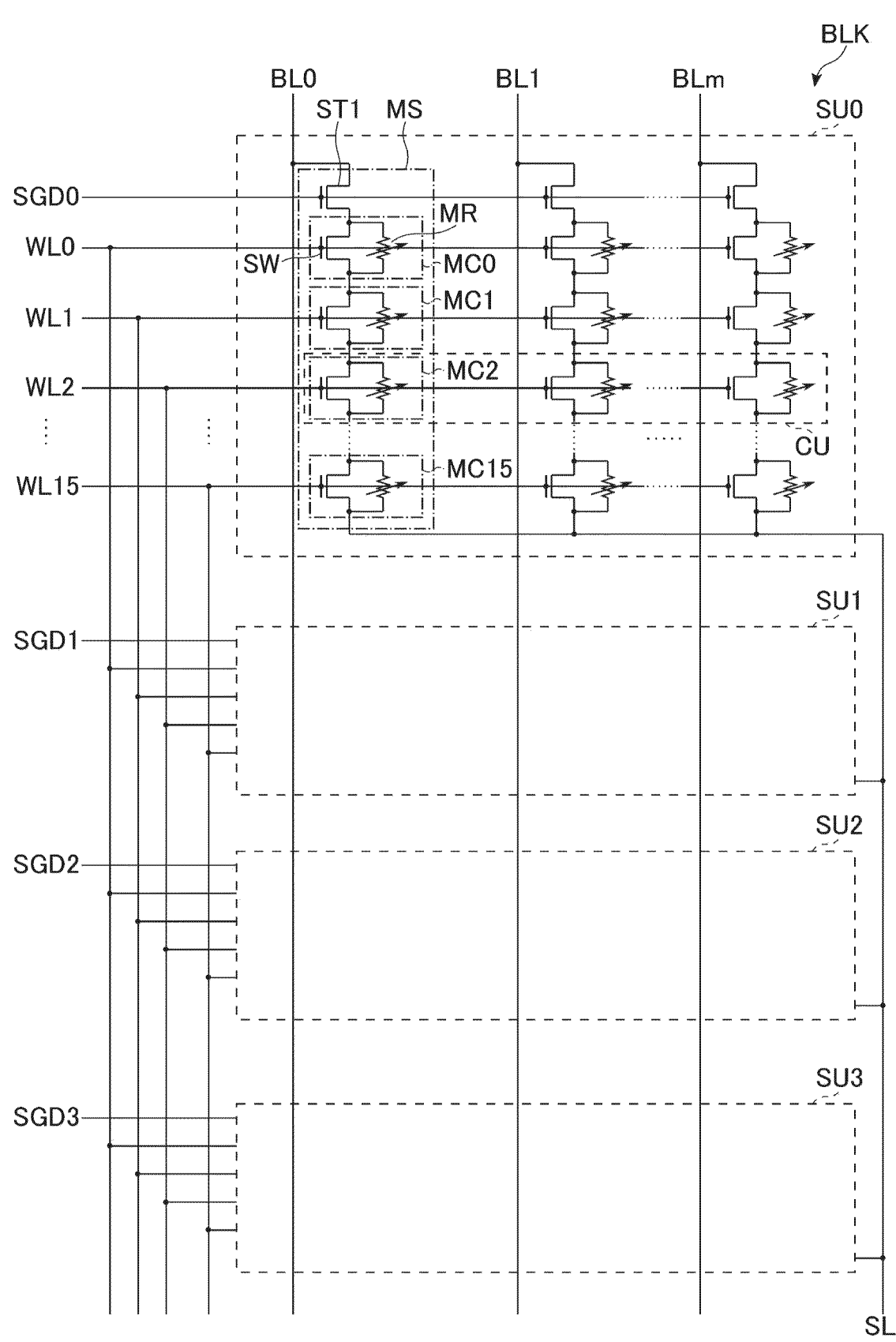
F I G. 2

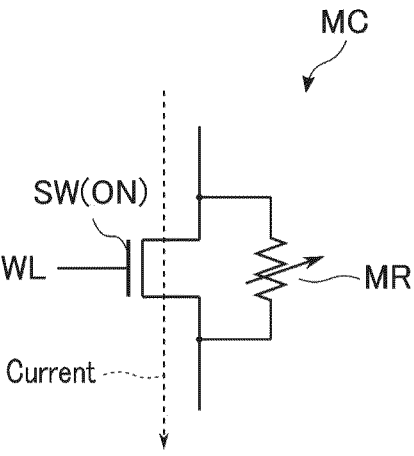
F I G. 3

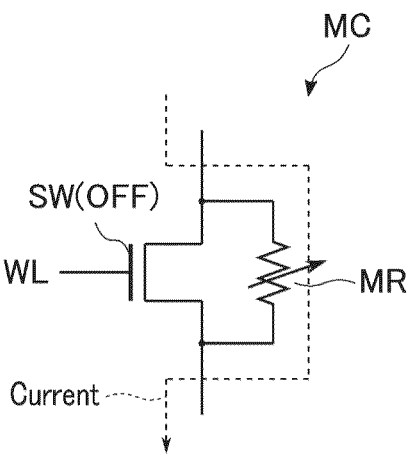
F I G. 4

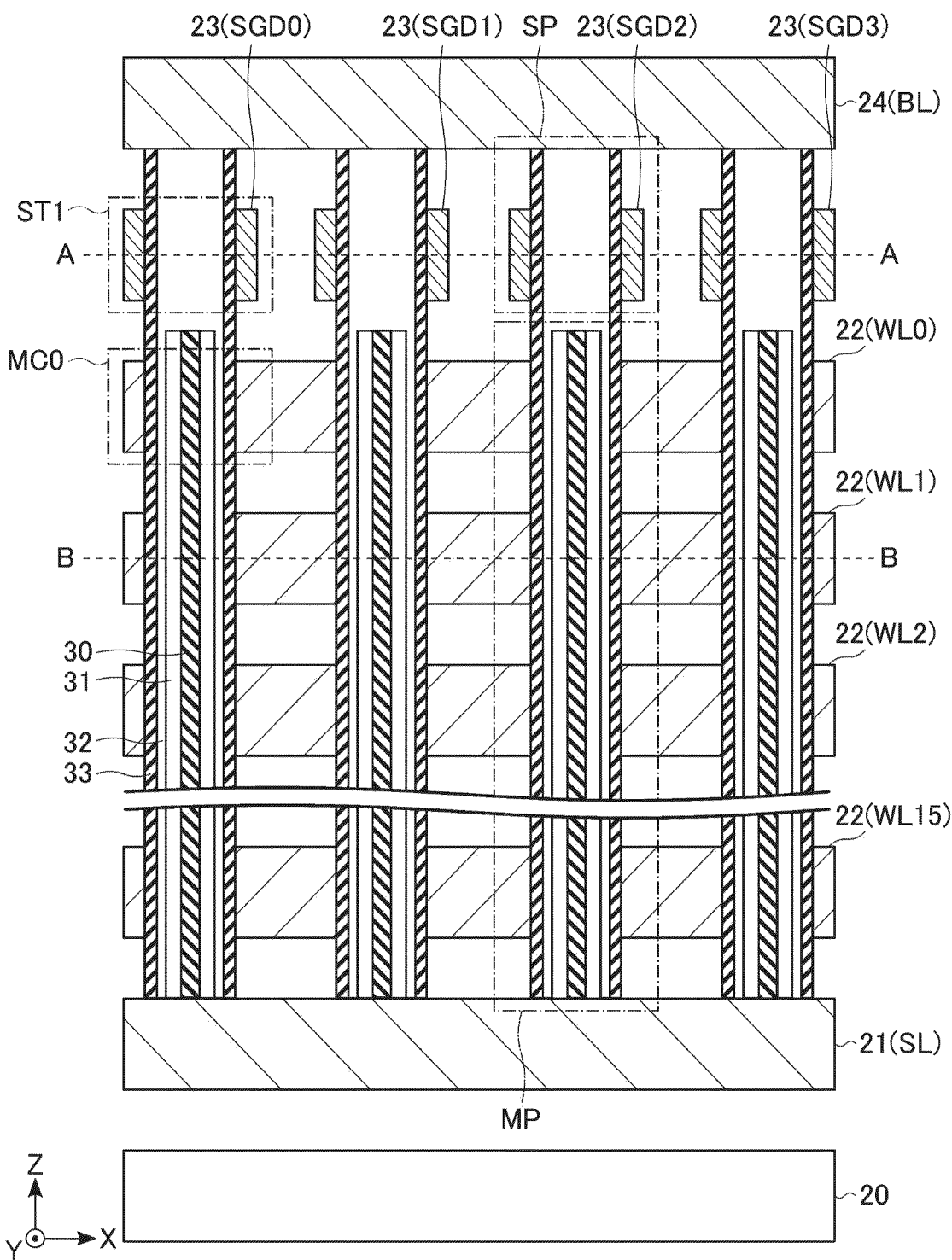
F I G. 5

| Resistance value | Resistance state | Upper bit | Middle bit | Lower bit |
|---|---|---|---|---|
| Low | RS0 | 1 | 1 | 1 |
| | RS1 | 1 | 0 | 1 |
| | RS2 | 1 | 0 | 0 |
| | RS3 | 1 | 1 | 0 |
| | RS4 | 0 | 1 | 0 |
| | RS5 | 0 | 1 | 1 |
| | RS6 | 0 | 0 | 1 |
| High | RS7 | 0 | 0 | 0 |

FIG. 8

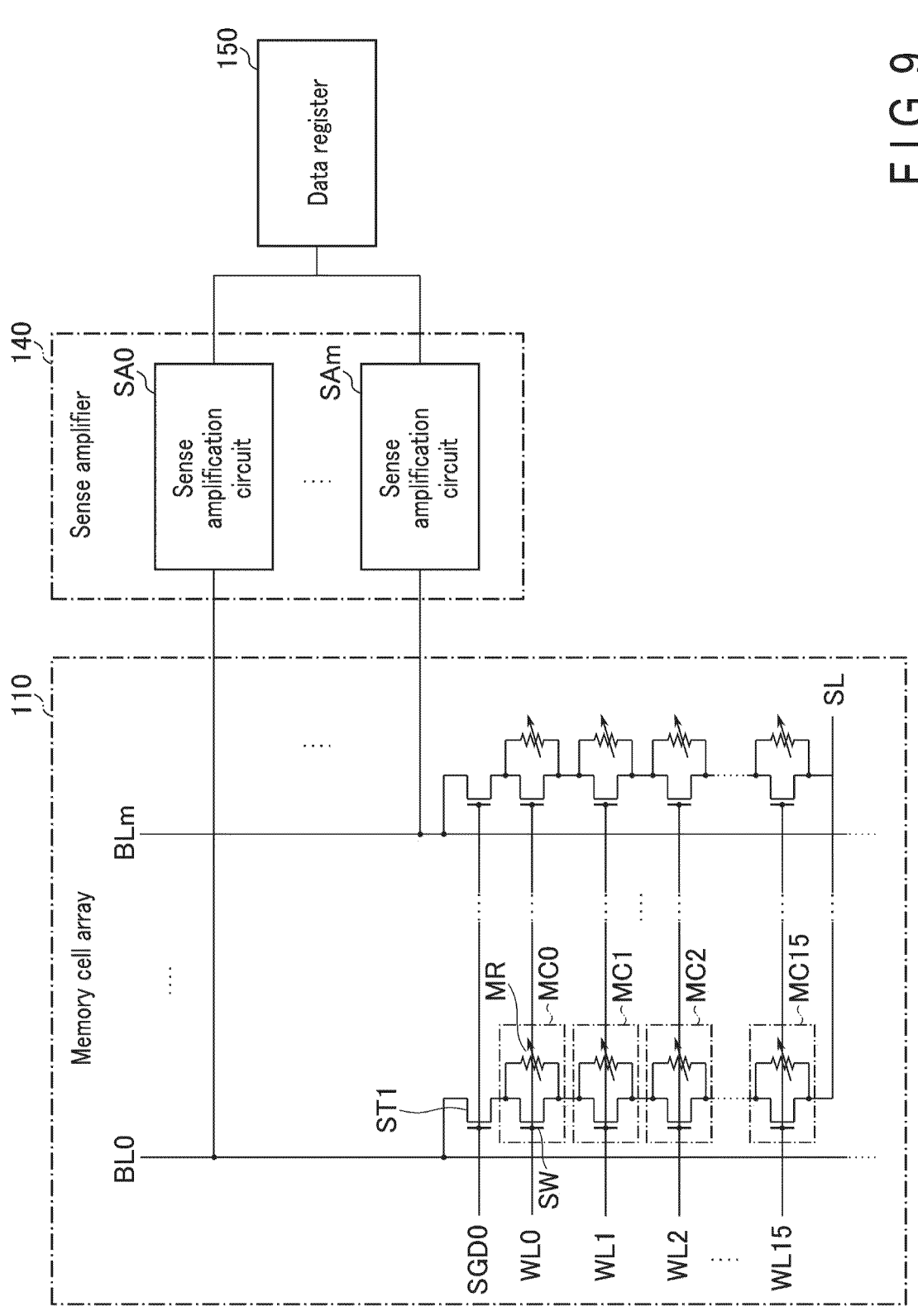
F I G. 9

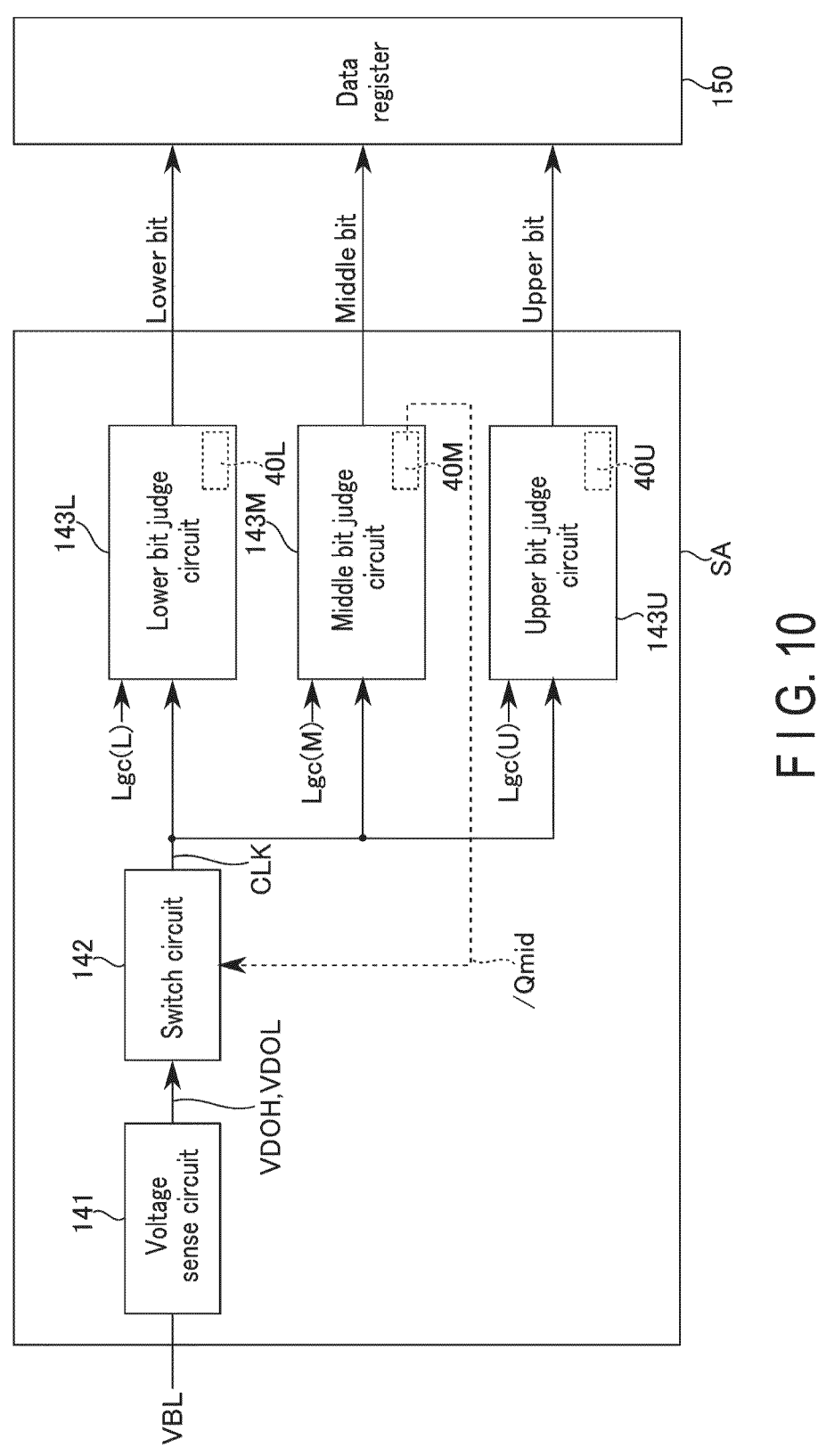
F I G. 10

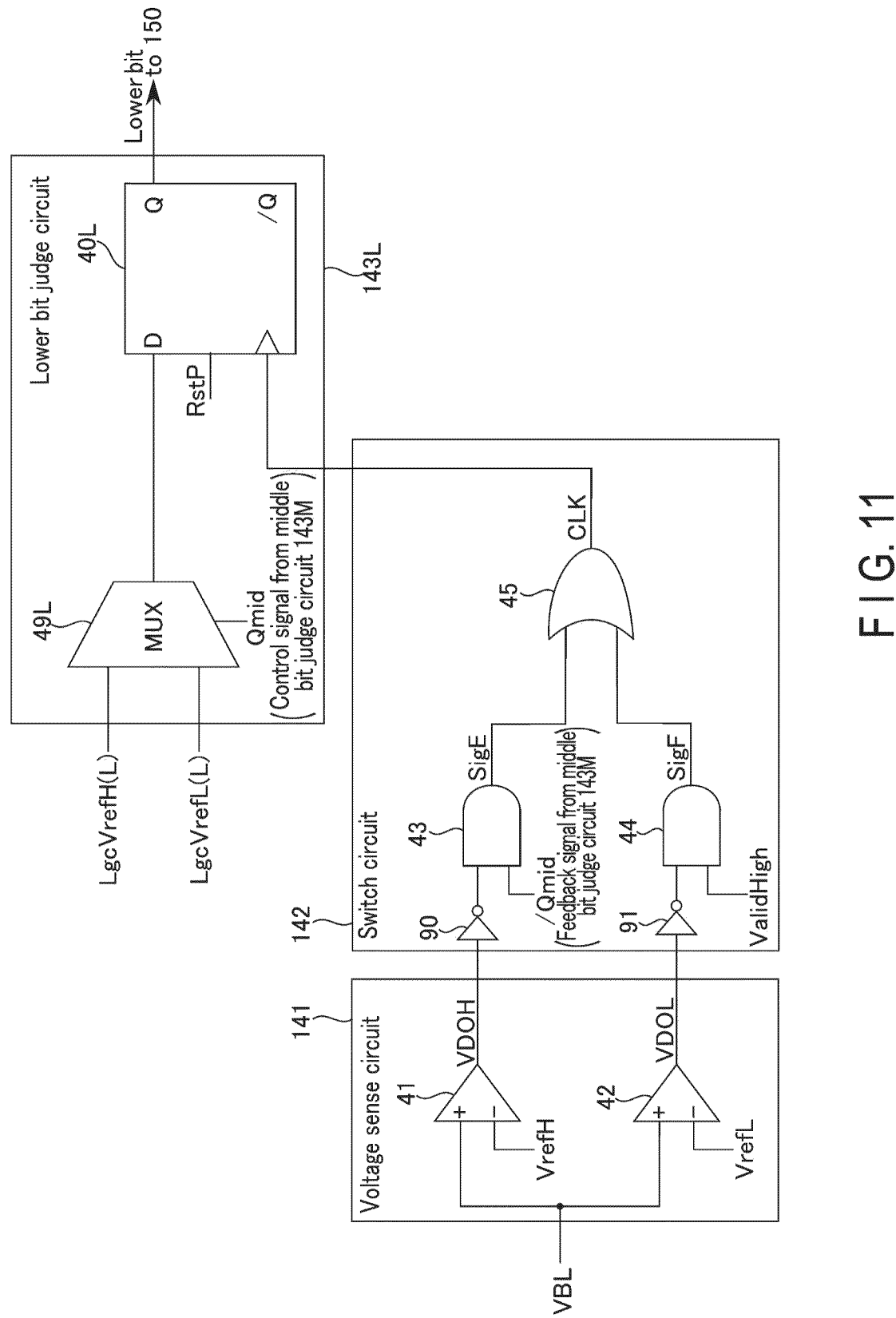
F I G. 11

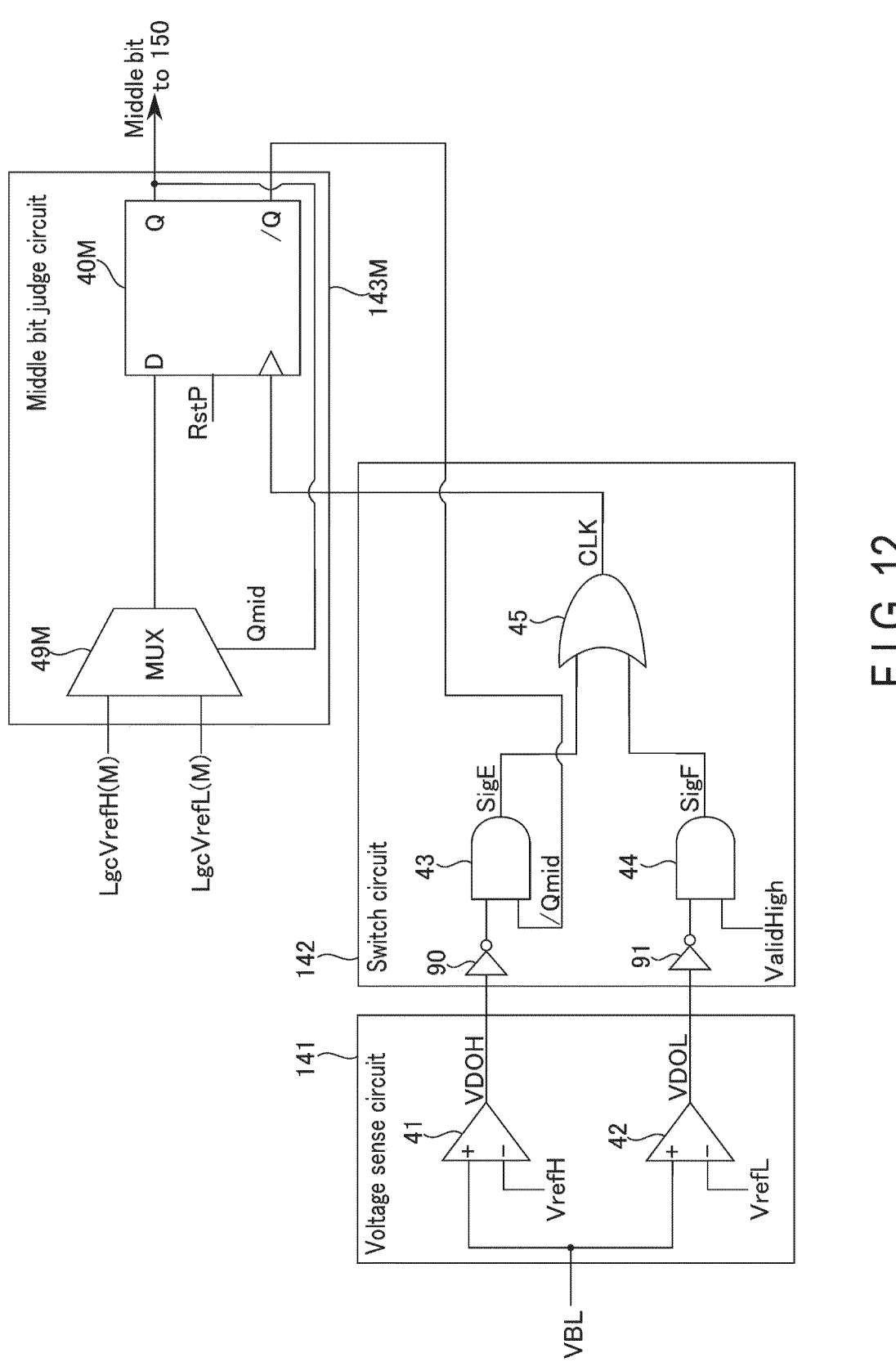
F I G. 12

| Resistance value | Resistance state | VrefL-side judgment | VrefH-side judgment |
|---|---|---|---|
| Low | RS0 | 111 | |
| | RS1 | 101 | 010 |
| | RS2 | 100 | |
| | RS3 | 110 | |
| | RS4 | | 010 |
| | RS5 | | 011 |
| | RS6 | | 001 |
| High | RS7 | | 000 |

F I G. 14

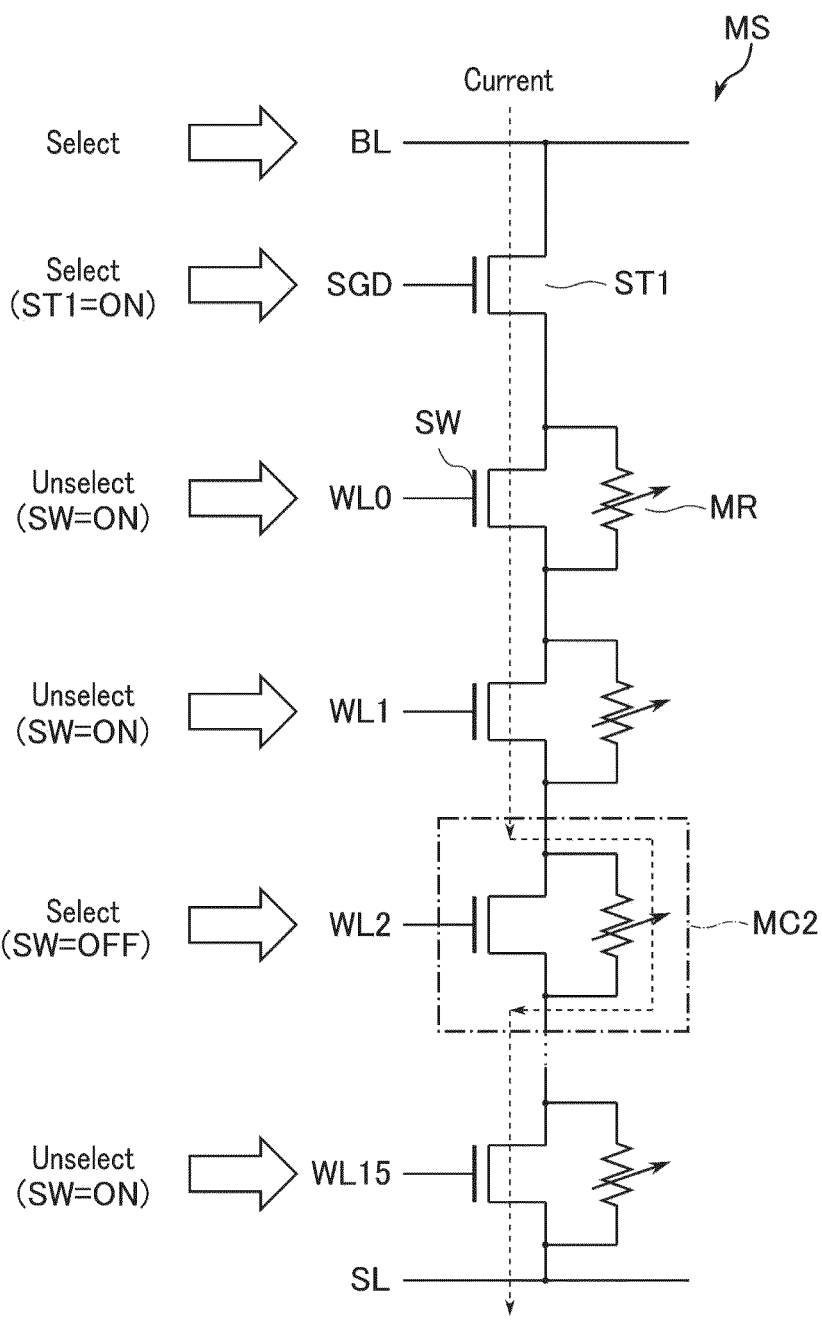
F I G. 15

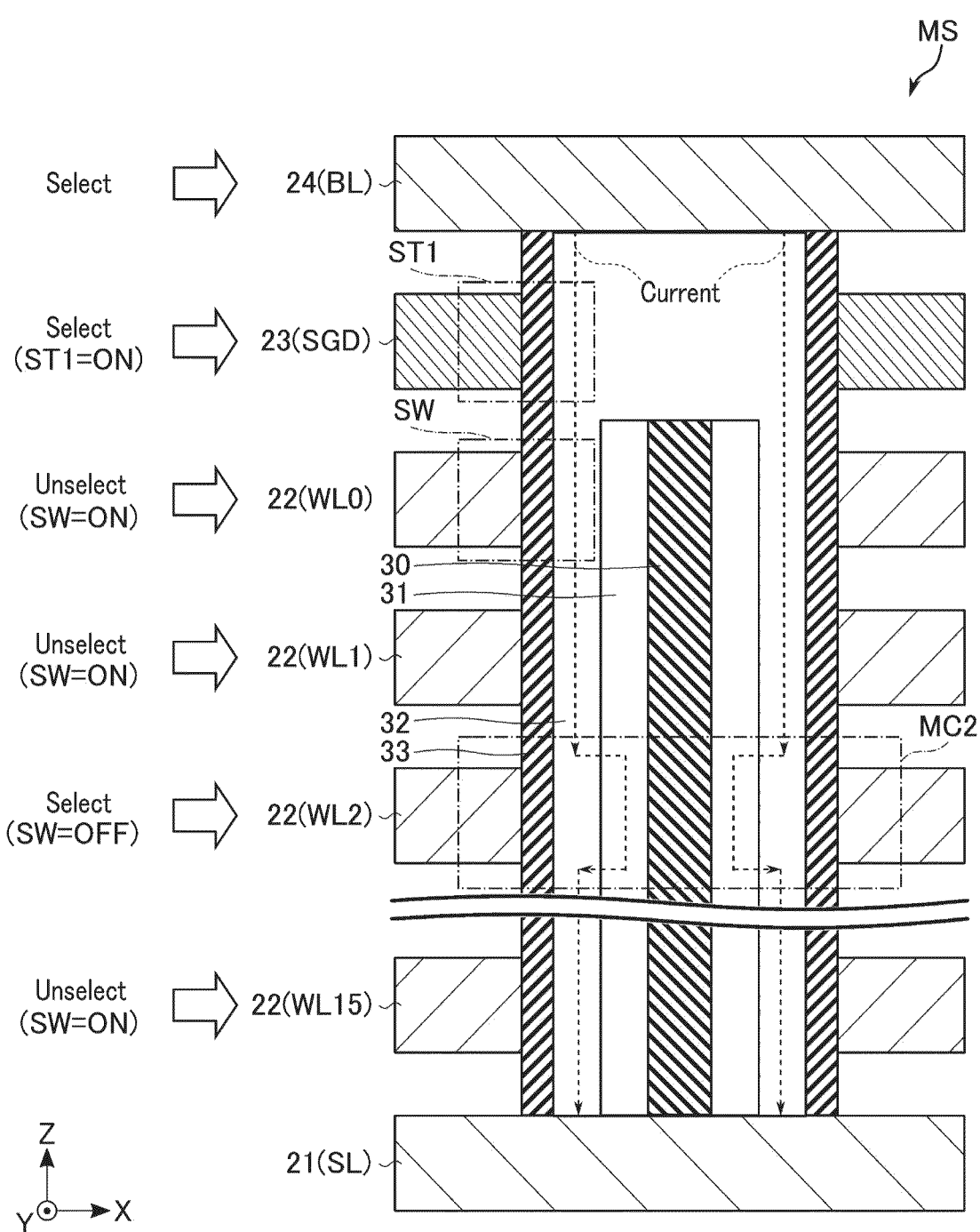
F I G. 16

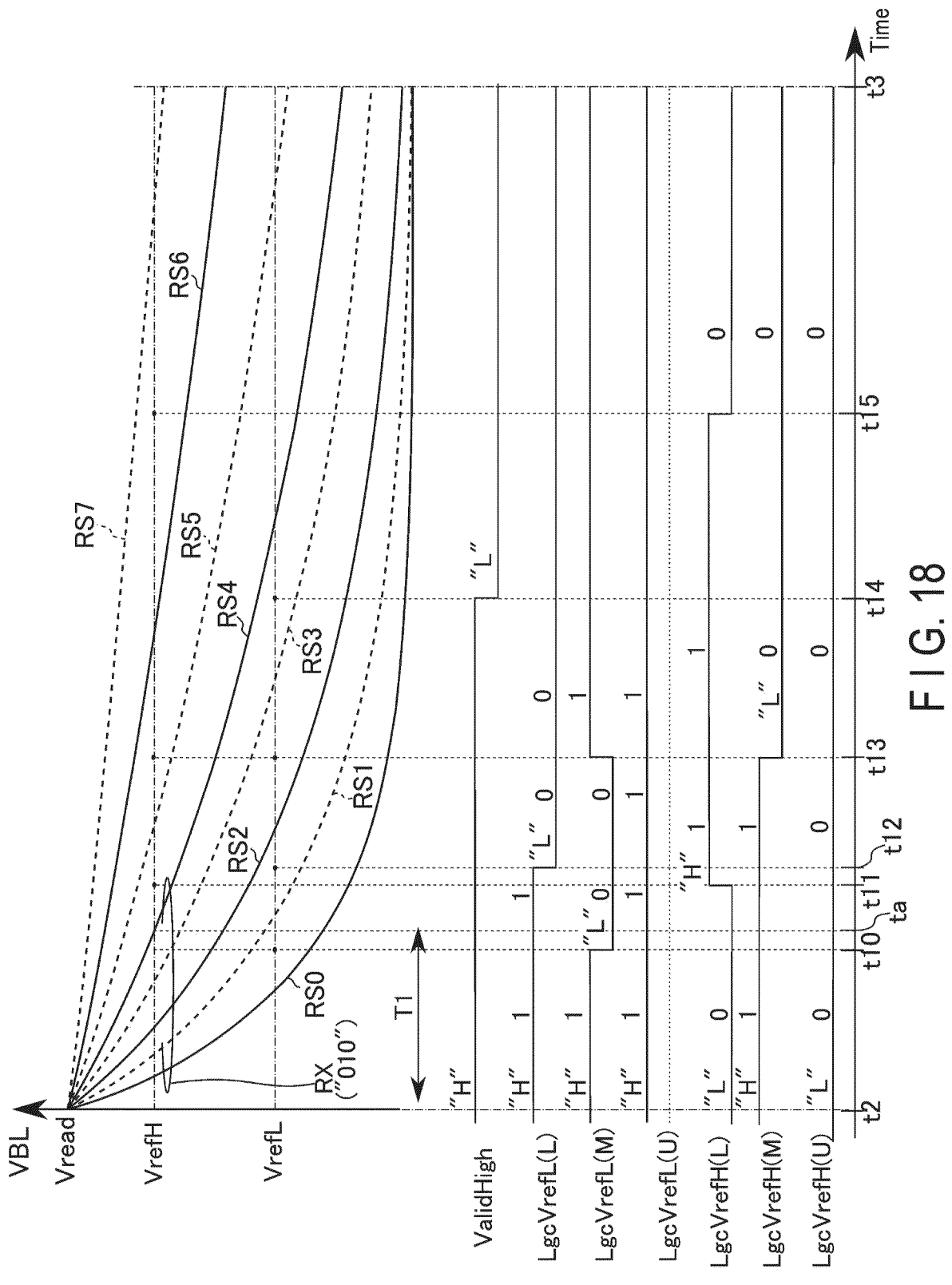
F I G. 18

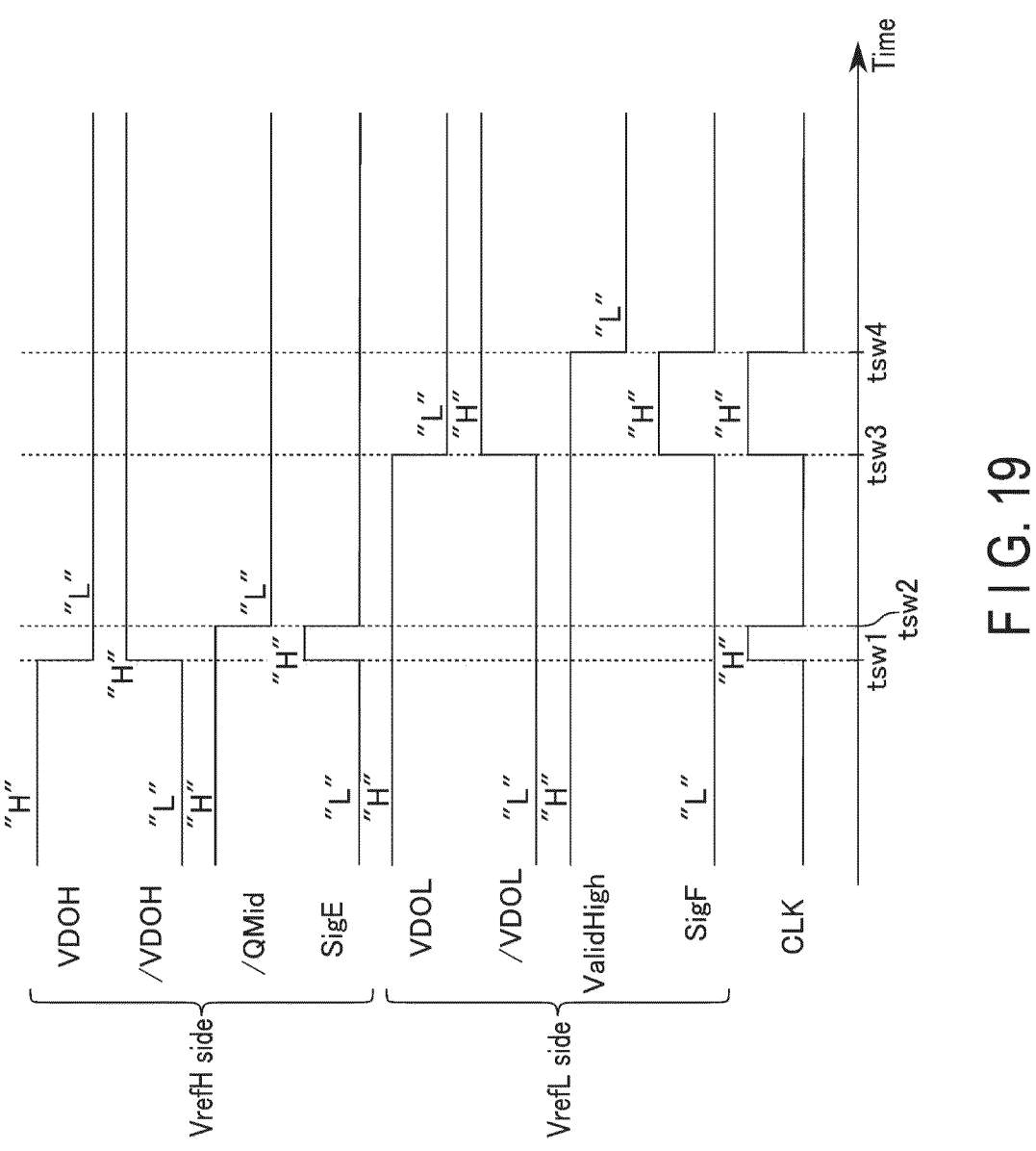
F I G. 19

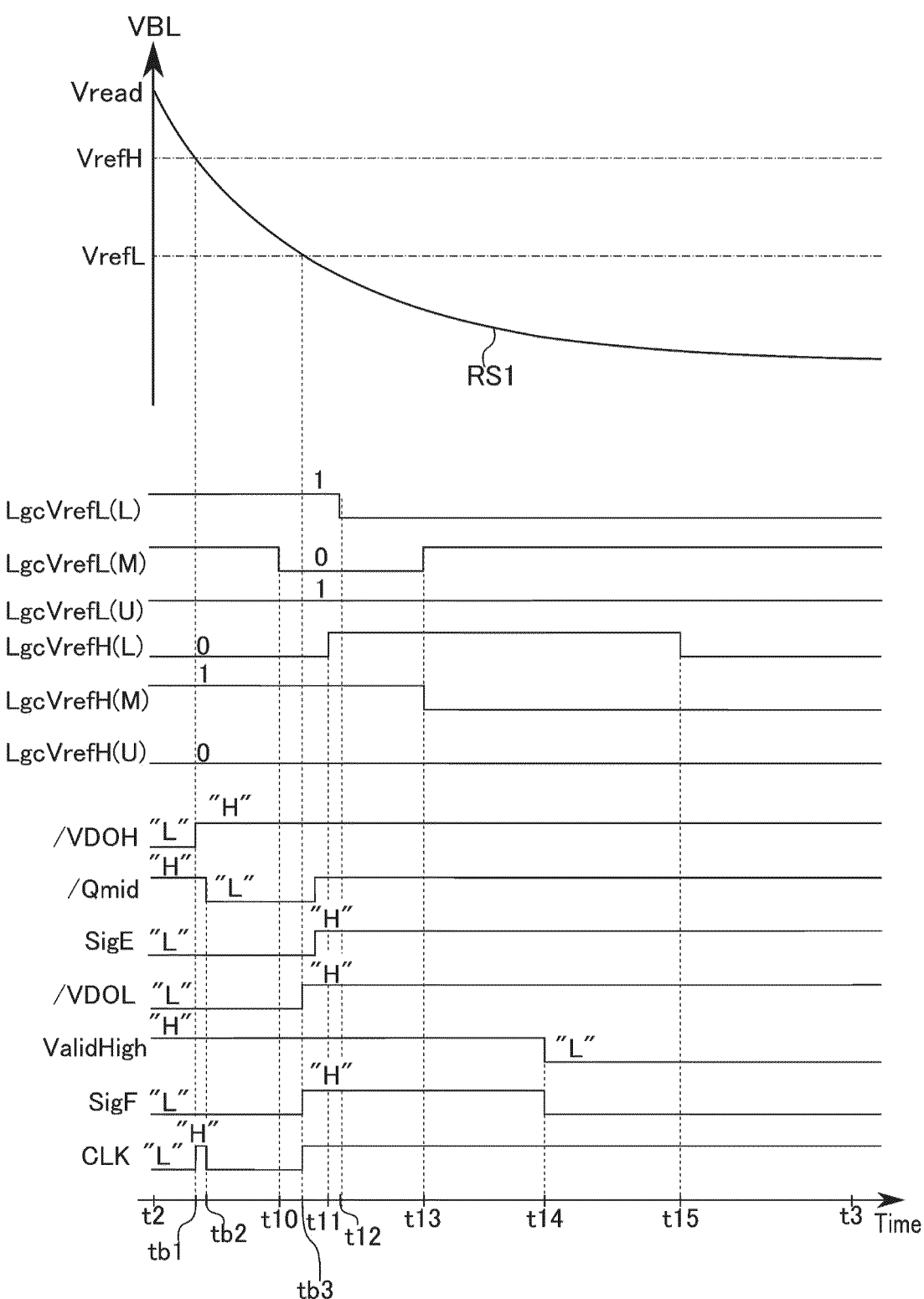
F I G. 20

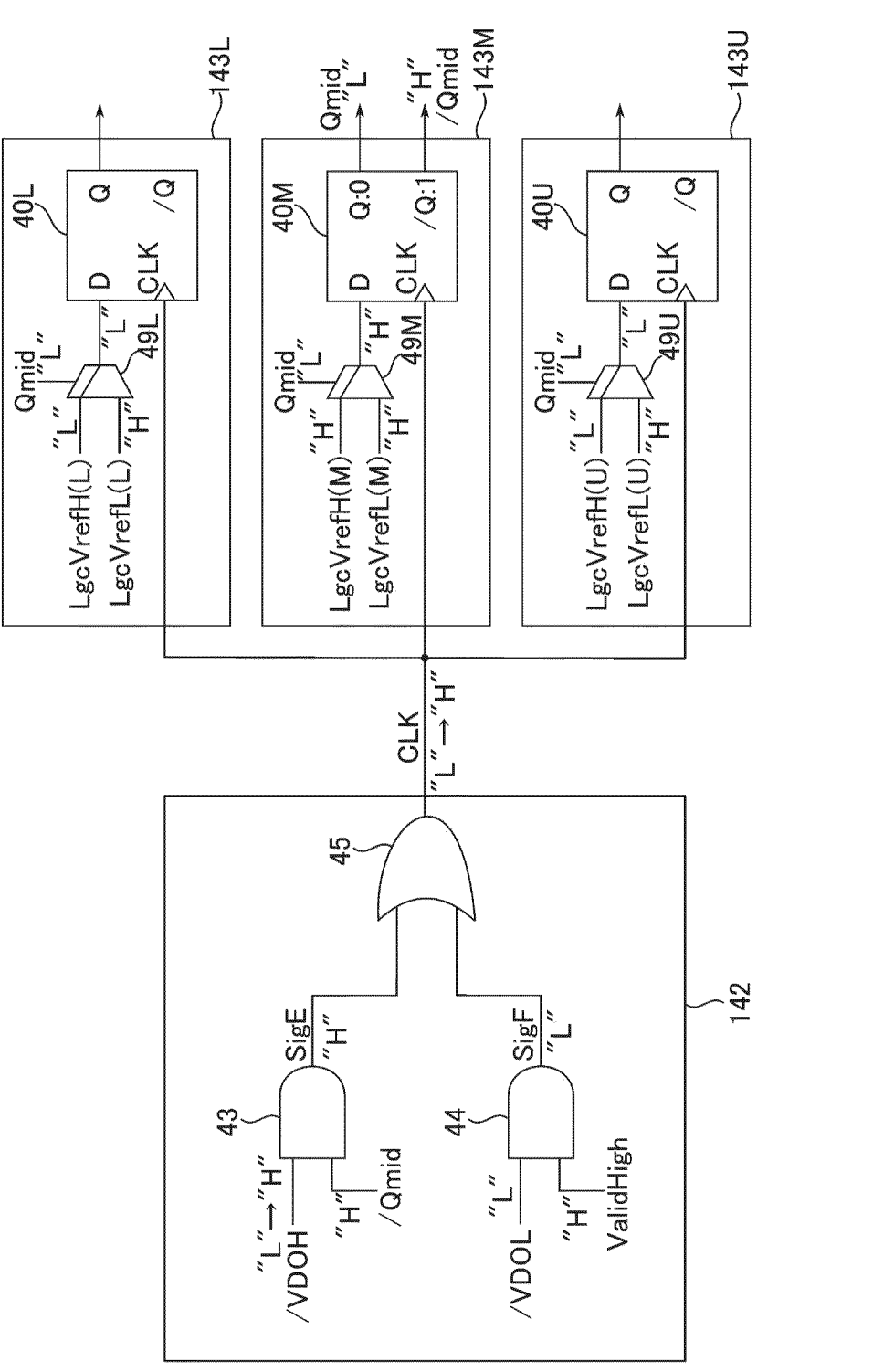
F I G. 21

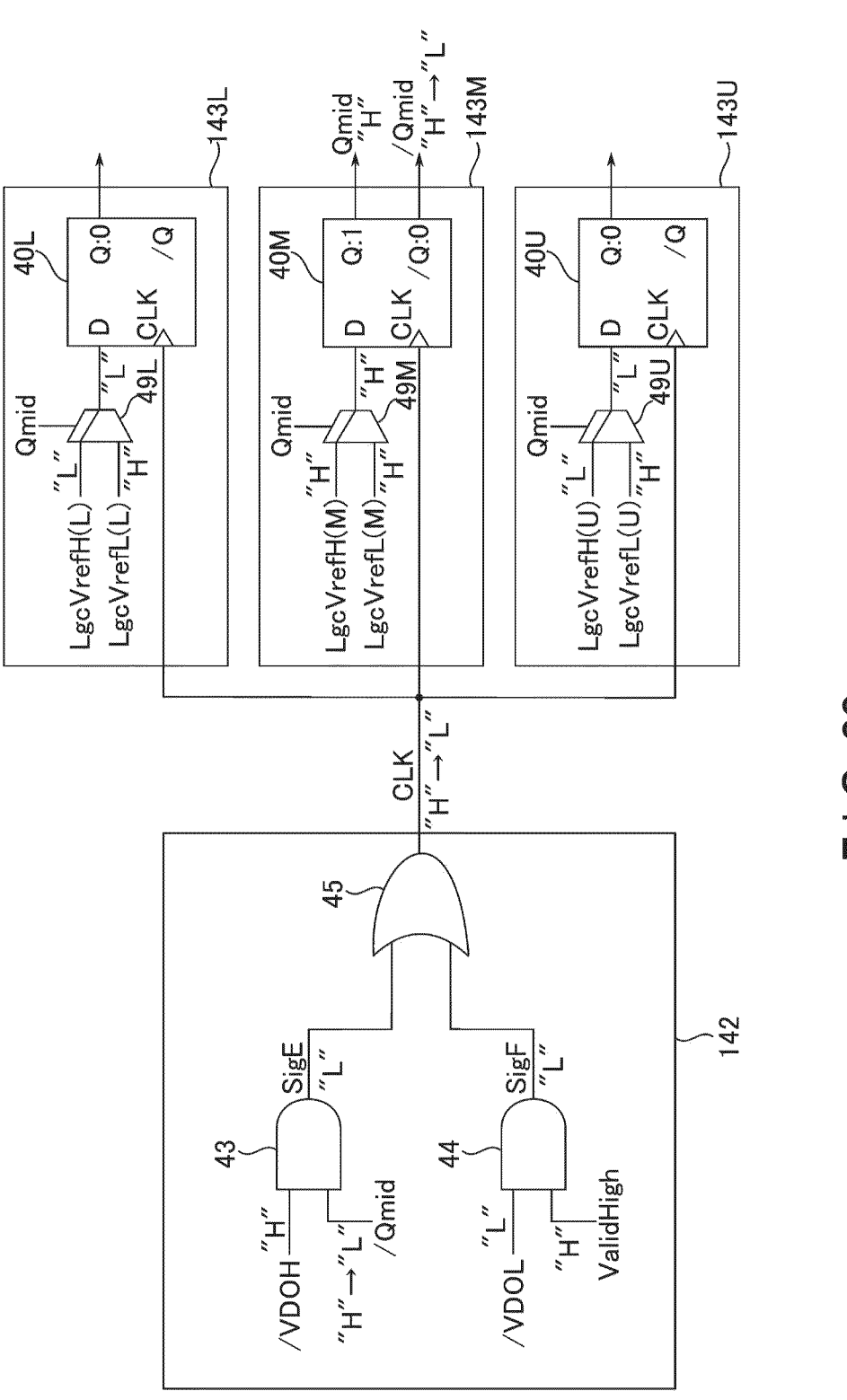
F I G. 22

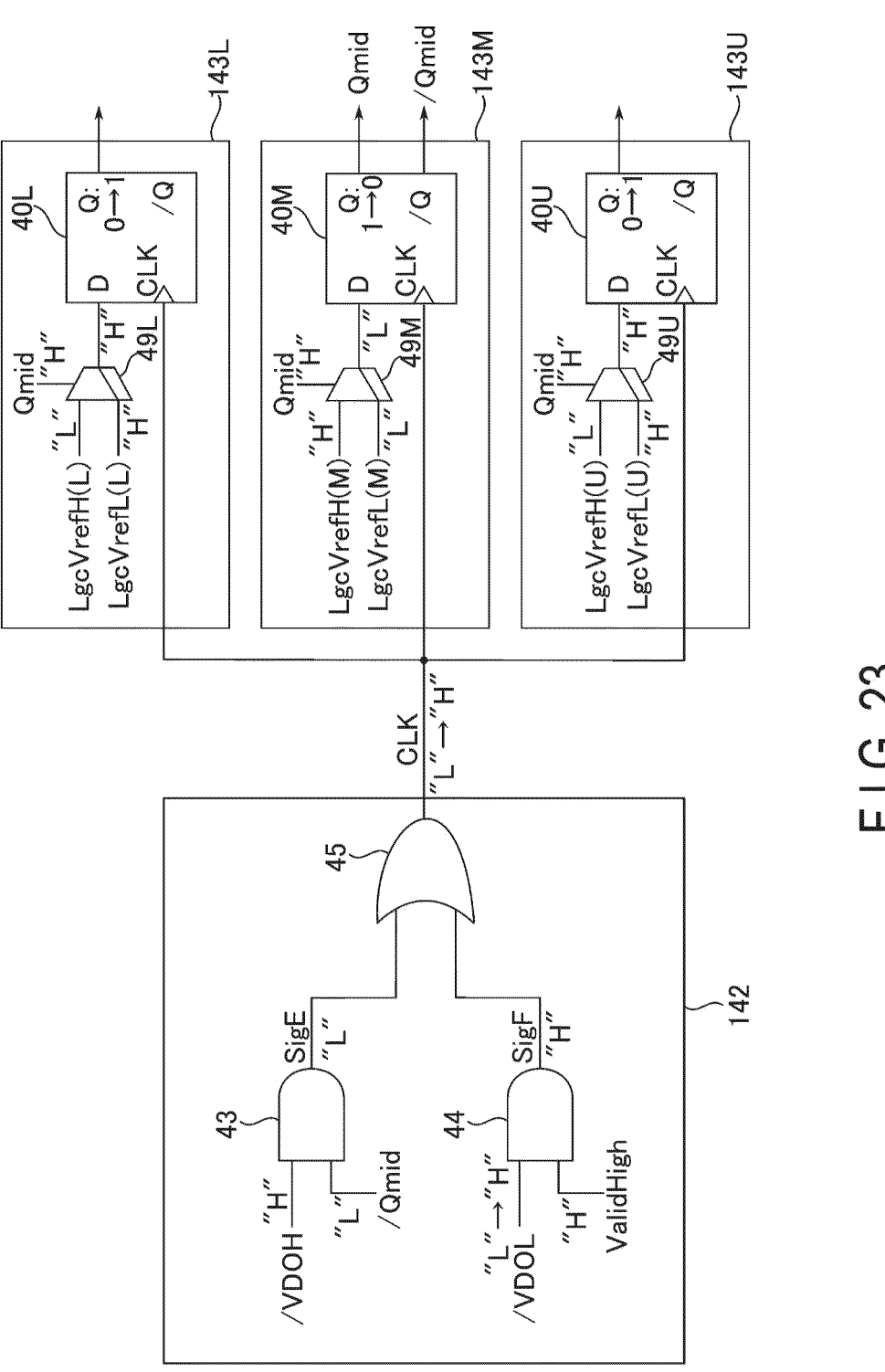
F I G. 23

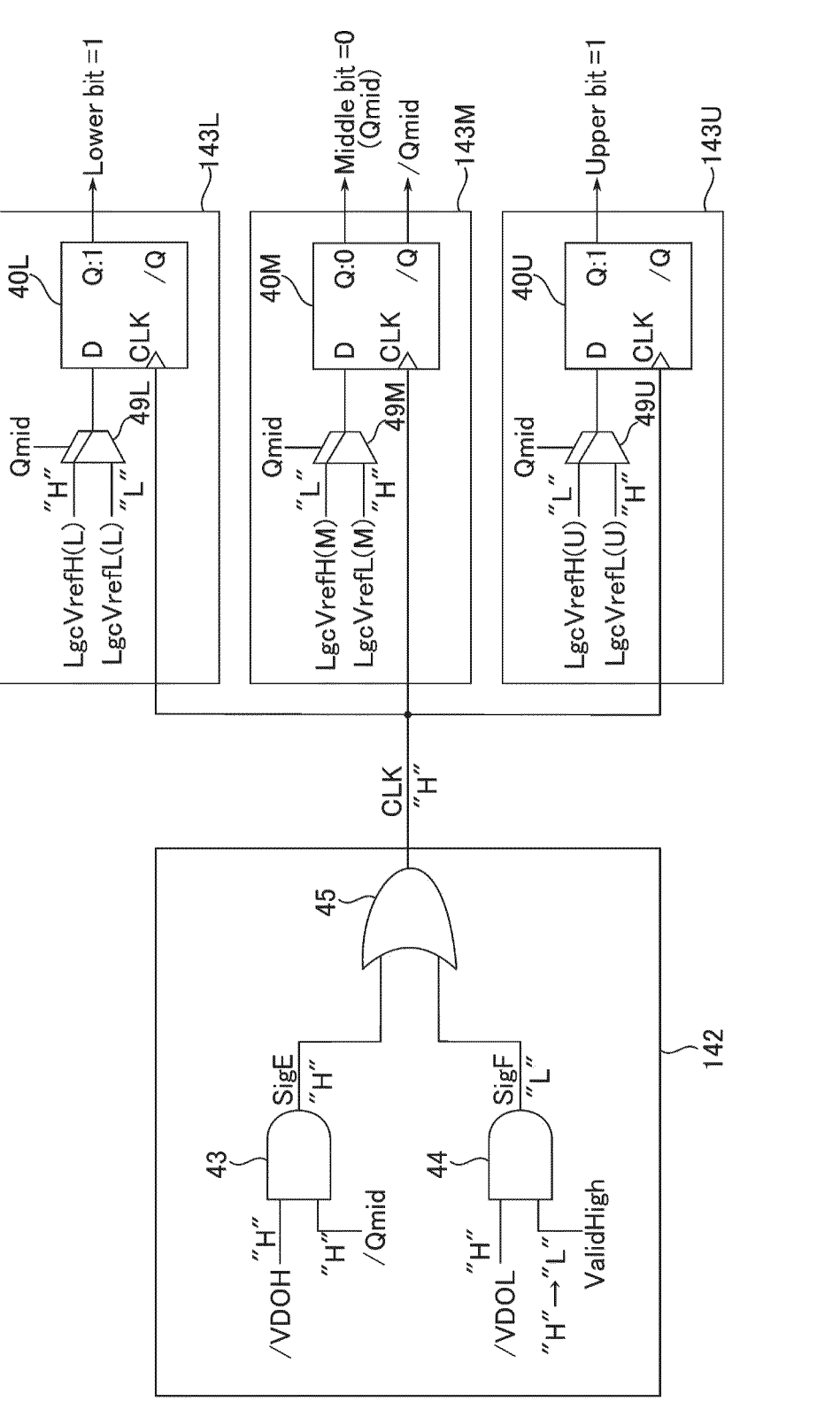
F I G. 24

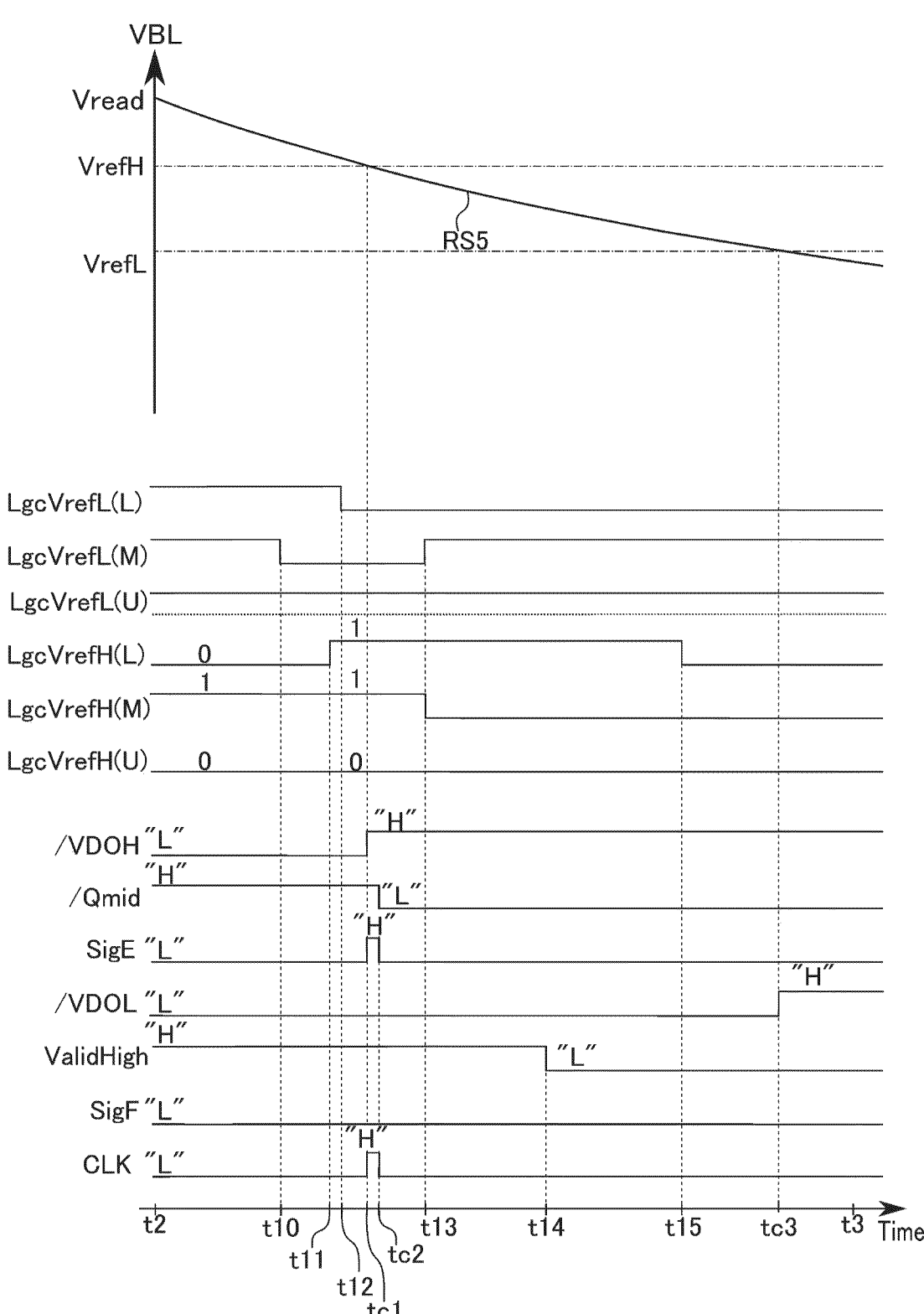
F I G. 25

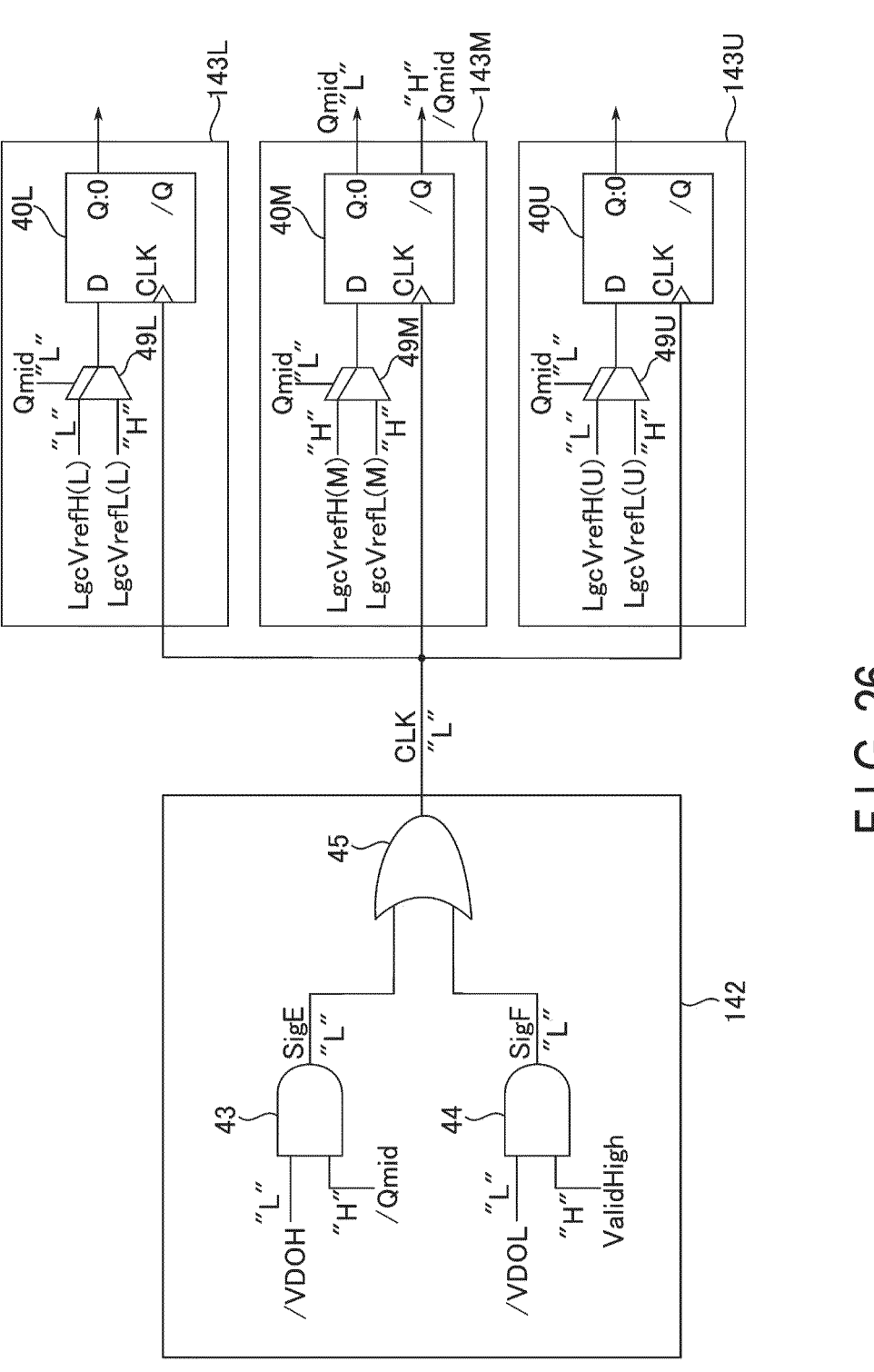
F I G. 26

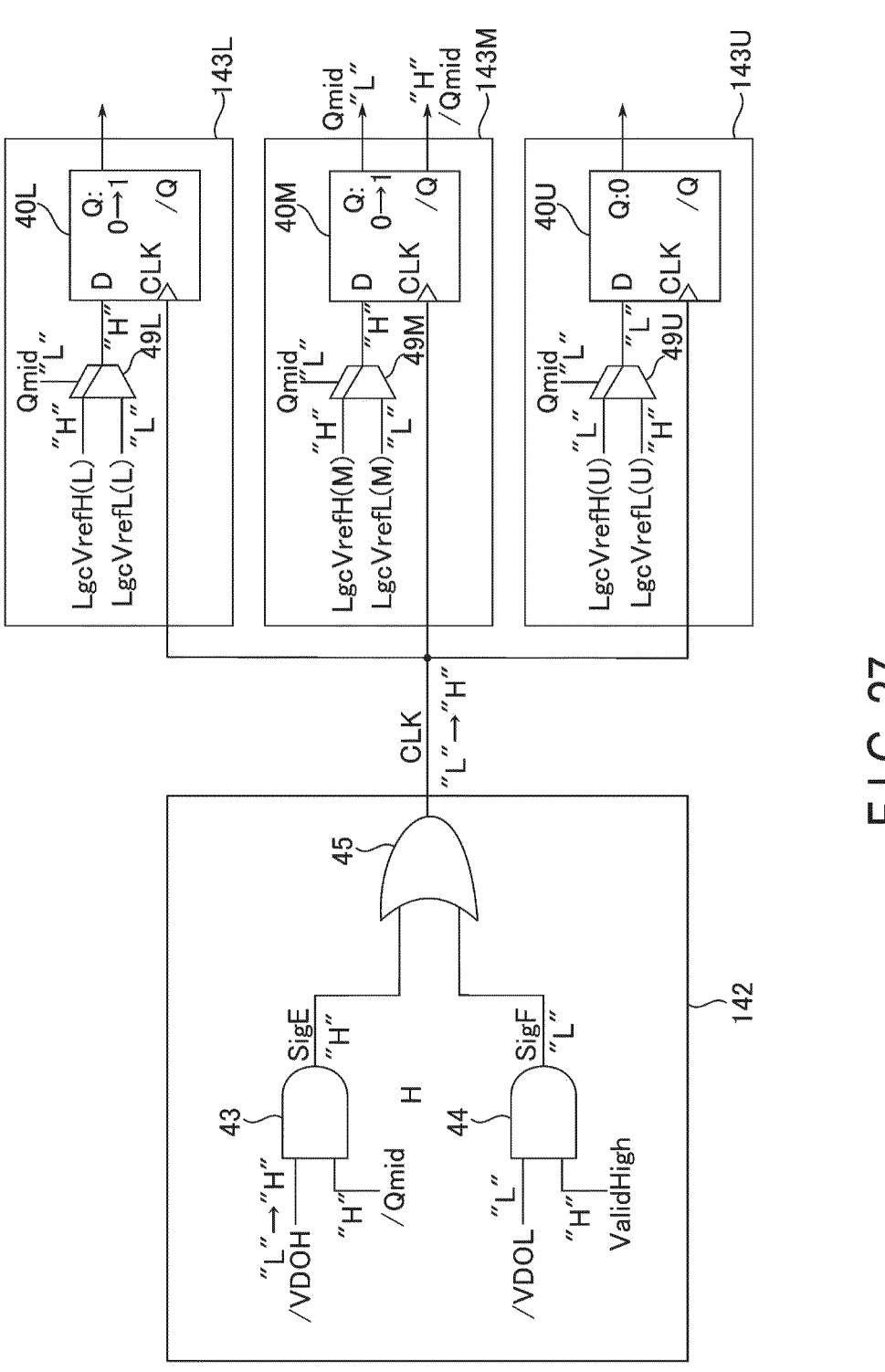
F I G. 27

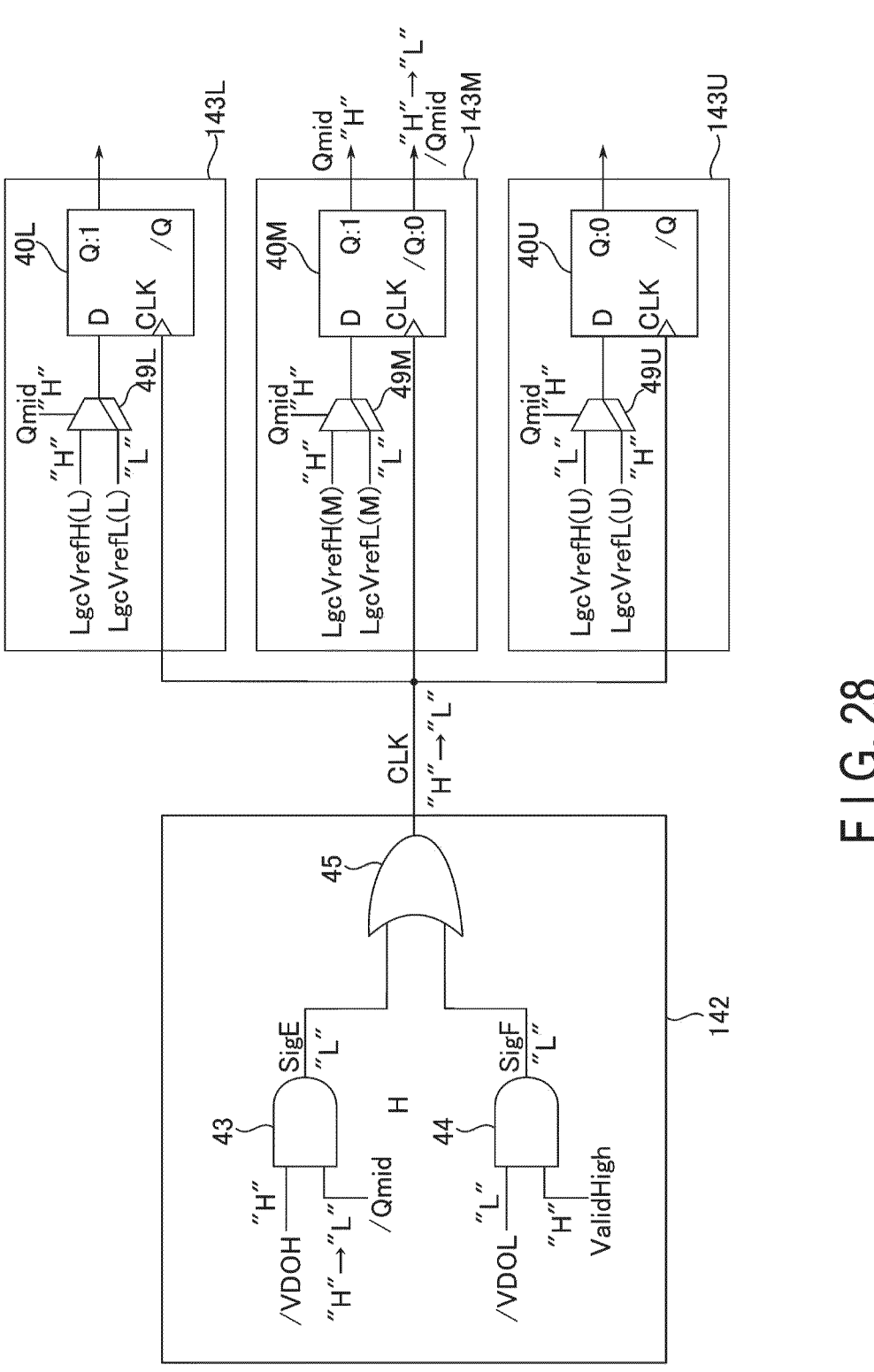
F I G. 28

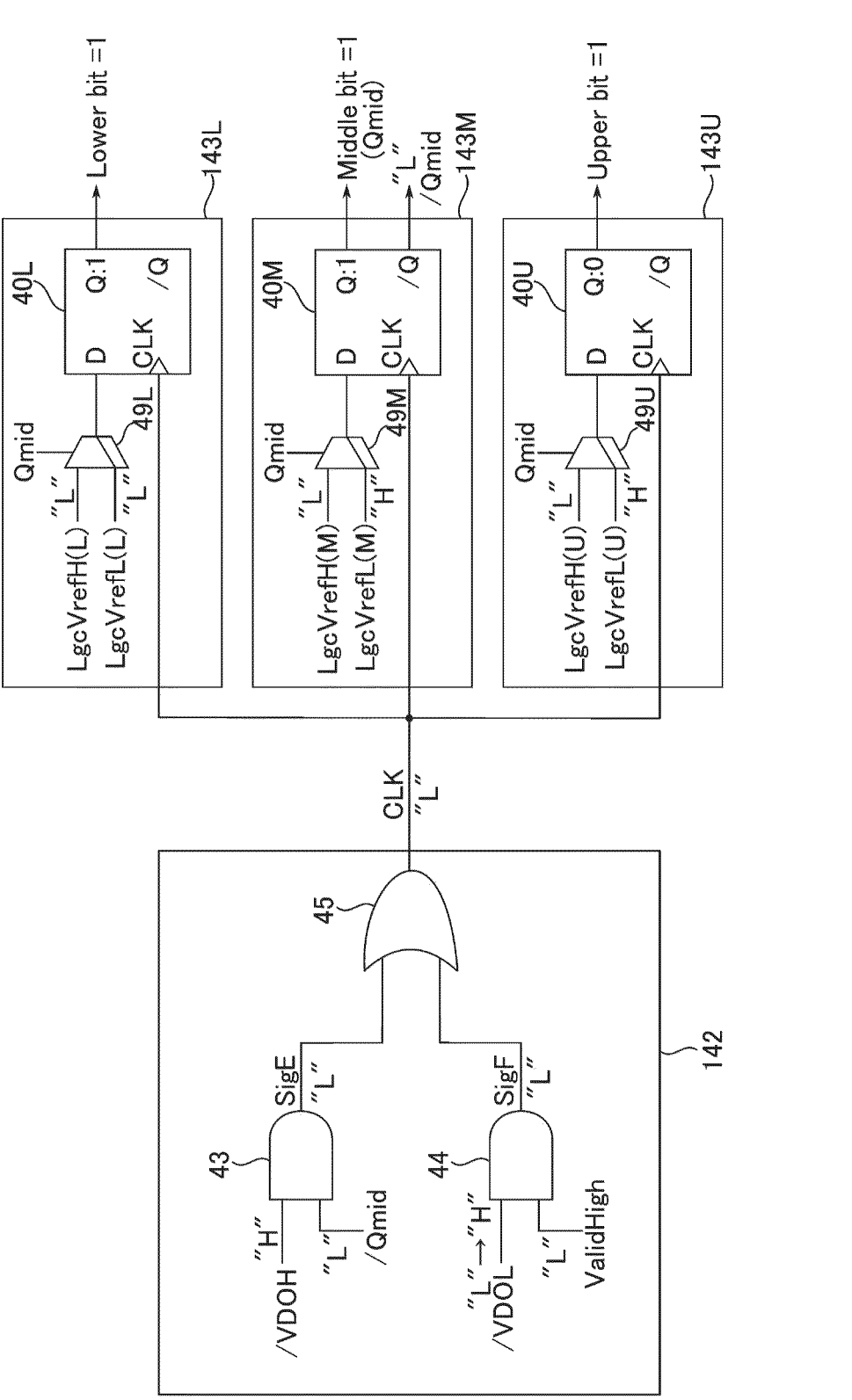
F I G. 30

| Resistance value | Resistance state | Upper bit | Middle bit | Lower bit |
|---|---|---|---|---|
| Low | RS0 | 0 | 0 | 0 |
| | RS1 | 0 | 0 | 1 |
| | RS2 | 0 | 1 | 0 |
| | RS3 | 0 | 1 | 1 |
| | RS4 | 1 | 0 | 0 |
| | RS5 | 1 | 0 | 1 |
| | RS6 | 1 | 1 | 0 |
| High | RS7 | 1 | 1 | 1 |

F I G. 31

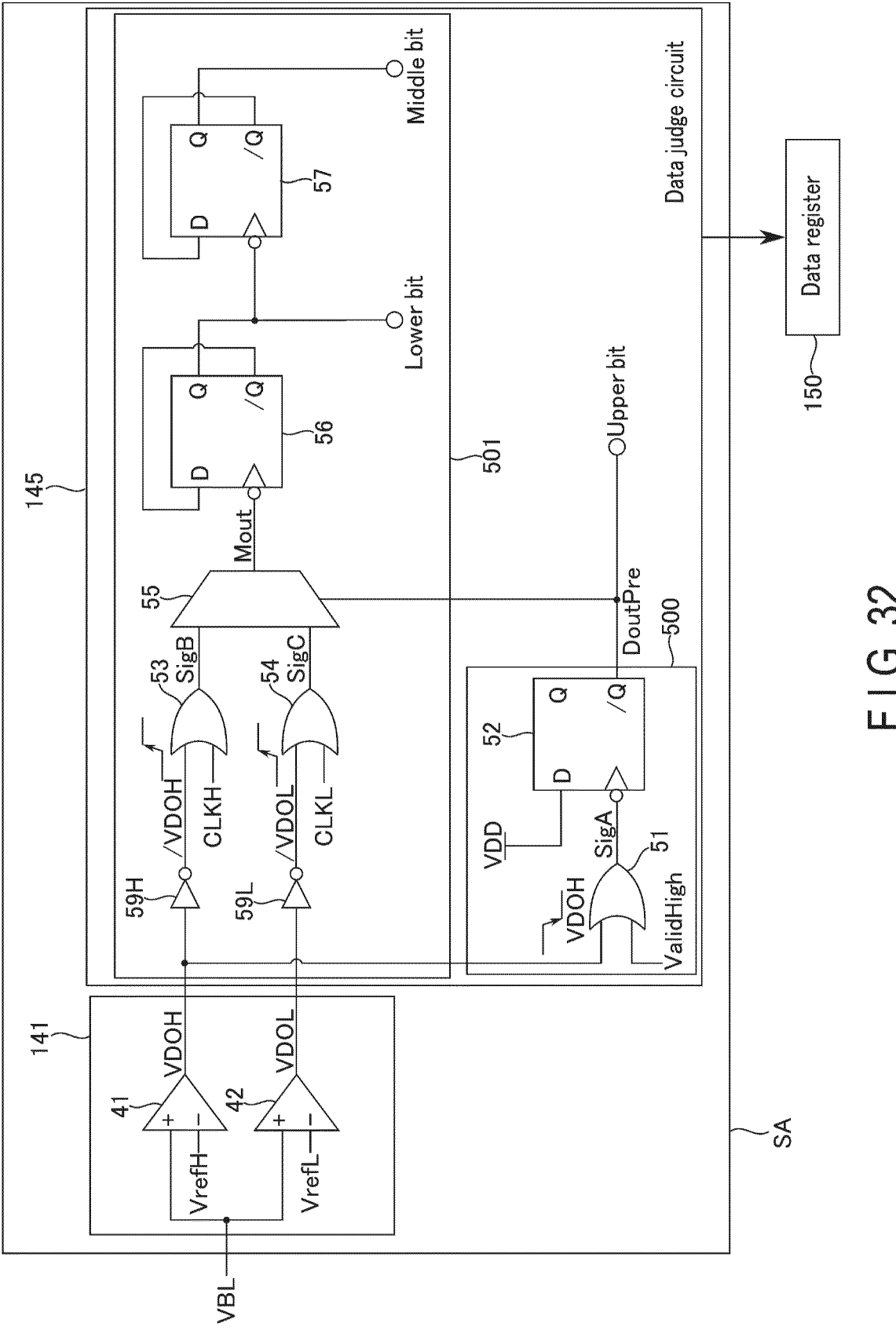
F I G. 32

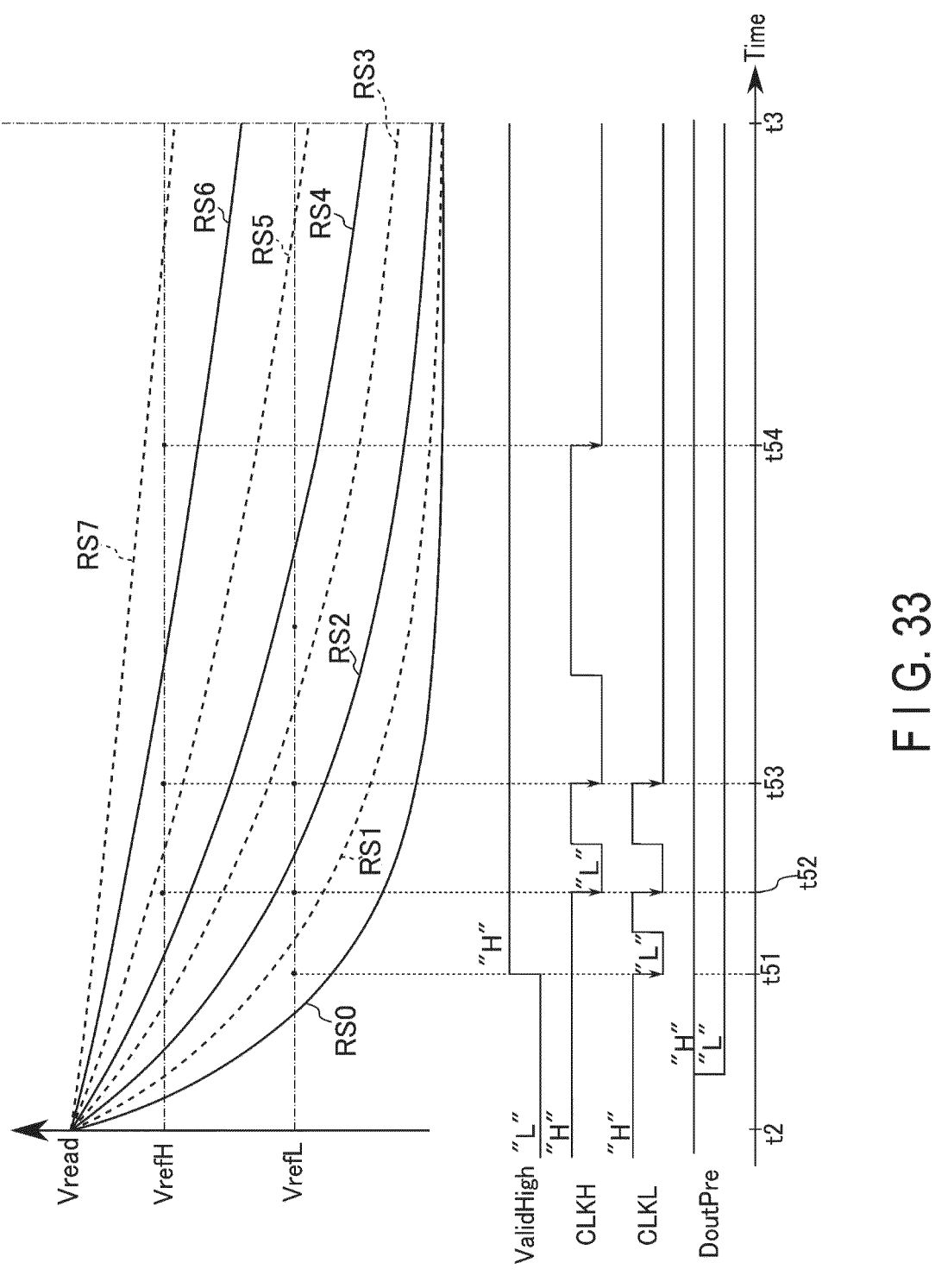
F I G. 33

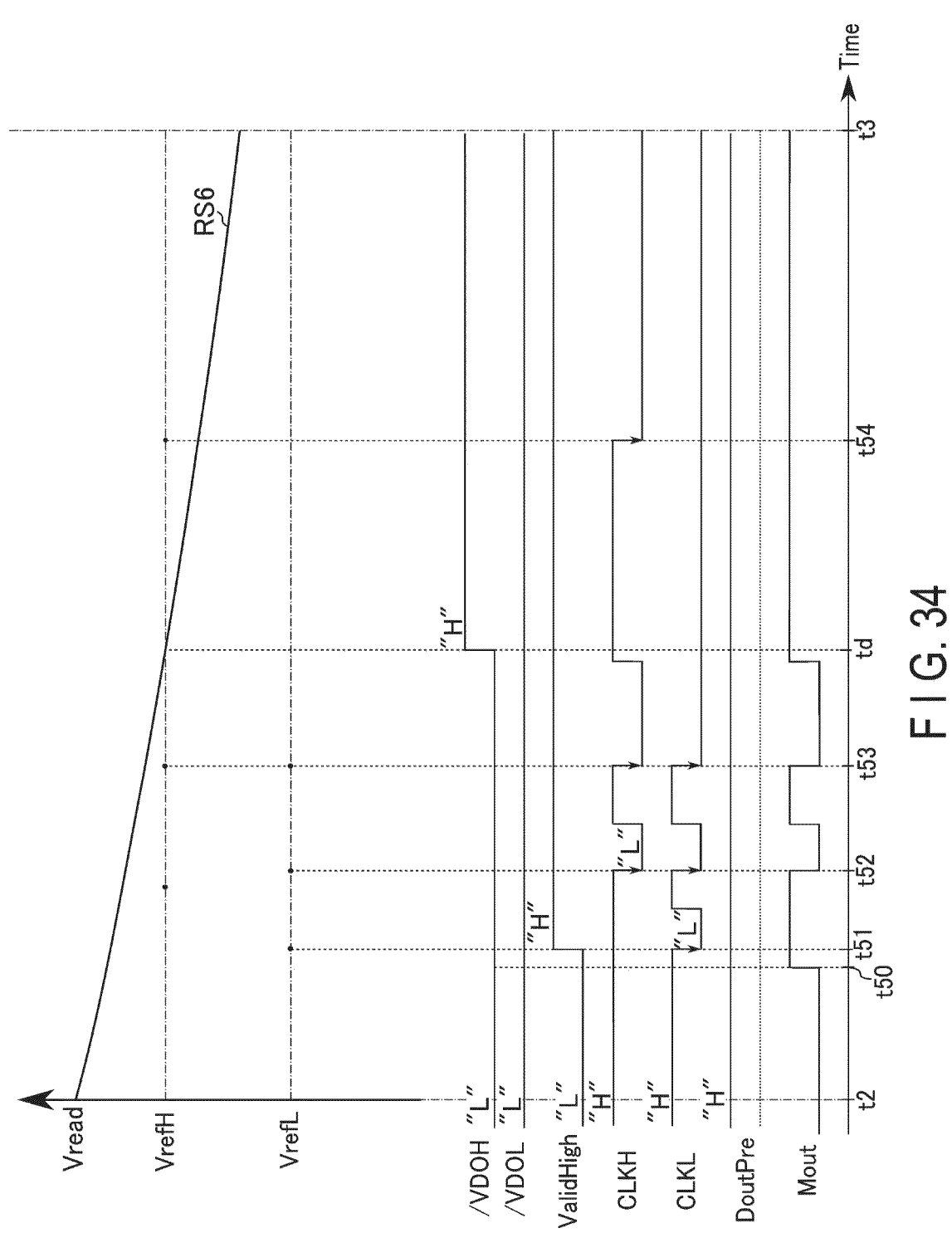
F I G. 34

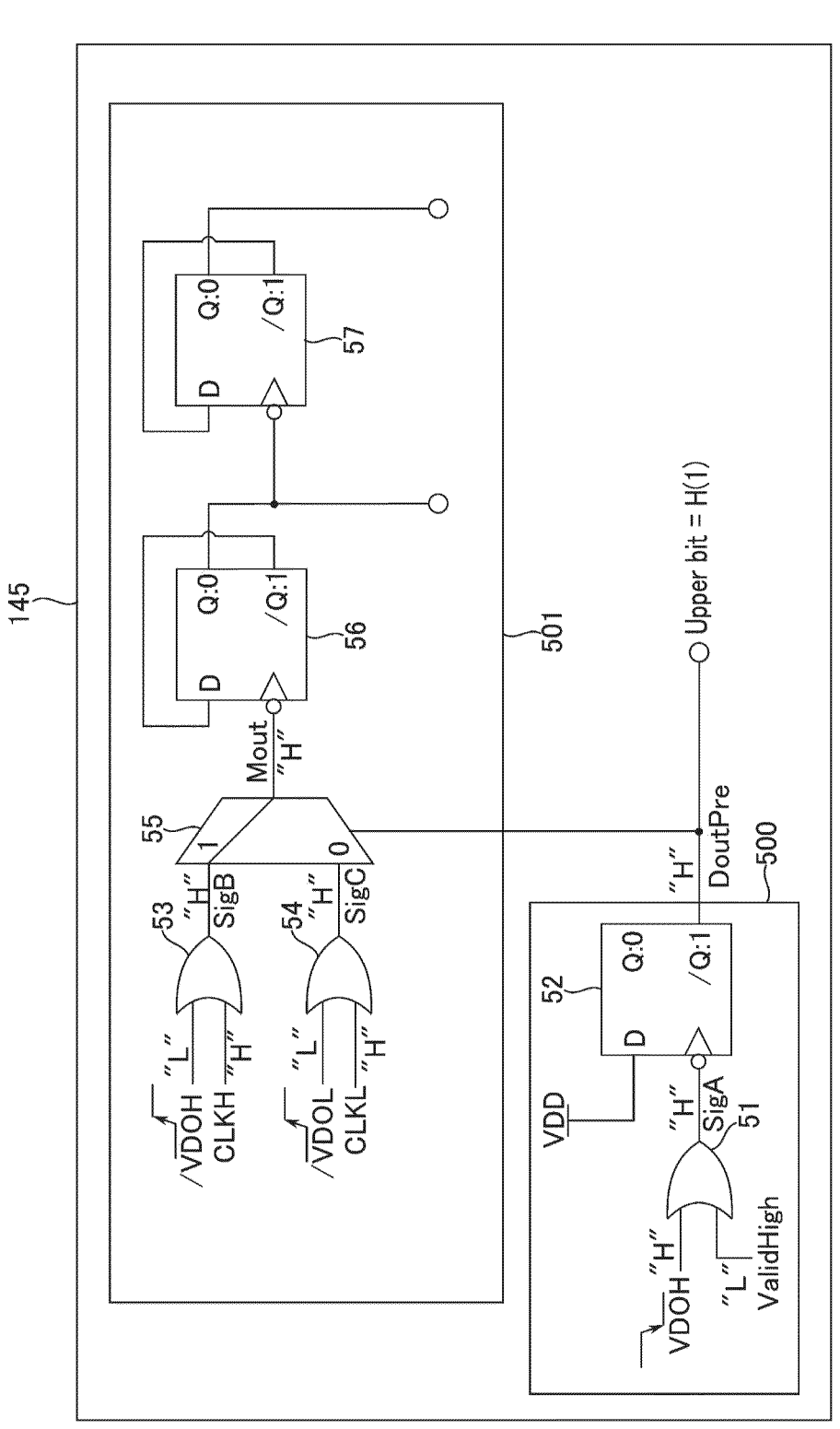
F I G. 35

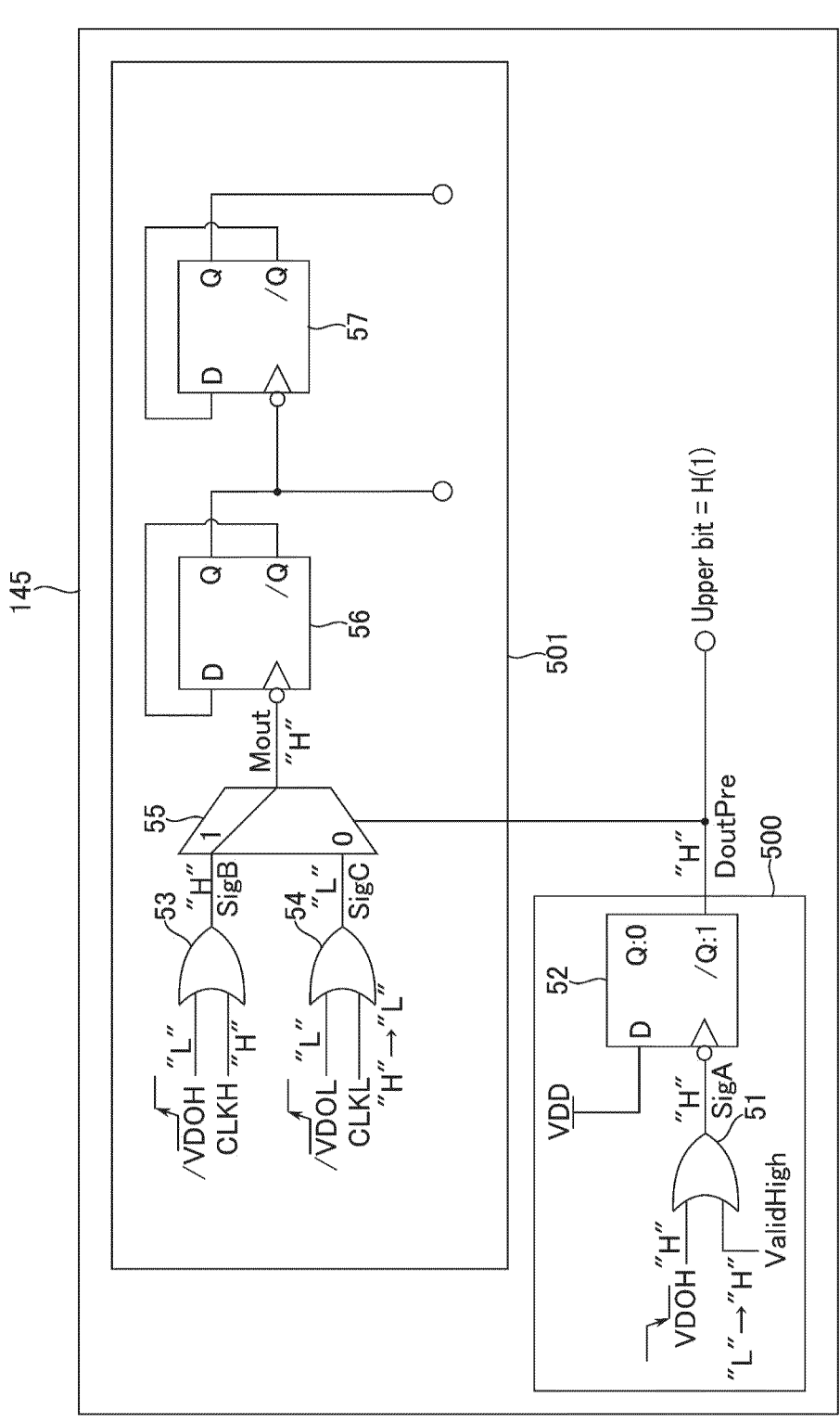
F I G. 36

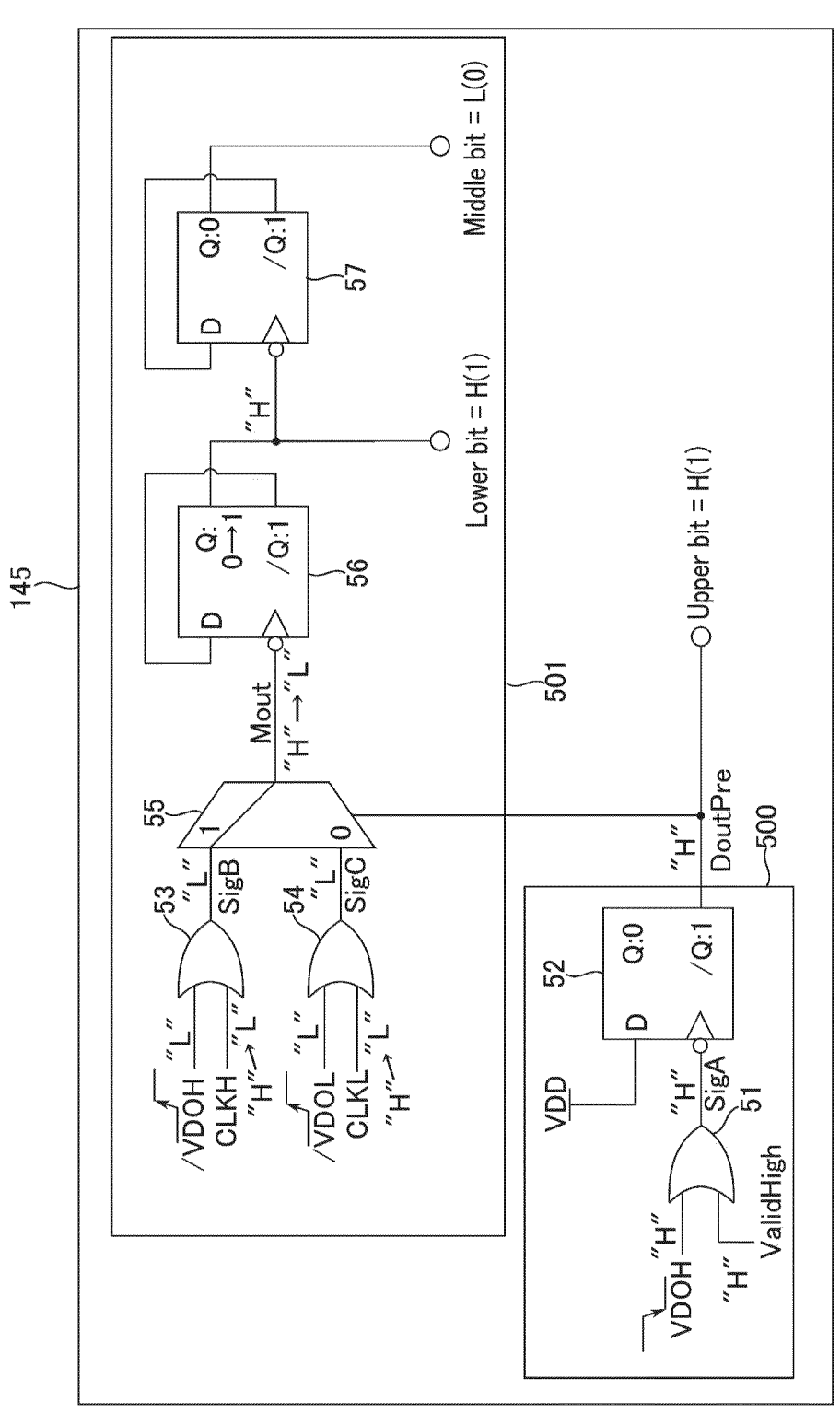
F I G. 37

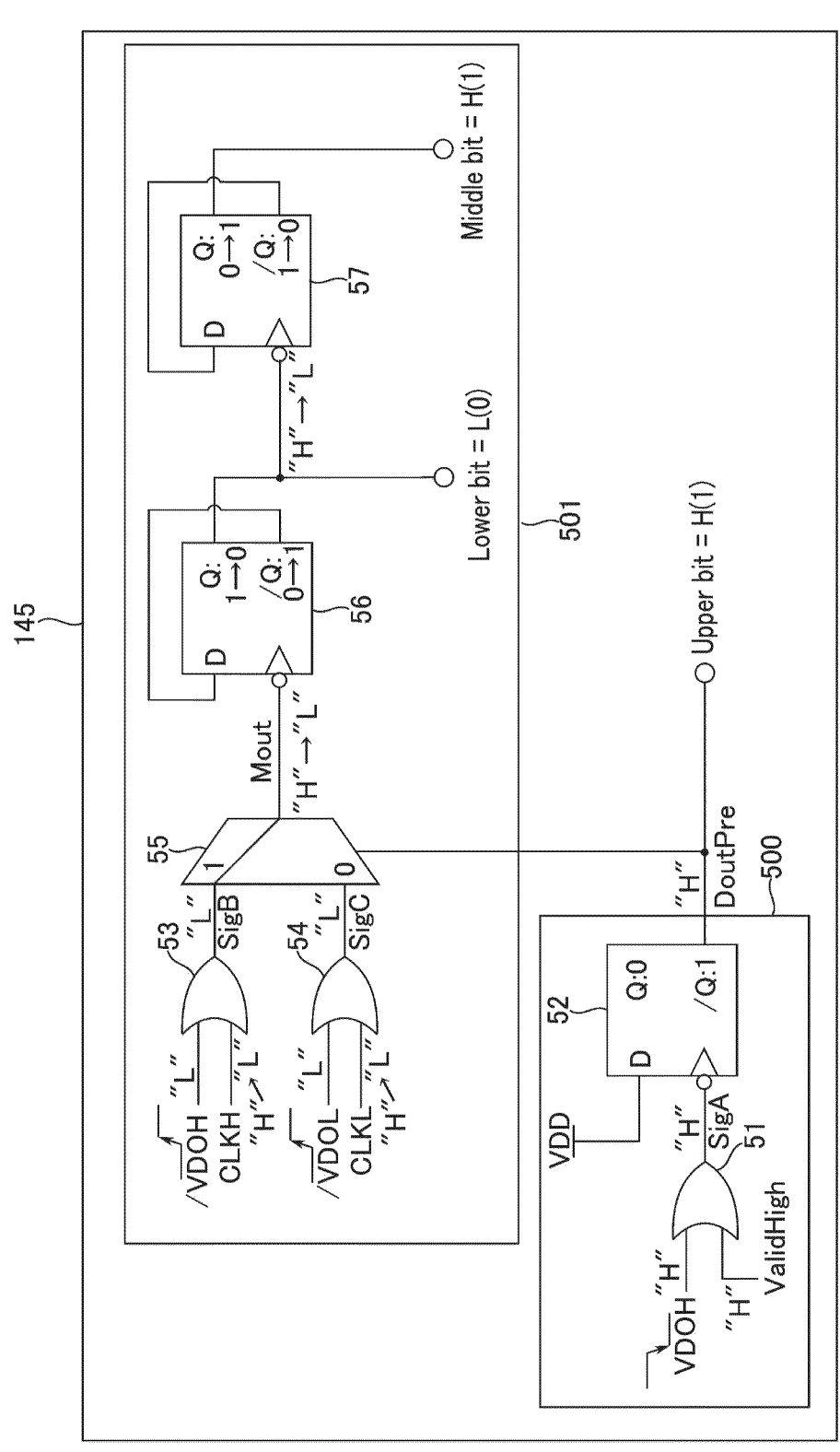
F I G. 38

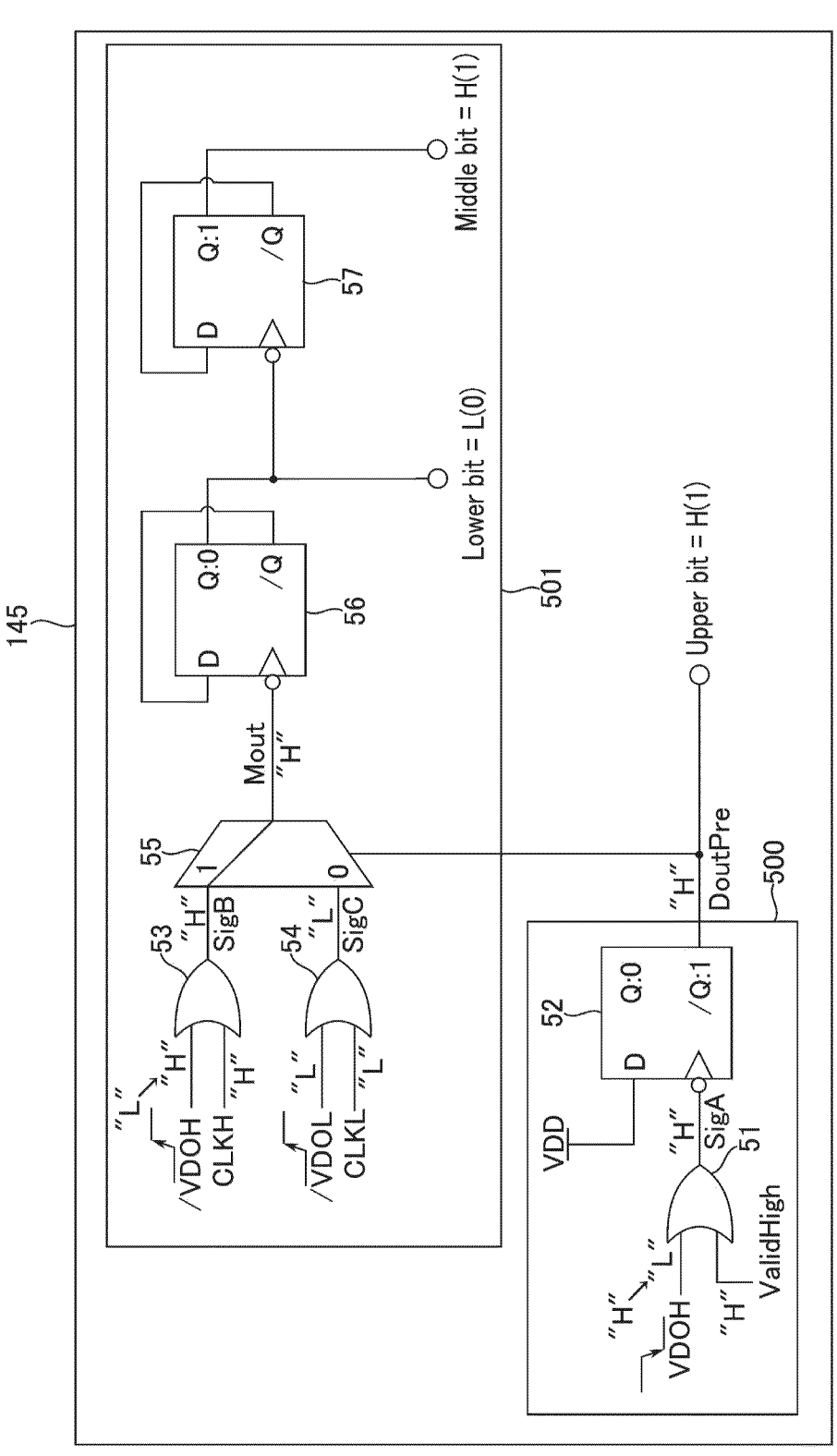
F I G. 39

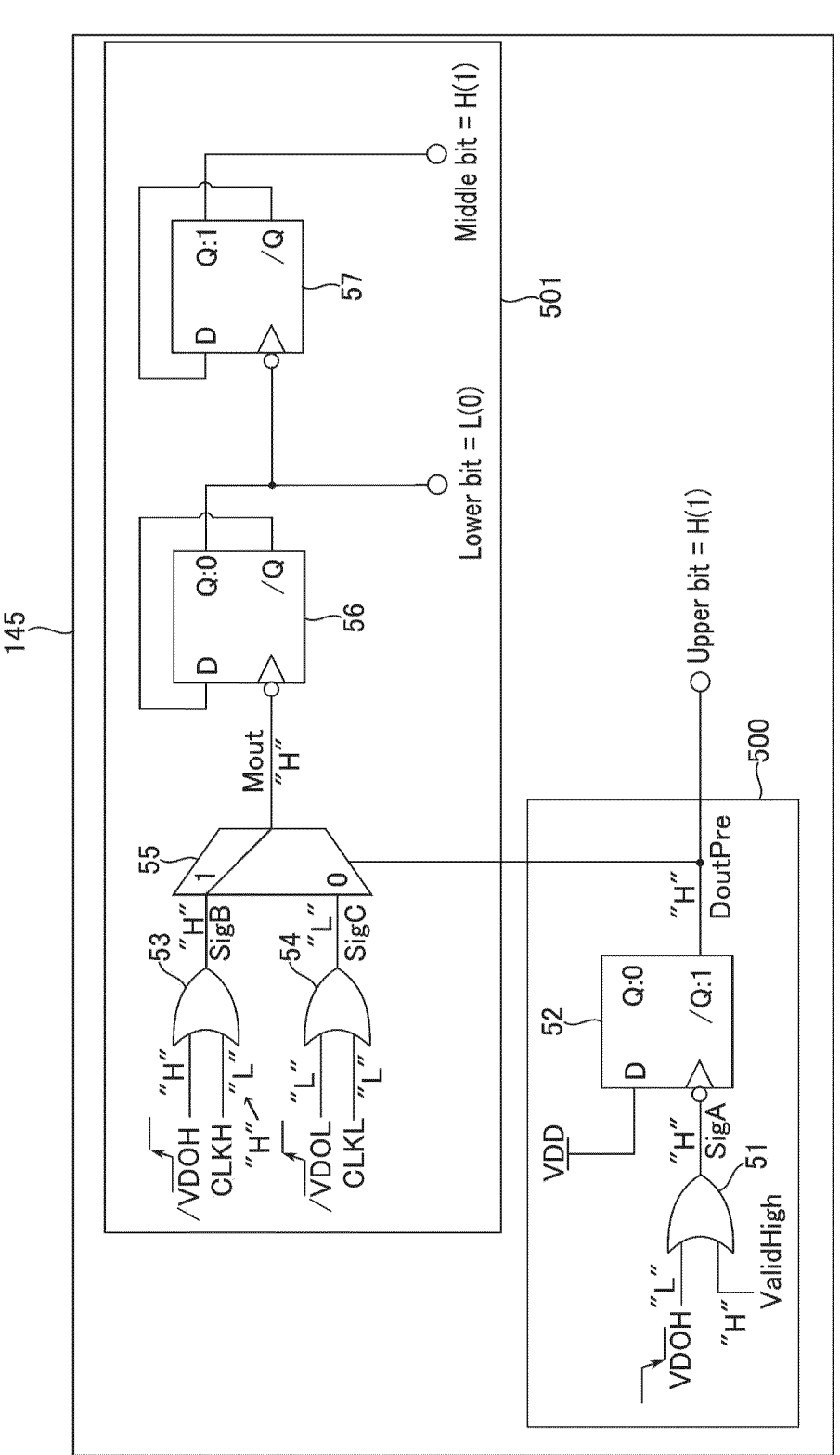
F I G. 40

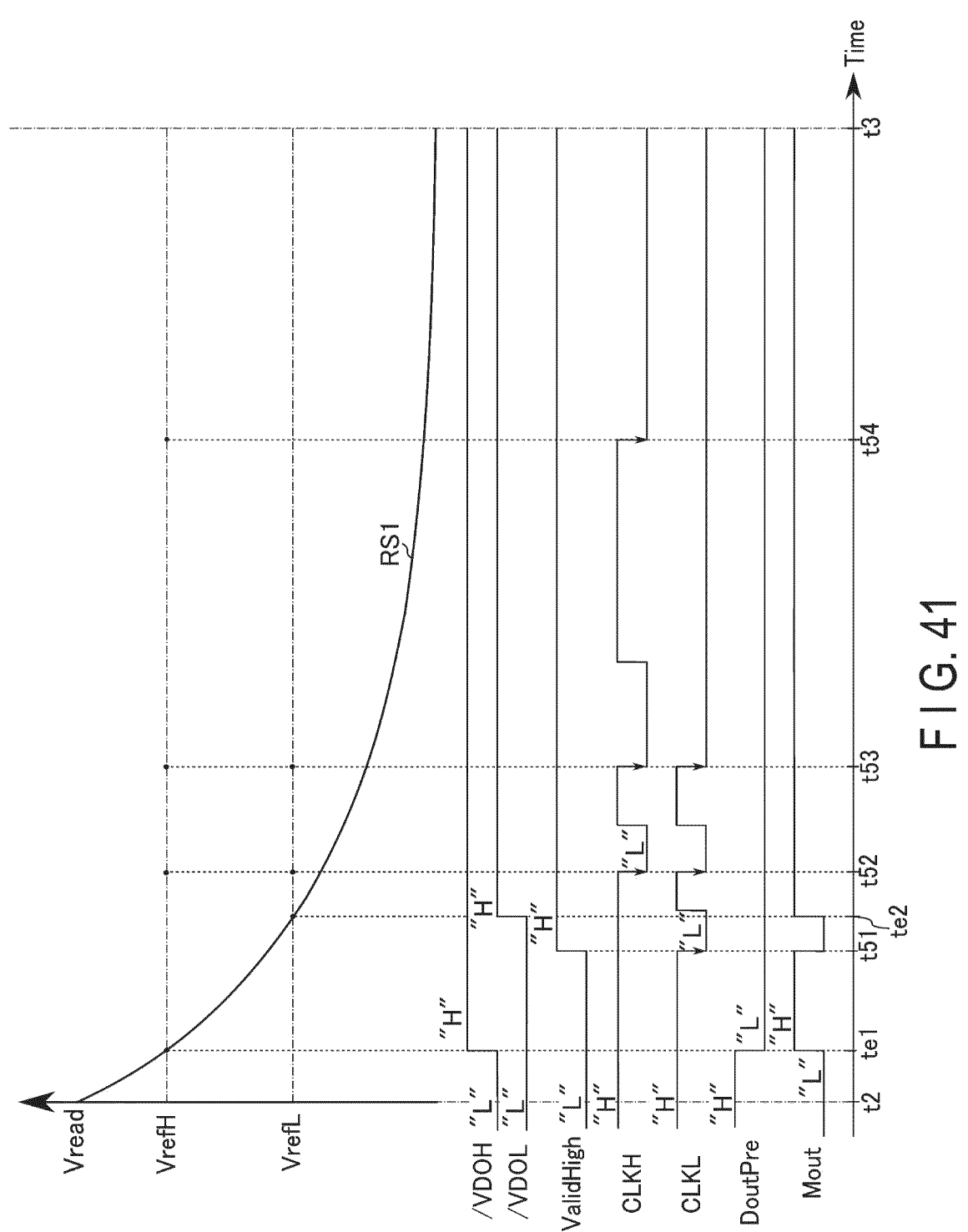
F I G. 41

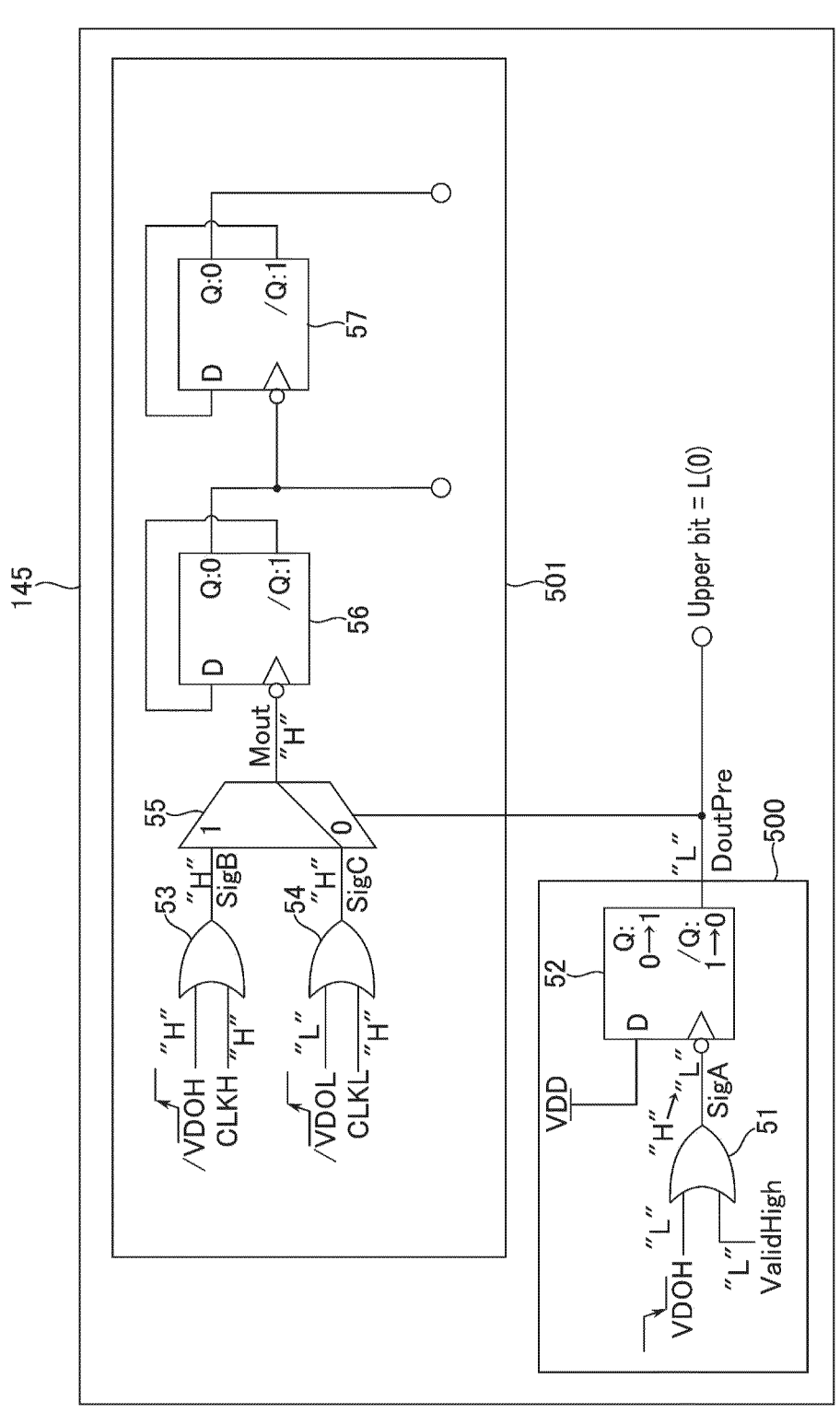
F I G. 42

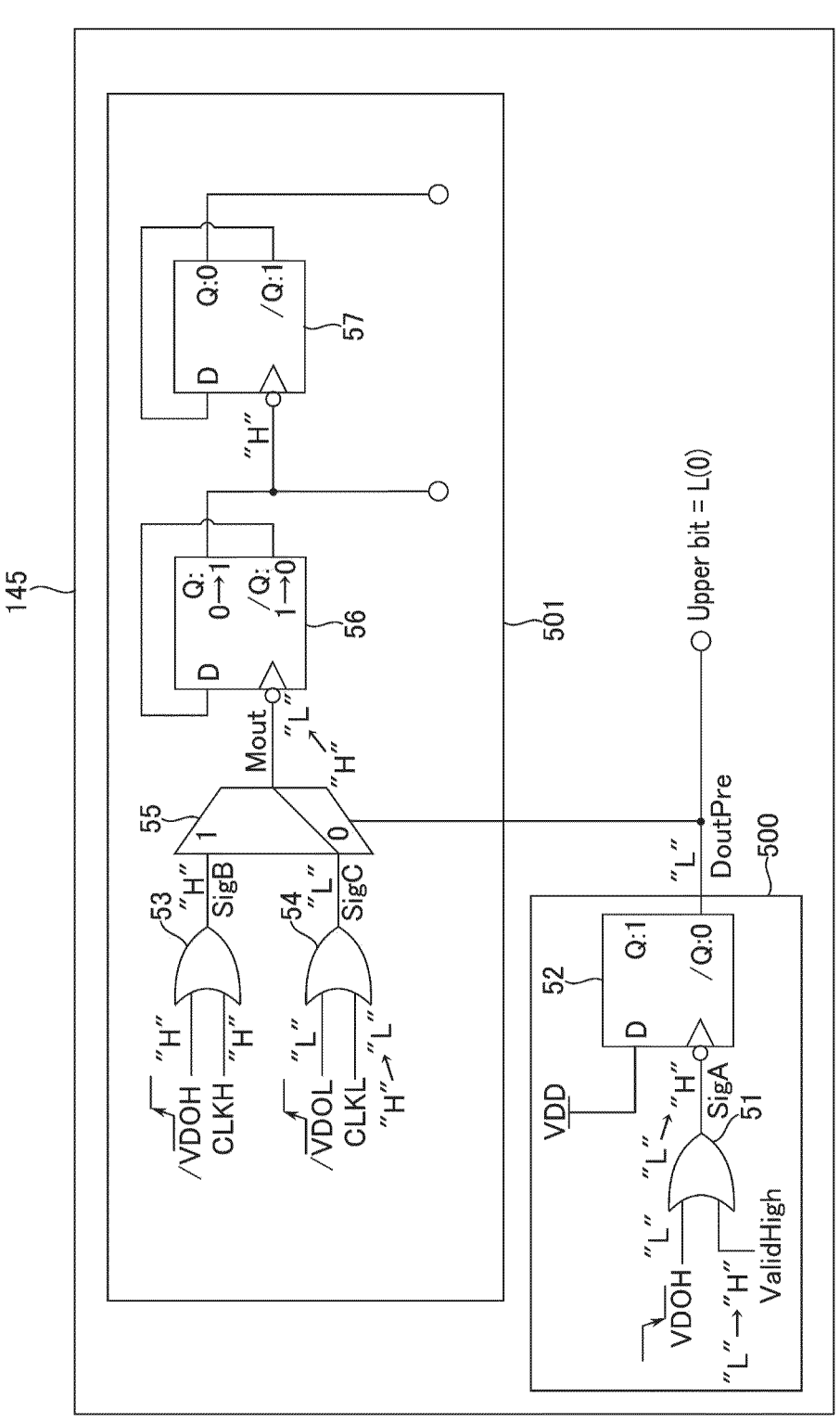
F I G. 43

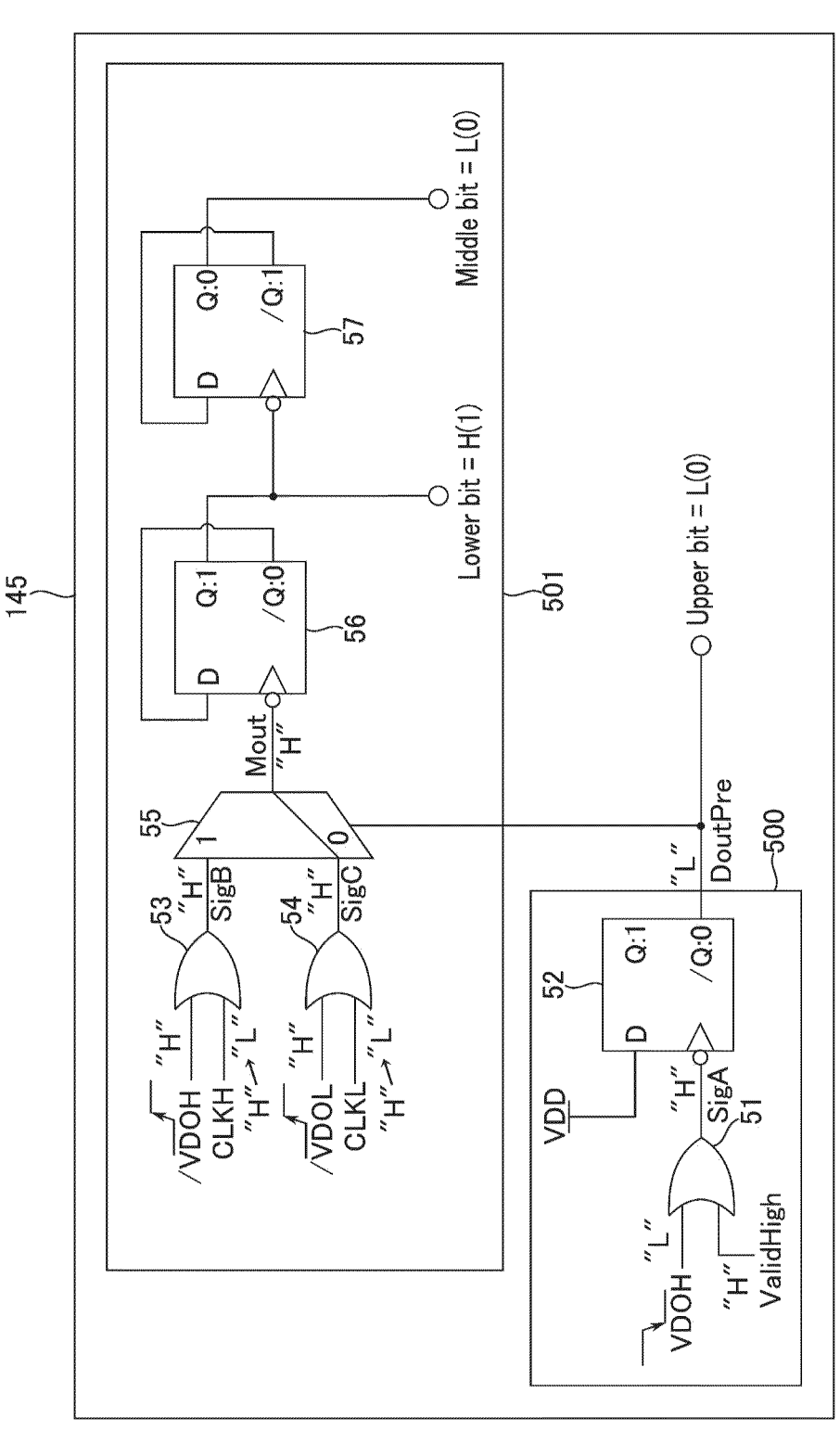
F I G. 45

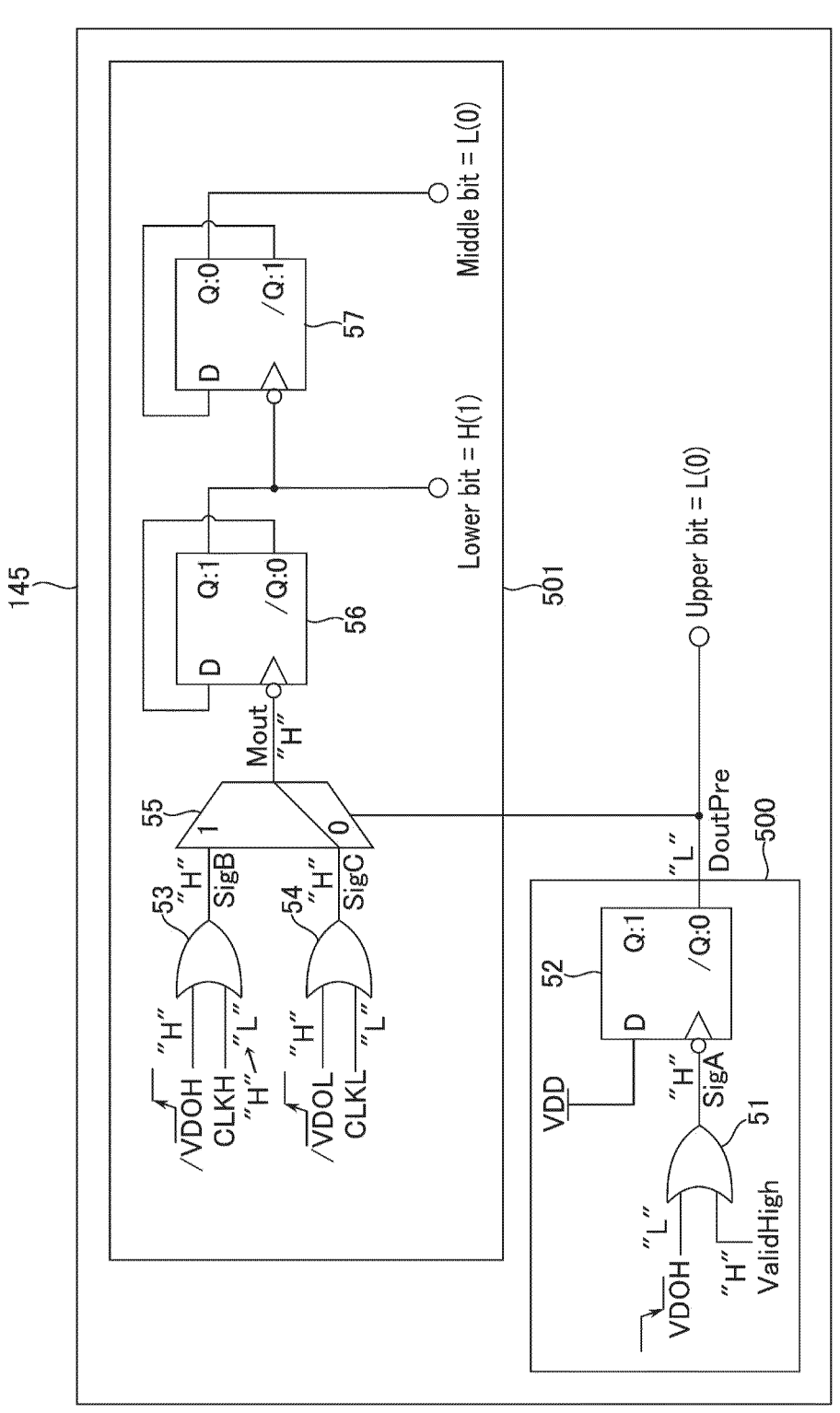
F I G. 46

| Data confirmation time | Resistance state | Upper bit | Middle bit | Lower bit |
|---|---|---|---|---|
| Early | RS0 | 1 | 1 | 1 |
| | RS4 | 0 | 1 | 0 |
| | RS1 | 1 | 0 | 1 |
| | RS5 | 0 | 1 | 1 |
| | RS2 | 1 | 0 | 0 |
| | RS3 | 1 | 1 | 0 |
| | RS6 | 0 | 0 | 1 |
| Late | RS7 | 0 | 0 | 0 |

F I G. 47

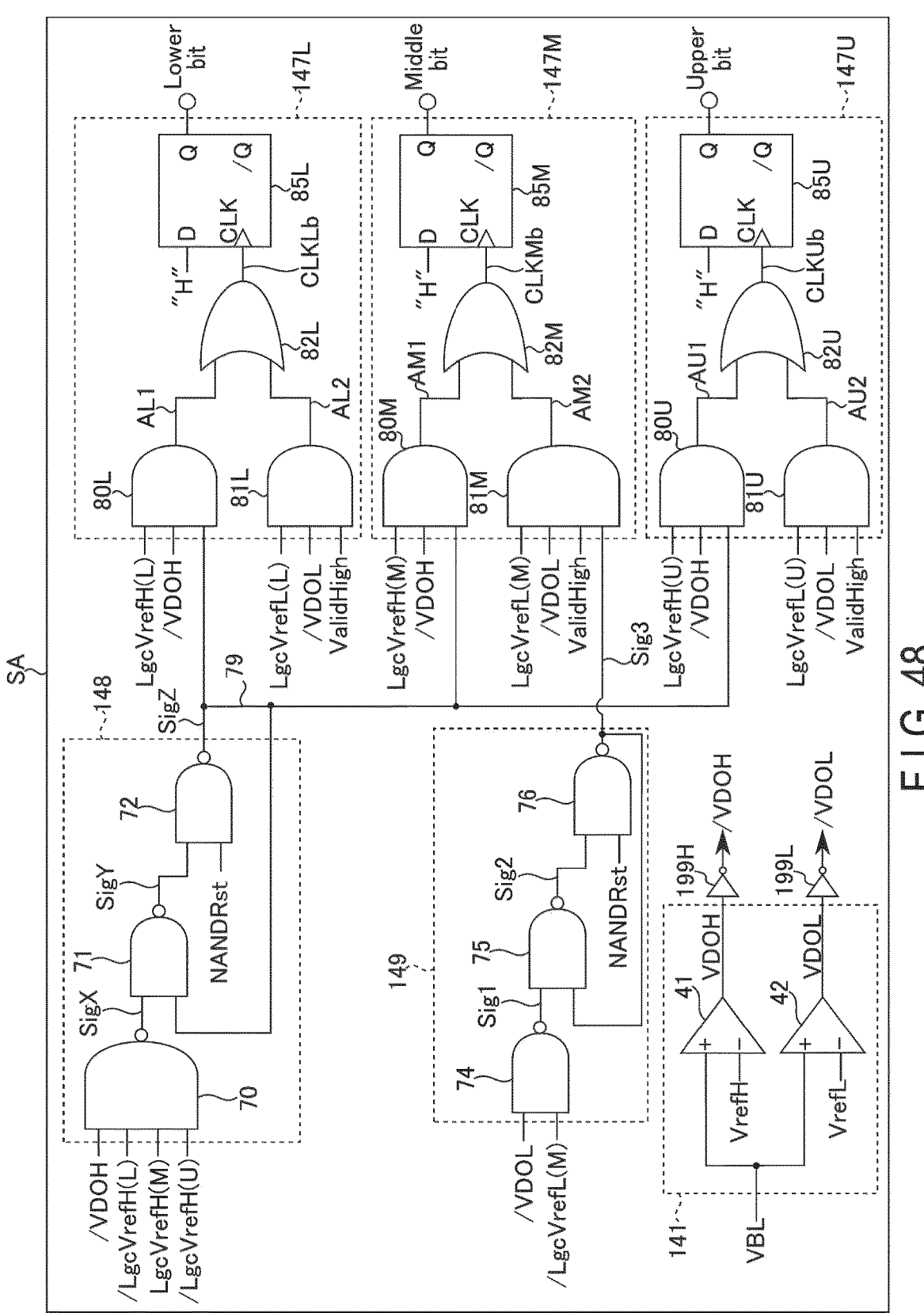
F I G. 48

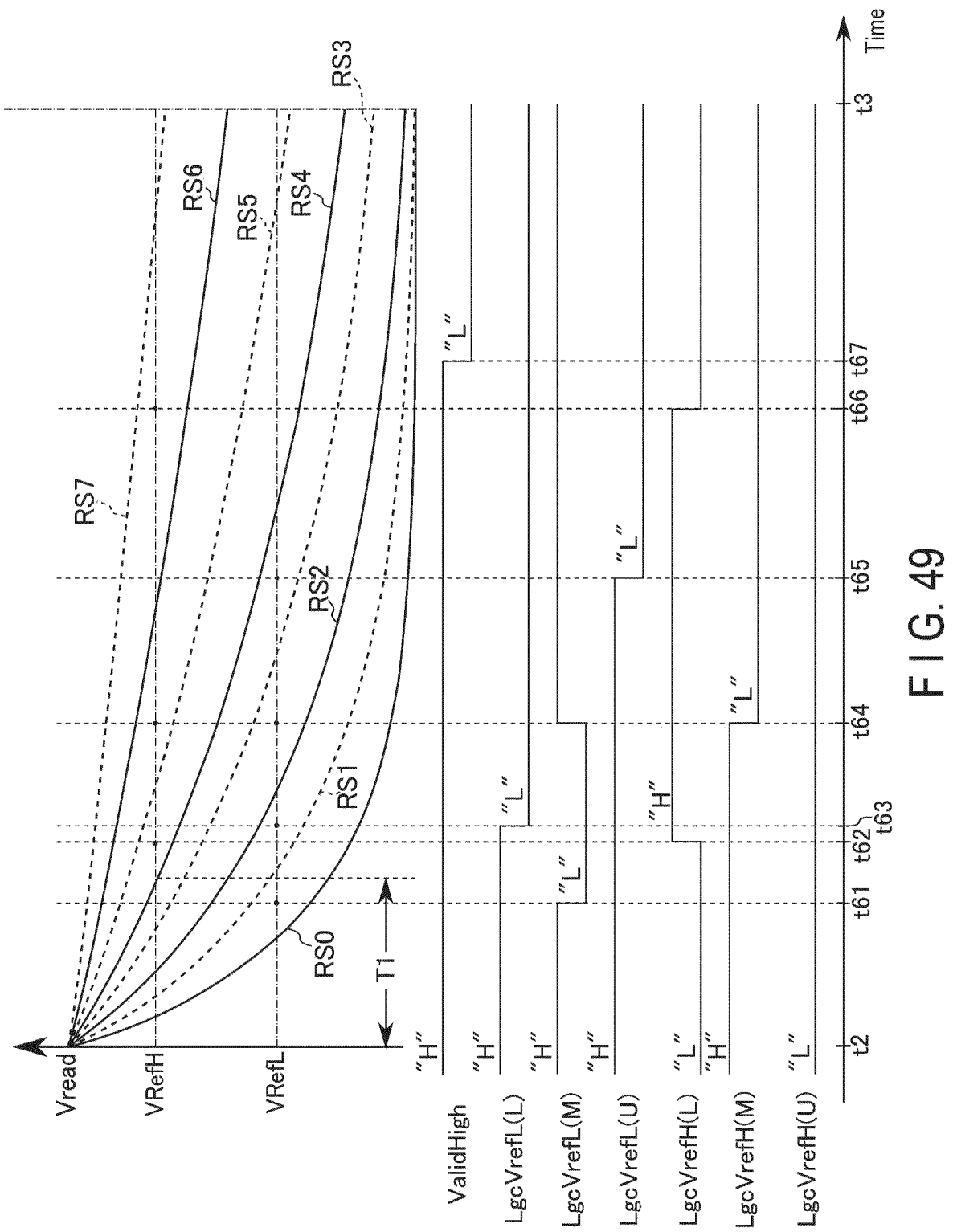
F I G. 49

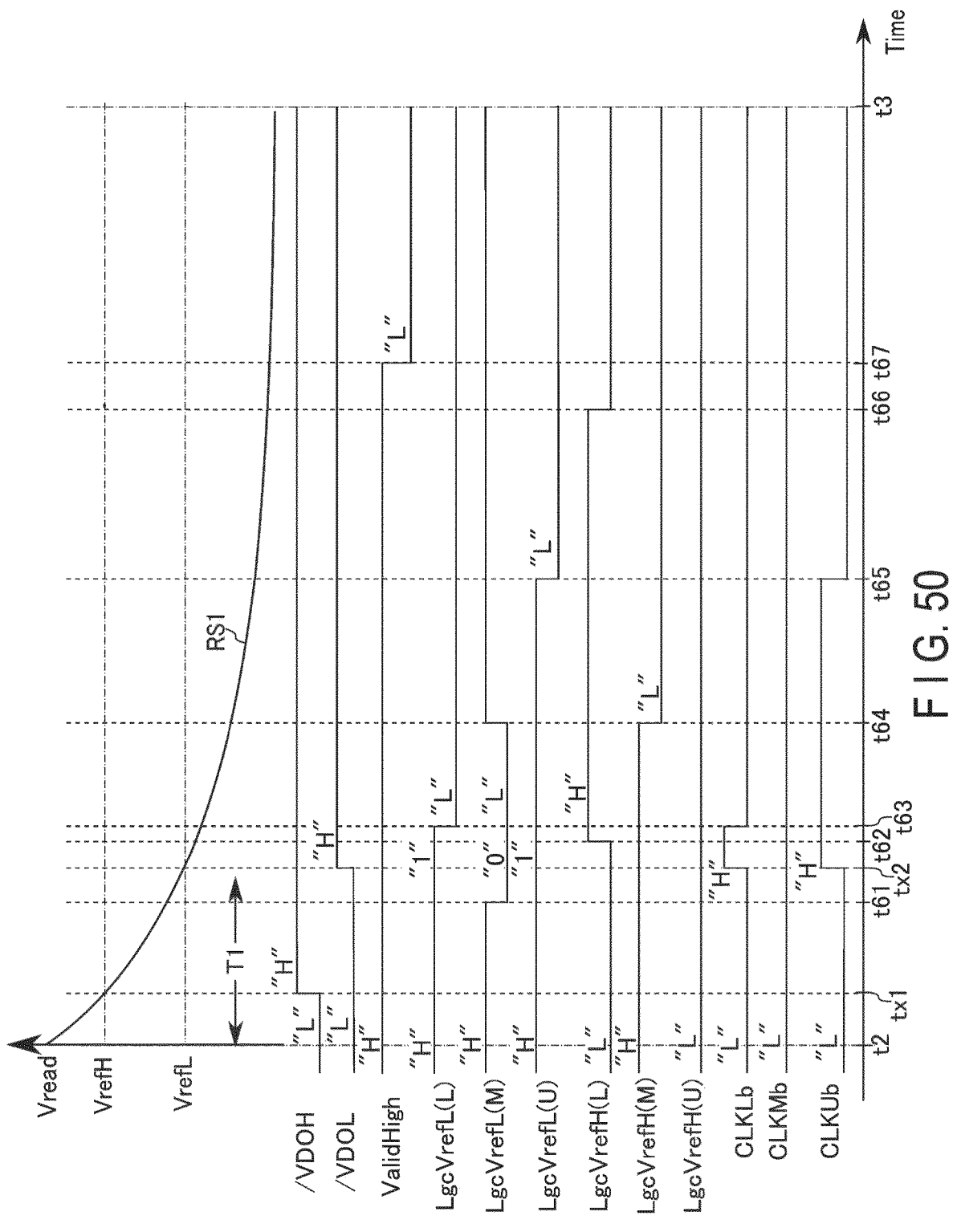
F I G. 50

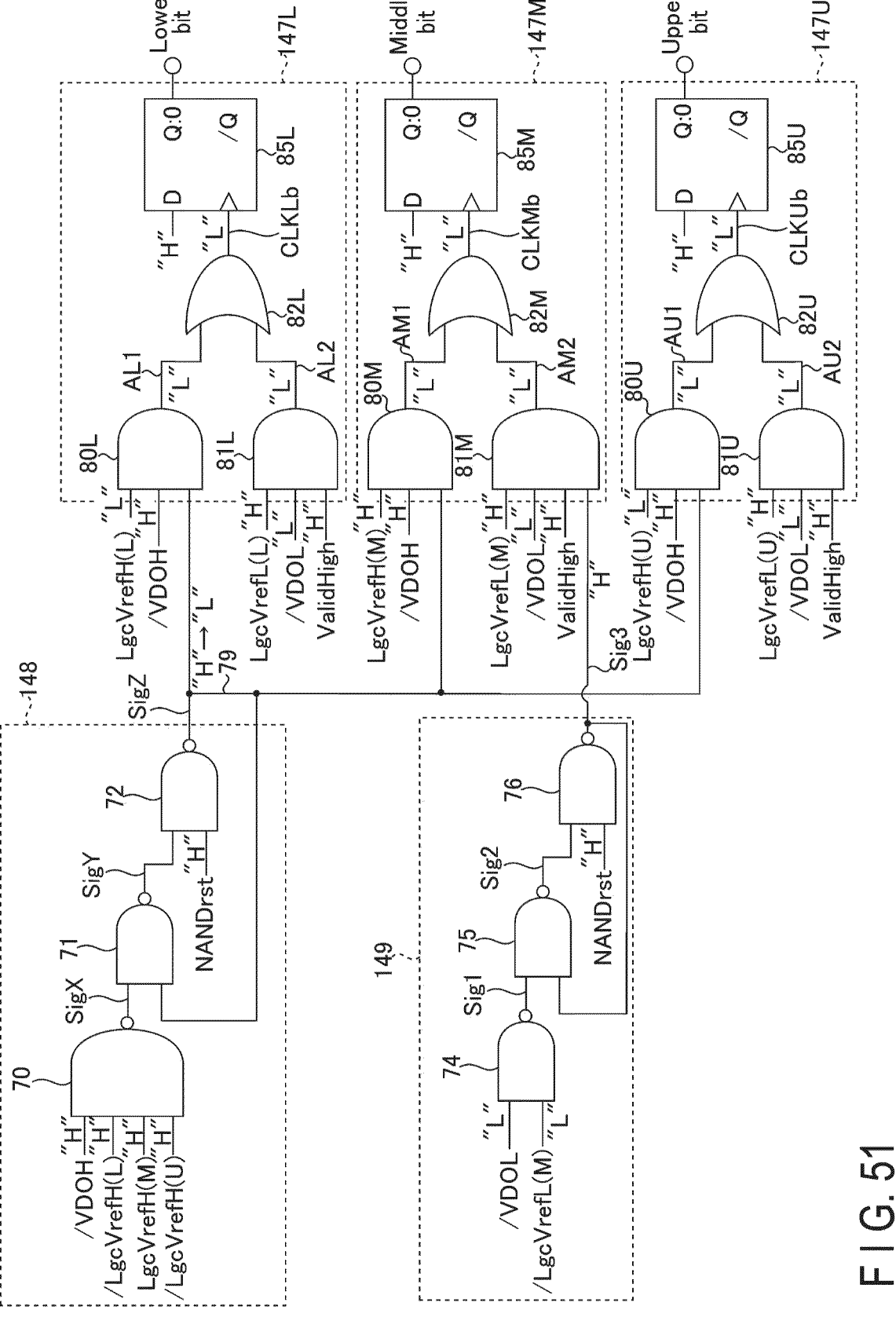
F I G. 51

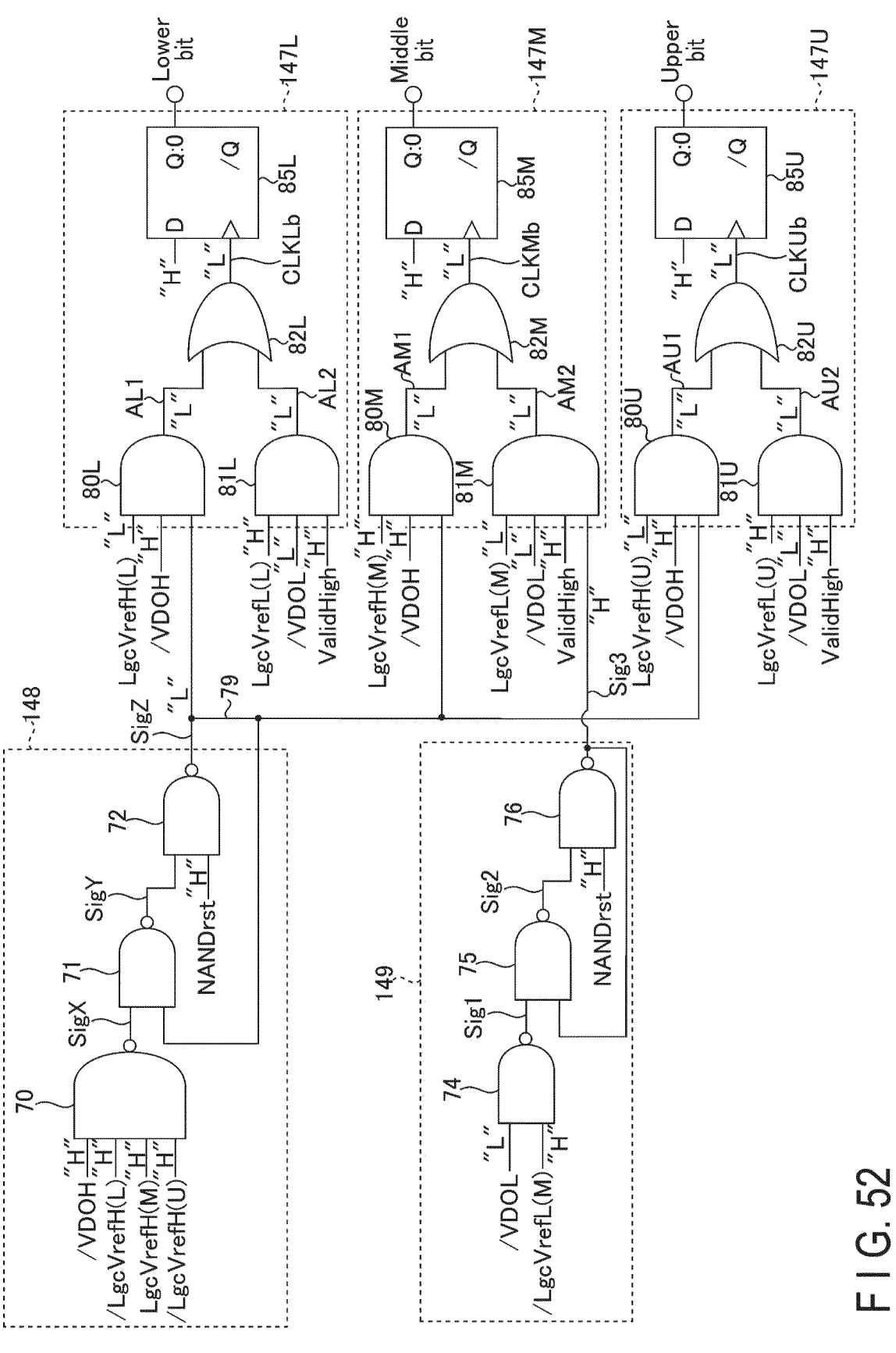
F I G. 52

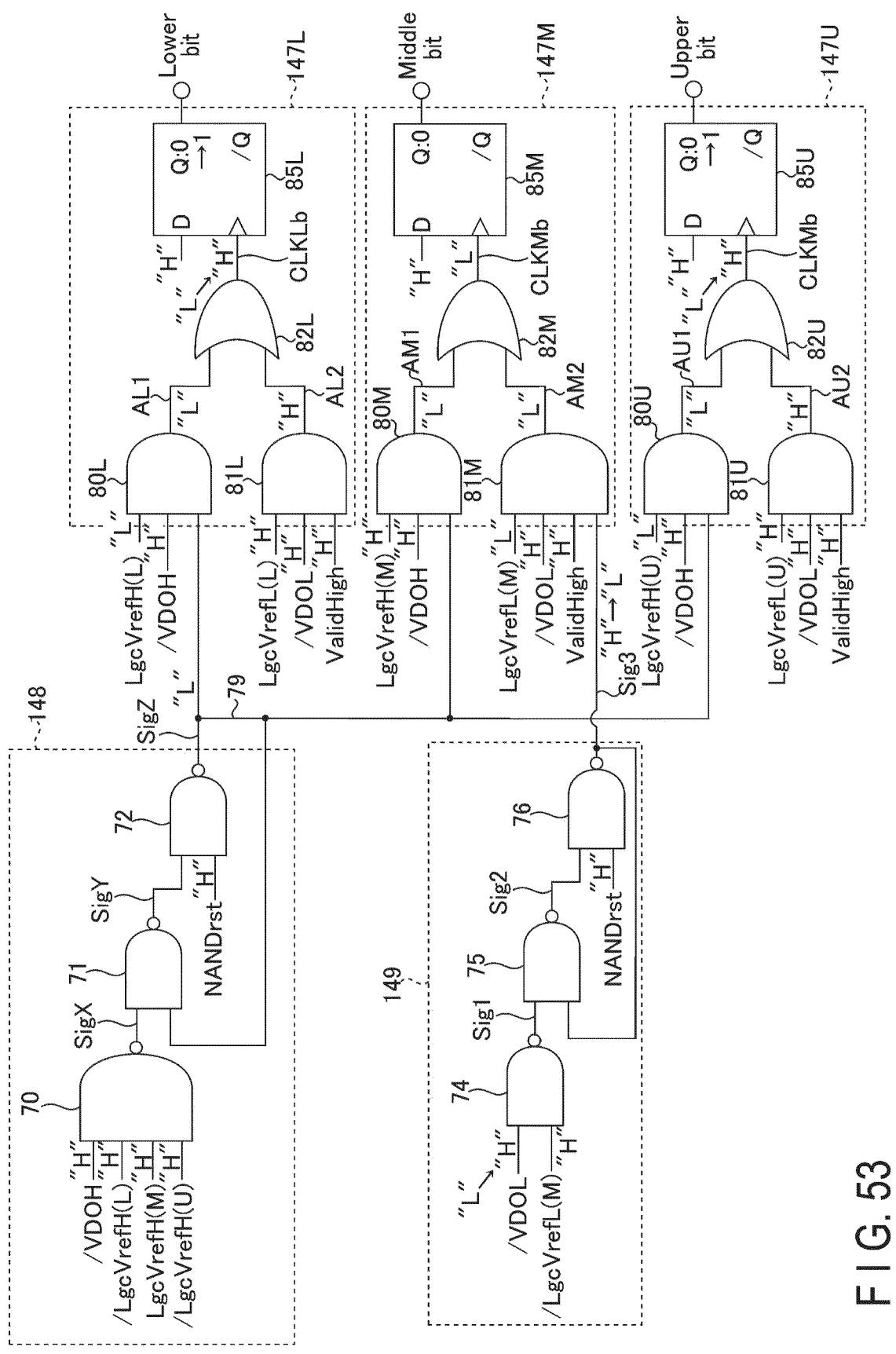
F I G. 53

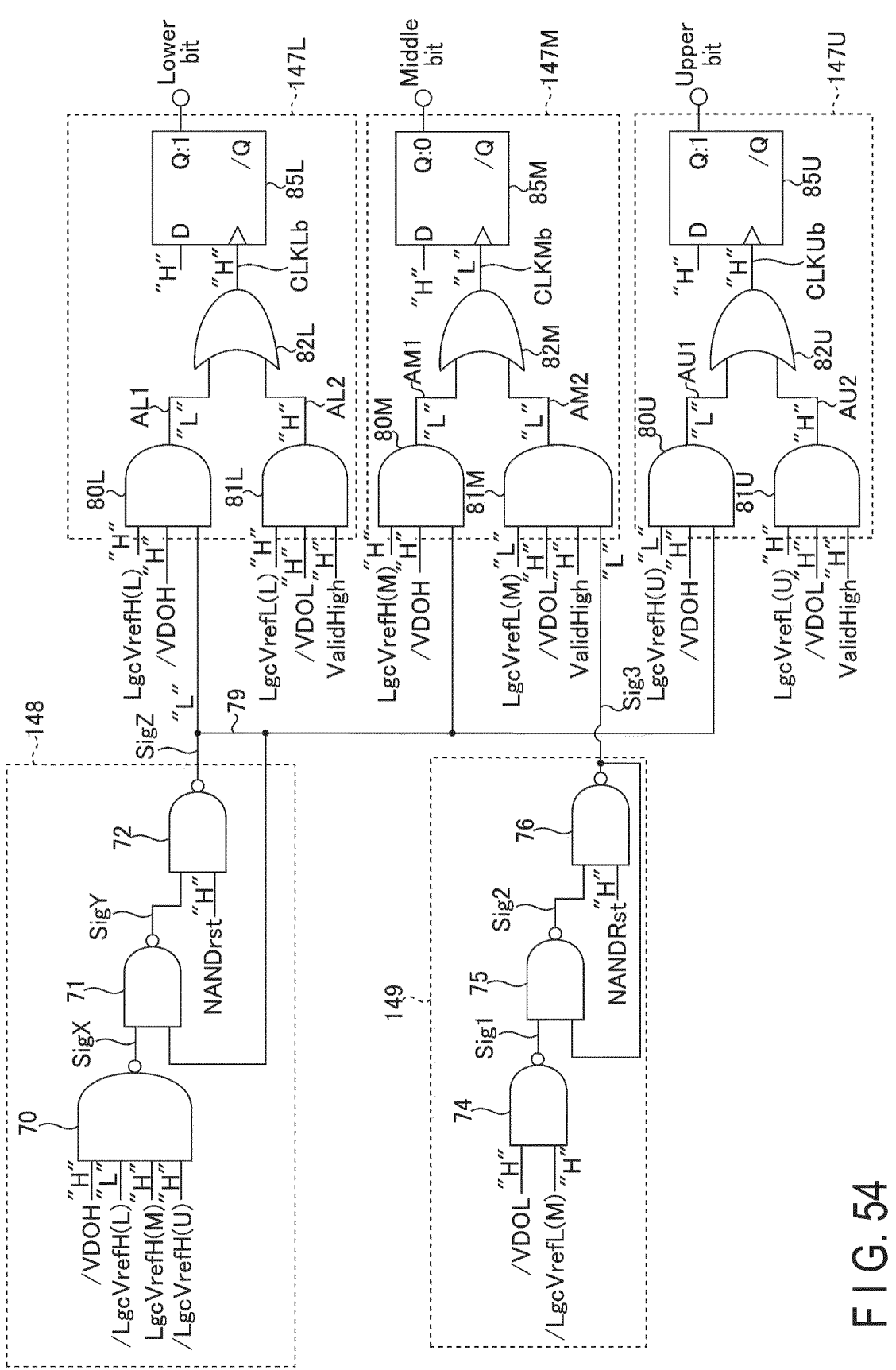
F I G. 54

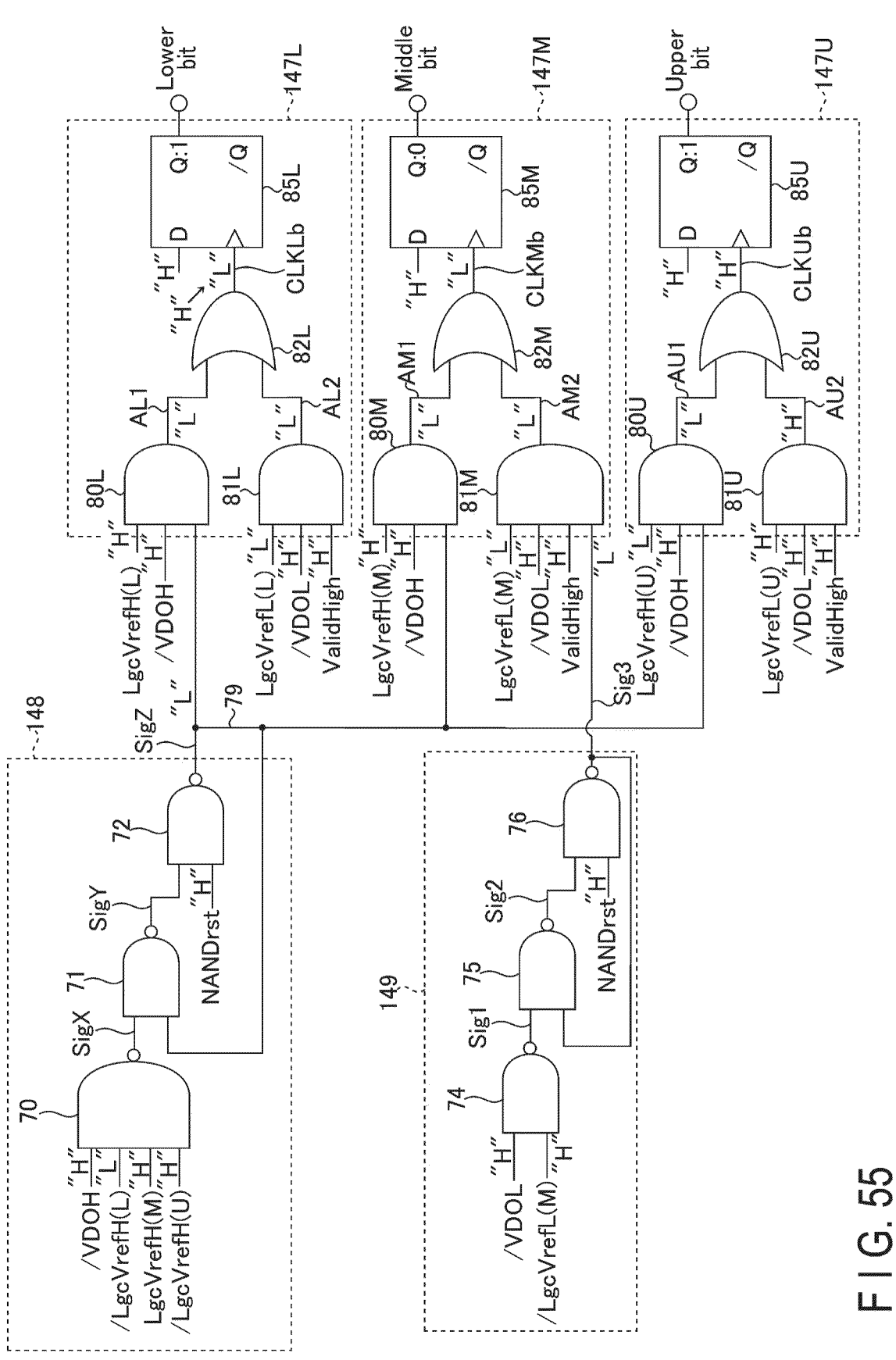
F I G. 55

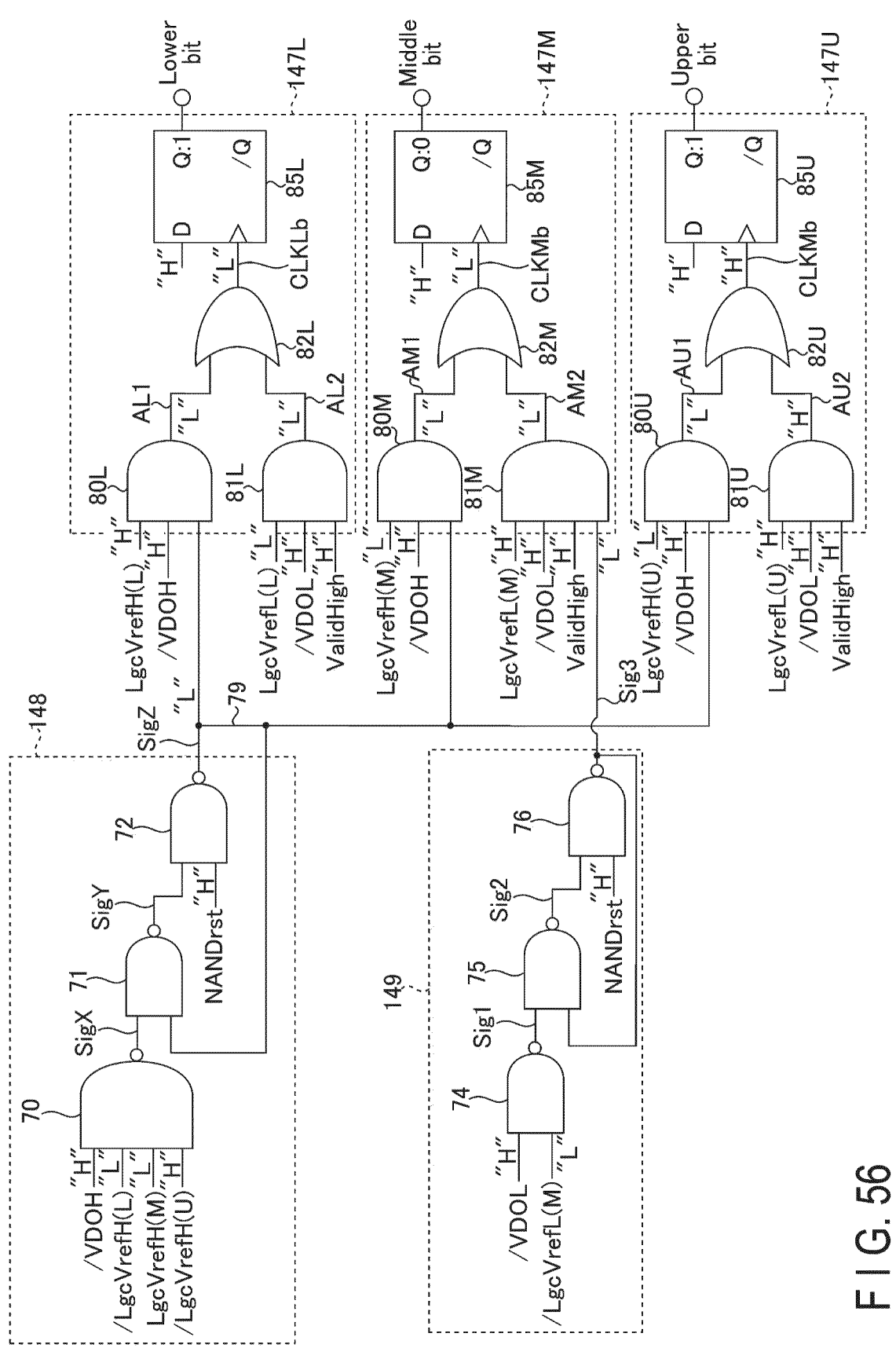
F I G. 56

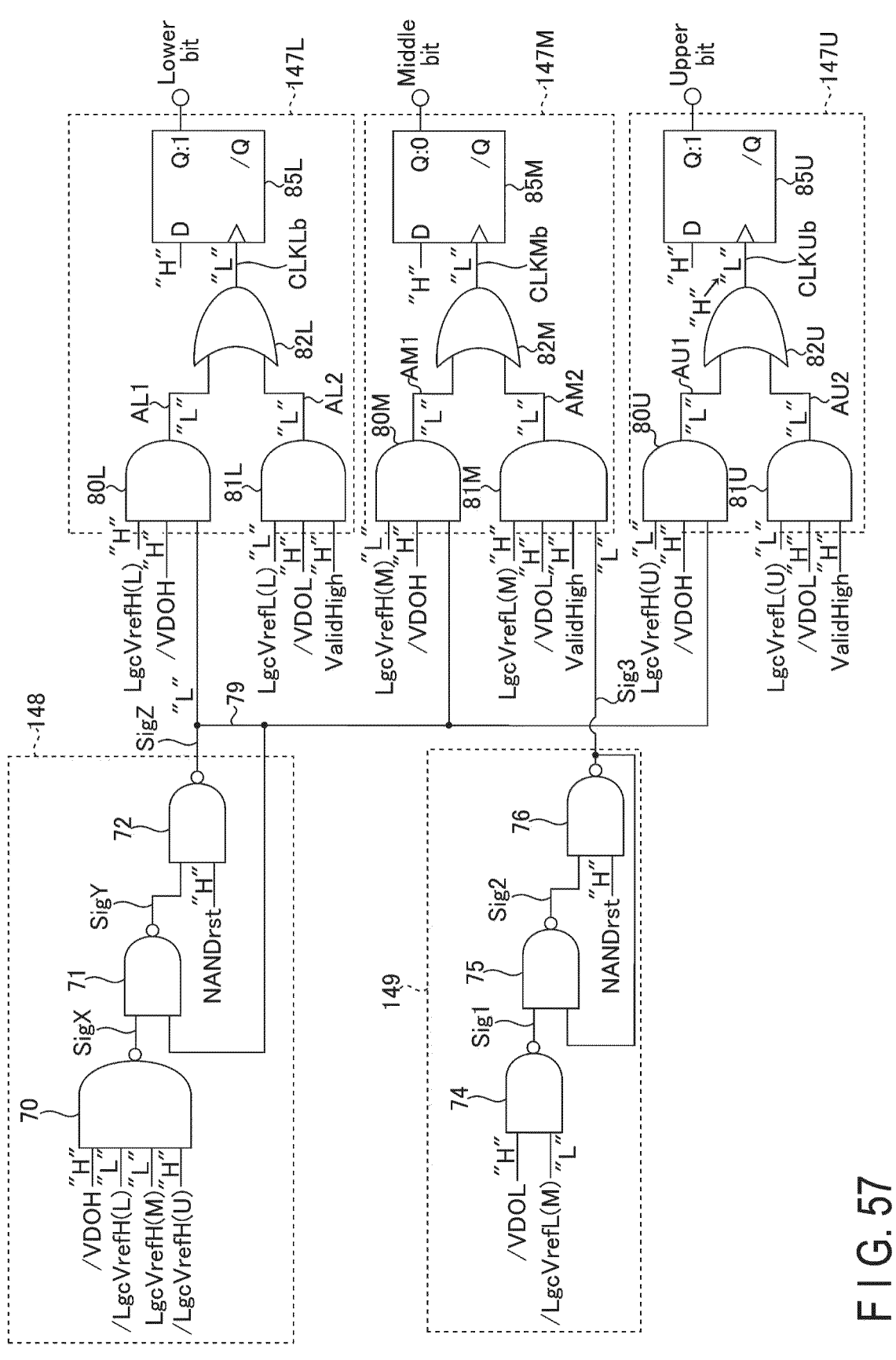
F I G. 57

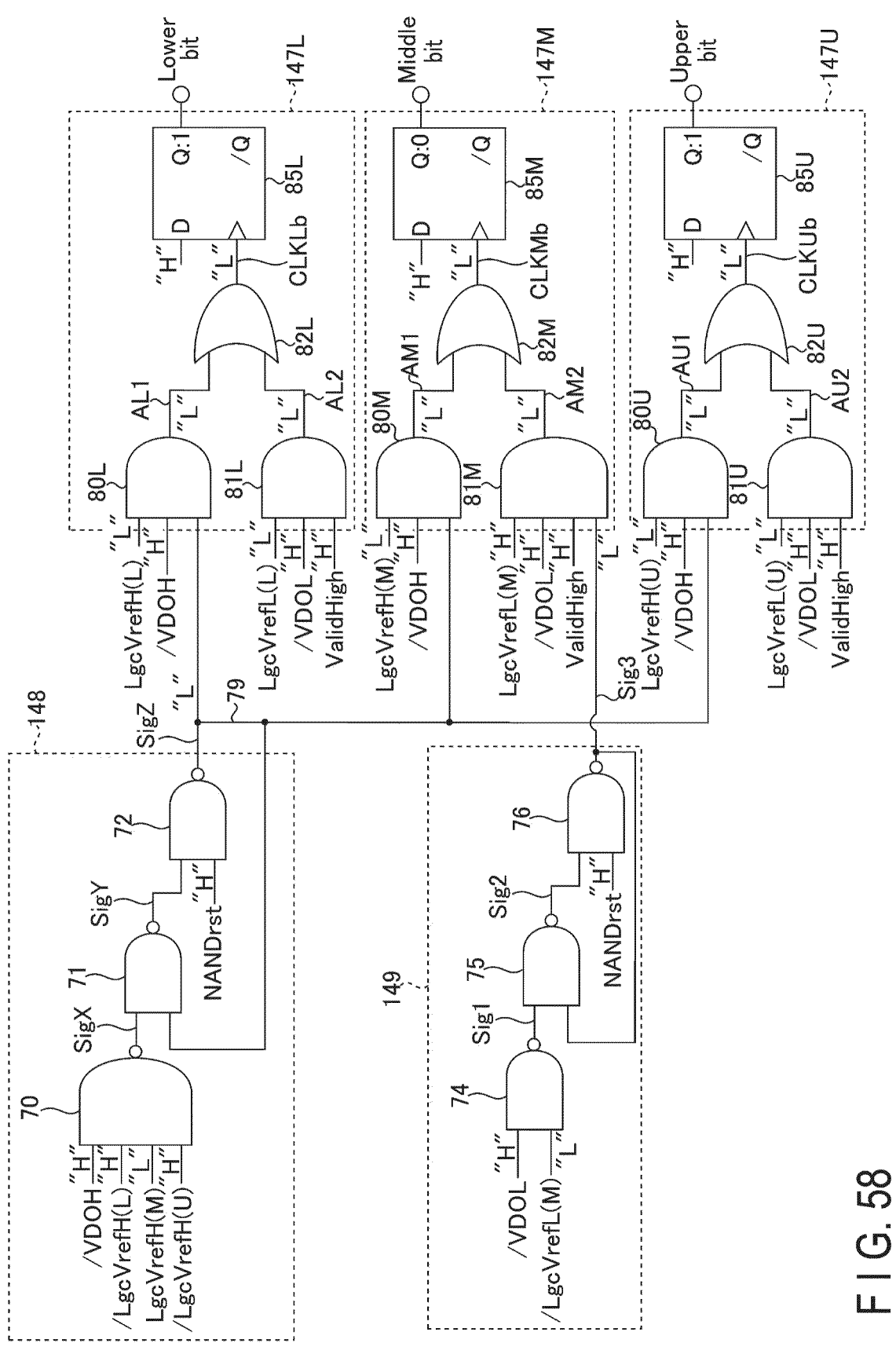
F I G. 58

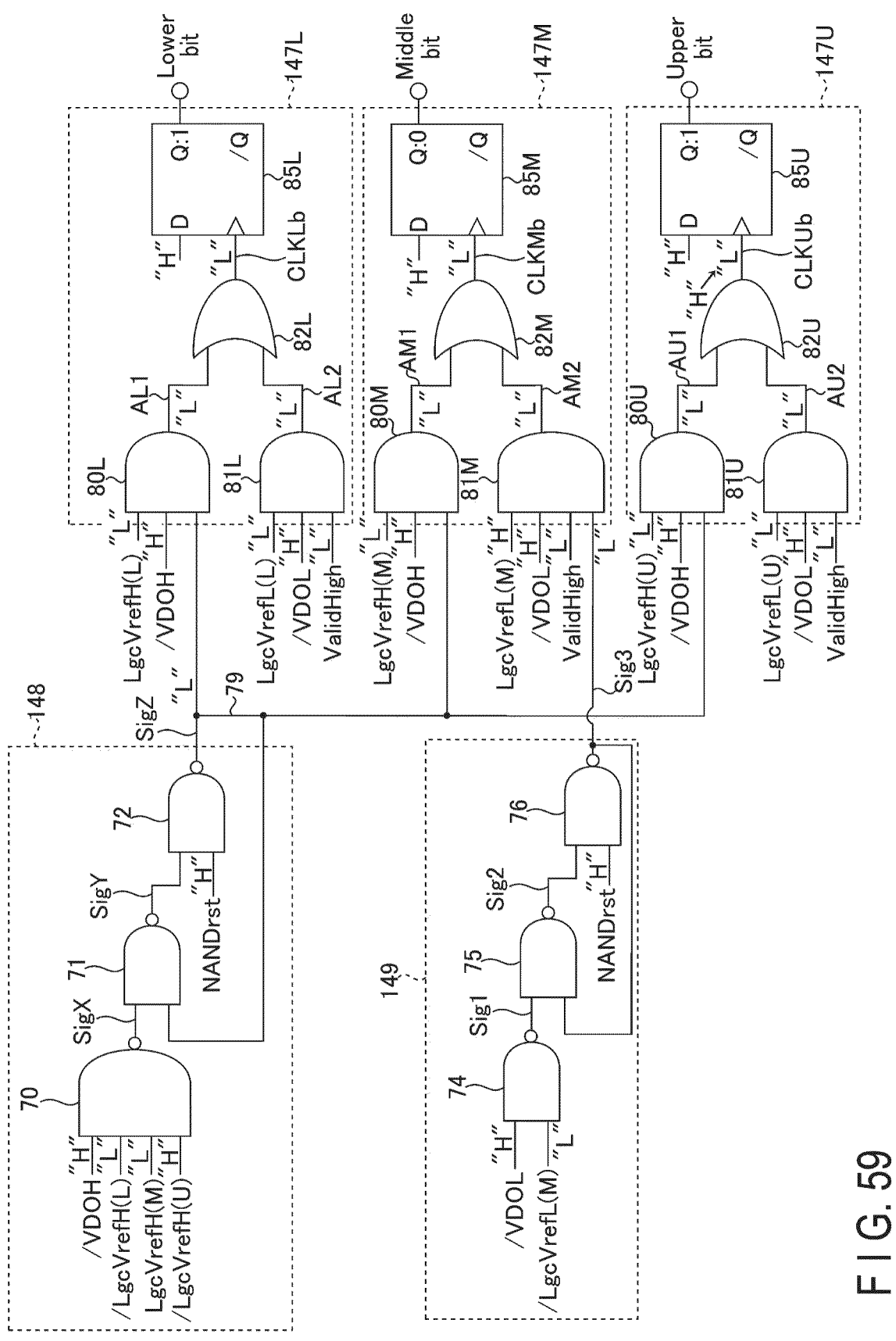
F I G. 59

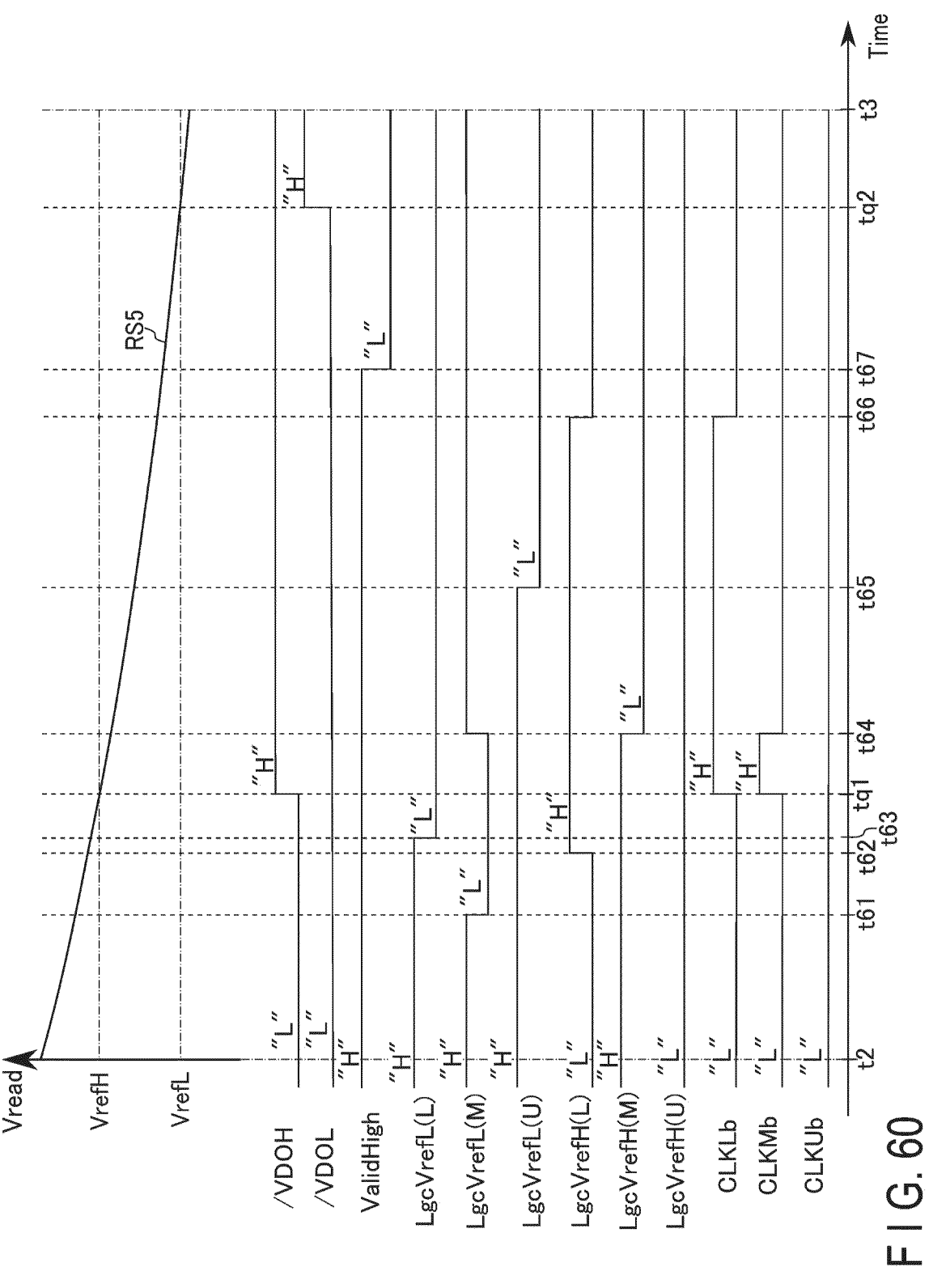
F I G. 60

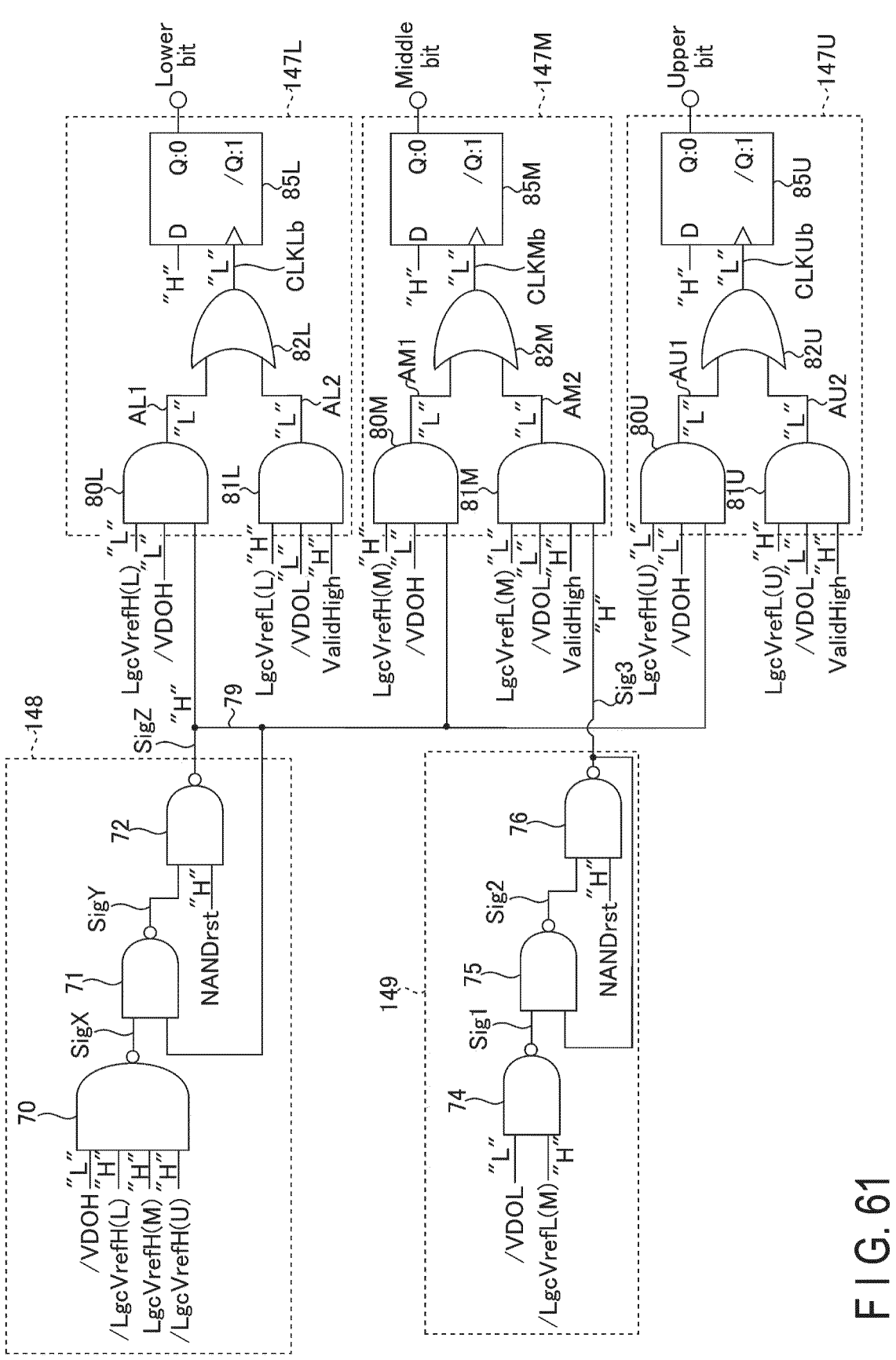
F I G. 61

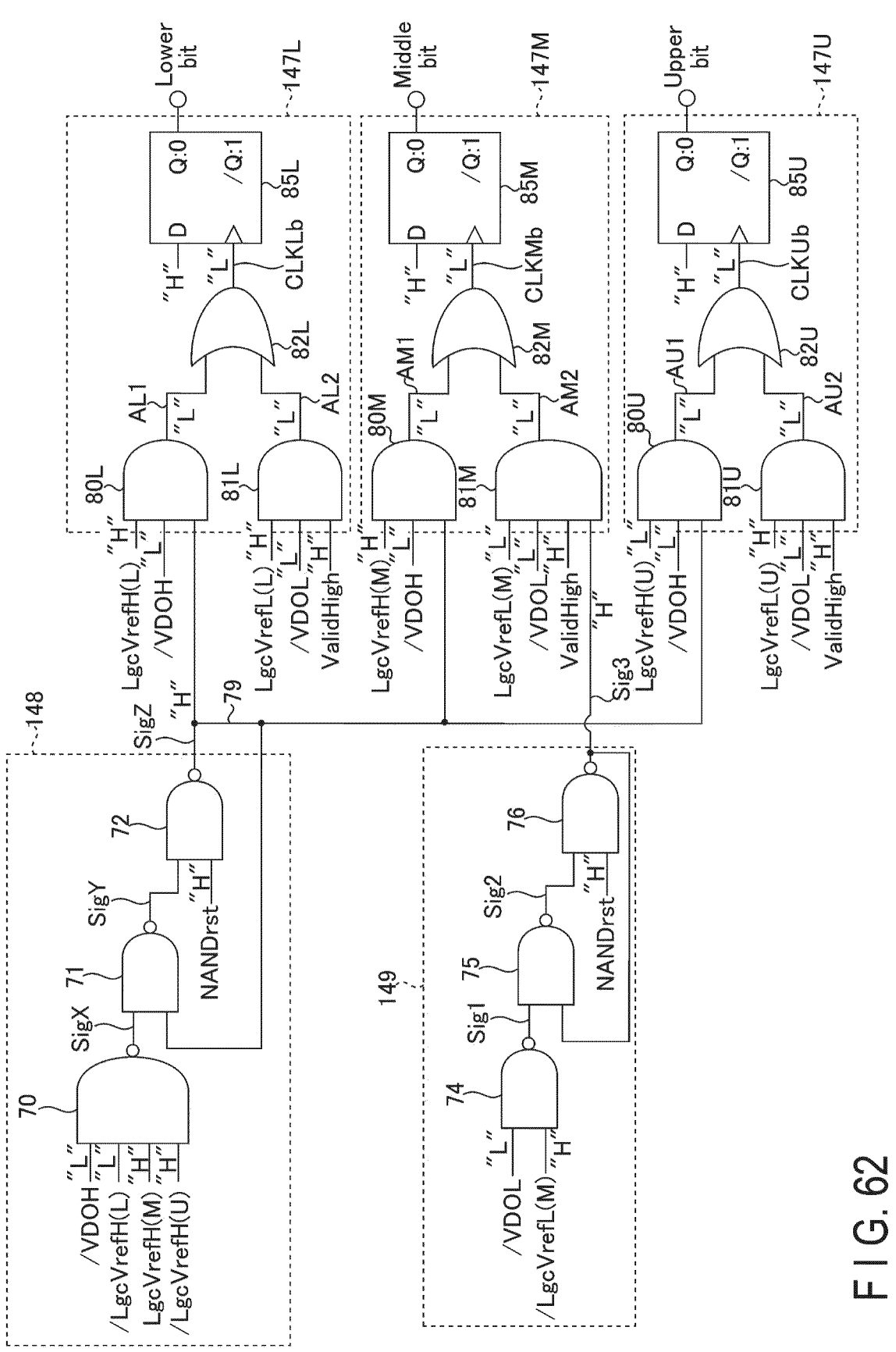
F I G. 62

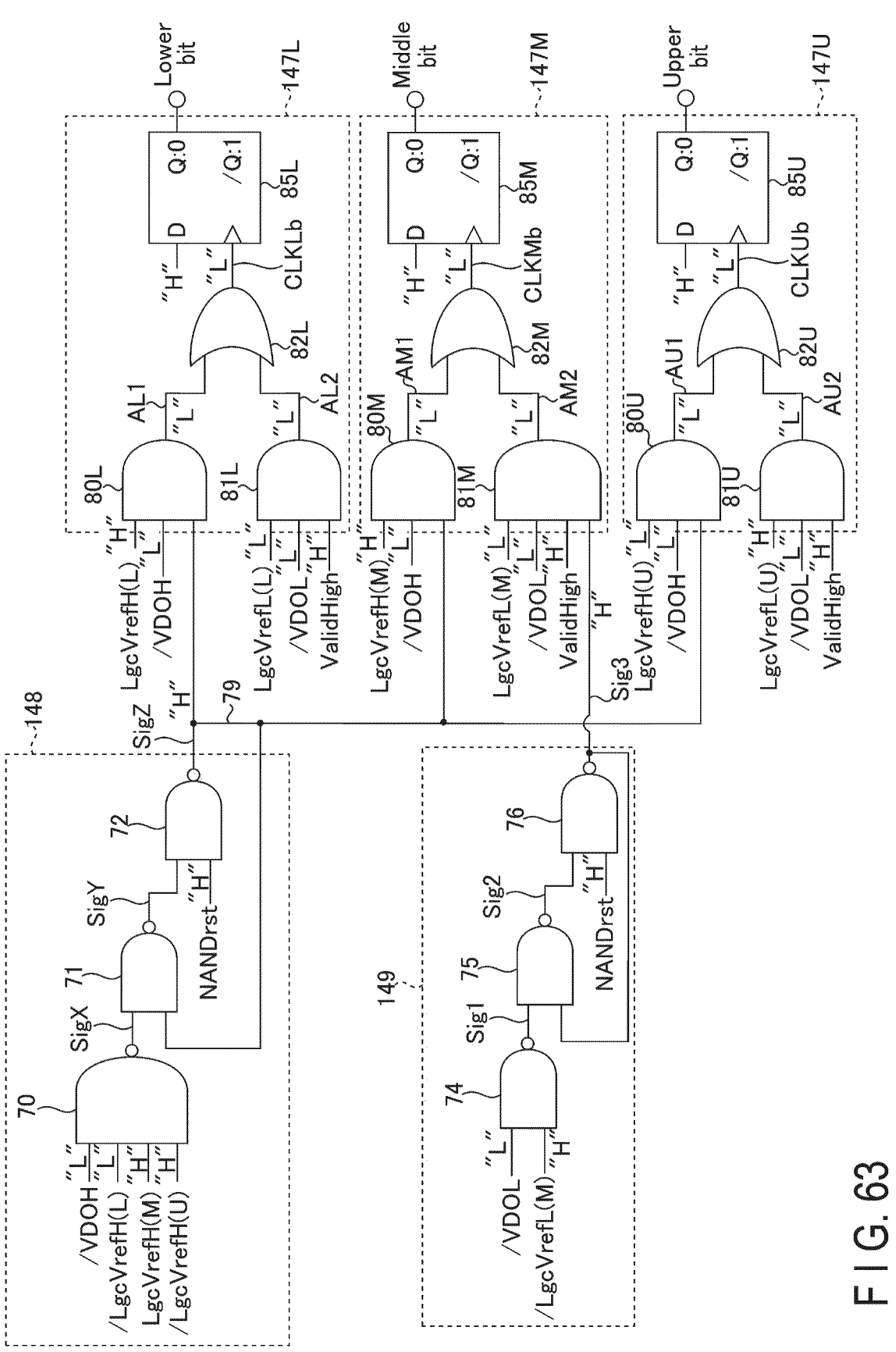
F I G. 63

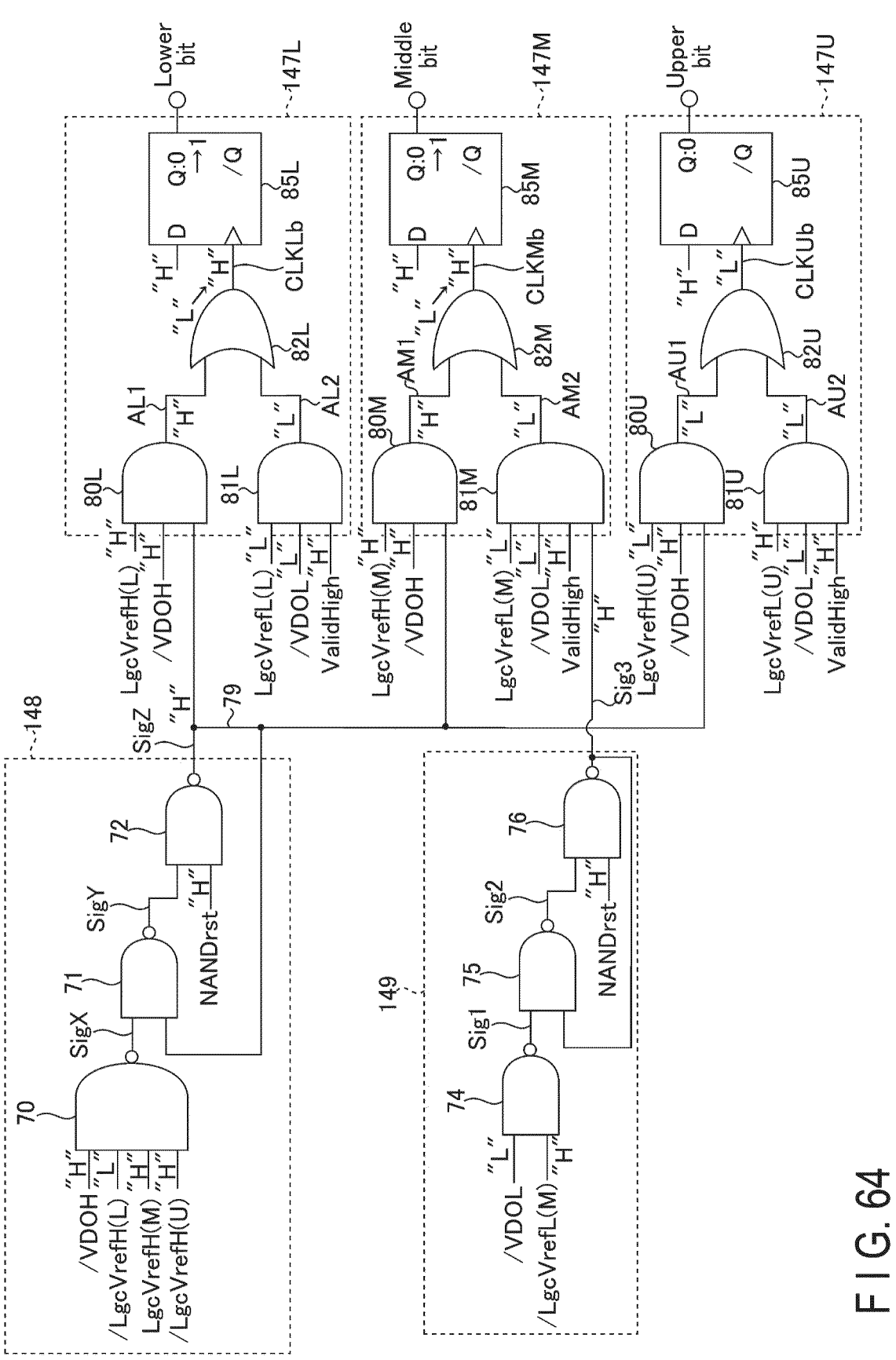
F I G. 64

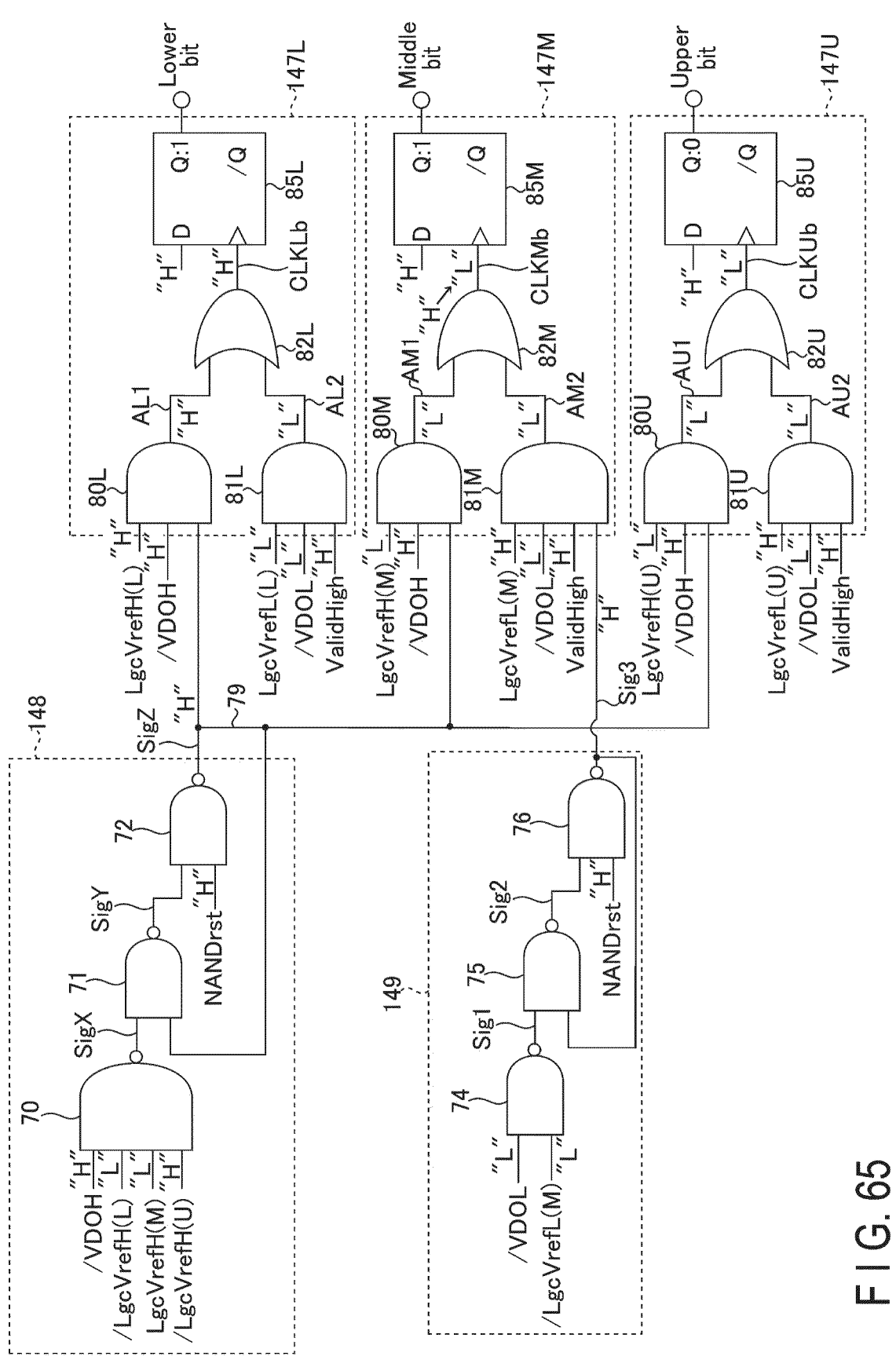
F I G. 65

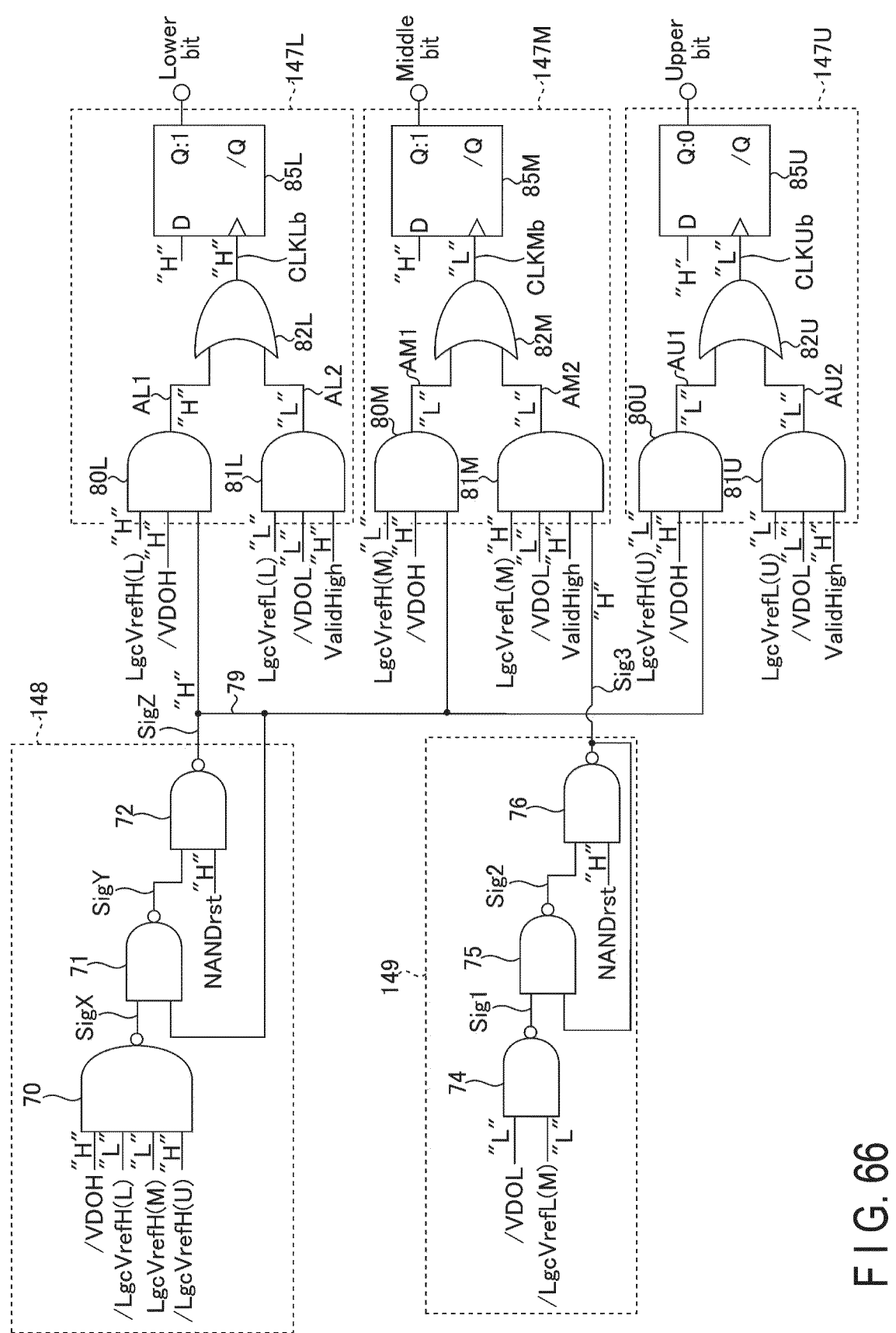
F I G. 66

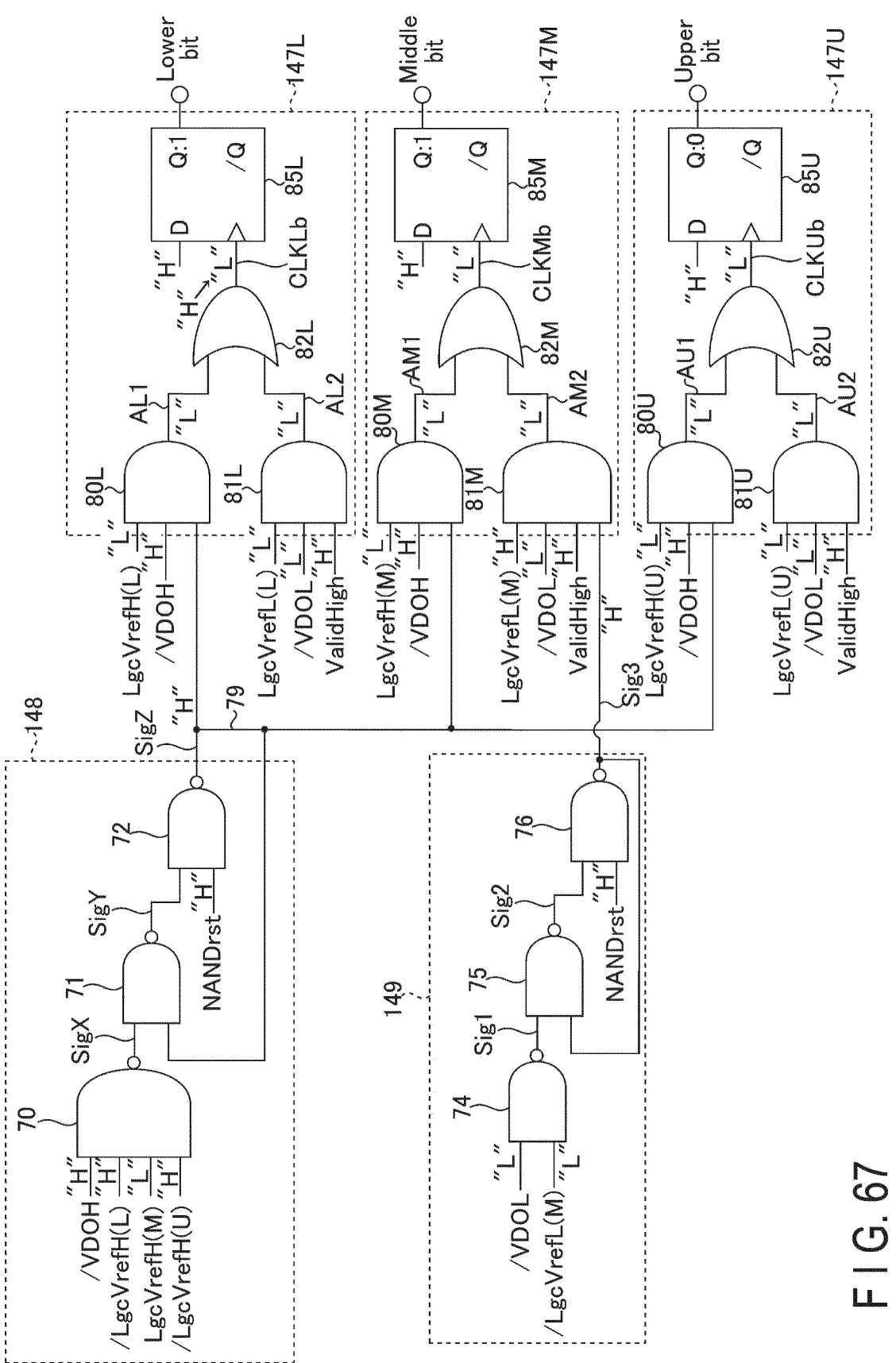
F I G. 67

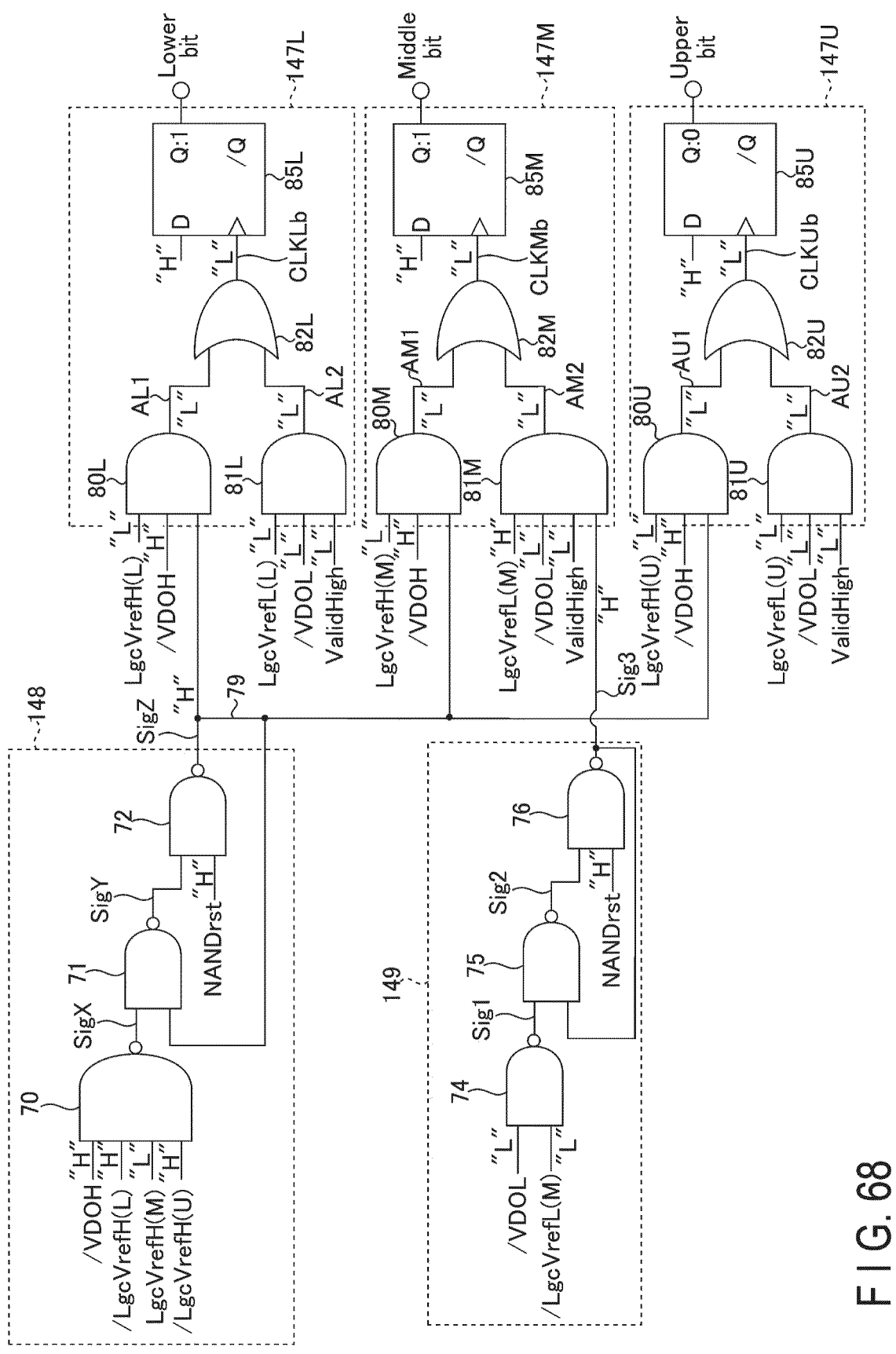
F I G. 68

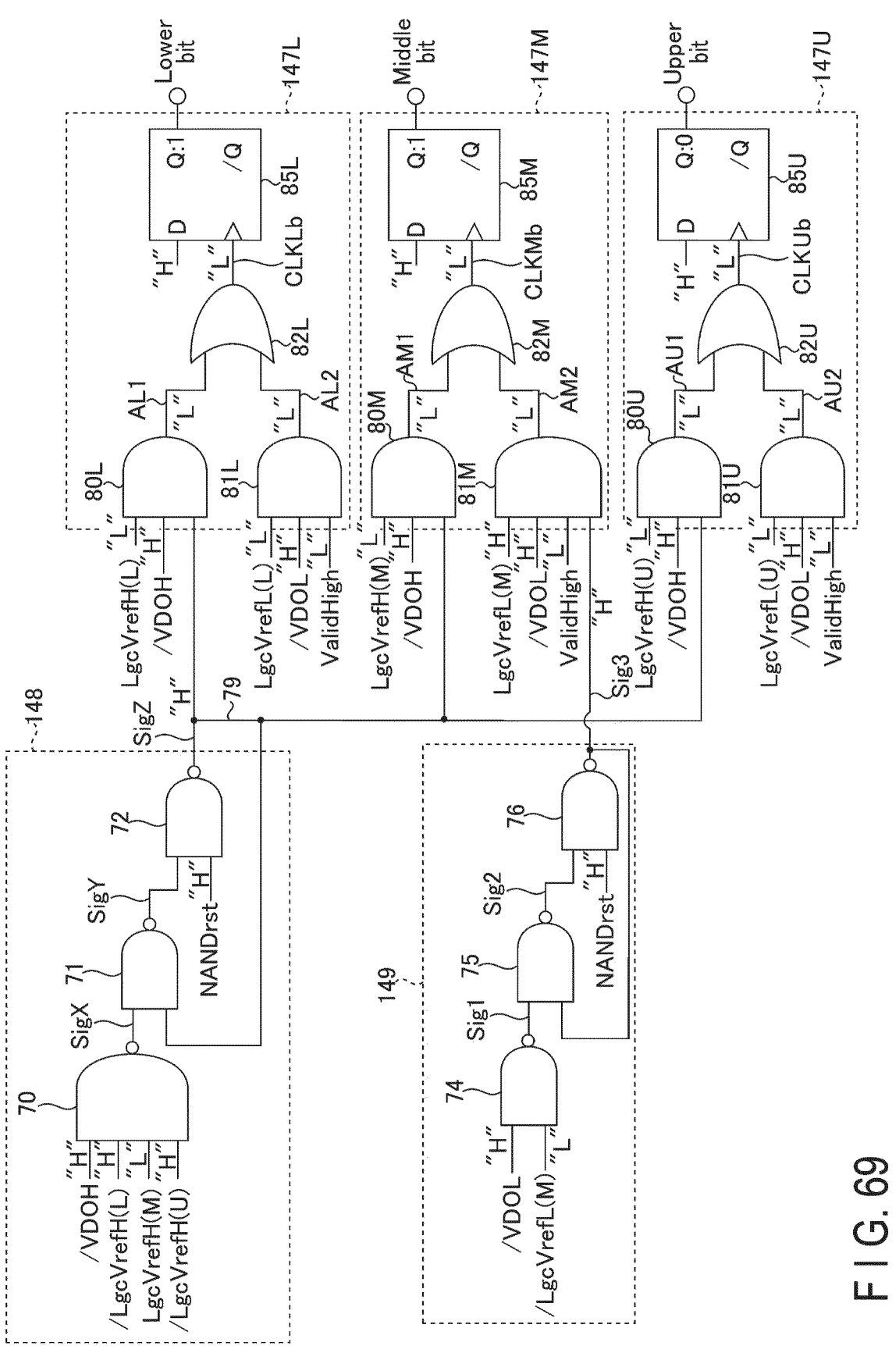
F I G. 69

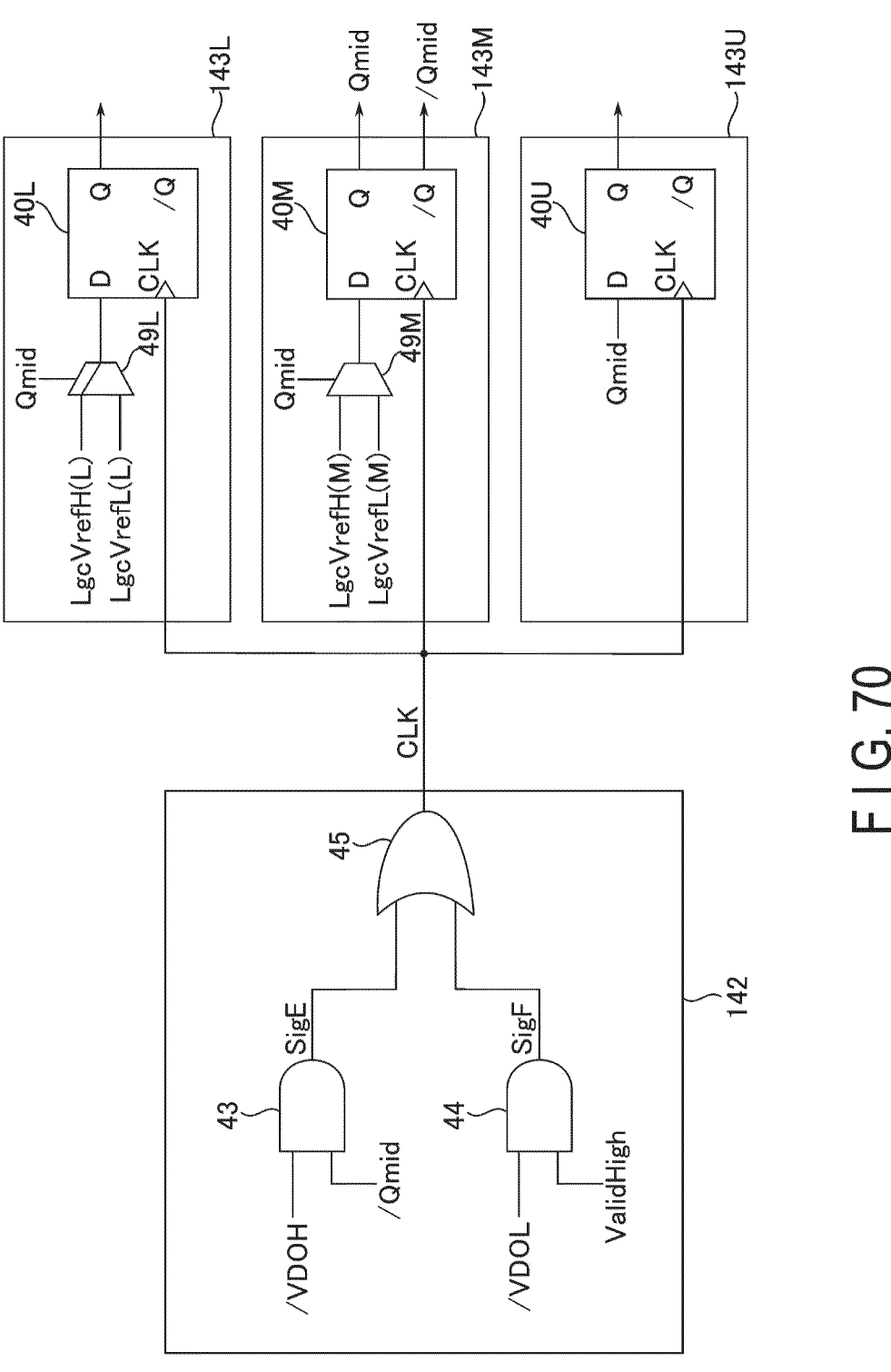
F I G. 70

MEMORY DEVICE STORING A FIRST, SECOND, AND THIRD BIT

CROSS-REFERENCE TO RELATED APPLICATIONS

This application is based upon and claims the benefit of priority from Japanese Patent Application No. 2023-044207, filed Mar. 20, 2023, the entire contents of which are incorporated herein by reference.

FIELD

Embodiments described herein relate generally to a memory device.

BACKGROUND

Memory devices with an integrated form of variable resistance memory elements, such as resistive random access memory (ReRAM) elements, alloy-based phase change memory (PCM) elements, interfacial phase change memory (iPCM) elements, and conductive bridge RAM (CBRAM) elements, have been proposed.

BRIEF DESCRIPTION OF THE DRAWINGS

FIG. 1 is a block diagram for explaining a memory device according to a first embodiment.

FIG. 2 is a circuit diagram of a memory cell array in the memory device according to the first embodiment.

FIG. 3 is a diagram illustrating an operation of a memory cell in the memory device according to the first embodiment.

FIG. 4 is a diagram illustrating an operation of the memory cell in the memory device according to the first embodiment.

FIG. 5 is a sectional view of the memory cell array in the memory device according to the first embodiment.

FIG. 8 is a diagram illustrating a relationship between a resistance state of the memory cell and data stored in the memory device according to the first embodiment.

FIG. 9 is a block diagram showing an exemplary configuration of a sense amplifier in the memory device according to the first embodiment.

FIG. 10 is a block diagram showing an exemplary configuration of a sense amplification circuit of the sense amplifier in the memory device according to the first embodiment.

FIG. 11 is a block diagram showing an exemplary configuration of the sense amplification circuit in the memory device according to the first embodiment.

FIG. 12 is a block diagram showing an exemplary configuration of the sense amplification circuit in the memory device according to the first embodiment.

FIG. 14 is a diagram for explaining a read operation of the memory device according to the first embodiment.

FIG. 15 is a circuit diagram illustrating an overview of the read operation of the memory device according to the first embodiment.

FIG. 16 is a sectional view illustrating an overview of the read operation of the memory device according to the first embodiment.

FIG. 18 is a diagram illustrating temporal changes in a bit line voltage and temporal changes in multiple control signals in the memory device according to the first embodiment.

FIG. 19 is a timing chart illustrating an exemplary operation of the sense amplification circuit in the memory device according to the first embodiment.

FIG. 20 is a timing chart illustrating an exemplary operation of the sense amplification circuit in the memory device according to the first embodiment.

FIG. 21 is a schematic diagram illustrating a state of the sense amplification circuit in operation in the memory device according to the first embodiment.

FIG. 22 is a schematic diagram illustrating a state of the sense amplification circuit in operation in the memory device according to the first embodiment.

FIG. 23 is a schematic diagram illustrating a state of the sense amplification circuit in operation in the memory device according to the first embodiment.

FIG. 24 is a schematic diagram illustrating a state of the sense amplification circuit in operation in the memory device according to the first embodiment.

FIG. 25 is a timing chart illustrating an exemplary operation of the sense amplification circuit in the memory device according to the first embodiment.

FIG. 26 is a schematic diagram illustrating a state of the sense amplification circuit in operation in the memory device according to the first embodiment.

FIG. 27 is a schematic diagram illustrating a state of the sense amplification circuit in operation in the memory device according to the first embodiment.

FIG. 28 is a schematic diagram illustrating a state of the sense amplification circuit in operation in the memory device according to the first embodiment.

FIG. 30 is a schematic diagram illustrating a state of the sense amplification circuit in operation in the memory device according to the first embodiment.

FIG. 31 is a diagram illustrating a relationship between a resistance state of a memory cell and data stored in a memory device according to a second embodiment.

FIG. 32 is a block diagram showing an exemplary configuration of a sense amplification circuit in the memory device according to the second embodiment.

FIG. 33 is a diagram illustrating temporal changes in a bit line voltage and temporal changes in multiple control signals in the memory device according to the second embodiment.

FIG. 34 is a timing chart illustrating an exemplary operation of the sense amplification circuit in the memory device according to the second embodiment.

FIG. 35 is a schematic diagram illustrating a state of the sense amplification circuit in operation in the memory device according to the second embodiment.

FIG. 36 is a schematic diagram illustrating a state of the sense amplification circuit in operation in the memory device according to the second embodiment.

FIG. 37 is a schematic diagram illustrating a state of the sense amplification circuit in operation in the memory device according to the second embodiment.

FIG. 38 is a schematic diagram illustrating a state of the sense amplification circuit in operation in the memory device according to the second embodiment.

FIG. 39 is a schematic diagram illustrating a state of the sense amplification circuit in operation in the memory device according to the second embodiment.

FIG. 40 is a schematic diagram illustrating a state of the sense amplification circuit in operation in the memory device according to the second embodiment.

FIG. 41 is a timing chart illustrating an exemplary operation of the sense amplification circuit in the memory device according to the second embodiment.

FIG. 42 is a schematic diagram illustrating a state of the sense amplification circuit in operation in the memory device according to the second embodiment.

FIG. 43 is a schematic diagram illustrating a state of the sense amplification circuit in operation in the memory device according to the second embodiment.

FIG. 45 is a schematic diagram illustrating a state of the sense amplification circuit in operation in the memory device according to the second embodiment.

FIG. 46 is a schematic diagram illustrating a state of the sense amplification circuit in operation in the memory device according to the second embodiment.

FIG. 47 is a diagram illustrating a relationship between a resistance state of a memory cell and data stored in a memory device according to a third embodiment.

FIG. 48 is a block diagram showing an exemplary configuration of a sense amplification circuit in the memory device according to the third embodiment.

FIG. 49 is a diagram illustrating temporal changes in a bit line voltage and temporal changes in multiple control signals in the memory device according to the third embodiment.

FIG. 50 is a timing chart illustrating an exemplary operation of the sense amplification circuit in the memory device according to the third embodiment.

FIG. 51 is a schematic diagram illustrating a state of the sense amplification circuit in operation in the memory device according to the third embodiment.

FIG. 52 is a schematic diagram illustrating a state of the sense amplification circuit in operation in the memory device according to the third embodiment.

FIG. 53 is a schematic diagram illustrating a state of the sense amplification circuit in operation in the memory device according to the third embodiment.

FIG. 54 is a schematic diagram illustrating a state of the sense amplification circuit in operation in the memory device according to the third embodiment.

FIG. 55 is a schematic diagram illustrating a state of the sense amplification circuit in operation in the memory device according to the third embodiment.

FIG. 56 is a schematic diagram illustrating a state of the sense amplification circuit in operation in the memory device according to the third embodiment.

FIG. 57 is a schematic diagram illustrating a state of the sense amplification circuit in operation in the memory device according to the third embodiment.

FIG. 58 is a schematic diagram illustrating a state of the sense amplification circuit in operation in the memory device according to the third embodiment.

FIG. 59 is a schematic diagram illustrating a state of the sense amplification circuit in operation in the memory device according to the third embodiment.

FIG. 60 is a timing chart for explaining an exemplary operation of the memory device according to the third embodiment.

FIG. 61 is a schematic diagram illustrating a state of the sense amplification circuit in operation in the memory device according to the third embodiment.

FIG. 62 is a schematic diagram illustrating a state of the sense amplification circuit in operation in the memory device according to the third embodiment.

FIG. 63 is a schematic diagram illustrating a state of the sense amplification circuit in operation in the memory device according to the third embodiment.

FIG. 64 is a schematic diagram illustrating a state of the sense amplification circuit in operation in the memory device according to the third embodiment.

FIG. 65 is a schematic diagram illustrating a state of the sense amplification circuit in operation in the memory device according to the third embodiment.

FIG. 66 is a schematic diagram illustrating a state of the sense amplification circuit in operation in the memory device according to the third embodiment.

FIG. 67 is a schematic diagram illustrating a state of the sense amplification circuit in operation in the memory device according to the third embodiment.

FIG. 68 is a schematic diagram illustrating a state of the sense amplification circuit in operation in the memory device according to the third embodiment.

FIG. 69 is a schematic diagram illustrating a state of the sense amplification circuit in operation in the memory device according to the third embodiment.

FIG. 70 is a block diagram showing an exemplary configuration of a sense amplification circuit in a memory device according to a fourth embodiment.

DETAILED DESCRIPTION

Figure 6:
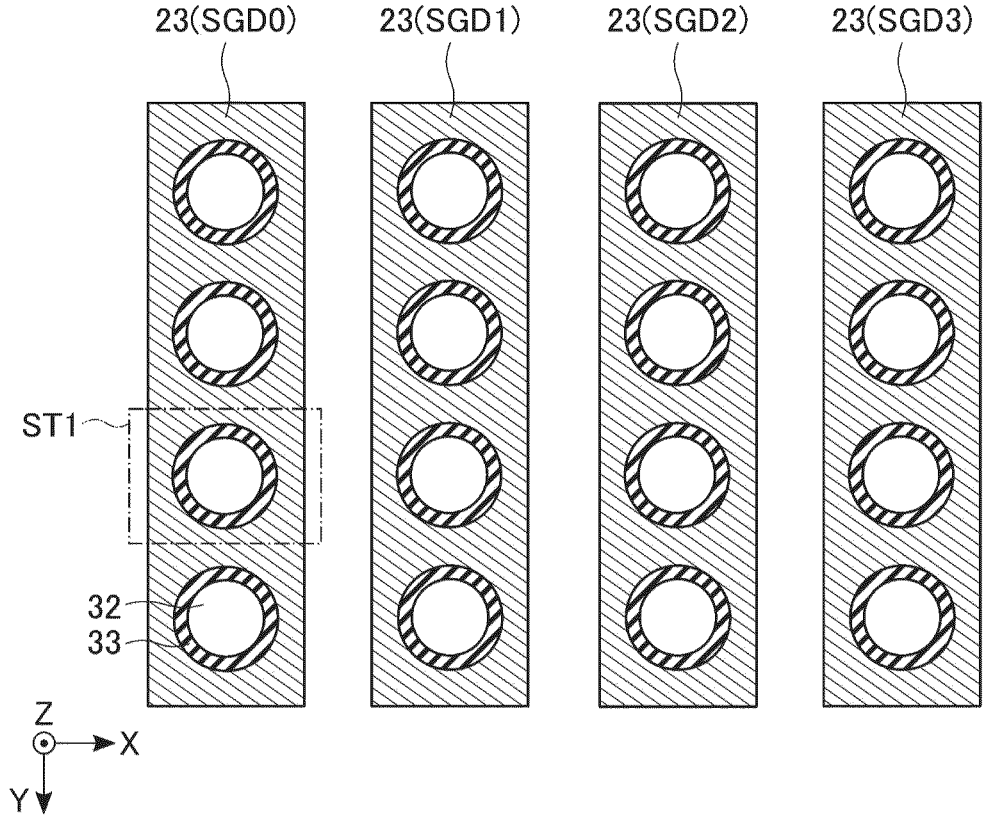
FIG. 6 is a sectional view taken along the line A-A in FIG. 5.

Memory devices according to embodiments will be described with reference to FIGS. 1 to 70.

The embodiments will be described in detail with reference to the drawings. The description will use the same reference signs for the elements or components having the same or substantially the same functions and configurations. For each embodiment below, where multiple elements or components of the same type may be involved (e.g., circuits, interconnects, a variety of voltages and signals, and so on), the description may add different numerals or alphabetic letters to the ends of the respective reference signs for discrimination therebetween. If discrimination between such elements or components is not required, the description will omit additional numerals or alphabetic letters so that the elements, etc., are denoted only by the corresponding reference signs.

EMBODIMENTS

In general, according to one embodiment, a memory device includes: a memory cell coupled to a bit line and a word line and configured to store first data including a first bit, a second bit, and a third bit; and a sense amplification circuit configured to perform a first comparison between a bit line voltage of the bit line and a first reference voltage, and a second comparison between the bit line voltage and a second reference voltage lower than the first reference voltage, and to read the first data from the memory cell based on a result of the first comparison and a result of the second comparison, wherein the sense amplification circuit is configured to retain second data having a first code in response to the bit line voltage becoming equal to or lower than the first reference voltage during a first period from a start of operation of the sense amplification circuit to a first time point, and retain the first data after the first period.

(1) First Embodiment

FIGS. 1 to 30 will be referred to for describing a memory device according to the first embodiment.

(a) Exemplary Configuration

<a-1> Overall Configuration of Memory System

An overall configuration of a memory system which includes the memory device according to the embodiment will be described with reference to FIG. 1.

FIG. 1 is a block diagram showing an overall configuration of the memory system, in which the memory device 1 according to the embodiment is included.

As shown in FIG. 1, this memory system 99 includes the memory device 1 and a controller 2. The memory device 1 and the controller 2, for example, may together constitute a storage device. Examples of such a storage device include a memory card, such as an SD™ card, and a solid state drive (SSD), etc.

The memory device 1 stores data in a nonvolatile manner.

The controller 2 is connected to the memory device 1 via a memory bus. The controller 2 controls various operations of the memory device 1. The memory bus enables signal transmission and reception in compliance with a memory interface. The controller 2 is connected to a host device 3 via a host bus. The controller 2 accesses the memory device 1 in response to a host command received from the host device 3.

Examples of the host device 3 include a digital camera, a personal computer, a smartphone, a mobile terminal, and so on. The host bus is, for example, a bus which complies with various interface standards such as an SD™ interface, SATA, USB, PCIExpress, etc.

<Configuration of Controller 2>

As shown in FIG. 1, the controller 2 includes a host interface circuit (host I/F) 210, an internal memory (random access memory: RAM) 220, a processor (central processing unit: CPU) 230, a buffer memory 240, a memory interface circuit (memory I/F) 250, and an error checking and correcting (ECC) circuit 260.

The host interface circuit 210 is connected to the host device 3 via the host bus. The host interface circuit 210 transfers a host command and data received from the host device 3 to the processor 230 and the buffer memory 240, respectively. The host interface circuit 210 transfers data in the buffer memory 240 to the host device 3 in response to instructions from the processor 230.

The internal memory 220 is constituted by, for example, a DRAM and/or an SRAM, or any type of semiconductor memories. The internal memory 220 is used as an operating area for the processor 230. In one example, the internal memory 220 stores firmware for managing the memory device 1 and/or various management tables, etc.

The processor 230 takes total control over operations of the controller 2. For example, upon receiving a host command for a read operation from the host device 3, the processor 230 causes, based on the host command, the memory interface circuit 250 to issue a read command (a memory command) to the memory device 1. If a host command for a write operation is received from the host device 3, the processor 230 then causes, based on the host command, the memory interface circuit 250 to issue a write command to the memory device 1. The processor 230 conducts a variety of processing (e.g., wear leveling) for managing the memory device 1.

The buffer memory 240 temporarily retains data to be written into the memory device 100 and data read from the memory device 1. Data to be written into the memory device 1 may be called "write data". Data read from the memory device 1 may be called "read data".

The memory interface circuit 250 is connected to the memory device 1 via the memory bus. The memory interface circuit 250 controls communications between the memory device 1 and the controller 2. The memory interface circuit 250 sends various signals to the memory device 1 according to instructions from the processor 230. The memory interface circuit 250 receives various signals from the memory device 1.

The ECC circuit 260 performs error detection and correction processes for data stored in the memory device 1. More specifically, the ECC circuit 260 generates an error correction code in the course of a data write operation. The ECC circuit 260 adds the generated error correction code to the data to be written into the memory device 1. At the time of a data read operation, the ECC circuit 260 decodes the error correction code of the data read from the memory device 1.

<Configuration of Memory Device 1>

As shown in FIG. 1, the memory device 1 includes a memory cell array 110, a row decoder 120, a driver 130, a sense amplifier 140, a data register 150, an address register 160, a command register 170, and a sequencer 180.

The memory cell array 110 includes multiple blocks BLK. The multiple blocks BLK each include multiple memory cells associated with rows (word lines) and columns (bit lines). As one example, FIG. 1 shows 4 blocks BLK0 to BLK3. The memory cell array 110 stores data from the controller 2 in the memory cells.

The row decoder 120 selects one of the blocks BLK0 to BLK3 based on a block address BA in the address register 160. The row decoder 120 selects a word line in the selected block BLK.

The driver 130 supplies voltages to the selected block BLK via the row decoder 120 based on a page address PA in the address register 160. In one example, the driver 130 further includes a source line driver, etc.

The sense amplifier 140 includes sense amplification circuits SA for respective bit lines BL. In a data read operation, the sense amplifier 140 senses data read from the memory cell array 110. The sense amplifier 140 performs a variety of processing on the read data (signal). The sense amplifier 140 transmits data DAT to the data register 150. In a data write operation, the sense amplifier 140 transfers data DAT received from the data register 150 to the memory cell array 110.

The data register 150 includes one or more latch circuits. The one or more latch circuits are capable of storing (retaining) read data or to-be-written data. For example, for a read operation, the data register 150 temporarily retains data (read data) DAT received from the sense amplifier 140. The data register 150 outputs the data DAT from the sense amplifier 140 to the controller 2. For a write operation, the data register 150 temporarily stores data (write data) DAT received from the controller 2. The data register 150 sends the data DAT from the controller 2 to the sense amplifier 140.

The address register 160 stores an address ADD received from the controller 2. The address ADD includes a block address BA and a page address PA as mentioned above.

The command register 170 stores a command CMD received from the controller 2.

The sequencer 180 takes total control over operations of the memory device 1. In one example, the sequencer 180 controls, based on the command CMD in the command register 170, components such as the row decoder 120, the driver 130, the sense amplifier 140, and the data register 150. The sequencer 180 thus conducts a read operation, a write operation, etc., according to the command CMD.

(a-2) Configuration of Memory Cell Array 110

<Circuit Configuration>

FIG. 2 will be referred to for describing a circuit configuration of the memory cell array 110 in the memory device 1 according to the embodiment. FIG. 2 is an equivalent circuit diagram showing an exemplary circuit configuration of the memory cell array 110 in the memory device 1 according to the embodiment. Here, one of the multiple blocks BLK included in the memory cell array 110 is extracted and shown in FIG. 2.

In one example, as shown in FIG. 2, each of the blocks BLK in the memory cell array 110 includes 4 string units SU (SU0 to SU3). The string units SU each include multiple memory cell strings MS. Each block BLK may include any number of string units SU. Each string unit SU may include any number of memory cell strings MS.

In one example, each memory cell string MS includes 16 memory cells MC (MC0 to MC15) and a select transistor ST1. In the description below, each memory cell will be simply called a "memory cell MC" if discriminating the memory cells MC0 to MC15 from one another is not required. Each memory cell string MS may include any number of memory cells MC without a limitation, and such a number may be 8, 32, 48, 64, 96, 128, etc. Also, each memory cell string MS may include any number of select transistors ST1, and such a number may be at least one.

Each memory cell MC includes a memory element (a variable resistance memory region, a variable resistance layer, or a variable resistance element) MR and a selector SW. Examples of the memory element MR include an alloy-based phase change element ($Ge_2Sb_2Te_5$). The memory element MR according to the embodiment changes its crystalline state so as to turn into a resistance state according to the crystalline state. By way of example, the description will assume a case where the memory element MR takes eight resistance states RS (RS0 to RS7). Resistance values corresponding to the resistance states RS0 to RS7 will be referred to as resistance values R0 to R7 (where R0<R1<R2<R3<R4<R5<R6<R7), respectively.

In one example, a 3-bit value is assigned to each of the eight resistance states. Each memory cell MC thus stores 3-bit data.

Note that the number of resistance states RS of a memory element MR is not limited. The memory element MR may be capable of taking any number of resistance states RS, and such a number may be 2, 4, 16, and so on. For example, if the memory element MR is adapted to take two resistance states, a low resistance state (LRS) of the memory element MR may be called a "set state", and a high resistance state (HRS) of the memory element MR may be called a "reset state".

According to the embodiment, the selector SW includes a semiconductor layer, a gate insulating film, and a gate electrode. In each memory cell MC, the memory element MR and the selector SW are connected in parallel.

Referring to FIGS. 3 and 4, operational features of the memory cell MC in an unselected state and that in a selected state will be explained.

In instances where the memory cell MC is in the unselected state, the selector SW is placed in an on state (a conductive state). As shown in FIG. 3, with the selector SW being in the on state, an inversion layer (a channel layer) is generated in the semiconductor layer of the selector SW. Accordingly, a current flows through the inversion layer in the unselected memory cell MC.

Note that, in one example, the resistance value R0 of the memory element MR in the lowest resistance state RS0 is 10 times (an order of magnitude) or more higher than the resistance value of the semiconductor layer of the on-state selector SW. As such, with the on-state selector SW, a current does not flow through the memory element MR connected in parallel. The memory element MR stores data. Here, no current flowing through the memory element MR means that the memory cell MC is not to be selected.

On the other hand, in instances where the memory cell MC is in the selected state, the selector SW is placed in an off state (a non-conductive state). As shown in FIG. 4, with the selector SW being in the off state, an inversion layer (a channel layer) is not formed in the semiconductor layer of the selector SW. Thus, no current flows through the semiconductor layer.

In one example, the resistance value R7 of the memory element MR in the highest resistance state RS7 is 10 times (an order of magnitude) or more lower than the resistance value of the semiconductor layer of the off-state selector SW. As such, with the off-state selector SW, a current flows through the memory element MR connected in parallel. A current flowing through the memory element MR means that the memory cell MC is to be selected.

Turning back to FIG. 2, the memory cell array 110 will be further described.

The memory cells MC0 to MC15 included in each memory cell string MS are connected in series between the select transistor ST1 and a source line SL.

A memory element MR that is connected in parallel with the select transistor ST1 may be provided. In this case, a configuration in which the select transistor ST1 and the memory element MR are connected in parallel with each other may conform to the configuration in the memory cell MC. The memory cells MC0 in the respective memory cell strings MS included in the same block BLK have their control gates (multiple control gates) coupled to a common word line WL0. Control gates of the memory cells MC1 to MC15 in the respective memory cell strings MS included in the same block BLK are commonly coupled to their respective corresponding word lines WL1 to WL15. In the description below, each word line will be simply called a "word line WL" if discriminating the word lines WL0 to WL15 from one another is not required.

A set of multiple memory cells MC coupled to their common word line WL within one string unit SU will be called a "cell unit CU".

In the context of the embodiment, one memory cell MC is capable of storing 3-bit data. Data pieces at the respective digits in this 3-bit data will be called, from the lower digit, a "lower bit" (or "lower data"), a "middle bit" (or "middle data"), and an "upper bit" (or "upper data"). A set of lower bits retained by the respective memory cells MC in one cell unit CU will be called a "lower page". A set of middle bits retained by the respective memory cells MC in one cell unit CU will be called a "middle page". A set of upper bits retained by the respective memory cells MC in one cell unit CU will be called an "upper page".

In this manner, 3 pages are assigned to one cell unit CU.

The multiple select transistors ST1 in each string unit SU have their gates coupled to a common select gate line SGD. More specifically, gates of the multiple select transistors ST1 in the string unit SU0 are commonly coupled to a select gate line SGD0. Gates of the multiple select transistors ST1 in the string unit SU1 are commonly coupled to a select gate line SGD1. The string units SU2 and SU3 have the same configuration. In the description below, each select gate line will be simply called a "select gate line SGD" if discriminating the select gate lines SGD (SGD0, SGD1, and so on) from one another is not required.

The select gate lines SGD and the word lines WL are each independently controlled by the row decoder 120.

Within the memory cell array 110, the select transistors ST1 in the multiple memory cell strings MS located in the same column have their drains coupled to a common bit line BL (BL0 to BLm, where m is a natural number equal to or greater than 1). The bit line BL couples together the memory cell strings MS in the respective string units SU, across the multiple blocks BLK. In the description below, each bit line will be simply called a "bit line BL" if discriminating the bit lines BL0 to BLm from one another is not required.

Within the memory cell array 110, the memory cells MC15 in the multiple memory cell strings MS have their sources coupled to the common source line SL.

As described above, each string unit SU includes multiple memory cell strings MS coupled to different bit lines BL and the same select gate line SGD. Each block BLK includes multiple string units SU sharing the same word line WL. The memory cell array 110 includes multiple blocks BLK sharing the same bit line BL.

<Structure>

FIG. 5 will be referred to for describing a structure of the memory cell array 110 in the memory device 1 according to the embodiment. FIG. 5 shows an example of the sectional structure of the memory cell array 110 in the memory device 1 according to the embodiment. The description will assume an X direction to be a direction in which the bit lines BL extend. It will also be assumed that a Y direction is a direction in which the word lines WL extend. A Z direction will be assumed to be a direction perpendicular to the surface of a semiconductor substrate 20 where the memory cell array 110 is formed. In order to facilitate comprehension of what is intended to be illustrated, each drawing discussed below may omit as appropriate components such as insulating layers (interlayer insulating films), interconnects, contacts, etc.

As shown in FIG. 5, the memory cell array 110 in one example includes conductive layers 21, 22, 23, and 24. The conductive layers 21, 22, 23, and 24 are provided above the semiconductor substrate 20.

The conductive layer (voltage application electrode) 21 is arranged above the semiconductor substrate 20 in the Z direction via an insulating layer (not shown in the figure). In this insulating layer between the semiconductor substrate 20 and the conductive layer 21, one or more circuit components including, for example, the sense amplifier 140 may be arranged. In one example, the conductive layer 21 is formed in a plate shape extending over the XY plane. The conductive layer 21 is used as the source line SL. The potential of the conductive layer 21 is set to a constant low voltage so as to allow a current to flow from the bit line BL to a memory pillar MP, which will be discussed later. The conductive layer 21 includes, for example, silicon (Si).

Above the conductive layer 21 in the Z direction, multiple insulating layers (not shown in the figure) and the multiple conductive layers (voltage application electrodes) 22 are alternately stacked. In one example, each conductive layer 22 is formed in a plate shape extending over the XY plane. The stacked multiple conductive layers 22 are used as, for example, the respective word lines WL15 to WL0 in the order from the semiconductor substrate 20 side. The conductive layers 22 each include, for example, tungsten (W).

Above the topmost conductive layer 22 (WL0) in the Z direction, the multiple conductive layers (voltage application electrodes) 23 are arranged via an insulating layer (not shown in the figure). The conductive layers 23 extend in the Y direction. The conductive layers 23 are arranged in the X direction for respective select pillars SP, which will be described later. The conductive layers 23 are used as the respective select gate lines SGD0, SGD1, SGD2, and SGD3. The conductive layers 23 each include, for example, tungsten (W).

Above the conductive layers 23 in the Z direction, the conductive layer (voltage application electrode) 24 is arranged via an insulating layer (not shown in the figure). In one example, the conductive layer 24 is formed in a linear shape extending along the X direction. The conductive layer 24 is used as the bit line BL. The conductive layer 24 contains, for example, copper (Cu).

Each memory pillar MP is, in one example, a columnar member extending along the Z direction. The memory pillar MP penetrates through the stack constituted by the conductive layers 22 and the insulating layers. The bottom portion of the memory pillar MP reaches the conductive layer 21. In one example, each memory pillar MP includes a core member 30, a variable resistance layer 31, a semiconductor layer 32, and an insulating layer 33.

The select pillar SP is a columnar member arranged above the respective memory pillar MP. Each select pillar SP penetrates through the corresponding conductive layer 23 and the insulating layer (not shown in the figure). The top portion of the select pillar SP reaches the conductive layer 24. In one example, the select pillar SP includes, for example, the semiconductor layer 32 and the insulating layer 33.

A layer in which the boundary between the memory pillar MP and the select pillar SP is located is included in the layer between the topmost conductive layer 22 and the conductive layers 23.

The core member 30 in the memory pillar MP has, in one example, a columnar shape extending in the Z direction. The core member 30 includes, for example, an insulator such as silicon nitride (SiN).

In the memory pillar MP, the variable resistance layer 31 covers the side surface (outer periphery) of the core member 30. The variable resistance layer 31 is in contact with the core member 30. In one example, the variable resistance layer 31 extends in the Z direction. The variable resistance layer 31 has a cylindrical shape. The bottom portion of the variable resistance layer 31 is in contact with the conductive layer 21. Examples of the materials for the variable resistance layer 31 include an alloy-based phase change material (for example, $Ge_2Sb_2Te_5$).

The semiconductor layer 32 in the memory pillar MP covers the side surface (outer periphery) of the variable resistance layer 31. The semiconductor layer 32 is in contact with the variable resistance layer 31. In one example, the semiconductor layer 32 extends in the Z direction. The semiconductor layer 32 has a cylindrical shape. The bottom portion of the semiconductor layer 32 is in contact with the conductive layer 21.

In one example, the semiconductor layer 32 in the select pillar SP extends in the Z direction. The semiconductor layer 32 has a columnar shape. The top portion of the semiconductor layer 32 is in contact with the conductive layer 24. The semiconductor layer 32 of the select pillar SP has its bottom portion in contact with the semiconductor layer 32, the variable resistance layer 31, and the core member 30 of the memory pillar MP.

In the memory pillar SP, the insulating layer 33 covers the side surface (outer periphery) of the semiconductor layer 32. The insulating layer 33 is in contact with the semiconductor layer 32. In one example, the insulating layer 33 extends in the Z direction. The insulating layer 33 has a cylindrical shape. The side surface of the insulating layer 33 is partly covered by the conductive layers 22. The side surface of the insulating layer 33 is partly in contact with the conductive layers 22. The side surface of the insulating layer 33 is partly covered by the corresponding conductive layer 23. The side surface of the insulating layer 33 is partly in contact with the corresponding conductive layer 23. The insulating layer 33 includes, for example, an insulator such as silicon oxide ($SiO_2$).

The select transistor ST1 includes the conductive layer 23, the semiconductor layer 32, and the insulating layer 33. A memory element MR that is connected in parallel with the select transistor ST1 may be provided. In this case, a configuration in which the select transistor ST1 and the memory element MR are connected in parallel with each other may conform to the configuration in the memory cell MC. For example, it is possible to adopt a structure in which, in FIG. 5, the core member 30 and the variable resistance layer 31 are arranged so that the top portions of the core member 30 and the variable resistance layer 31 are positioned at a higher level than the conductive layers 23 (i.e., closer to the bit line BL). The top portions of the core member 30 and the variable resistance layer 31 may be in contact with the conductive layer 24.

FIG. 6 will be referred to for describing a sectional structure of the memory cell array 110 corresponding to the positions of the conductive layers 23. FIG. 6 is a sectional view taken along the line A-A in FIG. 5 and perpendicular to the Z direction.

As shown in FIG. 6, the semiconductor layer 32 and the insulating layer 33 penetrate through the corresponding conductive layer 23. The conductive layers 23 function as the select gate lines SGD0 to SGD3 for the select transistors ST1. Each insulating layer 33 functions as a gate insulating film of the corresponding select transistor ST1. Each semiconductor layer 32 functions as a semiconductor layer of the corresponding select transistor ST1. Use of the select transistor ST1 enables selection of the memory pillar MP for each word line WL. More specifically, by placing the select transistor ST1 in an on state, an inversion layer is formed in the semiconductor layer 32, which is in contact with the variable resistance layer 31 of the memory pillar MP. A current is supplied to the memory pillar MP via the inversion layer so that the memory pillar MP can be selected.

Figure 7:
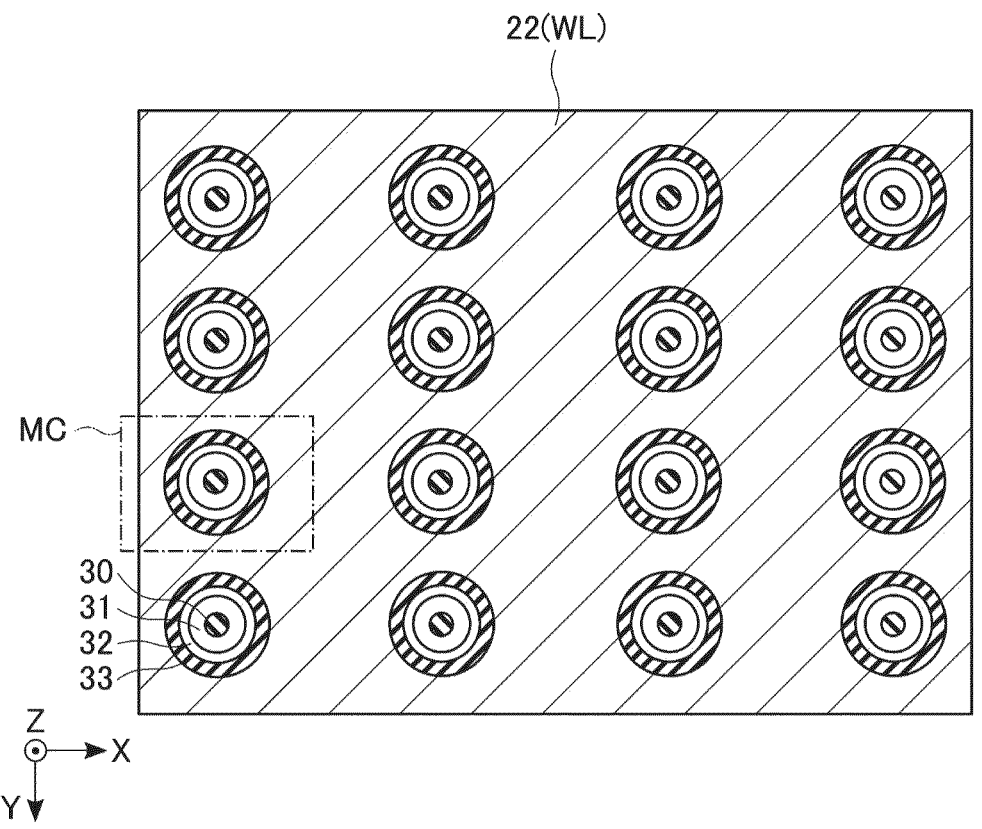
FIG. 7 is a sectional view taken along the line B-B in FIG. 5.

FIG. 7 will be referred to for describing a sectional structure of the memory cell array 110 corresponding to the position of one conductive layer 22. FIG. 7 is a sectional view taken along the line B-B in FIG. 5 and perpendicular to the Z direction.

As shown in FIG. 7, the memory cell MC is provided at an intersection between the plate-shaped word line WL and the memory pillar MP. The core member 30, the variable resistance layer 31, the semiconductor layer 32, and the insulating layer 33 penetrate through the conductive layer 22. The conductive layer 22 functions as the gate electrode of the selector SW in the memory cell MC and also as the word line WL for the memory cell MC. The insulating layer 33 functions as the gate insulating film of the selector SW in the memory cell MC. The semiconductor layer 32 functions as the semiconductor layer of the selector SW in the memory cell MC. The variable resistance layer 31 functions as the memory element MR in the memory cell MC.

With reference to FIG. 8, a relationship between the resistance state of the memory cell MC and data stored in the memory device according to the embodiment will be explained.

In the context of the embodiment, one memory cell MC stores 3-bit data as discussed above. This 3-bit data includes a lower bit (lower data), a middle bit (middle data), and an upper bit (upper data). The lower bit is the least significant digit data among the 3 bits. The middle bit is the middle digit data among the 3 bits. The upper bit is the most significant digit data among the 3 bits.

The memory cell MC can take eight resistance states RS in such a manner as to be associated with 3-bit data. The memory cell MC has one of the eight resistance states RS according to the data intended to be stored.

The memory cell MC varies its resistance state RS according to the size of the voltage applied to the variable resistance layer 31 at a write operation, the size of a current, the size of Joule heat, etc.

As shown in FIG. 8, the resistance value of the memory cell MC increases from the resistance state RS0 toward the resistance state RS7.

The memory cell MC in the resistance state RS0, which has the lowest resistance value, stores data "111". The memory cell MC in the resistance state RS1, which has the second lowest resistance value, stores data "101". The memory cell MC in the resistance state RS2, which has the third lowest resistance value, stores data "100". The memory cell MC in the resistance state RS3, which has the fourth lowest resistance value, stores data "110". The memory cell MC in the resistance state RS4, which has the fourth highest resistance value (i.e., the fifth lowest resistance value), stores data "010". The memory cell MC in the resistance state RS5, which has the third highest resistance value (i.e., the sixth lowest resistance value), stores data "011". The memory cell MC in the resistance state RS6, which has the second highest resistance value (i.e., the seventh lowest resistance value), stores data "001". The memory cell MC in the resistance state RS7, which has the highest resistance value, stores data "000".

In the four resistance states RS0, RS1, RS2, and RS3 showing relatively low resistance values among the eight resistance states, data "1" is assigned to the upper bit. In the four resistance states RS4, RS5, RS6, and RS7 showing relatively high resistance values among the eight resistance states, data "0" is assigned to the upper bit.

In this manner, 3-bit data is associated with the resistance states of the memory cell.

(a-3) Configuration of Sense Amplifier 140

FIG. 9 will be referred to for describing a configuration of the sense amplifier 140 in the memory device 1 according to the embodiment. FIG. 9 is a block diagram showing an exemplary configuration of the sense amplifier 140 in the memory device 1 according to the embodiment.

As shown in FIG. 9, the sense amplifier 140 includes the number of sense amplification circuits SA (SA0 to SAm, where m is a natural number equal to or greater than 1) which is equal to the number of bit lines BL. In the description below, each sense amplification circuit will be simply called a "sense amplification circuit SA" if discriminating the sense amplification circuits SA0 to SAm from one another is not required.

The sense amplification circuits SA0 to SAm are coupled to the respective bit lines BL0 to BLm. The sense amplification circuits SA0 to SAm are connected to the data register 150.

The sense amplification circuits SA each sense the voltage of the corresponding bit line BL at a data read operation. Each sense amplification circuit SA then performs a variety of processing based on the result of sensing the voltage of the bit line BL. The sense amplification circuit SA sends data DAT determined by the processing result to the data register 150.

In the course of a data write operation, the sense amplification circuit SA receives write data DAT from the data register 150. The sense amplification circuit SA sends a voltage according to the received write data DAT to the corresponding bit line BL.

FIG. 10 will be referred to for describing a configuration of the sense amplification circuit SA of the sense amplifier 140 in the memory device 1 according to the embodiment.

FIG. 10 is a block diagram showing an overview of a configuration of the sense amplification circuit SA in the memory device 1 according to the embodiment.

As shown in FIG. 10, each sense amplification circuit SA according to the embodiment includes a voltage sense circuit 141, a switch circuit (control circuit) 142, a lower bit judge circuit 143L, a middle bit judge circuit 143M, and an upper bit judge circuit 143U.

The voltage sense circuit 141 is coupled to the corresponding bit line BL. The voltage sense circuit 141 senses the potential of the bit line BL (i.e., a bit line voltage VBL) at a read operation. The voltage sense circuit 141 acquires a signal corresponding to the potential of the bit line BL. In one example, the voltage sense circuit 141 uses two reference voltages to determine the relationship in size between the bit line voltage VBL and the reference voltages.

The lower bit judge circuit 143L performs a judging process for the lower bit in the 3-bit data based on the signal corresponding to the bit line voltage VBL. The lower bit judge circuit 143L receives a control signal Lgc(L), which may also be called a "logic signal", for making a judgment for the lower bit. The lower bit judge circuit 143L includes a lower bit latch circuit 40L. This lower bit latch circuit 40L temporarily stores the lower bit.

The middle bit judge circuit 143M performs a judging process for the middle bit in the 3-bit data based on the signal corresponding to the bit line voltage VBL. The middle bit judge circuit 143M receives a control signal (logic signal) Lgc(M) for making a judgment for the middle bit. The middle bit judge circuit 143M includes a middle bit latch circuit 40M. This middle bit latch circuit 40M temporarily stores the middle bit.

The upper bit judge circuit 143U performs a judging process for the upper bit in the 3-bit data based on the signal corresponding to the bit line voltage VBL. The upper bit judge circuit 143U receives a control signal (logic signal) Lgc(U) for making a judgment for the upper bit. The upper bit judge circuit 143U includes an upper bit latch circuit 40U. This upper bit latch circuit 40U temporarily stores the upper bit.

In the description below, each of the lower bit judge circuit 143L, the middle bit judge circuit 143M, and the upper bit judge circuit 143U will be simply called a "judge circuit 143" if discriminating these circuits 143L, 143M, and 143U from one another is not required. Also in the description below, each of the lower bit latch circuit 40L, the middle bit latch circuit 40M, and the upper bit latch circuit 40U will be simply called a "latch circuit 40" if discriminating these circuits 40L, 40M, and 40U from one another is not required.

In one example, the latch circuit 40 in the judge circuit 143 includes a D-type flip-flop.

The switch circuit 142 is disposed between the voltage sense circuit 141 and each judge circuit 143. The switch circuit 142 controls the operation state of each judge circuit 143 for its bit (data) judging process at a read operation.

In the memory device 1 according to the embodiment, the switch circuit 142 switches the operation states of the judge circuits 143 according to the value of a judgment result stored in any one of the judge circuits 143 (for example, this value may be a value of the middle bit).

In one example, the middle bit judge circuit 143M at a read operation sends, as feedback, a signal /Qmid corresponding to the data stored in the circuit 143M to the switch circuit 142. As one example, the signal /Qmid is a signal complementary to the data (e.g., the middle bit) stored in the middle bit judge circuit 143M.

In the following description, the signal /Qmid fed back to the switch circuit 142 from the middle bit judge circuit 143M will be called a "feedback signal /Qmid".

<Concrete Example of Sense Amplification Circuit SA>

Figure 13:
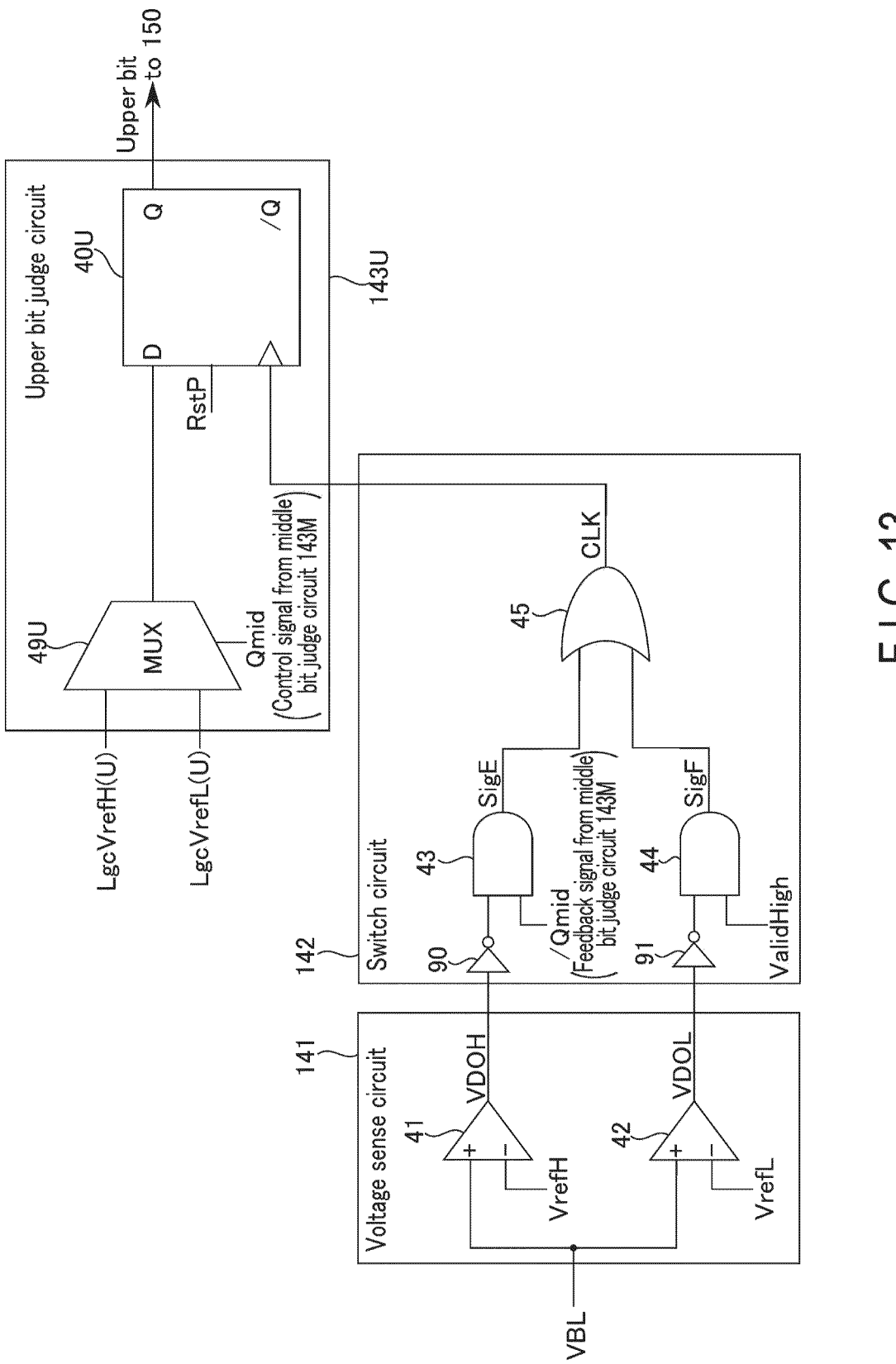
FIG. 13 is a block diagram showing an exemplary configuration of the sense amplification circuit in the memory device according to the first embodiment.

Referring to FIGS. 11, 12, and 13, a description will be given of an internal configuration of the sense amplification circuit SA in the memory device 1 according to the embodiment.

FIGS. 11, 12, and 13 are diagrams each showing a concrete example of the internal configuration of each of the voltage sense circuit 141, the switch circuit 142, and the corresponding judge circuit 143 in the sense amplification circuit SA in the memory device 1 according to the embodiment.

FIG. 11 shows a concrete example of the internal configuration of each of the voltage sense circuit 141, the switch circuit 142, and the lower bit judge circuit 143L in the sense amplification circuit SA in the memory device 1 according the embodiment.

As shown in FIG. 11, the voltage sense circuit 141 includes two operation amplifiers 41 and 42.

The operation amplifier 41 includes two input nodes and one output node. The one input node (e.g., a non-inverting input node) of the operation amplifier 41 is coupled to the bit line BL. The non-inverting input node of the operation amplifier 41 receives the bit line voltage VBL. The other of the input nodes (e.g., an inverting input node) of the operation amplifier 41 receives a high-potential-side reference voltage VrefH. The output node of the operation amplifier 41 is connected to the switch circuit 142.

The operation amplifier 41 performs a calculation (comparison) as to whether or not the bit line voltage VBL is higher than the reference voltage VrefH. Based on the result of calculation with the bit line voltage VBL and the reference voltage VrefH, the operation amplifier 41 outputs a signal VDOH indicative of the sense result (which may be called a "sense signal").

The operation amplifier 42 includes two input nodes and one output node. One of the input nodes (e.g., a non-inverting input node) of the operation amplifier 42 is coupled to the bit line BL. The non-inverting input node of the operation amplifier 42 receives the bit line voltage VBL.

The other of the input nodes (e.g., an inverting input node) of the operation amplifier 42 receives a low-potential-side reference voltage VrefL. The output node of the operation amplifier 42 is connected to the switch circuit 142. The reference voltage VrefL is lower than the reference voltage VrefH.

The operation amplifier 42 performs a calculation (comparison) as to whether or not the bit line voltage VBL is higher than the reference voltage VrefL. Based on the result of calculation with the bit line voltage VBL and the reference voltage VrefL, the operation amplifier 42 outputs a sense signal VDOL indicative of the sense result.

In the above manner, the sense amplification circuit SA performs the sensing operation for the bit line voltage VBL using two reference voltages VrefH and VrefL.

In the case where the resistance state of a memory cell MC is one of the relatively low resistance states RS0 to RS3, the sensing operation with the reference voltage VrefH cannot secure a sufficient margin for a voltage difference or a time period that permits the determination of the resistance state of the memory cell MC. Thus, the reference voltage VrefL, which is lower than the reference voltage VrefH, is employed by the sensing operation for the bit line voltage VBL for a memory cell MC that is in one of the resistance states RS0 to RS3.

In the case where the resistance state of a memory cell MC is one of the relatively high resistance states RS4 to RS7, the sensing operation with the reference voltage VrefL requires a long period of time from the start of the sensing operation. Thus, the reference voltage VrefH, which is higher than the reference voltage VrefL, is employed by the sensing operation for the bit line voltage VBL for a memory cell MC that is in one of the resistance states RS4 to RS7. For a memory cell MC in one of the resistance states RS4 to RS7, it is possible for the sensing operation to secure a sufficient margin for a voltage difference and a time period for the determination of the resistance state of the memory cell MC even with the use of the reference voltage VrefH.

The switch circuit 142 includes two AND gates (logic operation circuits) 43 and 44, an OR gate (logic operation circuit) 45, and inverters (NOT gates) 90 and 91.

The AND gate 43 includes two input nodes and one output node. The one input node of the AND gate 43 is connected to the output node of the operation amplifier 41 via the inverter 90. This input node of the AND gate 43 receives a signal /VDOH which is an inverted signal of the sense signal VDOH of the operation amplifier 41 (hereinafter, an "inverted sense signal"). The other input node of the AND gate 43 receives the feedback signal /Qmid. The output node of the AND gate 43 is connected to the OR gate 45.

The AND gate 43 performs logical conjunction (AND operation) of the inverted sense signal /VDOH and the feedback signal /Qmid. The AND gate 43 outputs a signal SigE indicating the result of the AND operation to the OR gate 45.

The AND gate 44 includes two input nodes and one output node. One of the input nodes of the AND gate 44 is connected to the output node of the operation amplifier 42 via the inverter 91. This input node of the AND gate 44 receives a signal /VDOL which is an inverted signal (inverted sense signal) of the sense signal VDOL of the operation amplifier 42. The other input node of the AND gate 44 receives a control signal (timing signal) ValidHigh. The output node of the AND gate 44 is connected to the OR gate 45.

The AND gate 44 performs an AND operation of the inverted sense signal /VDOL and the control signal ValidHigh. The AND gate 44 outputs a signal SigF indicating the result of the AND operation to the OR gate 45.

The control signal ValidHigh is a signal for indicating that the sensing operation is an operation in a sense period that uses the reference voltage VrefH, or an operation in a sense period that uses the reference voltage VrefL. As one example, it is indicated that for a period during which the control signal ValidHigh has a signal level "H", a sensing operation with the low-potential-side reference voltage VrefL is valid. For the period during which the control signal ValidHigh has the signal level "H", the sense amplification circuit SA uses the result of comparison between the bit line voltage VBL and the reference voltage VrefL for the data judgment. It is also indicated that for a period during which the control signal ValidHigh has a signal level "L", a sensing operation with the low-potential-side reference voltage VrefL is invalid. For the period during which the control signal ValidHigh has the signal level "L", the sense amplification circuit SA does not use the result of comparison between the bit line voltage VBL and the reference voltage VrefL for the data judgment.

The OR gate 45 includes two input nodes and one output node.

One of the input nodes of the OR gate 45 is connected to the output node of the AND gate 43. This input node of the OR gate 45 receives the signal SigE. The other input node of the OR gate 45 is connected to the output node of the AND gate 44. The other input node of the OR gate 45 receives the SigF. The output node of the OR gate 45 is connected to each of the multiple judge circuits 143L, 143M, and 143U.

The OR gate 45 performs logical sum (OR operation) of the supplied signals SigE and SigF. The OR gate 45 outputs a signal CLK indicating the result of the OR operation to each judge circuit 143.

The lower bit judge circuit 143L includes the lower bit latch circuit (data retaining circuit) 40L, and a multiplexer (selecting circuit) 49L.

In one example, the lower bit latch circuit 40L is a D-type flip-flop 40L. The D-type flip-flop 40L in the lower bit latch circuit 40L includes two input nodes and two output nodes.

One of the input nodes (which may also be called a "CLK node" or a "CK node") of the lower bit latch circuit (D-type flip-flop) 40L is connected to the output node of the OR gate 45. This input node of the lower bit latch circuit (D-type flip-flop) 40L receives the signal CLK from the OR gate 45.

The other input node (which may also be called a "D node") of the lower bit latch circuit (D-type flip-flop) 40L is connected to the multiplexer 49L. The D node of the lower bit latch circuit (D-type flip-flop) 40L receives a control signal Lgc(L) (LgcVrefH(L), LgcVrefL(L)) via the multiplexer 49L. The control signal Lgc is a signal indicating a value of data which can be determined according to a change in the bit line voltage occurring at a given time point in the period during which the sense amplification circuit SA is in operation.

One of the output nodes (which may also be called a "Q node") of the lower bit latch circuit (D-type flip-flop) 40L is connected to the data register 150. The Q node of the lower bit latch circuit (D-type flip-flop) 40L retains the lower bit. The Q node of the lower bit latch circuit (D-type flip-flop) 40L sends the lower bit to the data register 150.

The other output node (which may also be called a "/Q node") of the lower bit latch circuit (D-type flip-flop) 40L retains an inverted signal of the lower bit. In one example, the /Q node of the lower bit latch circuit (D-type flip-flop) 40L is not connected to other components.

The lower bit latch circuit (D-type flip-flop) 40L includes a reset node. The reset node of the lower bit latch circuit (D-type flip-flop) 40L receives a reset pulse RstP. The lower bit latch circuit (D-type flip-flop) 40L is reset by the reset pulse RstP. Resetting turns the lower bit latch circuit (D-type flip-flop) 40L into an initial state. The lower bit latch circuit (D-type flip-flop) 40L retains an "L" level signal (data "0") in the Q node in its initial state at the start of a read operation.

The multiplexer 49L includes two input nodes and one output node. One of the input nodes of the multiplexer 49L receives the control signal LgcVrefH(L). The other input node of the multiplexer 49L receives the control signal LgcVrefL(L). The control signal LgcVrefL(L) differs from the control signal LgcVrefH(L). The output node of the multiplexer 49L is connected to the D node of the D-type flip-flop 40L, i.e., the lower bit latch circuit 40L.

The multiplexer 49L receives a control signal (select signal) Qmid. According to this control signal Qmid, the multiplexer 49L sends, as the control signal Lgc(L), one of the two control signals LgcVrefH(L) and LgcVrefL(L) to the lower bit latch circuit (D-type flip-flop) 40L.

The control signal Qmid is a signal complementary to the feedback signal /Qmid. The control signal Qmid is an inverted signal of the feedback signal /Qmid.

The control signal LgcVrefH(L) is a signal indicating a value of the lower bit corresponding to the sensing operation with the reference voltage VrefH at a given time point in the sensing operation.

The control signal LgcVrefHL(L) is a signal indicating a value of the lower bit corresponding to the sensing operation with the reference voltage VrefL at a given time point in the sensing operation.

FIG. 12 shows a concrete example of the internal configuration of the middle bit judge circuit 143M in the sense amplification circuit SA in the memory device 1 according the embodiment.

The middle bit judge circuit 143M includes the middle bit latch circuit (data retaining circuit) 40M, and a multiplexer (selecting circuit) 49M.

In one example, the middle bit latch circuit (D-type flip-flop) 40M is a D-type flip-flop 40M. The D-type flip-flop 40M in the middle bit latch circuit 40M includes two input nodes and two output nodes.

One of the input nodes (CLK node) of the middle bit latch circuit (D-type flip-flop) 40M is connected to the output node of the OR gate 45 in the switch circuit 142. This input node of the middle bit latch circuit (D-type flip-flop) 40M receives the signal CLK from the OR gate 45.

The other input node (D node) of the middle bit latch circuit (D-type flip-flop) 40M is connected to the multiplexer 49M. The D node of the middle bit latch circuit (D-type flip-flop) 40M receives a control signal Lgc(M) (LgcVrefH(M), LgcVrefL(M)) via the multiplexer 49M.

One of the output nodes (Q node) of the middle bit latch circuit (D-type flip-flop) 40M is connected to the data register 150. The Q node of the middle bit latch circuit (D-type flip-flop) 40M retains the middle bit. The Q node of the middle bit latch circuit (D-type flip-flop) 40M sends the middle bit to the data register 150.

The other output node (/Q node) of the middle bit latch circuit (D-type flip-flop) 40M retains the feedback signal /Qmid. The /Q node of the middle bit latch circuit (D-type flip-flop) 40M outputs the feedback signal /Qmid. In one example, the /Q node of the D-type flip-flop 40M, i.e., the middle bit latch circuit 40M, is connected to the other input node of the AND gate 43 in the switch circuit 142.

The feedback signal /Qmid is an inverted signal of the middle bit retained in the Q node of the D-type flip-flop 40M, i.e., the middle bit latch circuit 40M. The control signal Qmid supplied to the multiplexer 49 is an inverted signal of the feedback signal /Qmid.

In one example, the middle bit latch circuit (D-type flip-flop) 40M includes a reset node. The middle bit latch circuit (D-type flip-flop) 40M is reset into an initial state by a reset pulse RstP supplied to the reset node. The middle bit latch circuit (D-type flip-flop) 40M retains an "L" level signal (data "0") in the Q node in its initial state at the start of a read operation.

The multiplexer 49M includes two input nodes and one output node. One of the input nodes of the multiplexer 49M receives the control signal LgcVrefH(M). The other input node of the multiplexer 49M receives the control signal LgcVrefL(M). The signal LgcVrefL(M) differs from the signal LgcVrefH(M). The output node of the multiplexer 49M is connected to the D node of the D-type flip-flop 40M, i.e., the middle bit latch circuit 40M.

The multiplexer 49M receives the control signal Qmid. According to this control signal Qmid, the multiplexer 49M sends, as the control signal Lgc(M), one of the two control signals LgcVrefH(M) and LgcVrefL(M) to the middle bit latch circuit (D-type flip-flop) 40M.

The control signal LgcVrefH(M) is a signal indicating a value of the middle bit corresponding to the sensing operation with the reference voltage VrefH at a given time point in the sensing operation.

The control signal LgcVrefHL(M) is a signal indicating a value of the middle bit corresponding to the sensing operation with the reference voltage VrefL at a given time point in the sensing operation.

FIG. 13 shows a concrete example of the internal configuration of the upper bit judge circuit 143U in the sense amplification circuit SA in the memory device 1 according the embodiment.

The upper bit judge circuit 143U includes the upper bit latch circuit (data retaining circuit) 40U, and a multiplexer (selecting circuit) 49U.

In one example, the upper bit latch circuit 40U is a D-type flip-flop 40U.

The D-type flip-flop 40U in the upper bit latch circuit 40U includes two input nodes and two output nodes.

One of the input nodes of the upper bit latch circuit (D-type flip-flop) 40U is connected to the output node of the OR gate 45 in the switch circuit 142. This input node of the upper bit latch circuit (D-type flip-flop) 40U receives the signal CLK from the OR gate 45.

The other input node (D node) of the upper bit latch circuit (D-type flip-flop) 40U is connected to the multiplexer 49U. The D node of the upper bit latch circuit (D-type flip-flop) 40U receives a control signal Lgc(U) (LgcVrefH (U), LgcVrefL(U)) via the multiplexer 49U.

One of the output nodes (Q node) of the upper bit latch circuit (D-type flip-flop) 40U is connected to the data register 150. The Q node of the upper bit latch circuit (D-type flip-flop) 40U retains the upper bit. The Q node of the upper bit latch circuit (D-type flip-flop) 40U sends the upper bit to the data register 150.

The other output node (/Q node) of the upper bit latch circuit (D-type flip-flop) 40U retains an inverted signal of the upper bit. In one example, the /Q node of the upper bit latch circuit (D-type flip-flop) 40U is not connected to other components.

The upper bit latch circuit (D-type flip-flop) 40U includes a reset node. The upper bit latch circuit (D-type flip-flop)

40U is reset into an initial state by a reset pulse RstP supplied to the reset node. The upper bit latch circuit (D-type flip-flop) 40U retains an "L" level signal (data "0") in the Q node in its initial state at the start of a read operation.

The multiplexer 49U includes two input nodes and one output node. One of the input nodes of the multiplexer 49U receives the control signal LgcVrefH(U). The other input node of the multiplexer 49U receives the control signal LgcVrefL(U). The signal LgcVrefL(U) differs from the signal LgcVrefH(U). The output node of the multiplexer 49U is connected to the D node of the D-type flip-flop 40U, i.e., the upper bit latch circuit 40U.

The multiplexer 49U receives the control signal Qmid. According to this control signal Qmid, the multiplexer 49U sends, as the control signal Lgc(U), one of the two control signals LgcVrefH(U) and LgcVrefL(U) to the upper bit latch circuit (D-type flip-flop) 40U.

The control signal LgcVrefH(U) is a signal indicating a value of the upper bit corresponding to the sensing operation with the reference voltage VrefH at a given time point in the sensing operation.

The control signal LgcVrefHL (U) is a signal indicating a value of the upper bit corresponding to the sensing operation with the reference voltage VrefL at a given time point in the sensing operation.

The memory device 1 according to the embodiment reads 3-bit data from one memory cell MC through the sensing operation with two reference voltages VrefH and VrefL, using the above described sense amplification circuit SA including the switch circuit 142 and the judge circuits 143.

FIG. 14 is a diagram showing a relationship between each reference voltage and data in a read operation conducted by the memory device 1 according to the embodiment.

The sense amplification circuit SA in the memory device 1 according to the embodiment serves so that, in response to the bit line voltage VBL becoming equal to or lower than the reference voltage VrefH during a period T1 which spans from the start of a read operation to a given time ta, a judgment result "1" is given (for the middle bit) by the middle bit judge circuit 143M with the reference voltage VrefH.

Accordingly, the data that is temporarily retained by the sense amplification circuit SA in the period T1 is, for example, data having a code "010".

For example, as shown in FIG. 14, if a memory cell MC has one of the four resistance states RS0, RS1, RS2, and RS3 showing relatively low resistance values, the sense amplification circuit SA temporarily stores data "010" as a tentative judgment result for the memory cell MC, based on the judgment result (sense result) with the high-potential-side reference voltage VrefH.

In the memory device 1 according to the embodiment, the sense amplification circuit SA which is in the state of temporarily storing the data "010" performs data acquisition again based on the sense result for the bit line voltage VBL, so that it reaches a state of corresponding to the data actually stored by the memory cell MC.

In this manner, the sense amplification circuit SA in the memory device 1 according to the embodiment temporarily retains data "010" as tentative data in the period T1 from the start of the sensing operation. This allows for the mitigation of timing control constraints in read operations of the memory device 1 according to the embodiment.

Consequently, the memory device 1 according to the embodiment can realize excellent reliability in the read operations.

(b) Exemplary Operations

<Overview of Read Operation>

An overview of a read operation of the memory device 1 according to the embodiment will be described.

The memory device 1 according to the embodiment carries out its read operation by causing a current to flow between a bit line BL and a source line SL, selecting a read target memory cell MC, and then sensing a voltage of the bit line BL. Such a memory cell selected as an operation target will be called a "selected cell" below. Memory cells other than the selected memory cell will be called "unselected cells".

Referring to FIGS. 15 and 16, a method of selecting a read target memory cell MC will be generally explained. FIG. 15 is a circuit diagram of one memory cell string MS within the memory cell array 110 in the memory device 1 according to the embodiment. FIG. 16 is a sectional view of one memory cell string MS within the memory cell array 110 in the memory device 1 according to the embodiment. By way of example, the description will assume an instance where a memory cell MC2 is selected in the read operation.

As shown in FIG. 15, the sequencer 180 places the select transistor ST1 in an on state.

The sequencer 180 places the selector SW of the selected cell MC2, i.e., the read target, in an off state.

The sequencer 180 places the selectors SW of the respective unselected cells MC0, MC1, MC3, MC4, . . . , and MC15 in an on state.

A current flows from the bit line BL to the source line SL through the select transistor ST1, the selectors SW of the unselected cells MC0 and MC1, the memory element MR of the selected cell MC2, and the selectors SW of the unselected cells MC3 to MC15.

As shown in FIG. 16, the sequencer 180 applies an "H" level voltage (a predetermined positive voltage) to the select gate line SGD of the select transistor ST1 which is in contact with the memory pillar MP to which the selected cell MC2 belongs. The select transistor ST1 is turned on.

This forms an inversion layer in the semiconductor layer 32 of the select transistor ST1. The select transistor ST1 is now in the state capable of conducting a current.

Accordingly, the bit line BL and the semiconductor layer 32 of the memory pillar MP establish electrical conduction via the on-state select transistor ST1.

The sequencer 180 applies an "L" level voltage (e.g., 0 V) to the word line WL2 corresponding to the selected cell MC2. Thus, an inversion layer is not formed in the portion of the semiconductor layer 32 that faces the selected cell MC2.

The sequencer 180 applies an "H" level voltage to the word lines WL0, WL1, WL3, . . . , and WL15 corresponding to the respective unselected cells MC0, MC1, MC3, . . . , and MC15. This forms an inversion layer in the portion of the semiconductor layer 32 that faces the unselected cells MC0, MC1, MC3, . . . , and MC15.

As a result, the current flowing between the bit line BL and the source line SL is routed through the memory element MR in the selected cell MC2 and through the semiconductor layer 32 of each of the selectors SW of the unselected cells MC0, MC1, MC3, . . . , and MC15.

As shown in FIG. 16, the memory pillar MP is provided with the core member 30, i.e., an insulating layer, in its center portion. In the selected cell MC2, the current flows through the variable resistance layer 31 surrounding the core member 30.

Thus, for the read operation, the memory element MR of the read target memory cell MC2 can be selected.

<Sensing Operation>

Figure 17:
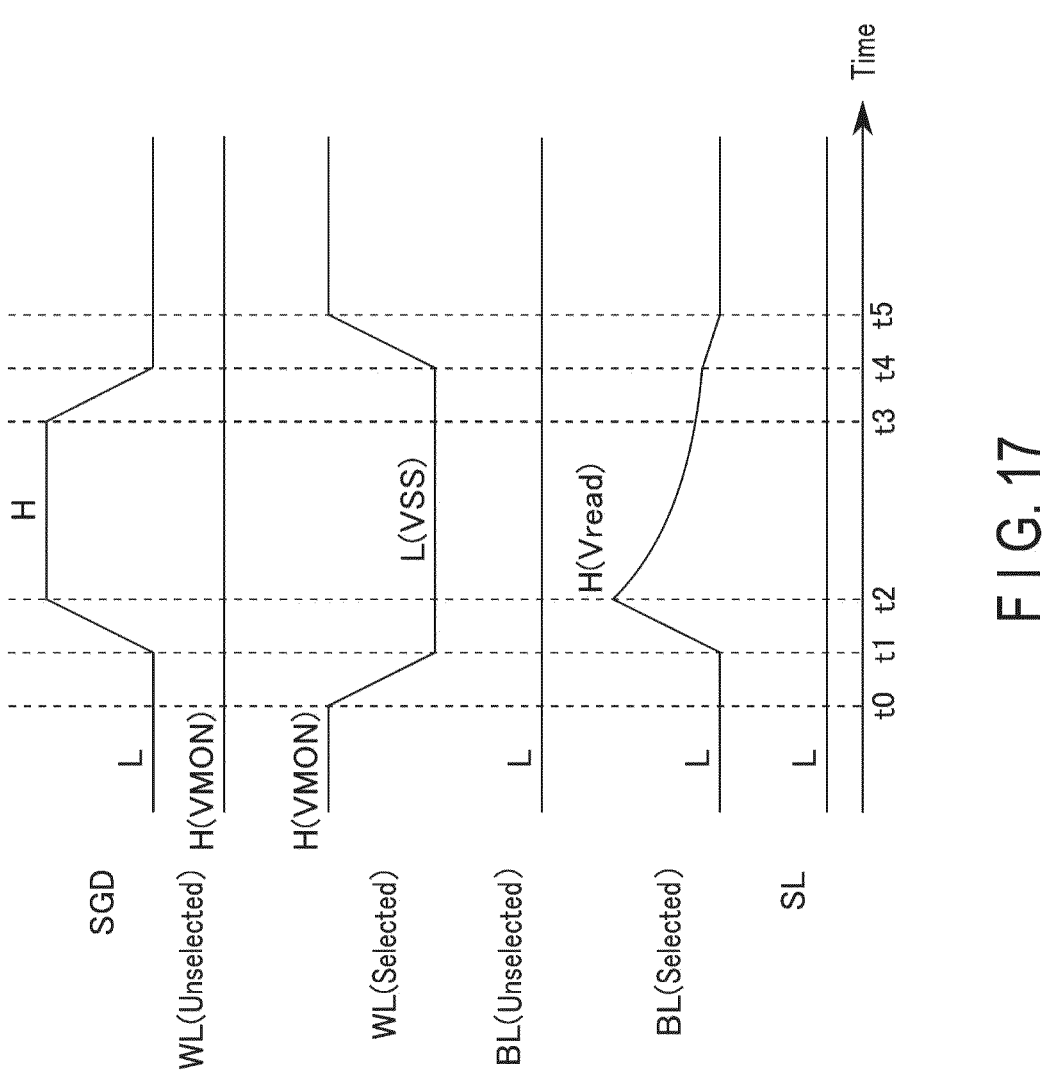
FIG. 17 is a waveform chart illustrating an overview of the read operation of the memory device according to the first embodiment.

FIG. 17 will be referred to for describing a method of sensing voltages of the bit lines BL in the memory device 1 according to the embodiment.

FIG. 17 is a timing chart for a sensing operation of the memory device 1 according to the embodiment. In FIG. 17, the horizontal axis represents time and the vertical axis represents a voltage or a signal level.

At time t0, as shown in FIG. 17, the sequencer 180 sets each of the voltage of the select gate line SGD, the voltage of the bit line BL, and the voltage of the source line SL at an "L" level.

The sequencer 180 sets the voltage of each unselected word line WL at an "H" level (voltage VMON). The sequencer 180 reduces the voltage of the selected word line WL from the "H" level to the "L" level (voltage VSS).

The voltage VSS is a voltage for placing the selector SW of the memory cell MC or the select transistor ST1 in the off state. The voltage VSS is a voltage which can stop the voltage transfer of the bit line BL. The voltage VSS is, for example, 0 V.

The voltage VMON is a voltage which can form a channel in the semiconductor layer 32 of the selector SW of each memory cell MC or the semiconductor layer 32 of the select transistor ST1 (that is, a voltage which can place the semiconductor layer 32 in a strong inversion state). The voltage VMON is, for example, 2 V.

For the period from time t1 to time t4, the sequencer 180 sets the voltage of the selected word line WL at the "L" level. Accordingly, for the period from time t1 to time t4, the selector SW of each unselected cell MC is kept in the on state and the selector SW of the selected cell MC is kept in the off state, among the memory cells MC within the selected memory cell string MS.

At time t1, the sequencer 180 raises the voltage of the select gate line SGD from the "L" level to the "H" level. The sequencer 180 raises the voltage of the selected bit line BL from the "L" level to an "H" level (read voltage Vread). The read voltage Vread is, for example, 0.3 V.

For the period from time t2 to time t3, the sequencer 180 sets the voltage of the select gate line SGD at the "H" level. The select transistor ST1 is turned on by the "H" level voltage. This establishes electrical coupling between the bit line BL and the memory cell string MS.

At time t2, upon application of the read voltage Vread to the selected bit line BL, the sense amplifier 140 monitors and senses the voltage VBL of the selected bit line BL. The voltage of the selected bit line BL drops (attenuates) according to the resistance state of the memory element MR of the selected cell MC during the period from time t2 to time t3.

The sense amplifier 140 sends data acquired based on the sense result to the data register 150.

At the time t3, the sequencer 180 reduces the voltage of the select gate line SGD from the "H" level to the "L" level. The select transistor ST1 is thus turned off. For the period from time t4, the sequencer 180 sets the voltage of the select gate line SGD at the "L" level.

At time t4, the sequencer 180 raises the voltage of the selected word line WL from the "L" level (voltage VSS) to the "H" level (voltage VMON). The sequencer 180 sets the voltage of the selected bit line BL at the "L" level.

For the period from time t5, the sequencer 180 sets the voltage of the selected word line WL at the "H" level (VMON). This turns on the selectors SW of all the memory cells MC. For the period from time t5, the sequencer 180 sets the voltage of the selected bit line BL at the "L" level.

<Operation of Sense Amplification Circuit SA>

FIG. 18 will be referred to for describing an operation of the sense amplification circuit SA of the sense amplifier 140 in the memory device 1 according to the embodiment.

FIG. 18 is a timing chart illustrating an operation of the sense amplification circuit SA in the memory device 1 according to the embodiment. What is illustrated in FIG. 18 is one example of the relationship between the voltage of the selected bit line BL and time after application of the read voltage Vread to the selected bit line BL, in the memory device 1 according to the embodiment. In FIG. 18, the vertical axis represents the voltage VBL of the bit line BL and signal levels of various control signals. Also in FIG. 18, the horizontal axis represents time elapsed since the application of the voltage Vread to the bit line BL. Time t2 and time t3 on the horizontal axis of FIG. 18 correspond to the time t2 and time t3 shown in FIG. 17. In the description below, the voltage (voltage value) VBL of the bit line BL may also be called a "bit line voltage VBL".

As shown in FIG. 18, after the application of the read voltage Vread to the selected bit line BL, the bit line voltage VBL drops at a rate depending on the resistance state of the memory element MR of the selected cell MC.

The voltage sense circuit 141 monitors and senses the bit line voltage VBL for the period from time t2 to time t3. The voltage sense circuit 141 outputs a sense signal VDOH and a sense signal VDOL according to the sense result reflecting the temporal change in the bit line voltage VBL.

The sense signal VDOH transitions from an "H" level to an "L" level according to the sense result. The sense signal VDOH turns to the "L" level at the timing of the bit line voltage VBL becoming equal to or lower than the high-potential-side reference voltage VrefH.

The sense signal VDOL transitions from an "H" level to an "L" level according to the sense result. The sense signal VDOL turns to the "L" level at the timing of the bit line voltage VBL becoming equal to or lower than the low-potential-side reference voltage VrefL.

The timings at which the signal levels of the sense signals VDOH and VDOL become their respective "L" levels depend on the resistance state of the selected cell MC. However, the signal level of the sense signal VDOL changes to the "L" level at the timing after the signal level of the sense signal VDOH turns to the "L" level.

Note that in instances where the memory cell MC has the resistance state RS6 or RS7, the signal level of the sense signal VDOL does not change to the "L" level during the period of a sensing operation.

The above described switch circuit 142 sends a signal CLK of a given signal level to the lower bit judge circuit 143L, the middle bit judge circuit 143M, and the upper bit judge circuit 143O, based on changes in signal levels of the inverted sense signals /VDOH and /VDOL, the control signal ValidHigh, and the feedback signal /Qmid.

Each of the judge circuits 143, in response to the signal CLK, takes in data according to the signal level of the control signal Lgc at a given time point.

The lower bit judge circuit 143L receives the control signal LgcVrefH(L) and the control signal LgcVrefL(L).

The control signal LgcVrefH(L) has a signal level of "L" level at time t2. The signal level of the control signal LgcVrefH(L) turns from the "L" level to an "H" level at time t11. Here, time t11 is set between the time point at which the bit line voltage VBL for a memory cell MC in the resistance state RS4 becomes equal to or lower than the reference voltage VrefH, and the time point at which the bit line voltage VBL for a memory cell MC in the resistance state RS5 becomes equal to or lower than the reference voltage VrefH. The signal level of the control signal LgcVrefH(L) turns from the "H" level to the "L" level at time t15. Here, time t15 is set between the time point at which the bit line voltage VBL for a memory cell MC in the resistance state RS6 becomes equal to or lower than the reference voltage VrefH, and the time point at which the bit line voltage VBL for a memory cell MC in the resistance state RS7 becomes equal to or lower than the reference voltage VrefH.

The control signal LgcVrefL(L) has a signal level "H" at time t2. The signal level of the control signal LgcVrefL(L) turns from the "H" level to an "L" level at time t12. Here, time t12 is set between the time point at which the bit line voltage VBL for a memory cell MC in the resistance state RS1 becomes equal to or lower than the reference voltage VrefL, and the time point at which the bit line voltage VBL for a memory cell MC in the resistance state RS2 becomes equal to or lower than the reference voltage VrefL.

The middle bit judge circuit 143M receives the control signal LgcVrefH(M) and the control signal LgcVrefL(M).

The control signal LgcVrefH(M) has a signal level "H" at time t2. The signal level of the control signal LgcVrefH(M) turns from the "H" level to an "L" level at time t13. Here, with respect to the reference voltage VrefH, time t13 is set between the time point at which the bit line voltage VBL for a memory cell MC in the resistance state RS5 becomes equal to or lower than the reference voltage VrefH, and the time point at which the bit line voltage VBL for a memory cell MC in the resistance state RS6 becomes equal to or lower than the reference voltage VrefH.

The control signal LgcVrefL(M) has a signal level "H" at time t2. The signal level of the control signal LgcVrefL(M) turns from the "H" level to an "L" level at time t10. Here, time t10 is set between the time point at which the bit line voltage VBL for a memory cell MC in the resistance state RS0 becomes equal to or lower than the reference voltage VrefL, and the time point at which the bit line voltage VBL for a memory cell MC in the resistance state RS1 becomes equal to or lower than the reference voltage VrefL. The signal level of the control signal LgcVrefL(M) turns from the "L" level to the "H" level at time t13. Here, with respect to the reference voltage VrefL, time t13 is set between the time point at which the bit line voltage VBL for a memory cell MC in the resistance state RS2 becomes equal to or lower than the reference voltage VrefL, and the time point at which the bit line voltage VBL for a memory cell MC in the resistance state RS3 becomes equal to or lower than the reference voltage VrefL.

The upper bit judge circuit 143U receives the control signal LgcVrefH(U) and the control signal LgcVrefL(U).

The signal level of the control signal LgcVrefH(U) is kept at an "L" level for the period from time t2 to time t3. The signal level of the control signal LgcVrefL(U) is kept at an "H" level for the period from time t2 to time t3.

The control signal ValidHigh has a signal level "H" at time t2. The signal level of the control signal ValidHigh turns from the "H" level to an "L" level at time t14. The control signal ValidHigh has the signal level "L" for the period from time t14 to time t3. In one example, the signal level of the control signal ValidHigh turns from the "H" level to the "L" level during a period between the time point at which the bit line voltage VBL for a memory cell MC in the resistance state RS3 becomes equal to or lower than the reference voltage VrefL, and the time point at which the bit line voltage VBL for a memory cell MC in the resistance state RS4 becomes equal to or lower than the reference voltage VrefL. In the sense amplification circuit SA shown in FIGS. 10 to 13, processing that would be performed in association with the inverted sense signal /VDOL in the event of the bit line voltage VBL becoming equal to or lower than the reference voltage VrefL at time t14 and onward is rendered invalid by the "L" level control signal ValidHigh.

FIG. 19 is a timing chart for explaining an exemplary operation of the switch circuit 142 in the sense amplification circuit SA in the memory device 1 according to the embodiment. In FIG. 19, the horizontal axis represents time and the vertical axis represents a signal level.

As read from FIG. 19, the inverted sense signal /VDOH and the feedback signal /Omid are supplied to the AND gate 43 corresponding to the high-potential-side reference voltage VrefH. The inverted sense signal /VDOL and the control signal ValidHigh are supplied to the AND gate 44 corresponding to the low-potential-side reference voltage VrefL.

The feedback signal /Qmid in its initial state has a signal level "H". The control signal Validhigh in its initial state has a signal level "H".

With the bit line voltage VBL that is higher than the reference voltage VrefH, the sense signal VDOH has a signal level "H". With the bit line voltage VBL that is higher than the reference voltage VrefL, the sense signal VDOL has a signal level "H".

If, at time tsw1, the bit line voltage VBL is equal to or lower than the reference voltage VrefH and higher than the reference voltage VrefL, the signal level of the sense signal VDOH turns to the "L" level. Accordingly, the signal level of the inverted sense signal /VDOH turns from the "L" level to the "H" level.

The AND gate 43 sends an "H" level signal SigE to the OR gate 45 based on the "H" level inverted sense signal /VDOH and the "H" level feedback signal /Qmid.

Here, the signal level of the sense signal VDOL is kept at the "H" level at time tsw1. Accordingly, the signal level of the inverted sense signal /VDOL is kept at the "L" level. The AND gate 44 sends an "L" level signal SigF to the OR gate 45.

The "H" level signal SigE changes the signal level of the signal CLK of the OR gate 45 from an "L" level to an "H" level. Each of the judge circuits 143, in response to the change in the signal level of the signal CLK, takes in the "H" level signal CLK.

The judge circuits 143 each take the signal corresponding to the control signal Lgc into their own latch circuit (D-type flip-flop) 40.

For example, if, in the middle bit judge circuit 143M, a signal retained in the Q node of the D-type flip-flop 40M, i.e., the middle bit latch circuit 40M, is changed, a signal retained in the /Q node of the middle bit latch circuit (D-type flip-flop) 40M is also changed. This causes a change in the signal level of the feedback signal /Qmid.

For example, if the signal level of the feedback signal /Qmid is changed from the "H" level to the "L" level at time tsw2, the signal level of the signal SigE is changed from the "H" level to the "L" level. Accordingly, the signal level of the signal CLK turns from the "H" level to the "L" level following the changes in the signal levels of the feedback signal /Qmid and the signal SigE.

The OR gate 45 sends the "L" level signal to each of the judge circuits 143.

If, at time tsw3, the bit line voltage VBL is equal to or lower than the reference voltage VrefL, the signal level of the sense signal VDOL turns to the "L" level.

Accordingly, the signal level of the inverted sense signal /VDOL turns from the "L" level to the "H" level.

The AND gate 44 sends an "H" level signal SigF to the OR gate 45 based on the "H" level inverted sense signal /VDOL and the "H" level control signal ValidHigh. The AND gate 43 sends, for example, an "L" level signal SigE to the OR gate 45.

The "H" level signal SigF changes the signal level of the signal CLK of the OR gate 45 from the "L" level to the "H" level. Each of the judge circuits 143, in response to the change in the signal level of the signal CLK, takes in the "H" level signal CLK.

The judge circuits 143 each take the signal corresponding to the control signal Lgc into their own latch circuit (D-type flip-flop) 40.

The signal level of the control signal ValidHigh turns from the "H" level to the "L" level at time tsw4. Accordingly, the signal level of the signal SigF turns from the "H" level to the "L" level.

Accordingly, the signal level of the signal CLK output from the OR gate 45 turns from the "H" level to the "L" level. The OR gate 45 sends the "L" level signal CLK to each of the judge circuits 143.

The switch circuit 142 operates in the manner as described above in the sense amplification circuit SA.

As shown in FIG. 18, if, in the memory device 1 according to the embodiment, the bit line voltage VBL becomes equal to or lower than the reference voltage VrefH during the period T1 spanning from the sensing operation starting time t2 to time ta for a memory cell MC that is in a resistance state of one or more resistance states RX, data having a given data code is temporarily retained in the sense amplification circuit SA. In one example, such a given data code is a data code "010".

For example, in a case where a memory cell MC has the resistance state RS4 which is the fourth highest among the four resistance states RS4, RS5, RS6, and RS7 showing relatively high resistance states, the time ta corresponds to a time point at which the bit line voltage VBL of the bit line BL coupled with this memory cell MC in the resistance state RS4 becomes equal to or lower than the reference voltage VrefH during the sensing operation. Note that time ta serves the purpose as long as it is set between the time point at which the bit line voltage VBL for a memory cell MC in the resistance state RS4 becomes equal to or lower than the reference voltage VrefH, and the time point at which the bit line voltage VBL for a memory cell MC in the resistance state RS3 becomes equal to or lower than the reference voltage VrefH.

As seen from the above, in instances where the selected cell MC has the resistance state RX, i.e., one of the five resistance states RS0, RS1, RS2, RS3, and RS4 showing relatively low resistance values, data "010" is retained in the sense amplification circuit SA as tentative data.

<Reading of Data "101">

FIGS. 20 to 24 will be referred to for describing an operation of the sense amplification circuit SA for a memory cell (selected cell) MC that stores data "101". A memory cell MC that stores data "101" has the resistance state RS1.

FIG. 20 sets forth a timing chart of an operation of the sense amplification circuit SA in the memory device 1 according to the embodiment, in the instance of reading data "101". In FIG. 20, the horizontal axis represents time and the vertical axis represents the bit line voltage VBL and the signal levels of the respective control signals.

Each of FIGS. 21 to 24 is a schematic diagram showing a state of signal levels of the respective signals supplied to the sense amplification circuit SA at a given time in the memory device 1 according to the embodiment.

(Time t2)

At time t2, the sense amplification circuit SA initiates its operation for reading data. In the sense amplification circuit SA, the voltage sense circuit 141 senses the bit line voltage VBL.

As shown in FIG. 20, the bit line voltage VBL at time t2 is set to the voltage Vread.

The operation amplifier 41 compares the bit line voltage VBL with the reference voltage VrefH. The voltage Vread is higher than the reference voltage VrefH. Thus, the operation amplifier 41 outputs an "H" level sense signal VDOH.

The operation amplifier 42 compares the bit line voltage VBL with the reference voltage VrefL. The voltage Vread is higher than the reference voltage VrefL. Thus, the operation amplifier 42 outputs an "H" level sense signal VDOL.

At time t2, an "L" level inverted sense signal /VDOH and an "L" level inverted sense signal /VDOL are supplied to the switch circuit 142 in the sense amplification circuit SA.

In the switch circuit 142, the AND gate 43, which is on the reference voltage VrefH side, receives the inverted sense signal /VDOH and a feedback signal /Qmid. The AND gate 43 performs an AND operation of the inverted sense signal /VDOH and the feedback signal /Qmid.

The signal level of the feedback signal /Qmid depends on the signal retained in the middle bit latch circuit (D-type flip-flop) 40M in the middle bit judge circuit 143M. At time t2, the middle bit latch circuit (D-type flip-flop) 40M retains, as an initial value, an "L" level signal (data "0") in the Q node of the middle bit latch circuit (D-type flip-flop) 40M. The feedback signal /Qmid having the "H" level (data "1") is supplied to the AND gate 43.

As such, at time t2, the AND gate 43 performs an AND operation of the "L" level inverted sense signal /VDOH and the "H" level feedback signal /Qmid. Accordingly, the AND gate 43 outputs an "L" level signal SigE.

In the switch circuit 142, the AND gate 44, which is on the reference voltage VrefL side, receives the inverted sense signal /VDOL and a control signal ValidHigh. The AND gate 44 performs an AND operation of the inverted sense signal /VDOL and the control signal ValidHigh.

The control signal ValidHigh is set to an "H" level for the period from the start of the operation of the sense amplification circuit SA to time t14.

As such, at time t2, the AND gate 44 performs an AND operation of the "L" level inverted sense signal /VDOL and the "H" level control signal ValidHigh. Accordingly, the AND gate 44 outputs an "L" level signal SigF.

The OR gate 45 receives the signal SigE and the signal SigF. The OR gate 45 performs an OR operation of the "L" level signal SigE and the "L" level signal SigF. Accordingly, the OR gate 45 outputs an "L" level signal CLK.

In the lower bit judge circuit 143L, the multiplexer 49L outputs, according to a control signal Qmid, one of a control signal LgcVrefH(L) and a control signal LgcVrefL(L) which have been supplied.

The control signal Qmid corresponds to the signal retained in the Q node of the middle bit latch circuit (D-type flip-flop) 40M. Thus, at time t2, the signal Qmid having a signal level "L" which is an initial value is supplied as a control signal to the multiplexer 49L.

Accordingly, the multiplexer 49L outputs the control signal LgcVrefH(L), according to the "L" level control signal Qmid. At time t2, the control signal LgcVrefH(L) has a signal level "L" (data "0").

In the lower bit judge circuit 143L, the D-type flip-flop 40L, i.e., the lower bit latch circuit 40L, receives the signal CLK from the switch circuit 142 and also the control signal LgcVrefH(L) selected by the multiplexer 49L. The "L" level control signal LgcVrefH(L) from the multiplexer 49L is sent to the D node of the lower bit latch circuit (D-type flip-flop) 40L. The "L" level signal CLK from the switch circuit 142 is sent to the CLK node of the lower bit latch circuit (D-type flip-flop) 40L.

The lower bit latch circuit (D-type flip-flop) 40L does not take the "L" level signal CLK into the CLK node. Thus, the lower bit latch circuit (D-type flip-flop) 40L does not take the control signal LgcVrefH(L) into the D node. Accordingly, in the lower bit latch circuit (D-type flip-flop) 40L, the signal in the Q node and the signal in the /Q node are kept in their initial state.

In the middle bit judge circuit 143M, the multiplexer 49M outputs, according to the control signal Qmid, one of a control signal LgcVrefH(M) and a control signal LgcVrefL (M) which have been supplied. The signal Qmid having the signal level "L" is supplied as a control signal to the multiplexer 49M. Accordingly, the multiplexer 49M outputs the control signal LgcVrefH(M), according to the "L" level control signal Qmid. At time t2, the control signal LgcVrefH (M) has a signal level "H" (data "1").

In the middle bit judge circuit 143M, the D-type flip-flop 40M, i.e., the middle bit latch circuit 40M, receives the signal CLK from the switch circuit 142 and also the control signal LgcVrefH(M) selected by the multiplexer 49M.

The "H" level signal LgcVrefH(M) from the multiplexer 49M is sent to the D node of the middle bit latch circuit (D-type flip-flop) 40M. The "L" level signal CLK from the switch circuit 142 is sent to the CLK node of the middle bit latch circuit (D-type flip-flop) 40M.

The middle bit latch circuit (D-type flip-flop) 40M does not take the "L" level signal CLK into the CLK node. Thus, the middle bit latch circuit (D-type flip-flop) 40M does not take the control signal LgcVrefH(M) into the D node. Accordingly, in the middle bit latch circuit (D-type flip-flop) 40M, the signal in the Q node and the signal in the /Q node are kept in their initial state.

In the upper bit judge circuit 143U, the multiplexer 49U outputs, according to the control signal Qmid, one of a control signal LgcVrefH(U) and a control signal LgcVrefL (U) which have been supplied. The signal Qmid having the signal level "L" is supplied as a control signal to the multiplexer 49U.

Accordingly, the multiplexer 49U outputs the control signal LgcVrefH(U), according to the "L" level control signal Qmid. At time t2, the control signal LgcVrefH(U) has a signal level "L" (data "0").

In the upper bit judge circuit 143U, the D-type flip-flop 40U, i.e., the upper bit latch circuit 40U, receives the signal CLK from the switch circuit 142 and also the control signal LgcVrefH(U) selected by the multiplexer 49U.

The "H" level signal LgcVrefH(U) from the multiplexer 49U is sent to the D node of the upper bit latch circuit (D-type flip-flop) 40U. The "L" level signal CLK from the switch circuit 142 is sent to the CLK node of the upper bit latch circuit (D-type flip-flop) 40U.

The upper bit latch circuit (D-type flip-flop) 40U does not take the "L" level signal CLK into the CLK node. Thus, the upper bit latch circuit (D-type flip-flop) 40U does not take the control signal LgcVrefH(U) into the D node. Accordingly, in the upper bit latch circuit (D-type flip-flop) 40U, the signal in the Q node and the signal in the /Q node are kept in their initial state.

(Time tb1)

In the case where a selected cell MC stores data "101", the bit line voltage VBL becomes equal to or lower than the reference voltage VrefH at time tb1. Accordingly, in the voltage sense circuit 141, the signal level of the sense signal VDOH of the operation amplifier 41 turns from the "H" level to the "L" level. The operation amplifier 42 continues to output the "H" level sense signal VDOL.

As seen from FIG. 21, the switch circuit 142 receives the "H" level inverted sense signal /VDOH.

The AND gate 43 performs an AND operation of the "H" level inverted sense signal /VDOH and the "H" level feedback signal /Qmid. Accordingly, the AND gate 43 sends the "H" level signal SigE to the OR gate 45.

The AND gate 44 sends the "L" level signal SigF to the OR gate 45.

The OR gate 45 performs an OR operation of the "H" level signal SigE and the "L" level signal SigF. The OR gate 45 outputs the "H" level signal CLK. The signal level of the signal CLK turns from the "L" level to the "H" level.

In the lower bit judge circuit 143L, the lower bit latch circuit (D-type flip-flop) 40L takes the "H" level signal CLK from the switch circuit 142 into the CLK node. Thus, the lower bit latch circuit (D-type flip-flop) 40L takes the signal LgcVrefH(L) from the multiplexer 49L into the D node. At time tb1, the multiplexer 49L is outputting the "L" level control signal LgcVrefH(L) to the D node of the lower bit latch circuit (D-type flip-flop) 40L.

In the lower bit latch circuit (D-type flip-flop) 40L, the signal level of the Q node is set to a value according to the signal level of the signal taken into the D node. Accordingly, at time tb1, an "L" level signal is retained in the Q node of the lower bit latch circuit (D-type flip-flop) 40L for the lower bit.

In the middle bit judge circuit 143M, the middle bit latch circuit (D-type flip-flop) 40M takes the "H" level signal CLK from the switch circuit 142 into the CLK node. Thus, the middle bit latch circuit (D-type flip-flop) 40M takes the signal LgcVrefH(M) from the multiplexer 49M into the D node. At time tb1, the multiplexer 49M is outputting the "H" level control signal LgcVrefH(M) to the D node of the middle bit latch circuit (D-type flip-flop) 40M.

In the middle bit latch circuit (D-type flip-flop) 40M, the signal level of the Q node is set to a value according to the signal level of the signal taken into the D node. Accordingly, at time tb1, an "H" level signal is retained in the Q node of the middle bit latch circuit (D-type flip-flop) 40M for the middle bit.

In the upper bit judge circuit 143U, the upper bit latch circuit (D-type flip-flop) 40U takes the "H" level signal CLK from the switch circuit 142 into the CLK node. Thus, the upper bit latch circuit (D-type flip-flop) 40U takes the signal LgcVrefH(U) from the multiplexer 49U into the D node. At time tb1, the multiplexer 49U outputs the "L" level signal LgcVrefH(U) to the D node of the upper bit latch circuit (D-type flip-flop) 40U.

In the upper bit latch circuit (D-type flip-flop) 40U, the signal level of the Q node is set to a value according to the signal level of the signal taken into the D node. Accordingly, at time tb1, an "L" level signal is retained in the Q node of the upper bit latch circuit (D-type flip-flop) 40U for the upper bit.

In the manner as described above, tentative data is temporarily stored in each of the latch circuits (D-type flip-flops) 40 at time tb1. The lower bit latch circuit (D-type flip-flop) 40L temporarily retains data "0". The middle bit latch circuit (D-type flip-flop) 40M temporarily retains data "1". The upper bit latch circuit (D-type flip-flop) 40U temporarily retains data "0".

Therefore, the 3-bit data indicated by the three latch circuits (D-type flip-flops) 40 is data "010".

(Time tb2)

As shown in FIG. 22, the signal level of the feedback signal /Qmid turns from the "H" level to the "L" level at time tb2 according to the signal transition in the middle bit latch circuit (D-type flip-flop) 40M for the middle bit.

The AND gate 43 performs an AND operation of the "H" level inverted sense signal /VDOH and the "L" level feedback signal /Qmid.

The AND gate 43 outputs the "L" level signal SigE according to the signal level of the feedback signal /Qmid transitioning to the "L" level.

Accordingly, the signal level of the signal CLK of the OR gate 45 turns from the "H" level to the "L" level.

The "L" level signal CLK is sent to the CLK node of the latch circuit (D-type flip-flop) 40 in each of the judge circuits 143.

(Time t10)

At time t10, the sequencer 180 changes the signal level of the control signal LgcVrefL(M) from the "H" level to the "L" level.

As seen from the above, the middle bit latch circuit (D-type flip-flop) 40M sends the "H" level control signal Qmid to the multiplexer 49 in each of the judge circuits 143 at time tb2 and onward.

In the lower bit judge circuit 143L, the multiplexer 49L selects the control signal LgcVrefL(L) based on the "H" level control signal Qmid. In the middle bit judge circuit 143M, the multiplexer 49M selects the control signal LgcVrefL(M) based on the "H" level control signal Qmid. In the upper bit judge circuit 143U, the multiplexer 49U selects the control signal LgcVrefL(U) based on the "H" level control signal Qmid.

Upon the bit line voltage VBL becoming equal to or lower than the high-potential-side reference voltage VrefH, the control signal LgcVrefL corresponding to the low-potential-side reference voltage VrefL is temporarily selected. Note that the signal level of the control signal ValidHigh is kept at the "H" level at time t10.

(Time tb3)

At time tb3, the bit line voltage VBL becomes equal to or lower than the reference voltage VrefL. Accordingly, in the voltage sense circuit 141, the signal level of the sense signal VDOL of the operation amplifier 42 turns from the "H" level to the "L" level. The operation amplifier 41 continues to output the "L" level sense signal VDOH.

As seen from FIG. 23, the switch circuit 142 receives the "H" level inverted sense signal /VDOL.

The AND gate 44 performs an AND operation of the "H" level inverted sense signal /VDOL and the "H" level control signal ValidHigh. Accordingly, the AND gate 44 sends the "H" level signal SigF to the OR gate 45.

Note that the AND gate 43 sends the "L" level signal SigE to the OR gate 45 according to the AND operation of the "H" level inverted sense signal /VDOH and the "L" level feedback signal /Qmid.

The OR gate 45 performs an OR operation of the "L" level signal SigE and the "H" level signal SigF. The OR gate 45 outputs the "H" level signal CLK. Here, the signal level of the signal CLK turns from the "L" level to the "H" level.

In the lower bit judge circuit 143L, the lower bit latch circuit (D-type flip-flop) 40L takes the "H" level signal CLK from the switch circuit 142 into the CLK node. Thus, the lower bit latch circuit (D-type flip-flop) 40L takes the control signal LgcVrefL(L) from the multiplexer 49L into the D node. At time tb3, the multiplexer 49L is outputting the "H" level control signal LgcVrefL(L) to the D node of the lower bit latch circuit (D-type flip-flop) 40L.

In the lower bit latch circuit (D-type flip-flop) 40L, the signal level of the Q node is set to a value according to the signal level of the signal taken into the D node. Accordingly, an "H" level signal is retained in the Q node of the lower bit latch circuit (D-type flip-flop) 40L for the lower bit. Then, an "L" level signal, which is an inverted signal of the signal in the Q node, is retained in the /Q node of the lower bit latch circuit (D-type flip-flop) 40L.

In the middle bit judge circuit 143M, the middle bit latch circuit (D-type flip-flop) 40M takes the "H" level signal CLK from the switch circuit 142 into the CLK node. Thus, the middle bit latch circuit (D-type flip-flop) 40M takes the control signal LgcVrefL(M) from the multiplexer 49M into the D node. At time tb3, the multiplexer 49M is outputting the "L" level control signal LgcVrefL(M) to the D node of the middle bit latch circuit (D-type flip-flop) 40M.

In the middle bit latch circuit (D-type flip-flop) 40M, the signal level of the Q node is set to a value according to the signal level of the signal taken into the D node. Accordingly, an "L" level signal is retained in the Q node of the middle bit latch circuit (D-type flip-flop) 40M for the middle bit.

Then, an "H" level signal, which is an inverted signal of the signal in the Q node, is retained in the /Q node of the middle bit latch circuit (D-type flip-flop) 40M. Accordingly, the signal level of the feedback signal /Qmid turns from the "L" level to the "H" level.

In the upper bit judge circuit 143U, the upper bit latch circuit (D-type flip-flop) 40U takes the "H" level signal CLK from the switch circuit 142 into the CLK node. Thus, the upper bit latch circuit (D-type flip-flop) 40U takes the control signal LgcVrefL(U) from the multiplexer 49U into the D node. At time tb3, the multiplexer 49U is outputting the "H" level control signal LgcVrefL(U).

In the upper bit latch circuit (D-type flip-flop) 40U, the signal level of the Q node is set to a value according to the signal level of the signal taken into the D node. Accordingly, an "H" level signal is retained in the Q node of the upper bit latch circuit (D-type flip-flop) 40U for the upper bit. Then, an "L" level signal, which is an inverted signal of the signal in the Q node, is retained in the /Q node of the upper bit latch circuit (D-type flip-flop) 40U.

In the manner as described above, at time tb3, the data in each of the latch circuits (D-type flip-flops) 40 is changed from the tentative data to the data that corresponds to the sense result for the bit line voltage VBL. The lower bit latch circuit (D-type flip-flop) 40L temporarily retains data "1". The middle bit latch circuit (D-type flip-flop) 40M retains data "0". The upper bit latch circuit (D-type flip-flop) 40U retains data "1".

The 3-bit data indicated by the three latch circuits (D-type flip-flops) 40 is data "101".

In this manner, data "010", which has been temporarily stored, is changed to data "101".

(Time t14)

At predetermined timings, i.e., times t11, t12, and t13, the sequencer 180 changes the signal levels of the respective control signals LgcVrefH(L), LgcVrefL(L), LgcVrefH(M), and LgcVrefL(M).

At time t14, the sequencer 180 changes the signal level of the control signal ValidHigh from the "H" level to the "L" level.

As seen from FIG. 24, the switch circuit 142 receives the "L" level control signal ValidHigh. Note that, at time tb3 and onward, the sense signal VDOH and the sense signal VDOL each have the sense signal level "L".

The AND gate 44 performs an AND operation of the "H" level inverted sense signal /VDOL and the "L" level control signal ValidHigh. Accordingly, the AND gate 44 sends the "L" level signal SigF to the OR gate 45.

The AND gate 43 performs an AND operation of the "H" level inverted sense signal /VDOH and the feedback signal /Qmid. Here, supposing that the middle bit latch circuit (D-type flip-flop) 40M stores data "0" (that is, an "L" level signal), the AND gate 43 is receiving a supply of the "H" level signal /Qmid at time tb3 and onward.

As such, the AND gate 43 is sending the "H" level signal SigE to the OR gate 45 at time tb3 and onward.

Thus, the OR gate 45 continues to output the "H" level signal CLK at time tb3 and onward.

Accordingly, even in the event that the signal level of the control signal ValidHigh transitions from the "H" level to the "L" level, the signal CLK output from the switch circuit 142 at time tb3 and onward is kept at the "H" level.

This means that a change in the signal level of the control signal ValidHigh does not cause a signal level transition of the signal CLK, and therefore, a data change in each latch circuit (D-type flip-flop) is not entailed.

As a result, the 3-bit data indicated by the three latch circuits (D-type flip-flops) 40 is settled at data "101".

After that, at time t15, the sequencer 180 changes the signal level of the control signal LgcVrefH(L).

At time t3, the sense amplification circuit SA terminates the sensing operation.

The sense amplification circuit SA sends the data in the latch circuits (D-type flip-flops) 40 to the data register 150.

This finishes the read operation of the memory device 1 according to the embodiment.

In the manner as described above, data "101" is read from the selected cell MC through the sensing operation by the sense amplification circuit SA shown in FIGS. 10 to 13.

<Reading of Data "011">

FIGS. 25 to 30 will be referred to for describing an operation of the sense amplification circuit SA for a memory cell (selected cell) MC that stores data "011". A memory cell MC that stores data "011" has the resistance state RS5.

FIG. 25 sets forth a timing chart of an operation of the sense amplification circuit SA in the memory device 1 according to the embodiment, in the instance of reading data "011". In FIG. 25, the horizontal axis represents time and the vertical axis represents the bit line voltage VBL and the signal levels of the respective control signals.

Each of FIGS. 26 to 30 is a schematic diagram showing a state of signal levels of the respective signals supplied to the sense amplification circuit SA at a given time in the memory device 1 according to the embodiment.

(Time t2)

At time t2, the sense amplification circuit SA initiates its operation for reading data.

As described above, the voltage sense circuit 141 senses the bit line voltage VBL. The operation amplifier 41 outputs an "H" level sense signal VDOH. The operation amplifier 42 outputs an "H" level sense signal VDOL. An "L" level inverted sense signal /VDOH and an "L" level inverted sense signal /VDOL are supplied to the switch circuit 142.

In the switch circuit 142, the AND gate 43 performs an AND operation of the "L" level inverted sense signal /VDOH and the "H" level feedback signal /Qmid. The AND gate 43 outputs an "L" level signal SigE.

In the switch circuit 142, the AND gate 44 performs an AND operation of the "L" level inverted sense signal /VDOL and the "H" level control signal ValidHigh. The AND gate 44 outputs an "L" level signal SigF.

The OR gate 45 outputs an "L" level signal CLK according to the OR operation of the "L" level signal SigE and the "L" level signal SigF.

In each of the judge circuits 143, the D-type flip-flop 40, i.e., the latch circuit 40, does not take the "L" level signal CLK into the CLK node. Thus, each latch circuit (D-type flip-flop) 40 does not take the control signal Lgc into the D node.

(Times t10 and t11)

At times t10 and t11, the sequencer 180 changes the signal levels of the control signals LgcVrefL and LgcVrefH to predetermined signal levels.

At a given time point between time t2 and time t11, the control signal LgcVrefH(L) has a signal level "L" (data "0"), the control signal LgcVrefH(M) has a signal level "H" (data "1"), and the control signal LgcVrefH(U) has a signal level "L" (data "0").

In the case where a memory cell MC stores data "011", the bit line voltage VBL at a given time point before time t11 is higher than the reference voltage VrefH and the reference voltage VrefL. Accordingly, the voltage sense circuit 141 continues to output the "H" level sense signal VDOH and the "H" level sense signal VDOL.

As seen from FIG. 26, the switch circuit 142 receives the "L" level inverted sense signals /VDOH and /VDOL. Accordingly, the switch circuit 142 outputs the "L" level signal CLK to each of the judge circuits 143.

Thus, the latch circuit (D-type flip-flop) 40 in each judge circuit 143 does not take in the data. As such, the latch circuit (D-type flip-flop) 40 is kept in the initial state.

This means that data "010" which serves as tentative data is not taken into the judge circuits 143.

(Time tc1)

The sequencer 180 at time t12 controls each of the signal levels of the control signals LgcVrefH(L), LgcVrefH(M), and LgcVrefH(U). Here, the control signals LgcVrefH(L), LgcVrefH(M), and LgcVrefH(U) at time t12 have the following signal levels. The control signal LgcVrefH(L) has a signal level "H". The control signal LgcVrefH(M) has a signal level "H". The control signal LgcVrefH(U) has a signal level "L".

At time tc1 after the time t12, the bit line voltage VBL becomes equal to or lower than the reference voltage VrefH. Thus, the operation amplifier 41 outputs the "L" level sense signal VDOH.

The bit line voltage VBL is higher than the reference voltage VrefL. Thus, the operation amplifier 42 outputs the "H" level sense signal VDOL.

As seen from FIG. 27, the switch circuit 142 receives the "H" level inverted sense signal /VDOH and the "L" level inverted sense signal /VDOL.

The AND gate 43 performs an AND operation of the "H" level inverted sense signal /VDOH and the "H" level feedback signal /Qmid. Accordingly, the AND gate 43 sends the "H" level signal SigE to the OR gate 45.

The AND gate 44 outputs the "L" level signal SigF.

The OR gate 45 performs an OR operation of the "H" level signal SigE and the "L" level signal SigF. The OR gate 45 outputs the "H" level signal CLK. Here, the signal level of the signal CLK turns from the "L" level to the "H" level.

In the lower bit judge circuit 143L, the lower bit latch circuit (D-type flip-flop) 40L for the lower bit takes the "H" level signal CLK from the switch circuit 142 into the CLK node. Thus, the lower bit latch circuit (D-type flip-flop) 40L takes, into the D node, the "H" level signal LgcVrefH(L) selected by the multiplexer 49L.

In the lower bit latch circuit (D-type flip-flop) 40L, the signal level of the Q node is set to the "H" level according to the signal level of the signal taken into the D node.

In the middle bit judge circuit 143M, the middle bit latch circuit (D-type flip-flop) 40M for the middle bit takes the "H" level signal CLK into the CLK node. Thus, the middle bit latch circuit (D-type flip-flop) 40M takes, into the D node, the "H" level signal LgcVrefH(M) selected by the multiplexer 49M.

In the middle bit latch circuit (D-type flip-flop) 40M, the signal level of the Q node is set to the "H" level according to the signal level of the signal taken into the D node.

In the upper bit judge circuit 143U, the upper bit latch circuit (D-type flip-flop) 40U for the upper bit takes the "H" level signal CLK into the CLK node. Thus, the upper bit latch circuit (D-type flip-flop) 40U takes, into the D node, the "L" level signal LgcVrefH(U) selected by the multiplexer 49U.

In the upper bit latch circuit (D-type flip-flop) 40U, the signal level of the Q node is set to the "L" level according to the signal level of the signal taken into the D node.

As a result, the latch circuits (D-type flip-flops) 40 at time tc1 retain data as follows. The lower bit latch circuit (D-type flip-flop) 40L retains data "1". The middle bit latch circuit (D-type flip-flop) 40M retains data "1". The upper bit latch circuit (D-type flip-flop) 40U retains data "0".

Therefore, the 3-bit data indicated by the three latch circuits (D-type flip-flops) 40 is data "011".
(Time tc2)

The signal level of the /Q node of the D-type flip-flop 40M, i.e., the middle bit latch circuit 40M, turns from the "H" level to the "L" level according to the internal signal transition in the latch circuit (D-type flip-flop) 40.

Accordingly, the signal level of the feedback signal /Qmid turns from the "H" level to the "L" level at time tc2.

As shown in FIG. 28, the AND gate 43 sends the "L" level signal SigE to the OR gate 45 according to the AND operation of the "H" level inverted sense signal /VDOH and the "L" level feedback signal /Qmid.

The AND gate 44 sends the "L" level signal SigF to the OR gate 45.

Accordingly, the OR gate 45 outputs the "L" level signal CLK. The signal level of the signal CLK turns from the "H" level to the "L" level.
(Time t14)

As described above, the sequencer 180 changes the signal levels of the respective control signals LgcVrefL and LgcVrefH at predetermined timings (times t11, t12, and t13).

At time t14, the sequencer 180 changes the signal level of the control signal ValidHigh from the "H" level to the "L" level.

Figure 29:
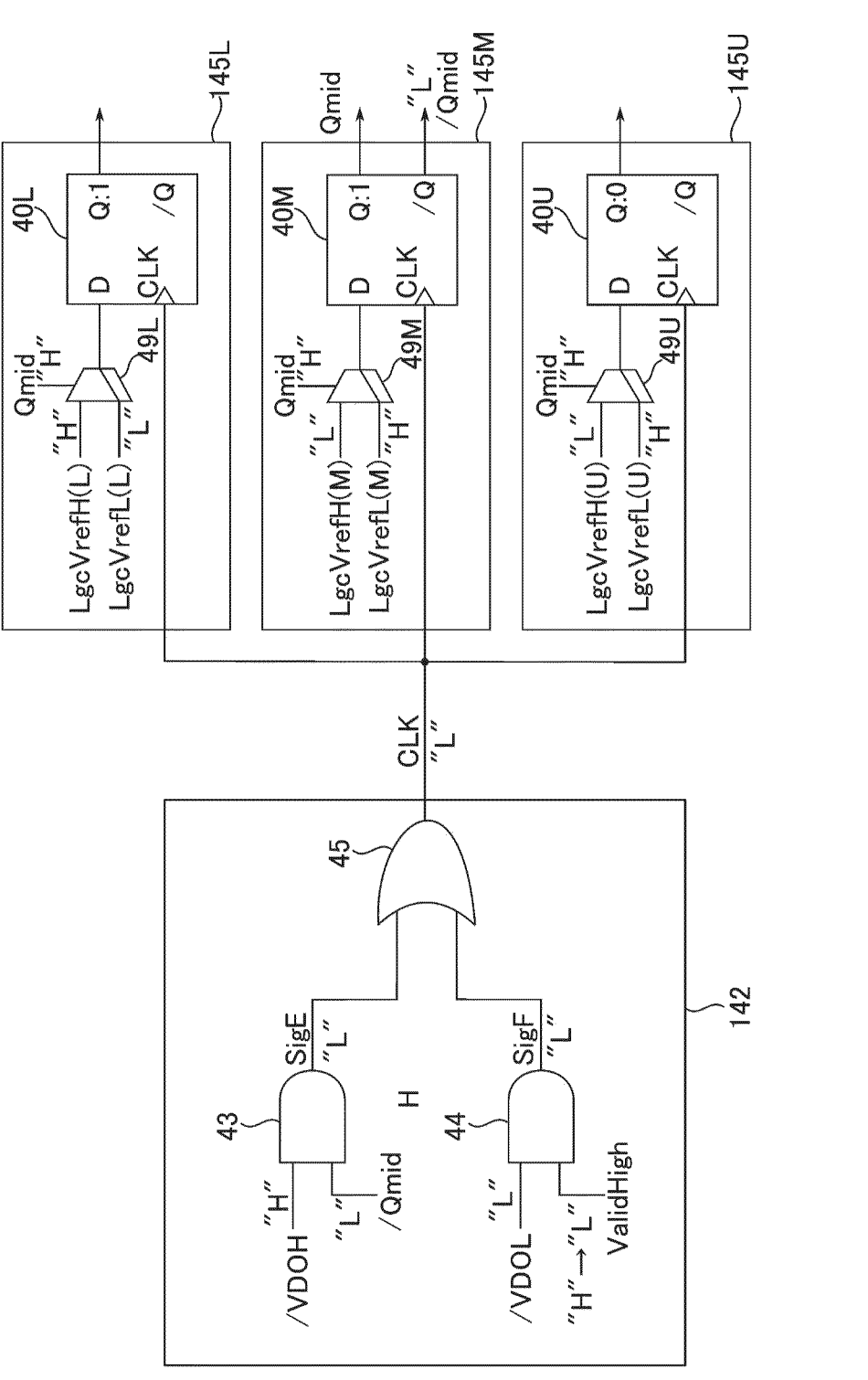
FIG. 29 is a schematic diagram illustrating a state of the sense amplification circuit in operation in the memory device according to the first embodiment.

As seen from FIG. 29, the switch circuit 142 receives the "L" level control signal ValidHigh.

The AND gate 44 performs an AND operation of the "L" level inverted sense signal /VDOL and the "L" level control signal ValidHigh. Accordingly, the AND gate 44 sends the "L" level signal SigF to the OR gate 45.

Note that the AND gate 43 sends the "L" level signal SigE to the OR gate 45 according to the AND operation of the "H" level inverted sense signal /VDOH and the "L" level feedback signal /Qmid.

The OR gate 45 outputs the "L" level signal CLK according to the OR operation of the "L" level signal SigE and the "L" level signal SigF.

Therefore, even in the event that the signal level of the control signal ValidHigh transitions from the "H" level to the "L" level, the signal level of the signal CLK is kept at the "L" level.

This means that a transition of the signal level of the control signal ValidHigh from the "H" level to the "L" level does not cause a change in the data retained in each of the latch circuits (D-type flip-flops) 40.
(Time tc3)

At time tc3 after the time t14, the bit line voltage VBL becomes equal to or lower than the reference voltage VrefL.

The operation amplifier 42 outputs the "L" level sense signal VDOL.

As seen from FIG. 30, the AND gate 44 in the switch circuit 142 receives the "H" level inverted sense signal /VDOL.

The AND gate 44 sends the "L" level signal SigF to the OR gate 45 according to the AND operation of the "H" level inverted sense signal /VDOL and the "L" level control signal ValidHigh.

The AND gate 43, as in the operation described above, sends the "L" level signal SigE to the OR gate 45.

The OR gate 45 outputs the "L" level signal CLK according to the OR operation of the "L" level signal SigE and the "L" level signal SigF. Accordingly, the signal level of the signal CLK is kept at the "L" level. As such, a change in the data retained in each of the latch circuits (D-type flip-flops) 40 is not entailed.

As a result, the 3-bit data indicated by the three latch circuits (D-type flip-flops) 40 is maintained to be data "011".

At time t3, the sense amplification circuit SA terminates the sensing operation.

The sense amplification circuit SA sends the data in the latch circuits (D-type flip-flops) 40 to the data register 150.

This finishes the read operation of the memory device 1 according to the embodiment.

In the manner as described above, data "011" is read from the selected cell MC through the sensing operation by the sense amplification circuit SA shown in FIGS. 10 to 13.

(c) In Sum

The memory device 1 according to the first embodiment reads, using the high-potential-side reference voltage VrefH and the low-potential-side reference voltage VrefL, 3-bit data stored in one memory cell.

In the memory device 1 according to the first embodiment, the sense amplification circuit SA temporarily stores tentative data in response to the bit line voltage VBL becoming equal to or lower than the high-potential-side reference voltage VrefH during a given period T1 from the start of the data read operation.

Once the bit line voltage VBL becomes equal to or lower than the low-potential-side reference voltage VrefL within the range where a sensing operation with this reference voltage VrefL is valid, the memory device 1 according to the first embodiment rewrites the tentative data into data obtained from the memory cell through the sensing operation with the reference voltage VrefL.

Therefore, the memory device 1 according to the first embodiment is capable of avoiding short-term signal level transitions of various control signals.

This allows the memory device 1 according to the first embodiment to secure relatively wide sensing margins. Consequently, the memory device 1 according to the first embodiment can enhance reliability in read operations.

With the configurations and operations described above, the memory device 1 according to the first embodiment can accelerate read operations.

From the foregoing, the memory device 1 according to the first embodiment can realize improved characteristics in read operations.

(2) Second Embodiment

FIGS. 31 to 46 will be referred to for describing a memory device according to the second embodiment.

(a) Configurations

<Relationship Between Resistance State of Memory Cell and Data>

FIG. 31 is a diagram illustrating a relationship between the resistance state of a memory cell and data in the memory device 1 according to the embodiment.

As shown in FIG. 31, each memory cell MC in the memory device 1 according to the embodiment stores 3-bit data according to the resistance state of the memory cell MC.

The memory cell MC in the resistance state RS0, which has the lowest resistance value, stores data "000". The memory cell MC in the resistance state RS1, which has the second lowest resistance value, stores data "001". The memory cell MC in the resistance state RS2, which has the third lowest resistance value, stores data "010". The memory cell MC in the resistance state RS3, which has the fourth lowest resistance value, stores data "011".

The memory cell MC in the resistance state RS4, which has the fourth highest resistance value, stores data "100". The memory cell MC in the resistance state RS5, which has the third highest resistance value, stores data "101". The memory cell MC in the resistance state RS6, which has the second highest resistance value, stores data "110". The memory cell MC in the resistance state RS7, which has the highest resistance value, stores data "111".

In the context of the embodiment, data "0" is associated with the upper bits in the four resistance states RS0, RS1, RS2, and RS3 showing relatively low resistance values among the eight resistance states. Data "1" is associated with the upper bits in the four resistance states RS4, RS5, RS6, and RS7 showing relatively high resistance values among the eight resistance states.

<Exemplary Configuration of Sense Amplification Circuit SA>

FIG. 32 is a diagram showing an exemplary configuration of a sense amplification circuit SA in the memory device 1 according to the embodiment.

The sense amplification circuit SA shown in FIG. 32 includes a voltage sense circuit 141 and a data judge circuit 145. The data judge circuit 145 includes an upper bit judge circuit 500 and a lower-middle bit judge circuit 501.

The voltage sense circuit 141 includes operation amplifiers 41 and 42.

One input node of the operation amplifier 41 receives the bit line voltage VBL. Another input node of the operation amplifier 41 receives the reference voltage VrefH. An output node of the operation amplifier 41 is connected to the upper bit judge circuit 500 and the lower-middle bit judge circuit 501 in the data judge circuit 145.

The operation amplifier 41 performs a calculation (comparison) as to whether or not the bit line voltage VBL is higher than the reference voltage VrefH. The operation amplifier 41 sends the sense signal VDOH to the data judge circuit 145.

One input node of the operation amplifier 42 receives the bit line voltage VBL. Another input node of the operation amplifier 42 receives the reference voltage VrefL. An output node of the operation amplifier 42 is connected to the lower-middle bit judge circuit 501 in the data judge circuit 145.

The operation amplifier 42 performs a calculation (comparison) as to whether or not the bit line voltage VBL is higher than the reference voltage VrefL. The operation amplifier 42 sends the sense signal VDOL to the data judge circuit 145.

The upper bit judge circuit 500 performs a judging process for the upper bit included in 3-bit data. The upper bit judge circuit 500 includes an OR gate (logic operation circuit) 51 and an upper bit latch circuit (data retaining circuit) 52.

The OR gate 51 includes two input nodes and one output node.

One of the input nodes of the OR gate 51 is connected to the output node of the operation amplifier 41. This input node of the OR gate 51 receives the signal VDOH. The other input node of the OR gate 51 receives the control signal (timing signal) ValidHigh. The output node of the OR gate 51 is connected to the upper bit latch circuit 52.

The OR gate 51 performs an OR operation of the sense signal VDOH and the control signal ValidHigh. The OR gate 51 sends a signal SigA indicating the result of the OR operation to the upper bit latch circuit 52.

The control signal ValidHigh is a timing signal for use in judging the value of the upper bit. As one example, in response to the bit line voltage VBL becoming equal to or lower than the reference voltage VrefH in a period during which the control signal ValidHigh has a signal level "L", it is judged that the upper bit of 3-bit data stored in a memory cell MC has a value "0". If the bit line voltage VBL is higher than the reference voltage VrefH in the period during which the control signal ValidHigh has the signal level "L", the value of the upper bit of 3-bit data stored in a memory cell MC is judged to be "1". In one example, the control signal ValidHigh can indicate the period where the result of sensing with the reference voltage VrefL is valid (or invalid).

The upper bit latch circuit 52 includes a D-type flip-flop 52. The D-type flip-flop 52 includes two input nodes and two output nodes.

One of the input nodes (D node) of the upper bit latch circuit (D-type flip-flop) 52 receives a voltage (e.g., power source voltage) VDD. The other input node (CLK node) of the upper bit latch circuit (D-type flip-flop) 52 is connected to the output node of the OR gate 51. The CLK node of the upper bit latch circuit (D-type flip-flop) 52 receives the signal SigA from the OR gate 51. The CLK node of the upper bit latch circuit (D-type flip-flop) 52 is an inverting input node. The upper bit latch circuit (D-type flip-flop) 52 takes in the voltage (signal) VDD supplied to the D node according to a falling edge of the signal SigA.

One of the output nodes (/Q node) of the upper bit latch circuit (D-type flip-flop) 52 outputs an inverted signal of the signal (i.e., a signal in the other output node (Q node)) retained in the upper bit latch circuit (D-type flip-flop) 52. The /Q node of the upper bit latch circuit (D-type flip-flop) 52 is connected to a multiplexer 55 in the lower-middle bit judge circuit 501. A signal DoutPre output from this /Q node is supplied to the multiplexer 55 as a control signal (select signal).

The output signal from the /Q node of the upper bit latch circuit (D-type flip-flop) 52 serves as the upper bit of 3-bit data.

The other output node (Q node) of the upper bit latch circuit (D-type flip-flop) 52 is not connected to other components.

In one example, the D-type flip-flop 52 constituting the upper bit latch circuit 52 includes a reset node. The reset node of the upper bit latch circuit (D-type flip-flop) 52 receives a reset pulse. The upper bit latch circuit (D-type flip-flop) 52 is reset by the reset pulse. Resetting turns the upper bit latch circuit (D-type flip-flop) 52 into an initial state. The upper bit latch circuit (D-type flip-flop) 52 retains an "L" level signal (data "0") in the Q node in its initial state at the start of a read operation. In this case, the upper bit latch circuit (D-type flip-flop) 52 retains an "H" level signal (data "1") in the /Q node which is complementary to the Q node.

The lower-middle bit judge circuit 501 performs a judging process for the lower bit and the middle bit included in 3-bit data. The lower-middle bit judge circuit 501 includes two OR gates (logic operation circuits) 53 and 54, the aforementioned multiplexer (selecting circuit) 55, a lower bit latch circuit (data retaining circuit) 56, a middle bit latch circuit (data retaining circuit) 57, and inverters (NOT gates) 59H and 59L.

The OR gate 53 includes two input nodes and one output node.

The one input nodes of the OR gate 53 is connected to the output node of the operation amplifier 41 via the inverter 59H. This input node of the OR gate 53 receives a signal /VDOH which is an inverted signal (inverted sense signal) of the sense signal VDOH. The other input node of the OR gate 53 receives a control signal (timing signal) CLKH. The output node of the OR gate 53 is connected to the multiplexer 55.

The OR gate 53 performs an OR operation of the inverted sense signal /VDOH and the control signal CLKH. The OR gate 53 sends a signal SigB indicating the result of the OR operation to the multiplexer 55.

The OR gate 54 includes two input nodes and one output node.

One of the input nodes of the OR gate 54 is connected to the output node of the operation amplifier 42 via the inverter 59L. This input node of the OR gate 54 receives a signal /VDOL which is an inverted signal (inverted sense signal) of the sense signal VDOL. The other input node of the OR gate 54 receives a control signal (timing signal) CLKL. The output node of the OR gate 54 is connected to the multiplexer 55.

The OR gate 54 performs an OR operation of the inverted sense signal /VDOL and the control signal CLKL. The OR gate 54 sends a signal SigC indicating the result of the OR operation to the multiplexer 55.

The multiplexer 55 includes two input nodes, one output node, and one control node.

One of the input nodes of the multiplexer 55 is connected to the output node of the OR gate 53. This input node of the multiplexer 55 receives the signal SigB output from the OR gate 53. The other input node of the multiplexer 55 is connected to the output node of the OR gate 54. The other input node of the multiplexer 55 receives the signal SigC output from the OR gate 54.

The control node of the multiplexer 55 is connected to the /Q node of the D-type flip-flop 52, i.e., the upper bit latch circuit 52. The multiplexer 55 receives the signal (upper bit) DoutPre output from the upper bit latch circuit (D-type flip-flop) 52 as a control signal. In instances where the control signal DoutPre has a signal level "H" (data "1"), the multiplexer 55 selects the signal SigB. In instances where the control signal DoutPre has a signal level "L" (data "0"), the multiplexer 55 selects the signal SigC.

The output node of the multiplexer 55 is connected to the lower bit latch circuit 56. The output node of the multiplexer 55 outputs, as a signal Mout, one of the signal SigB and the signal SigC to the lower bit latch circuit 56 according to the signal level of the control signal DoutPre.

The lower bit latch circuit 56 includes a D-type flip-flop 56. The D-type flip-flop 56 constituting the lower bit latch circuit 56 includes two input nodes and two output nodes.

One of the input nodes (D node) of the lower bit latch circuit (D-type flip-flop) 56 is connected to one of the output nodes (/Q node) of the lower bit latch circuit (D-type flip-flop) 56 itself. The D node of the lower bit latch circuit (D-type flip-flop) 56 receives a feedback signal from the /Q node of the lower bit latch circuit (D-type flip-flop) 56.

The other input node (CLK node) of the lower bit latch circuit (D-type flip-flop) 56 is connected to the output node of the multiplexer 55. The CLK node of the lower bit latch circuit (D-type flip-flop) 56 receives the output signal (signal SigA or signal SigB) from the multiplexer 55. The CLK node of the lower bit latch circuit (D-type flip-flop) 56 is an inverting input node. The lower bit latch circuit (D-type flip-flop) 56 takes in the signal supplied to the D node according to a falling edge of the output signal from the multiplexer 55.

One of the output nodes (/Q node) of the lower bit latch circuit (D-type flip-flop) 56 is connected the D node of the lower bit latch circuit (D-type flip-flop) 56 itself. The /Q node of the lower bit latch circuit (D-type flip-flop) 56 sends an inverted signal of the signal retained in the other output node (Q node) of the lower bit latch circuit (D-type flip-flop) 56.

The other output node (Q node) of the lower bit latch circuit (D-type flip-flop) 56 is connected to the middle bit latch circuit 57. The Q node of the lower bit latch circuit (D-type flip-flop) 56 sends the signal retained in this Q node of the lower bit latch circuit (D-type flip-flop) 56 to the middle bit latch circuit 57.

The output signal from the Q node of the lower bit latch circuit (D-type flip-flop) 56 serves as the lower bit of 3-bit data.

In one example, the D-type flip-flop 56 constituting the lower bit latch circuit 56 includes a reset node. The reset node of the lower bit latch circuit (D-type flip-flop) 56 receives a reset pulse. The lower bit latch circuit (D-type flip-flop) 56 is reset by the reset pulse. Resetting turns the lower bit latch circuit (D-type flip-flop) 56 into an initial state. The lower bit latch circuit (D-type flip-flop) 56 retains an "L" level signal (data "0") in the Q node in its initial state at the start of a read operation. Here, the lower bit latch circuit (D-type flip-flop) 56 retains an "H" level signal (data "1") in the /Q node which is complementary to the Q node.

The middle bit latch circuit 57 includes a D-type flip-flop 57. The D-type flip-flop 57 includes two input nodes and two output nodes.

One of the input nodes (D node) of the middle bit latch circuit (D-type flip-flop) 57 is connected to one of the output nodes (/Q node) of the middle bit latch circuit (D-type flip-flop) 57 itself. The D node of the middle bit latch circuit (D-type flip-flop) 57 receives a feedback signal from the /Q node of the middle bit latch circuit (D-type flip-flop) 57.

The other input node (CLK node) of the middle bit latch circuit (D-type flip-flop) 57 is connected to the Q node of the D-type flip-flop (lower bit latch circuit) 56. The Q node of the middle bit latch circuit (D-type flip-flop) 57 is an inverting input node. The CLK node of the middle bit latch circuit (D-type flip-flop) 57 receives the output signal (lower bit) from the lower bit latch circuit (D-type flip-flop) 56. The middle bit latch circuit (D-type flip-flop) 57 takes in the signal supplied to the D node of the D-type flip-flop 57 according to the output signal from the lower bit latch circuit (D-type flip-flop) 56.

One of the output nodes (/Q node) of the middle bit latch circuit (D-type flip-flop) 57 is connected the D node of the middle bit latch circuit (D-type flip-flop) 57 itself. The /Q node of the middle bit latch circuit (D-type flip-flop) 57 sends an inverted signal of the signal retained in the other output node (Q node) of the middle bit latch circuit (D-type flip-flop) 57.

The other output node (Q node) of the middle bit latch circuit (D-type flip-flop) 57 outputs the signal retained in this Q node of the middle bit latch circuit (D-type flip-flop) 57.

The output signal from the Q node of the middle bit latch circuit (D-type flip-flop) 57 serves as the middle bit of 3-bit data.

In one example, the D-type flip-flop 57 constituting the middle bit latch circuit 57 includes a reset node. The reset node of the middle bit latch circuit (D-type flip-flop) 57 receives a reset pulse. The middle bit latch circuit (D-type flip-flop) 57 is reset by the reset pulse. Resetting turns the middle bit latch circuit (D-type flip-flop) 57 into an initial state. The middle bit latch circuit (D-type flip-flop) 57 retains an "L" level signal (data "0") in the Q node in its initial state at the start of a read operation. Here, the middle bit latch circuit (D-type flip-flop) 57 retains an "H" level signal (data "1") in the /Q node which is complementary to the Q node.

The lower bit latch circuit (D-type flip-flop) 56 and the middle bit latch circuit (D-type flip-flop) 57 form a 2-bit counter. The signal retained in the middle bit latch circuit (D-type flip-flop) 57 changes according to the signal latch operation of the lower bit latch circuit (D-type flip-flop) 56.

The 3-bit data acquired by the sense amplification circuit SA shown in FIG. 32 is sent to the data register 150.

FIG. 33 is a waveform chart showing various control signals supplied to the sense amplification circuit SA in the memory device 1 according to the embodiment. FIG. 33 also shows the temporal change in the resistance value of each memory cell MC.

The control signal CLKH and the control signal CLKL each have a signal level "H" at time t2.

The signal level of the control signal CLKH is controlled so as to turn from the "H" level to an "L" level at time t52, time t53, and time t54. As such, the change in the signal level of the control signal CLKH from the "H" level to the "L" level occurs three times.

The signal level of the control signal CLKH becomes the "H" level upon elapse of a given period of time after it changed to the "L" level.

The signal level of the control signal CLKL is controlled so as to turn from the "H" level to an "L" level at time t51, time t52, and time t53. As such, the change in the signal level of the control signal CLKL from the "H" level to the "L" level occurs three times.

The signal level of the control signal CLKL becomes the "H" level upon elapse of a given period of time after it changed to the "L" level.

The first change of the control signal CLKL from the "H" level to the "L" level is set to the timing (time t51) which is prior to the timing at which the first change of the control signal CLKH from the "H" level to the "L" level occurs.

In one example, the timing of the first "H" to "L" level change of the control signal CLKL is set between the time point at which the bit line voltage VBL for a memory cell MC in the resistance state RS0 becomes equal to or lower than the reference voltage VrefL, and the time point at which the bit line voltage VBL for a memory cell MC in the resistance state RS1 becomes equal to or lower than the reference voltage VrefL.

The timing (time t52) of the first "H" to "L" level change of the control signal CLKH is aligned with the timing of the second "H" to "L" level change of the control signal CLKL.

In one example, the timing of the first "H" to "L" level change of the control signal CLKH is set between the time point at which the bit line voltage VBL for a memory cell MC in the resistance state RS4 becomes equal to or lower than the reference voltage VrefH, and the time point at which the bit line voltage VBL for a memory cell MC in the resistance state RS5 becomes equal to or lower than the reference voltage VrefH.

In one example, the timing of the second "H" to "L" level change of the control signal CLKL is set between the time point at which the bit line voltage VBL for a memory cell MC in the resistance state RS1 becomes equal to or lower than the reference voltage VrefL, and the time point at which the bit line voltage VBL for a memory cell MC in the resistance state RS2 becomes equal to or lower than the reference voltage VrefL.

The timing (time t53) of the second "H" to "L" level change of the control signal CLKH is aligned with the timing of the third "H" to "L" level change of the control signal CLKL.

In one example, the timing of the second "H" to "L" level change of the control signal CLKH is set between the time point at which the bit line voltage VBL for a memory cell MC in the resistance state RS5 becomes equal to or lower than the reference voltage VrefH, and the time point at which the bit line voltage VBL for a memory cell MC in the resistance state RS6 becomes equal to or lower than the reference voltage VrefH.

In one example, the timing of the third "H" to "L" level change of the control signal CLKL is set between the time point at which the bit line voltage VBL for a memory cell MC in the resistance state RS2 becomes equal to or lower than the reference voltage VrefL, and the time point at which the bit line voltage VBL for a memory cell MC in the resistance state RS3 becomes equal to or lower than the reference voltage VrefL.

The third "H" to "L" level change of the control signal CLKH is set to the timing (time t54) which is after the timing (time t53) of the third "H" to "L" level change of the control signal CLKL.

In one example, the timing of the third "H" to "L" level change of the control signal CLKH is set between the time point at which the bit line voltage VBL for a memory cell MC in the resistance state RS6 becomes equal to or lower than the reference voltage VrefH, and the time point at which the bit line voltage VBL for a memory cell MC in the resistance state RS7 becomes equal to or lower than the reference voltage VrefH.

The control signal ValidHigh is controlled so as to turn from the "L" level to an "H" level at time t51. The timing of the "L" to "H" level change of the control signal ValidHigh is aligned with the timing of the first "H" to "L" level change of the control signal CLKL.

The signal DoutPre, in one example, changes its signal level from the "H" level to the "L" level in response to the bit line voltage VBL becoming equal to or lower than the high-potential-side reference voltage VrefH in the period during which the control signal ValidHigh has the signal level "L".

With each of the control signals CLKH, CLKL, and ValidHigh as described above, the sense amplification circuit SA acquires data stored in the memory cell MC.

(b) Operations

FIGS. 34 to 46 will be referred to for describing exemplary operations of the memory device 1 according to the embodiment.

As in the foregoing embodiment, the memory device 1 according to this embodiment performs its read operation in response to a read command.

At the read operation, the sequencer 180 sets the sense amplification circuit to an initial state.

The sequencer 180 sets, as the initial values, the signal level of the Q node of each of the D-type flip-flops 52, 56, and 57, i.e., the latch circuits 52, 56, and 57, in the sense amplification circuit SA to the "L" level (that is, a signal of data "0"), and the signal level of the /Q node thereof to the "H" level (that is, a signal of data "1").

As in the foregoing embodiment, the voltage sense circuit 141 obtains the sense signal VDOH and the sense signal VDOL based on a sense result for the bit line voltage VBL.

The data judge circuit 145 takes the sense signal VDOH, the inverted signal /VDOH of the sense signal VDOH, and the inverted signal /VDOL of the sense signal VDOL.

The data judge circuit 145 receives the control signal ValidHigh, the control signal CLKH, and the control signal CLKL from the sequencer 180.

The data judge circuit 145 performs a judging process using the signals VDOH, /VDOH, and /VDOL according to the changes in the signal levels of the control signals CLKH, CLKL, and ValidHigh.

<Reading of Data "110">

FIGS. 34 to 40 will be referred to for describing an operation of the sense amplification circuit SA in the memory device 1 according to the embodiment, for a memory cell (selected cell) MC that stores data "110". A memory cell MC that stores data "110" has the resistance state RS6.

FIG. 34 sets forth a timing chart of an operation of the sense amplification circuit SA in the memory device 1 according to the embodiment, in the instance of reading data "110". In FIG. 34, the horizontal axis represents time and the vertical axis represents the bit line voltage VBL and the signal levels of the respective control signals.

Each of FIGS. 35 to 40 is a schematic diagram showing a state of signal levels of the respective signals supplied to the sense amplification circuit SA at a given time in the memory device 1 according to the embodiment.

(Time t50)

As shown in FIGS. 34 and 35, the data judge circuit 145 receives the "L" level control signal ValidHigh, the "H" level control signal CLKH, and the "H" level control signal CLKL at time t50.

In the case where a selected cell MC stores data "110", the selected cell has the resistance state RS6. Here, the bit line voltage VBL at time t50 is higher than both of the reference voltage VrefH and the reference voltage VrefL. Thus, the sense signal VDOH and the sense signal VDOL each have the signal level "H". The inverted sense signal /VDOH and the inverted sense signal /VDOL each have the signal level "L".

In the lower-middle bit judge circuit 501, the OR gate 53 receives the "L" level inverted sense signal /VDOH and the "H" level control signal CLKH. The OR gate 53 sends the "H" level signal SigB to the multiplexer 55 according to the OR operation.

In the lower-middle bit judge circuit 501, the OR gate 54 receives the "L" level inverted sense signal /VDOL and the "H" level control signal CLKL. The OR gate 54 sends the "H" level signal SigC to the multiplexer 55 according to the OR operation.

In the upper bit judge circuit 500, the OR gate 51 receives the "H" level sense signal VDOH and the "L" level control signal ValidHigh. The OR gate 51 outputs the "H" level signal SigA according to the OR operation.

The "H" level signal SigA is sent to the CLK node of the D-type flip-flop 52, i.e., the upper bit latch circuit 52. The CLK node of the upper bit latch circuit (D-type flip-flop) 52 does not take in the "H" level signal SigA.

In the case where the signal SigA is at the "H" level, the upper bit latch circuit (D-type flip-flop) 52 does not take in the signal for the D node. Here, the signal level of the Q node of the upper bit latch circuit (D-type flip-flop) 52 is kept at the "L" level. The signal level of the /Q node of the upper bit latch circuit (D-type flip-flop) 52 is kept at the "H" level.

The upper bit latch circuit (D-type flip-flop) 52 outputs the "H" level signal DoutPre from the /Q node.

The multiplexer 55 receives, as a control signal, the "H" level signal DoutPre of the /Q node of the upper bit latch circuit (D-type flip-flop) 52 for the upper bit.

The multiplexer 55 selects the signal SigB based on the "H" level signal DoutPre. The "H" level signal Mout is accordingly supplied to the CLK node of the D-type flip-flop 56, i.e., the lower bit latch circuit 56. The lower bit latch circuit (D-type flip-flop) 56 does not take the "H" level signal Mout into the CLK node, which is an inverting input node.

Therefore, in the case where the signal Mout is at the "H" level, the D-type flip-flop 56, i.e., the lower bit latch circuit 56, does not take in the signal for the D node.

Here, each of the signal level of the Q node of the lower bit latch circuit (D-type flip-flop) 56 and the signal level of the Q node of the middle bit latch circuit (D-type flip-flop) 57 is the "L" level (state of retaining data "0").

(Time t51)

At time t51, the sequencer 180 changes the signal level of the control signal ValidHigh from the "L" level to the "H" level. The sequencer 180, at time t51, changes the signal level of the control signal CLKL from the "H" level to the "L" level.

In the case where the selected cell MC stores data "110", the sense signal VDOH and the sense signal VDOL each have the signal level "H" at time t51. The inverted sense signal /VDOH and the inverted sense signal /VDOL each have the signal level "L".

As shown in FIG. 36, the data judge circuit 145 receives the "H" level control signal ValidHigh, the "H" level control signal CLKH, and the "L" level control signal CLKL.

In the lower-middle bit judge circuit 501, the OR gate 54 performs, according to the change in the signal level of the control signal CLKL, an OR operation of the "L" level inverted sense signal /VDOL and the "L" level control signal CLKL. The OR gate 54 sends the "L" level signal SigC to the multiplexer 55.

In the upper bit judge circuit 500, the OR gate 51 performs, according to the change in the signal level of the control signal ValidHigh, an OR operation of the "H" level sense signal VDOH and the "H" level control signal ValidHigh. The OR gate 51 sends the "H" level signal SigA to the upper bit latch circuit (D-type flip-flop) 52.

Note that, at time t51, the signal levels of the respective signals /VDOH and CLKH supplied to the OR gate 53 do not change. As such, the OR gate 53 sends the "H" level signal SigB to the multiplexer 55 as in the operation at time t50.

As described above, the D-type flip-flop 52 serving as the upper bit latch circuit 52 does not take the "H" level signal SigA into the CLK node. Accordingly, the "H" level signal DoutPre is supplied to the multiplexer 55 as in the operation at time t50.

The multiplexer 55 sends the "H" level signal Mout to the lower bit latch circuit (D-type flip-flop) 56 based on the "H" level signal DoutPre.

The D-type flip-flop 56 serving as the lower bit latch circuit 56 does not take the "H" level signal Mout into the CLK node. Thus, each of the lower bit latch circuit (D-type flip-flop) 56 and the middle bit latch circuit (D-type flip-flop) 57 remains in the same state as that at time t50.

Subsequently, the sequencer 180 changes the signal level of the control signal CLKL from the "L" level to the "H" level.

(Time t52)

At time t52, the sequencer 180 changes each of the signal levels of the control signal CLKH and the control signal CLKL from the "H" level to the "L" level.

The signal level of the signal ValidHigh is kept at the "H" level at time t51 and onward.

In the case where the selected cell MC stores data "110", the sense signal VDOH and the sense signal VDOL each have the signal level "H" at time t52. The inverted sense signal /VDOH and the inverted sense signal /VDOL each have the signal level "L".

As shown in FIG. 37, the data judge circuit 145 receives the "H" level control signal ValidHigh, the "L" level control signal CLKH, and the "L" level control signal CLKL.

In the lower-middle bit judge circuit 501, the OR gate 53 performs an OR operation of the "L" level inverted sense signal /VDOH and the "L" level control signal CLKH. The OR gate 53 sends the "L" level signal SigB to the multiplexer 55.

In the lower-middle bit judge circuit 501, the OR gate 54 performs an OR operation of the "L" level inverted sense signal /VDOL and the "L" level control signal CLKL. The OR gate 54 sends the "L" level signal SigC to the multiplexer 55.

In the upper bit judge circuit 500, the OR gate 51 performs an OR operation of the "H" level sense signal VDOH and the "H" level control signal ValidHigh, and accordingly sends the "H" level signal SigA to the upper bit latch circuit (D-type flip-flop) 52.

As described above, the upper bit latch circuit (D-type flip-flop) 52 does not take the "H" level signal SigA into the CLK node. Accordingly, the "H" level signal DoutPre is sent to the multiplexer 55 as in the operation at time t51.

The multiplexer 55 selects the "L" level signal SigB based on the "H" level signal DoutPre. The signal level of the signal Mout changes from the "H" level to the "L" level. The multiplexer 55 therefore sends the "L" level signal Mout to the lower bit latch circuit (D-type flip-flop) 56.

The D-type flip-flop 56 serving as the lower bit latch circuit 56 takes, according to the "H" to "L" level change of the signal Mout, the "L" level signal Mout into the CLK node.

This updates (counts up) the value in the lower bit latch circuit (D-type flip-flop) 56 in the 2-bit counter constituted by the lower bit latch circuit (D-type flip-flop) 56 and the middle bit latch circuit (D-type flip-flop) 57.

The lower bit latch circuit (D-type flip-flop) 56 takes the "H" level signal of its own/Q node into the D node. This changes the signal level of the Q node of the lower bit latch circuit (D-type flip-flop) 56 from the "L" level to the "H" level.

The D-type flip-flop 56 for the lower bit retains the "H" level signal (data "1") in the Q node.

The "H" level signal is sent to the CLK node of the middle bit latch circuit (D-type flip-flop) 57. The middle bit latch circuit (D-type flip-flop) 57 does not take the "H" level signal into the CLK node. As such, the middle bit latch circuit (D-type flip-flop) 57 retains the "L" level signal (data "0") in its Q node.

Accordingly, the lower bit is set to data "1" at time t52. The middle bit is set to data "0". Note that the upper bit is set to data "1".

Subsequently, the sequencer 180 changes each of the signal levels of the control signal CLKH and the control signal CLKL from the "L" level to the "H" level. In response, the signal level of the signal Mout turns from the "L" level to the "H" level.

(Time t53)

At time t53, the sequencer 180 changes each of the signal levels of the control signal CLKH and the control signal CLKL from the "H" level to the "L" level.

In the case where the selected cell MC stores data "110", the inverted sense signal /VDOH and the inverted sense signal /VDOL each have the signal level "L" at time t53, as in the state at time t52.

As shown in FIG. 38, the data judge circuit 145 receives the "H" level control signal ValidHigh, the "L" level control signal CLKH, and the "L" level control signal CLKL.

In the lower-middle bit judge circuit 501, the OR gate 53 performs an OR operation of the "L" level inverted sense signal /VDOH and the "L" level control signal CLKH. The OR gate 53 sends the "L" level signal SigB to the multiplexer 55.

In the lower-middle bit judge circuit 501, the OR gate 54 performs an OR operation of the "L" level inverted sense signal /VDOL and the "L" level control signal CLKL. The OR gate 54 sends the "L" level signal SigC to the multiplexer 55.

The "H" level signal DoutPre is sent to the multiplexer 55 as in the operation at time t52.

The multiplexer 55 selects the "L" level signal SigB based on the "H" level signal DoutPre. The multiplexer 55 therefore sends the "L" level signal Mout to the lower bit latch circuit (D-type flip-flop) 56. The signal level of the signal Mout changes from the "H" level to the "L" level.

The D-type flip-flop 56 serving as the lower bit latch circuit 56 takes, according to the "H" to "L" level change of the signal Mout, the "L" level signal Mout into the CLK node.

Thus, in the 2-bit counter constituted by the lower bit latch circuit (D-type flip-flop) 56 and the middle bit latch circuit (D-type flip-flop) 57, the values in the latch circuits (D-type flip-flops) 56 and 57 are updated (counted up).

The lower bit latch circuit (D-type flip-flop) 56 takes the signal ("L" level signal) of its own/Q node into the D node.

In the lower bit latch circuit (D-type flip-flop) 56 for the lower bit, the signal level of the Q node turns from the "H" level to the "L" level. The Q node of the lower bit latch circuit (D-type flip-flop) 56 retains the "L" level signal. Accordingly, the signal level of the /Q node of the lower bit latch circuit (D-type flip-flop) 56 turns from the "L" level to the "H" level.

The signal level of the signal output from the Q node of the lower bit latch circuit (D-type flip-flop) 56 turns from the "H" level to the "L" level.

The middle bit latch circuit (D-type flip-flop) 57 for the middle bit takes, according to the "H" to "L" level-changed signal from the lower bit latch circuit (D-type flip-flop) 56, the "L" level signal into the CLK node. Thus, the middle bit latch circuit (D-type flip-flop) 57 takes the signal retained in its own/Q node into the D node.

Accordingly, the middle bit latch circuit (D-type flip-flop) 57 retains the "H" level signal in the Q node. Together, the signal level of the /Q node of the middle bit latch circuit (D-type flip-flop) 57 turns from the "H" level to the "L" level.

At time t53, the latch circuits (D-type flip-flops) 52, 56, and 57 stand in the following data retaining states. The upper bit latch circuit (D-type flip-flop) 52 retains data "1". The middle bit latch circuit (D-type flip-flop) 57 retains data "1". The lower bit latch circuit (D-type flip-flop) 56 retains data "0".

Subsequently, the sequencer 180 changes the signal level of the control signal CLKH from the "L" level to the "H" level. The sequencer 180 keeps the signal level of the control signal CLKL at the "L" level.

(Time td)

In the case where the selected cell MC stores data "110", the bit line voltage VBL becomes equal to or lower than the threshold voltage VrefH at time td after the signal level of the control signal CLKH turns to the "H" level.

Accordingly, the signal level of the sense signal VDOH of the operation amplifier 41 turns from the "H" level to the "L" level. Accordingly, the signal level of the inverted sense signal /VDOH turns from the "L" level to the "H" level.

Note that the bit line voltage VBL is higher than the reference voltage VrefL at time td. As such, the signal level of the sense signal VDOL is the "H" level, and the signal level of the inverted sense signal /VDOL is the "L" level.

Here, the signal level of the control signal CLKL is the "L" level.

As shown in FIG. 39, in the upper bit judge circuit 500, the OR gate 51 receives the "L" level sense signal VDOH and the "H" level control signal ValidHigh. The OR gate 51 outputs the "H" level signal SigA even in the event that the sense signal VDOH has transitioned from the "H" level to the "L" level.

The upper bit latch circuit (D-type flip-flop) 52 therefore sends the "H" level signal DoutPre to the multiplexer 55.

In the lower-middle bit judge circuit 501, the OR gate 53 receives the "H" level inverted sense signal /VDOH and the "H" level control signal CLKH. The OR gate 53 outputs the "H" level signal SigB according to the "H" level control signal CLKH, even in the event that the inverted sense signal /VDOH has transitioned from the "L" level to the "H" level.

The OR gate 54 outputs the "L" level signal SigC.

The multiplexer 55 selects the "H" level signal SigB based on the "H" level signal DoutPre. The multiplexer 55 outputs the "H" level signal Mout.

As in the example described above, in the case where a signal level of the signal Mout is the "H" level, the lower bit latch circuit (D-type flip-flop) 56 does not take in the "H"

level signal SigB. Thus, the values in the lower bit latch circuit (D-type flip-flop) 56 and the middle bit latch circuit (D-type flip-flop) 57 are not updated.

As such, the lower bit latch circuit (D-type flip-flop) 56 retains the "L" level signal in its Q node. The middle bit latch circuit (D-type flip-flop) 57 retains the "H" level signal in its Q node.

(Time t54)

At time t54, the sequencer 180 changes the signal level of the control signal CLKH from the "H" level to the "L" level. Note that the signal level of the control signal CLKL has been kept at the "L" level since time t53.

In the case where the selected cell MC stores data "110", the sense signal VDOH has the signal level "L" and the sense signal VDOL has the signal level "H" at time t54. The inverted sense signal /VDOH has the signal level "H". The inverted sense signal /VDOL has the signal level "L".

As shown in FIG. 40, the data judge circuit 145 receives the "H" level control signal ValidHigh, the "L" level control signal CLKH, and the "L" level control signal CLKL.

In the upper bit judge circuit 500, the OR gate 51 receives the "L" level sense signal VDOH and the "H" level control signal ValidHigh. The OR gate 51 outputs the "H" level signal SigA.

Accordingly, as in the example described above, the upper bit latch circuit (D-type flip-flop) 52 sends the "H" level signal DoutPre from the /Q node to the multiplexer 55.

In the lower-middle bit judge circuit 501, the OR gate 53 receives the "H" level inverted sense signal /VDOH and the "L" level control signal CLKH. The OR gate 53 outputs the "H" level signal SigB.

In the lower-middle bit judge circuit 501, the OR gate 54 receives the "L" level inverted sense signal /VDOL and the "L" level control signal CLKL. The OR gate 54 outputs the "L" level signal SigC.

The multiplexer 55 selects the signal SigB based on the "H" level signal DoutPre. The multiplexer 55 therefore sends the "H" level signal Mout to the lower bit latch circuit (D-type flip-flop) 56.

Accordingly, the lower bit latch circuit (D-type flip-flop) 56 does not take in the "H" level signal Mout. Thus, the values in the lower bit latch circuit (D-type flip-flop) 56 and the middle bit latch circuit (D-type flip-flop) 57 which form the 2-bit counter are not updated.

At time t3, the sense amplification circuit SA terminates the sensing operation.

At time t3, the latch circuits (D-type flip-flops) 52, 56, and 57 stand in the following data retaining states. The upper bit latch circuit (D-type flip-flop) 52 retains data "1". The middle bit latch circuit (D-type flip-flop) 57 retains data "1". The lower bit latch circuit (D-type flip-flop) 56 retains data "0". As a result, the 3-bit data indicated by the three latch circuits (D-type flip-flops) 52, 56, and 57 is data "110".

The sense amplification circuit SA sends the data in the latch circuits (D-type flip-flops) 52, 56, and 57 to the data register 150. The data "110" is thus transferred from the sense amplification circuit SA to the data register 150.

In the manner as described above, data "110" is read from the selected cell MC through the sensing operation by the sense amplification circuit SA shown in FIG. 32.

<Reading of Data "001">

FIGS. 41 to 46 will be referred to for describing an operation of the sense amplification circuit SA in the memory device 1 according to the embodiment, for a memory cell (selected cell) MC that stores data "001". A memory cell MC that stores data "001" has the resistance state RS1.

FIG. 41 sets forth a timing chart of an operation of the sense amplification circuit SA in the memory device 1 according to the embodiment, in the instance of reading data "001". In FIG. 41, the horizontal axis represents time and the vertical axis represents the bit line voltage VBL and the signal levels of the respective control signals.

Each of FIGS. 42 to 46 is a schematic diagram showing a state of signal levels of the respective signals supplied to the sense amplification circuit SA at a given time in the memory device 1 according to the embodiment.

(Time t2)

As shown in FIG. 41, the data judge circuit 145 receives the "L" level control signal ValidHigh, the "H" level control signal CLKH, and the "H" level control signal CLKL at time t2.

In the case where a selected cell stores data "001", the selected cell has the resistance state RS1. Here, the bit line voltage VBL at time t2 is higher than both of the reference voltage VrefH and the reference voltage VrefL.

Thus, the sense signal VDOH and the sense signal VDOL each have the signal level "H". The inverted sense signal /VDOH and the inverted sense signal /VDOL each have the signal level "L".

In the lower-middle bit judge circuit 501, the OR gate 53 receives the "L" level inverted sense signal /VDOH and the "H" level control signal CLKH. The OR gate 53 sends the "H" level signal SigB to the multiplexer 55 according to the OR operation.

In the lower-middle bit judge circuit 501, the OR gate 54 receives the "L" level inverted sense signal /VDOL and the "H" level control signal CLKL. The OR gate 54 sends the "H" level signal SigC to the multiplexer 55 according to the OR operation.

In the upper bit judge circuit 500, the OR gate 51 receives the "H" level sense signal VDOH and the "L" level control signal ValidHigh. The OR gate 51 outputs the "H" level signal SigA according to the OR operation.

In the case where the signal SigA is at the "H" level, the D-type flip-flop 52, i.e., the upper bit latch circuit 52, does not take in the signal for the D node. Here, the upper bit latch circuit (D-type flip-flop) 52 for the upper bit retains, as the initial value, an "L" level signal in the Q node. The upper bit latch circuit (D-type flip-flop) 52 retains an "H" level signal in the /Q node.

The "H" level signal in the /Q node of the upper bit latch circuit (D-type flip-flop) 52 is supplied to the multiplexer 55 as the control signal DoutPre.

The multiplexer 55 selects the "H" level signal SigB based on the "H" level control signal DoutPre. The multiplexer 55 sends the "H" level signal Mout to the lower bit latch circuit (D-type flip-flop) 56.

In the case where the signal Mout is at the "H" level, the D-type flip-flop 56, i.e., the lower bit latch circuit 56, does not take in the signal Mout.

Here, each of the signal level of the Q node of the lower bit latch circuit (D-type flip-flop) 56 and the signal level of the Q node of the middle bit latch circuit (D-type flip-flop) 57 is the initial value, i.e., the "L" level (data "0").

(Time te1)

In instances where the resistance state of a selected cell MC is one of the relatively low resistance states RS, RS1, RS2, and RS3, the bit line voltage VBL becomes equal to or lower than the reference voltage VrefH at time te1 which is prior to the change in the signal level of the control signal ValidHigh from the "L" level to the "H" level.

Here, the operation amplifier 41 outputs the "L" level sense signal VDOH based on the result of comparison between the bit line voltage VBL and the reference voltage VrefH.

Note that the bit line voltage VBL is higher than the reference voltage VrefL at time te1. Accordingly, the signal level of the sense signal VDOL is the "H" level.

At time te1, each of the signal levels of the control signal CLKH and the control signal CLKL is the "H" level.

As shown in FIG. 42, the OR gate 51 in the upper bit judge circuit 500 receives the "L" level sense signal VDOH. The OR gate 51 performs an OR operation of the "L" level sense signal VDOH and the "L" level control signal ValidHigh. The OR gate 51 sends the "L" level signal SigA to the upper bit latch circuit (D-type flip-flop) 52. The signal level of the signal SigA turns from the "H" level to the "L" level.

The D-type flip-flop 52 serving as the upper bit latch circuit 52 takes, according to the "H" to "L" level change of the signal SigA, the "L" level signal SigA into the CLK node. This entails a change in the data retaining state of the D-type flip-flop 52 serving as the upper bit latch circuit 52 from the initial state. Accordingly, the signal level of the signal retained in the /Q node of the upper bit latch circuit (D-type flip-flop) 52 is set to the "L" level.

The upper bit latch circuit (D-type flip-flop) 52 takes in the voltage VDD ("H" level signal) supplied to the D node according to the "L" level signal SigA taken into the CLK node. This changes the signal level of the signal retained in the Q node of the upper bit latch circuit (D-type flip-flop) 52 from, the "L" level, i.e., the initial value, to the "H" level.

The "L" level signal DoutPre is output from the /Q node of the upper bit latch circuit (D-type flip-flop) 52.

In the lower-middle bit judge circuit 501, the OR gate 53 receives the "H" level inverted sense signal /VDOH. The OR gate 53 performs an OR operation of the "H" level inverted sense signal /VDOH and the "H" level control signal CLKH. The OR gate 53 sends the "H" level signal SigB to the multiplexer 55.

In the lower-middle bit judge circuit 501, the OR gate 54 performs an OR operation of the "L" level inverted sense signal /VDOL and the "H" level control signal CLKL. The OR gate 54 sends the "H" level signal SigC to the multiplexer 55.

The multiplexer 55 selects the signal SigC according to the "L" level signal DoutPre from the upper bit latch circuit (D-type flip-flop) 52. The multiplexer 55 sends the "H" level signal Mout to the lower bit latch circuit (D-type flip-flop) 56.

The lower bit latch circuit (D-type flip-flop) 56 does not take the "H" level signal Mout into its CLK node. Thus, the lower bit latch circuit (D-type flip-flop) 56 and the middle bit latch circuit (D-type flip-flop) 57 do not change their data retaining states.

As described above, the retained signal (data) in the upper bit latch circuit (D-type flip-flop) 52 and the signal level of the control signal DoutPre are changed at the timing of the bit line voltage VBL becoming equal to or lower than the reference voltage VrefH.

(Time t51)

At time t51, the sequencer 180 changes the signal level of the control signal ValidHigh from the "L" level to the "H" level. The sequencer 180, at time t51, changes the signal level of the control signal CLKL from the "H" level to the "L" level.

In the case where the selected cell MC stores data "001", the bit line voltage VBL at time t51 is lower than the reference voltage VrefH and higher than the reference voltage VrefL. Thus, at time t51, the sense signal VDOH has the signal level "L" and the sense signal VDOL has the signal level "H". The inverted sense signal /VDOH has the signal level "H". The inverted sense signal /VDOL has the signal level "L".

As shown in FIG. 43, the data judge circuit 145 receives the "H" level control signal ValidHigh, the "H" level control signal CLKH, and the "L" level control signal CLKL.

In the lower-middle bit judge circuit 501, the OR gate 53 performs an OR operation of the "H" level inverted sense signal /VDOH and the "H" level control signal CLKH. The OR gate 53 sends the "H" level signal SigB to the multiplexer 55.

In the lower-middle bit judge circuit 501, the OR gate 54 performs an OR operation of the "L" level inverted sense signal /VDOL and the "L" level control signal CLKL. The OR gate 54 sends the "L" level signal SigC to the multiplexer 55.

In the upper bit judge circuit 500, the OR gate 51 performs an OR operation of the "L" level sense signal VDOH and the "H" level control signal ValidHigh. The OR gate 51 sends the "H" level signal SigA to the upper bit latch circuit (D-type flip-flop) 52.

As described above, the D-type flip-flop 52 serving as the upper bit latch circuit 52 does not take the "H" level signal SigA into the CLK node. The upper bit latch circuit (D-type flip-flop) 52 keeps the data retaining state.

The Q node of the upper bit latch circuit (D-type flip-flop) 52 here retains the "H" level signal differing from the initial value, in accordance with the "H" to "L" level change of the sense signal VDOH at time te1 explained above. Accordingly, the /Q node of the upper bit latch circuit (D-type flip-flop) 52 here retains the "L" level signal.

Thus, at time t51 after time te1, the "L" level signal DoutPre is supplied to the multiplexer 55.

The multiplexer 55 selects the "L" level signal SigC based on the "L" level signal DoutPre. The multiplexer 55 sends the "L" level signal Mout to the lower bit latch circuit (D-type flip-flop) 56. The signal level of the signal Mout changes from the "H" level to the "L" level.

The D-type flip-flop 56 serving as the lower bit latch circuit 56 takes, according to the "H" to "L" level change of the signal Mout, the "L" level signal Mout into the CLK node. The lower bit latch circuit (D-type flip-flop) 56 thus updates the retained value.

The lower bit latch circuit (D-type flip-flop) 56 takes the signal of its own/Q node into the D node. Accordingly, the lower bit latch circuit (D-type flip-flop) 56 retains the "H" level signal (data "1") in the Q node. The lower bit latch circuit (D-type flip-flop) 56 sends the "H" level signal of the Q node to the CLK node of the middle bit latch circuit (D-type flip-flop) 57. Then, in the lower bit latch circuit (D-type flip-flop) 56, the signal level of the signal in the /Q node turns from the "H" level to the "L" level.

The middle bit latch circuit (D-type flip-flop) 57 does not take the "H" level signal into its CLK node. Accordingly, the middle bit latch circuit (D-type flip-flop) 57 retains the "L" level signal (data "0") in the Q node.

Subsequently, the sequencer 180 changes the signal level of the control signal CLKL from the "L" level to the "H" level.

(Time te2)

At time te2, the bit line voltage VBL becomes equal to or lower than the reference voltage VrefL. Here, the operation amplifier 42 outputs the "L" level sense signal VDOL based on the result of comparison between the bit line voltage VBL and the reference voltage VrefL. The signal level of the inverted sense signal /VDOL turns from the "L" level to the "H" level.

In one example, at time te2, the control signal CLKH has the signal level "H" and the control signal CLKL has the signal level "L".

Figure 44:
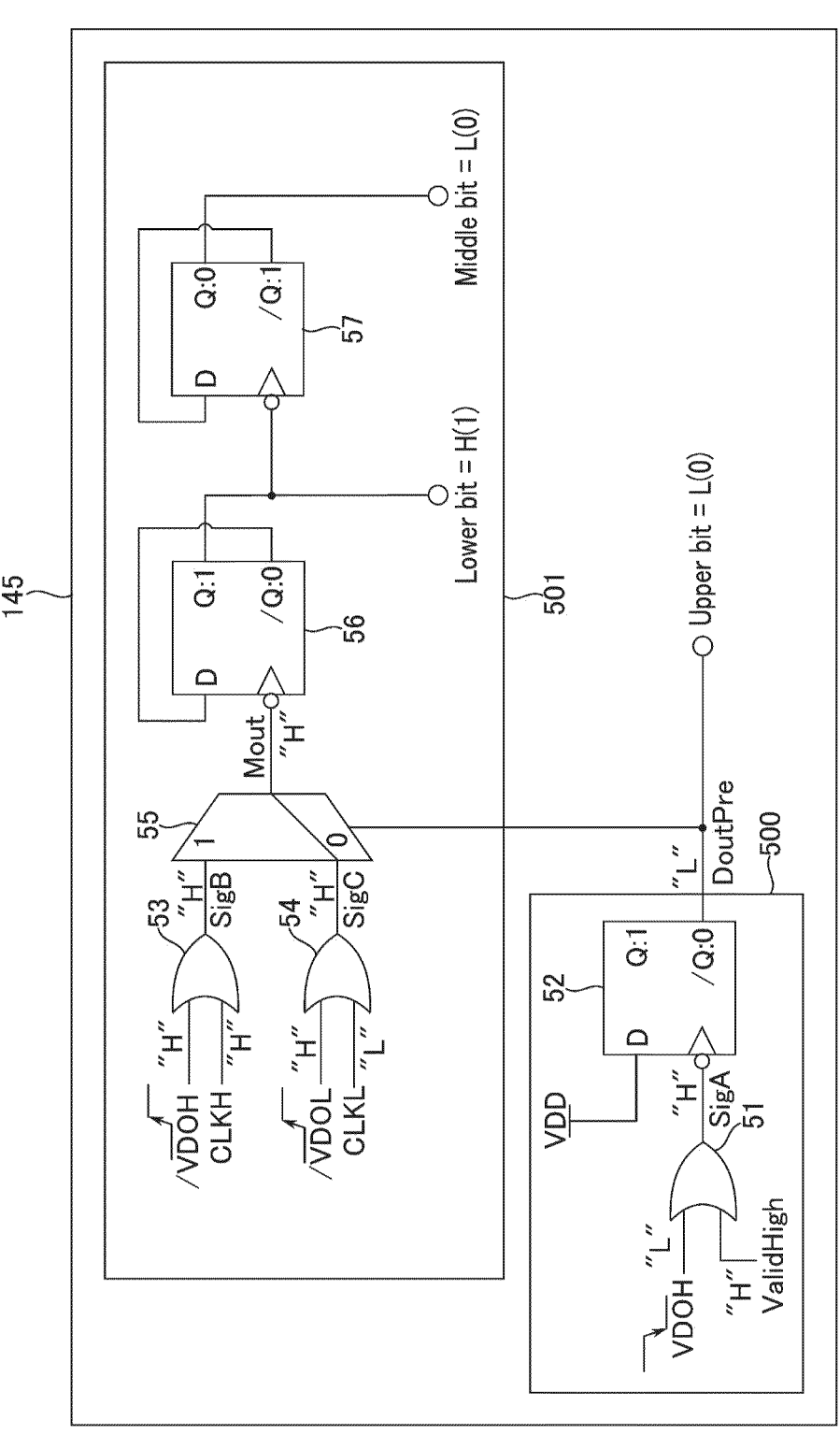
FIG. 44 is a schematic diagram illustrating a state of the sense amplification circuit in operation in the memory device according to the second embodiment.

As shown in FIG. 44, in the upper bit judge circuit 500, the OR gate 51 performs an OR operation of the "L" level sense signal VDOH and the "H" level control signal ValidHigh, and accordingly sends the "H" level signal SigA to the upper bit latch circuit (D-type flip-flop) 52.

The D-type flip-flop 52 serving as the upper bit latch circuit 52 sends the "L" level signal DoutPre to the multiplexer 55 without taking the "H" level signal SigA into the CLK node.

In the lower-middle bit judge circuit 501, the OR gate 53 performs an OR operation of the "H" level inverted sense signal /VDOH and the "H" level control signal CLKH, and accordingly sends the "H" level signal SigB to the multiplexer 55.

The OR gate 54 receives the "H" level inverted sense signal /VDOL. The OR gate 54 performs an OR operation of the "H" level inverted sense signal /VDOL and the "L" level control signal CLKL. The OR gate 54 sends the "H" level signal SigC to the multiplexer 55.

The multiplexer 55 selects the signal SigC according to the "L" level signal DoutPre from the upper bit latch circuit (D-type flip-flop) 52. The multiplexer 55 sends the "H" level signal Mout to the lower bit latch circuit (D-type flip-flop) 56.

The lower bit latch circuit (D-type flip-flop) 56 does not take the "H" level signal Mout into its CLK node. Thus, the lower bit latch circuit (D-type flip-flop) 56 and the middle bit latch circuit (D-type flip-flop) 57 do not change their data retaining states.

(Time t52)

At time t52, the sequencer 180 changes each of the signal levels of the control signal CLKH and the control signal CLKL from the "H" level to the "L" level. Note that the signal level of the control signal ValidHigh is kept at the "H" level.

In the case where the selected cell MC stores data "001", the sense signal VDOH and the sense signal VDOL both have the signal level "L" at time t52. Therefore, the inverted sense signal /VDOH and the inverted sense signal /VDOL both have the signal level "H".

As shown in FIG. 45, the data judge circuit 145 receives the "H" level control signal ValidHigh, the "L" level control signal CLKH, and the "L" level control signal CLKL.

In the upper bit judge circuit 500, the OR gate 51 performs an OR operation of the "L" level sense signal VDOH and the "H" level control signal ValidHigh, and accordingly sends the "H" level signal SigA to the upper bit latch circuit (D-type flip-flop) 52.

As described above, the upper bit latch circuit (D-type flip-flop) 52 does not take in the "H" level signal SigA. Accordingly, the "L" level signal DoutPre is supplied to the multiplexer 55.

In the lower-middle bit judge circuit 501, the OR gate 53 performs an OR operation of the "H" level inverted sense signal /VDOH and the "L" level control signal CLKH. The OR gate 53 sends the "H" level signal SigB to the multiplexer 55.

In the lower-middle bit judge circuit 501, the OR gate 54 performs an OR operation of the "H" level inverted sense signal /VDOL and the "L" level control signal CLKL. The OR gate 54 sends the "H" level signal SigC to the multiplexer 55.

The multiplexer 55 selects the "H" level signal SigC based on the "L" level signal DoutPre. The multiplexer 55 sends the "H" level signal Mout to the lower bit latch circuit (D-type flip-flop) 56.

The D-type flip-flop 56 serving as the lower bit latch circuit 56 does not take the "H" level signal Mout into the CLK node.

Thus, in the 2-bit counter constituted by the lower bit latch circuit (D-type flip-flop) 56 and the middle bit latch circuit (D-type flip-flop) 57, the values in the latch circuits (D-type flip-flops) 56 and 57 are not updated.

The lower bit latch circuit (D-type flip-flop) 56 for the lower bit retains the "H" level signal in the Q node.

The "H" level signal is sent to the CLK node of the middle bit latch circuit (D-type flip-flop) 57.

The middle bit latch circuit (D-type flip-flop) 57 does not take the "H" level signal into the CLK node. In the middle bit latch circuit (D-type flip-flop) 57, therefore, the signal level of the Q node is kept at the "L" level.

Subsequently, the sequencer 180 changes each of the signal levels of the control signal CLKH and the control signal CLKL from the "L" level to the "H" level.
(Time t53)

At time t53, the sequencer 180 changes each of the signal levels of the control signal CLKH and the control signal CLKL from the "H" level to the "L" level.

In the case where the selected cell MC stores data "001", the sense signal VDOH and the sense signal VDOL each have the signal level "L" at time t53. The inverted sense signal /VDOH and the inverted sense signal /VDOL each have the signal level "H".

As in the example shown in FIG. 45, the data judge circuit 145 receives the "H" level control signal ValidHigh, the "L" level control signal CLKH, and the "L" level control signal CLKL.

Here, the upper bit latch circuit (D-type flip-flop) 52 outputs the "L" level signal DoutPre as in the operation at time t52 (cf. FIG. 45). The multiplexer 55 sends the "H" level signal Mout to the lower bit latch circuit (D-type flip-flop) 56 based on the "L" level signal DoutPre.

The lower bit latch circuit (D-type flip-flop) 56 does not take the "H" level signal Mout into the CLK node. Thus, the values in the lower bit latch circuit (D-type flip-flop) 56 and the middle bit latch circuit (D-type flip-flop) 57 constituting the 2-bit counter are not updated and remain the same as those at time t52. The lower bit latch circuit (D-type flip-flop) 56 retains the "H" level signal (data "1") in its Q node. The middle bit latch circuit (D-type flip-flop) 57 retains the "L" level signal (data "0") in its Q node.

Subsequently, the sequencer 180 changes the signal level of the control signal CLKH from the "L" level to the "H" level.
(Time t54)

At time t54, the sequencer 180 changes the signal level of the control signal CLKH from the "H" level to the "L" level. Note that the signal level of the control signal CLKL has been kept at the "L" level since time t53.

Each of the signal levels of the sense signal VDOH and the sense signal VDOL is the "L" level. Each of the signal levels of the inverted sense signal /VDOH and the inverted sense signal /VDOL is the "H" level.

As shown in FIG. 46, the data judge circuit 145 receives the "H" level control signal ValidHigh, the "L" level control signal CLKH, and the "L" level control signal CLKL.

In the upper bit judge circuit 500, the OR gate 51 performs an OR operation of the "L" level sense signal VDOH and the "H" level control signal ValidHigh, and accordingly outputs the "H" level signal SigA.

The upper bit latch circuit (D-type flip-flop) 52 sends the "L" level signal DoutPre to the multiplexer 55 without taking in the "H" level signal SigA.

In the lower-middle bit judge circuit 501, the OR gate 53 performs an OR operation of the "H" level inverted sense signal /VDOH and the "L" level control signal CLKH. The OR gate 53 accordingly outputs the "H" level signal SigB.

In the lower-middle bit judge circuit 501, the OR gate 54 performs an OR operation of the "H" level inverted sense signal /VDOL and the "L" level control signal CLKH, and accordingly outputs the "H" level signal SigC.

The multiplexer 55 selects the signal SigC based on the "L" level signal DoutPre. The multiplexer 55 sends the signal Mout to the lower bit latch circuit (D-type flip-flop) 56.

The signal Mout based on the selected signal SigC has the signal level "H". As such, the lower bit latch circuit (D-type flip-flop) 56 does not take the signal Mout into its CLK node.

Thus, the values in the lower bit latch circuit (D-type flip-flop) 56 and the middle bit latch circuit (D-type flip-flop) 57 which form the 2-bit counter are not updated.

At time t3, the sense amplification circuit SA terminates the sensing operation.

At time t3, the latch circuits (D-type flip-flops) 52, 56, and 57 stand in the following data retaining states. The upper bit latch circuit (D-type flip-flop) 52 retains data "0". The middle bit latch circuit (D-type flip-flop) 57 retains data "0". The lower bit latch circuit (D-type flip-flop) 56 retains data "1". As a result, the 3-bit data indicated by the three latch circuits (D-type flip-flops) 52, 56, and 57 is data "001".

The sense amplification circuit SA sends the data in the latch circuits (D-type flip-flops) 52, 56, and 57 to the data register 150. The data "001" is thus transferred from the sense amplification circuit SA to the data register 150.

In the manner as described above, data "001" is read from the selected cell MC through the sensing operation by the sense amplification circuit SA shown in FIG. 32.

(c) In Sum

With the configurations and the operations of the sense amplification circuit SA described above, the memory device 1 according to the second embodiment can secure relatively wide sensing margins. The memory device 1 according to the second embodiment can accelerate read operations.

From the foregoing, the memory device 1 according to the second embodiment can realize improved characteristics in read operations.

(3) Third Embodiment

FIGS. 47 to 69 will be referred to for describing a memory device according to the third embodiment.

(a) Configurations

<Relationship Between Resistance State of Memory Cell and Data>

FIG. 47 is a diagram illustrating a relationship between the resistance state of a memory cell and data stored in the memory device 1 according to the embodiment.

As shown in FIG. 47, each memory cell in the memory device 1 according to the embodiment stores data according to the resistance state of the memory cell as in the memory device 1 according to the first embodiment described above.

It is noted that, referring to FIG. 18 in the foregoing description, a time (time point) at which data stored in a memory cell MC is confirmed or ascertained can be specified for each resistance state of the memory cell according to time points at which the relationship in size between the bit line voltage VBL and each of the reference voltages VrefH and VrefL changes.

Data "111" corresponding to the resistance state RS0 can be confirmed at the earliest time. Data "010" corresponding to the resistance state RS4 can be confirmed at the second earliest time. Data "101" corresponding to the resistance state RS1 can be confirmed at the third earliest time. Data "011" corresponding to the resistance state RS5 can be confirmed at the fourth earliest time. Data "100" corresponding to the resistance state RS2 can be confirmed at the fifth earliest time. Data "110" corresponding to the resistance state RS3 can be confirmed at the sixth earliest time (i.e., the third latest time). Data "001" corresponding to the resistance state RS6 can be confirmed at the seventh earliest time (i.e., the second latest time). Data "000" corresponding to the resistance state RS7 can be confirmed at the latest time (i.e., the eighth earliest time).

In the memory device 1 according to the embodiment, the sense amplification circuit SA reads data in a selected cell MC by performing a judging operation at timings based on data confirmation times.

<Exemplary Configuration of Sense Amplification Circuit SA>

FIG. 48 is a diagram showing an exemplary configuration of a sense amplification circuit SA in the memory device 1 according to the embodiment.

As shown in FIG. 48, the sense amplification circuit SA includes a voltage sense circuit 141.

As in the foregoing embodiments, the voltage sense circuit 141 includes two operation amplifiers 41 and 42. One of the input nodes of the operation amplifier 41 is coupled to a bit line BL. This input node of the operation amplifier 41 receives the bit line voltage VBL. Another input node of the operation amplifier 41 receives the reference voltage VrefH. The output node of the operation amplifier 41 outputs its sense signal VDOH.

One of the input nodes of the operation amplifier 42 is coupled to the bit line BL. This input node of the operation amplifier 42 receives the bit line voltage VBL. Another input node of the operation amplifier 42 receives the reference voltage VrefL. The output node of the operation amplifier 42 outputs its sense signal VDOL.

An inverter 199H is provided to receive the sense signal VDOH. The inverter 199H outputs an inverted sense signal /VDOH to each circuit 147, which will be described later.

An inverter 199L is provided to receive the sense signal VDOL. The inverter 199L outputs an inverted sense signal /VDOL to each circuit 147.

The sense amplification circuit SA includes a lower bit judge circuit 147L, a middle bit judge circuit 147M, an upper bit judge circuit 147U, and control circuits 148 and 149.

The lower bit judge circuit 147L performs a judging process for the lower bit included in 3-bit data. The lower bit judge circuit 147L includes two AND gates (logic operation circuits) 80L and 81L, an OR gate (logic operation circuit) 82L, and a lower bit latch circuit (data retaining circuit) 85L.

The AND gate 80L includes three input nodes and one output node. The first input node of the AND gate 80L is connected to a signal line 79. The first input node of the AND gate 80L receives a signal SigZ output from the control circuit 148, which will be described later. The second input node of the AND gate 80L receives the signal /VDOH which is an inverted signal (inverted sense signal) of the sense signal VDOH. The third input node of the AND gate 80L receives the control signal LgcVrefH(L). The output node of the AND gate 80L is connected to the OR gate 82L.

The AND gate 80L performs an AND operation of the control signal SigZ, the inverted sense signal /VDOH, and the control signal LgcVrefH(L). The AND gate 80L sends a signal AL1 indicating the result of the AND operation to the OR gate 82L.

The AND gate 81L includes three input nodes and one output node. The first input node of the AND gate 81L receives the control signal ValidHigh. The second input node of the AND gate 81L receives the signal /VDOL which is an inverted signal (inverted sense signal) of the sense signal VDOL. The third input node of the AND gate 81L receives the control signal LgcVrefL(L). The output node of the AND gate 81L is connected to the OR gate 82L.

The AND gate 81L performs an AND operation of the control signal ValidHigh, the inverted sense signal /VDOL, and the control signal LgcVrefL(L). The AND gate 81L sends a signal AL2 indicating the result of the AND operation to the OR gate 82L.

The OR gate 82L includes two input nodes and one output node. One of the input nodes of the OR gate 82L is connected to the output node of the AND gate 80L. This input node of the OR gate 82L receives the output signal AL1 from the AND gate 80L. The other input node of the OR gate 82L is connected to the output node of the AND gate 81L. The other input node of the OR gate 82L receives the output signal AL2 from the AND gate 81L. The output node of the OR gate 82L is connected to the lower bit latch circuit 85L.

The OR gate 82L performs an OR operation of the signal AL1 and the signal AL2. The OR gate 82L sends a signal CLKLb indicating the result of the OR operation to the lower bit latch circuit 85L.

The lower bit latch circuit 85L includes a D-type flip-flop 85L. The D-type flip-flop 85L constituting the lower bit latch circuit 85L includes two input nodes and two output nodes.

One of the input nodes (D node) of the lower bit latch circuit (D-type flip-flop) 85L receives an "H(1)" level signal. The other input node (CLK node) of the lower bit latch circuit (D-type flip-flop) 85L is connected to the output node of the OR gate 82L. This CLK node of the lower bit latch circuit (D-type flip-flop) 85L receives the signal CLKLb from the OR gate 82L. The lower bit latch circuit (D-type flip-flop) 85L takes in the signal supplied to the D node according to a rising edge of the signal CLKLb. One of the output nodes (Q node) of the lower bit latch circuit (D-type flip-flop) 85L outputs the signal retained in this Q node of the lower bit latch circuit (D-type flip-flop) 85L. The other output node (/Q node) of the lower bit latch circuit (D-type flip-flop) 85L retains an inverted signal of the signal retained in the Q node.

The output signal from the Q node of the lower bit latch circuit (D-type flip-flop) 85L serves as the lower bit of 3-bit data.

The lower bit latch circuit (D-type flip-flop) 85L in its initial state retains an "L" level signal (data "O") in the Q node.

The middle bit judge circuit 147M performs a judging process for the middle bit included in 3-bit data. The middle bit judge circuit 147M includes two AND gates (logic operation circuits) 80M and 81M, an OR gate (logic operation circuit) 82M, and a middle bit latch circuit (data retaining circuit) 85M.

The AND gate 80M includes three input nodes and one output node. The first input node of the AND gate 80M is connected to the signal line 79. The first input node of the AND gate 80M receives the signal SigZ output from the control circuit 148. The second input node of the AND gate 80M receives the inverted sense signal /VDOH. The third input node of the AND gate 80M receives the control signal LgcVrefH(M). The output node of the AND gate 80M is connected to the OR gate 82M.

The AND gate 80M performs an AND operation of the control signal SigZ, the inverted sense signal /VDOH, and the control signal LgcVrefH(M). The AND gate 80M sends a signal AM1 indicating the result of the AND operation to the OR gate 82M.

The AND gate 81M includes four input nodes and one output node. The first input node of the AND gate 81M receives the control signal ValidHigh. The second input node of the AND gate 81M receives the inverted sense signal /VDOL. The third input node of the AND gate 81M receives the control signal LgcVrefL(M). The fourth input node of the AND gate 81M receives a control signal Sig3 from the control circuit 149, which will be described later. The output node of the AND gate 81M is connected to the OR gate 82M.

The AND gate 81M performs an AND operation of the control signal ValidHigh, the inverted sense signal /VDOL, the control signal LgcVrefL(M), and the control signal Sig3. The AND gate 81M sends a signal AM2 indicating the result of the AND operation to the OR gate 82M.

The OR gate 82M includes two input nodes and one output node. One of the input nodes of the OR gate 82M is connected to the output node of the AND gate 80M. This input node of the OR gate 82M receives the output signal AM1 from the AND gate 80M. The other input node of the OR gate 82M is connected to the output node of the AND gate 81M. The other input node of the OR gate 82M receives the output signal AM2 from the AND gate 81M. The output node of the OR gate 82M is connected to the middle bit latch circuit 85M.

The OR gate 82M performs an OR operation of the signal AM1 and the signal AM2. The OR gate 82M sends a signal CLKMb indicating the result of the OR operation to the middle bit latch circuit 85M.

The middle bit latch circuit 85M includes a D-type flip-flop 85M. The D-type flip-flop 85M constituting the middle bit latch circuit 85M includes two input nodes and two output nodes.

One of the input nodes (D node) of the middle bit latch circuit (D-type flip-flop) 85M receives an "H" level signal. The other input node (CLK node) of the middle bit latch circuit (D-type flip-flop) 85M is connected to the output node of the OR gate 82M. This CLK node of the middle bit latch circuit (D-type flip-flop) 85M receives the signal CLKMb from the OR gate 82M. The middle bit latch circuit (D-type flip-flop) 85M takes in the signal supplied to the D node according to a rising edge of the signal CLKMb. One of the output nodes (Q node) of the middle bit latch circuit (D-type flip-flop) 85M outputs the signal retained in this Q node of the middle bit latch circuit (D-type flip-flop) 85M. The other output node (/Q node) of the middle bit latch circuit (D-type flip-flop) 85M retains an inverted signal of the signal retained in the Q node.

The output signal from the Q node of the middle bit latch circuit (D-type flip-flop) 85M serves as the middle bit of 3-bit data.

The middle bit latch circuit (D-type flip-flop) 85M in its initial state retains an "L" level signal (data "0") in the Q node.

The upper bit judge circuit 147U performs a judging process for the upper bit included in 3-bit data. The upper bit judge circuit 147U includes two AND gates (logic operation circuits) 80U and 81U, an OR gate (logic operation circuit) 82U, and an upper bit latch circuit (data retaining circuit) 85U.

The AND gate 80U includes three input nodes and one output node. The first input node of the AND gate 80U is connected to the signal line 79. The first input node of the AND gate 80U receives the signal SigZ output from the control circuit 148. The second input node of the AND gate 80U receives the inverted sense signal /VDOH. The third input node of the AND gate 80U receives the control signal LgcVrefH(U). The output node of the AND gate 80U is connected to the OR gate 82U.

The AND gate 80U performs an AND operation of the control signal SigZ, the inverted sense signal /VDOH, and the control signal LgcVrefH(U). The AND gate 80U sends a signal AU1 indicating the result of the AND operation to the OR gate 82U.

The AND gate 81U includes three input nodes and one output node. The first input node of the AND gate 81U receives the control signal ValidHigh. The second input node of the AND gate 81U receives the inverted sense signal /VDOL. The third input node of the AND gate 81U receives the control signal LgcVrefL(U). The output node of the AND gate 81U is connected to the OR gate 82U.

The AND gate 81U performs an AND operation of the control signal ValidHigh, the inverted sense signal /VDOL, and the control signal LgcVrefL(U). The AND gate 81U sends a signal AU2 indicating the result of the AND operation to the OR gate 82U.

The OR gate 82U includes two input nodes and one output node. One of the input nodes of the OR gate 82U is connected to the output node of the AND gate 80U. This input node of the OR gate 82U receives the output signal AU1 from the AND gate 80U. The other input node of the OR gate 82U is connected to the output node of the AND gate 81U. The other input node of the OR gate 82U receives the output signal AU2 from the AND gate 81U. The output node of the OR gate 82U is connected to the upper bit latch circuit 85U.

The OR gate 82U performs an OR operation of the signal AU1 and the signal AU2. The OR gate 82U sends a signal CLKUb indicating the result of the OR operation to the upper bit latch circuit 85U.

The upper bit latch circuit 85U includes a D-type flip-flop 85U. The D-type flip-flop 85U constituting the upper bit latch circuit 85U includes two input nodes and two output nodes.

One of the input nodes (D node) of the upper bit latch circuit (D-type flip-flop) 85U receives an "H" level signal. The other input node (CLK node) of the upper bit latch circuit (D-type flip-flop) 85U is connected to the output node of the OR gate 82U. This CLK node of the upper bit latch circuit (D-type flip-flop) 85U receives the signal CLKUb from the OR gate 82U. The upper bit latch circuit (D-type flip-flop) 85U takes in the signal supplied to the D node according to a rising edge of the signal CLKUb. One of the output nodes (Q node) of the upper bit latch circuit (D-type flip-flop) 85U outputs the signal retained in this Q node of the upper bit latch circuit (D-type flip-flop) 85U. The other output node (/Q node) of the upper bit latch circuit (D-type flip-flop) 85U retains an inverted signal of the signal retained in the Q node.

The output signal from the Q node of the upper bit latch circuit (D-type flip-flop) 85U serves as the upper bit of 3-bit data.

The upper bit latch circuit (D-type flip-flop) 85U in its initial state retains an "L" level signal (data "0") in the Q node.

Note that each latch circuit (D-type flip-flop) 85 includes a reset node. The reset node of the latch circuit (D-type flip-flop) 85 receives a reset pulse. The latch circuit (D-type flip-flop) 85 is reset by the reset pulse. Resetting turns the latch circuit (D-type flip-flop) 85 into the initial state.

In the description below, each of the lower bit judge circuit 147L, the middle bit judge circuit 147M, and the upper bit judge circuit 147U will be simply called a "judge circuit 147" if discriminating these circuits 147L, 147M, and 147U from one another is not required.

The control circuit 148 controls the operation states of the multiple judge circuits 147. The control circuit 148 includes three NAND gates 70, 71, and 72.

The NAND gate 70 includes four input nodes and one output node. The first input node of the NAND gate 70 receives the inverted sense signal /VDOH. The second input node of the NAND gate 70 receives an inverted signal /LgcVrefH (L) of the control signal LgcVrefH(L). The third input node of the NAND gate 70 receives the control signal LgcVrefH(M). The fourth input node of the NAND gate 70 receives an inverted signal /LgcVrefH(U) of the control signal LgcVrefH(U). The output node of the NAND gate 70 is connected to the subsequent NAND gate 71.

The NAND gate 70 performs a negative AND operation (NAND operation) of the inverted sense signal /VDOH, the control signal /LgcVrefH(L), the control signal LgcVrefH (M), and the control signal /LgcVrefH(U). The NAND gate 70 sends a signal SigX indicating the result of the NAND operation to the NAND gate 71.

The NAND gate 71 includes two input nodes and one output node. One of the input nodes of the NAND gate 71 is connected to the output node of the preceding NAND gate 70. This input node of the NAND gate 71 receives the output signal SigX from the NAND gate 70. The other input node of the NAND gate 71 is connected to the output node of the subsequent NAND gate 72 (and the signal line 79). The other input node of the NAND gate 71 receives the control signal SigZ output from the NAND gate 72. The output node of the NAND gate 71 is connected to the NAND gate 72.

The NAND gate 71 performs a NAND operation of the output signal from the preceding NAND gate 70 and the output signal from the subsequent NAND gate 72. The NAND gate 71 sends a signal SigY indicating the result of the NAND operation to the NAND gate 72.

The NAND gate 72 includes two input nodes and one output node. One of the input nodes of the NAND gate 72 is connected to the output node of the preceding NAND gate 71. This input node of the NAND gate 72 receives the output signal SigY from the NAND gate 71. The other input node of the NAND gate 72 receives a signal (reset signal) NANDrst. The output node of the NAND gate 72 is connected to the signal line 79.

The NAND gate 72 performs a NAND operation of the output signal SigY from the preceding NAND gate 71 and the reset signal NANDrst. The NAND gate 72 sends the signal SigZ indicating the result of the NAND operation to the AND gates 80L, 80M, and 80U via the signal line 79.

The control circuit 149 controls the operation state of the middle bit judge circuit 147M. The control circuit 149 includes three NAND gates 74, 75, and 76.

The NAND gate 74 includes two input nodes and one output node. The first input node of the NAND gate 74 receives the inverted sense signal /VDOL. The second input node of the NAND gate 74 receives an inverted signal /LgcVrefL(M) of the control signal LgcVrefL(M). The output node of the NAND gate 74 is connected to the subsequent NAND gate 75.

The NAND gate 74 performs a NAND operation of the inverted sense signal /VDOL and the control signal /LgcVrefL (M). The NAND gate 74 sends a signal Sig1 indicating the result of the NAND operation to the NAND gate 75.

The NAND gate 75 includes two input nodes and one output node. One of the input nodes of the NAND gate 75 is connected to the output node of the preceding NAND gate 74. This input node of the NAND gate 75 receives the output signal Sig1 from the NAND gate 74. The other input node of the NAND gate 75 is connected to the output node of the subsequent NAND gate 76. The other input node of the NAND gate 75 receives the output signal Sig3 from the NAND gate 76. The output node of the NAND gate 75 is connected to the subsequent NAND gate 76.

The NAND gate 75 performs a NAND operation of the output signal Sig1 from the preceding NAND gate 74 and the output signal Sig3 from the subsequent NAND gate 76. The NAND gate 75 sends a signal Sig2 indicating the result of the NAND operation to the NAND gate 76.

The NAND gate 76 includes two input nodes and one output node. One of the input nodes of the NAND gate 76 is connected to the output node of the preceding NAND gate 75. This input node of the NAND gate 76 receives the output signal Sig2 from the NAND gate 75. The other input node of the NAND gate 76 receives the reset signal NANDrst. The output node of the NAND gate 76 is connected to the fourth input node of the AND gate 81M in the middle bit judge circuit 147M.

The NAND gate 76 performs a NAND operation of the output signal Sig2 from the preceding NAND gate 75 and the reset signal NANDrst. The NAND gate 76 sends the signal Sig3 indicating the result of the NAND operation to the AND gate 81M.

FIG. 49 is a waveform chart showing various control signals supplied to the sense amplification circuit SA in the memory device 1 according to the embodiment. FIG. 49 also shows the temporal change in the resistance value of each memory cell MC.

The control signal LgcVrefL(L) at time t2 has the signal level "H". The signal level of the control signal LgcVrefL(L) turns from the "H" level to the "L" level at time t63. Here, time t63 is set between the time point at which the bit line voltage VBL for a memory cell MC in the resistance state RS1 becomes equal to or lower than the reference voltage VrefL, and the time point at which the bit line voltage VBL for a memory cell MC in the resistance state RS2 becomes equal to or lower than the reference voltage VrefL.

The control signal LgcVrefL(M) at time t2 has the signal level "H". The signal level of the control signal LgcVrefL (M) turns from the "H" level to the "L" level at time t61. Here, time t61 is set between the time point at which the bit line voltage VBL for a memory cell MC in the resistance state RS0 becomes equal to or lower than the reference voltage VrefL, and the time point at which the bit line voltage VBL for a memory cell MC in the resistance state RS1 becomes equal to or lower than the reference voltage VrefL. The signal level of the control signal LgcVrefL(M) turns from the "L" level to the "H" level at time t64. Here, time t64 is set between the time point at which the bit line voltage VBL for a memory cell MC in the resistance state RS2 becomes equal to or lower than the reference voltage VrefL, and the time point at which the bit line voltage VBL for a memory cell MC in the resistance state RS3 becomes equal to or lower than the reference voltage VrefL.

The control signal LgcVrefL(U) at time t2 has the signal level "H". The signal level of the control signal LgcVrefL (U) turns from the "H" level to the "L" level at time t65. Here, time t65 is set between the time point at which the bit line voltage VBL for a memory cell MC in the resistance state RS3 becomes equal to or lower than the reference voltage VrefL, and the time point at which the bit line voltage VBL for a memory cell MC in the resistance state RS4 becomes equal to or lower than the reference voltage VrefL.

The control signal LgcVrefH(L) at time t2 has the signal level "L". The signal level of the control signal LgcVrefH(L) turns from the "L" level to the "H" level at time t62. Here, time t62 is set between the time point at which the bit line voltage VBL for a memory cell MC in the resistance state RS4 becomes equal to or lower than the reference voltage VrefH, and the time point at which the bit line voltage VBL for a memory cell MC in the resistance state RS5 becomes equal to or lower than the reference voltage VrefH. The signal level of the control signal LgcVrefH(L) turns from the "H" level to the "L" level at time t66. Here, time t66 is set between the time point at which the bit line voltage VBL for a memory cell MC in the resistance state RS6 becomes equal to or lower than the reference voltage VrefH, and the time point at which the bit line voltage VBL for a memory cell MC in the resistance state RS7 becomes equal to or lower than the reference voltage VrefH.

The control signal LgcVrefH(M) at time t2 has the signal level "H". The signal level of the control signal LgcVrefH (M) turns from the "H" level to the "L" level at time t64. Here, time t64 is set between the time point at which the bit line voltage VBL for a memory cell MC in the resistance state RS5 becomes equal to or lower than the reference voltage VrefH, and the time point at which the bit line voltage VBL for a memory cell MC in the resistance state RS6 becomes equal to or lower than the reference voltage VrefH.

The control signal LgcVrefH(U) at time t2 has the signal level "L". The signal level of the control signal LgcVrefH (U) is kept at the "L" level for the period from time t2 to time t3.

The control signal ValidHigh at time t2 has the signal level "H". The signal level of the control signal ValidHigh turns from the "H" level to the "L" level at time t67. Here, time t67 is after time t66. Time t67 is set between time t66 and the time point at which the bit line voltage VBL for a memory cell MC in the resistance state RS7 becomes equal to or lower than the reference voltage VrefH.

(b) Operations

FIGS. 50 to 69 will be referred to for describing exemplary operations of the memory device 1 according to the embodiment.

As in the foregoing embodiment, the memory device 1 according to this embodiment performs its read operation in response to a read command.

At the read operation, the sequencer 180 sets the sense amplification circuit to an initial state.

The sequencer 180 sets, as the initial values, the signal level of the Q node of each of the D-type flip-flops 85, i.e., the latch circuits 85, in the sense amplification circuit SA to the "L" level (that is, a signal of data "0"), and the signal level of the /Q node thereof to the "H" level (that is, a signal of data "1").

As in the foregoing embodiment, the voltage sense circuit 141 obtains the sense signal VDOH and the sense signal VDOL based on a sense result for the bit line voltage VBL.

In the sense amplification circuit SA, each judge circuit 147 serves for a sensing operation for reading data based on various signals supplied.

<Operation of Sense Amplification Circuit SA>

Upon start of the sensing operation, the voltage sense circuit 141 obtains the sense signal VDOH and the sense signal VDOL. The inverted sense signal /VDOH and the inverted sense signal /VDOL are supplied to the circuits 147, 148, and 149 in the sense amplification circuit SA.

The control circuit 148 operates as follows.

The NAND gate 70 receives the inverted signal /LgcVrefH(L) of the control signal LgcVrefH(L), the control signal LgcVrefH(M), the inverted signal /LgcVrefH(U) of the control signal LgcVrefH(U), and the inverted sense signal /VDOH.

The NAND gate 70 performs a NAND operation of the signal /LgcVrefH(L), the signal LgcVrefH(M), the signal /LgcVrefH(U), and the signal /VDOH. The NAND gate 70 outputs the signal SigX indicating the result of the NAND operation.

As described above, in the initial state at the start of the sensing operation, the control signal LgcVrefH(L) has the signal level "L(0)", the control signal LgcVrefH(M) has the signal level "H(1)", and the control signal LgcVrefH(U) has the signal level "L(0)".

As such, for a period T1 from the start of the sensing operation to a given time point, the "H" control signal /LgcVrefH(L), the "H" level control signal LgcVrefH(M), and the "H" level control signal LgcVrefH(U) are supplied to the NAND gate 70.

Supposing that the inverted sense signal /VDOH here has the signal level "H", the NAND gate 70 outputs the "L" level signal SigX for the period T1. If the inverted sense signal /VDOH has the signal level "L", the NAND gate 70 outputs the "H" level signal SigX for the period T1.

In the case where the signal SigX for the period T1 is at the signal level "L", the read target selected cell MC has one of the relatively low resistance states RS0, RS1, RS2, and RS3. In the case where the signal SigX for the period T1 is at the signal level "H", the selected cell MC has one of the relatively high resistance states RS4, RS5, RS6, and RS7.

The NAND gate 71 receives the signal SigX and the control signal SigZ, which is from the NAND gate 72. The NAND gate 71 performs a NAND operation of the signal SigX and the signal SigZ. The NAND gate 71 outputs the signal SigY indicating the result of the NAND operation.

The NAND gate 72 receives the signal SigY and the reset signal NANDrst. The NAND gate 72 performs a NAND operation of the signal SigY and the signal NANDrst. The NAND gate 72 outputs the signal SigZ indicating the result of the NAND operation. In one example, the signal NANDrst at the "L" level is supplied to the NAND gate 72 prior to the start of the operation of the sense amplification circuit SA. At the timing (e.g., time t2) of the start of the operation of the sense amplification circuit SA, the signal level of the reset signal NANDrst is set to the "H" level.

The signal SigZ is supplied to each judge circuit 147 via the signal line 79. At the start of the sensing operation, the signal level of the signal SigZ is set to the "H" level as the initial state, by the "L" level reset signal NANDrst.

The control circuit 149 operates as follows.

The NAND gate 74 receives the inverted signal /LgcVrefL(M) of the control signal LgcVrefL(M) and the inverted signal /VDOL of the sense signal VDOL. The NAND gate 74 performs a NAND operation of the signal /LgcVrefL(M) and the signal /VDOL. The NAND gate 74 outputs the signal Sig1 indicating the result of the NAND operation.

The NAND gate 75 receives the signal Sig1 and the output signal Sig3, which is from the NAND gate 76. The NAND gate 75 performs a NAND operation of the signal Sig1 and the signal Sig3. The NAND gate 75 outputs the signal Sig2 indicating the result of the NAND operation.

The NAND gate 76 receives the signal Sig2 and the reset signal NANDrst. The NAND gate 76 performs a NAND operation of the signal Sig2 and the signal NANDrst. The NAND gate 76 outputs the signal Sig3 indicating the result of the NAND operation.

At the start of the sensing operation, the signal level of the signal Sig3 is set to the "H" level as the initial state, by the "L" level reset signal NANDrst.

In the event that the inverted sense signal /VDOL is set to the "H" level during the period where the control signal LgcVrefL(M) has the signal level "L", the control circuit 149 outputs the "L" level signal Sig3.

In the event that the inverted sense signal /VDOL is set to the "H" level during the period where the control signal LgcVrefL(M) has the signal level "H", the control circuit 149 outputs the "H" level signal Sig3.

The lower bit judge circuit 147L receives the signal SigZ, the inverted sense signal /VDOH, the inverted sense signal /VDOL, the control signal LgcVrefH(L), the control signal LgcVrefL(L), and the control signal ValidHigh.

The AND gate 80L performs an AND operation of the signal SigZ, the inverted sense signal /VDOH, and the control signal LgcVrefH(L). The AND gate 80L outputs the signal AL1 indicating the result of the AND operation to the OR gate 82L.

The AND gate 81L performs an AND operation of the control signal ValidHigh, the inverted sense signal /VDOL, and the control signal LgcVrefL(L). The AND gate 81L outputs the signal AL2 indicating the result of the AND operation to the OR gate 82L.

The OR gate 82L performs an OR operation of the signal AL1 and the signal AL2. The OR gate 82L outputs the signal CLKLb indicating the result of the OR operation.

The lower bit latch circuit 85L, i.e., the D-type flip-flop 85L, receives the signal CLKLb.

In the event that the signal level of the signal CLKLb turns from the "L" level to the "H" level, the lower bit latch circuit (D-type flip-flop) 85L takes the "H" level signal CLKLb into its CLK node. According to the taking in of the signal CLKLb, the signal level of the Q node of the lower bit latch circuit (D-type flip-flop) 85L is changed.

If the signal level of the signal CLKLb is "L", the lower bit latch circuit (D-type flip-flop) 85L does not take this "L" level signal CLKLb into its CLK node. Without the signal CLKLb taken into the CLK node, the signal level of the Q node of the lower bit latch circuit (D-type flip-flop) 85L is maintained.

Accordingly, the lower bit latch circuit (D-type flip-flop) 85L retains the lower bit of the 3-bit data stored in the memory cell MC.

The middle bit judge circuit 147M receives the signal SigZ, the inverted sense signal /VDOH, the inverted sense signal /VDOL, the control signal LgcVrefH(M), the control signal LgcVrefL(M), the control signal ValidHigh, and the signal Sig3.

The AND gate 80M performs an AND operation of the signal SigZ, the inverted sense signal /VDOH, and the control signal LgcVrefH(M). The AND gate 80M outputs the signal AM1 indicating the result of the AND operation to the OR gate 82M.

The AND gate 81M performs an AND operation of the control signal ValidHigh, the inverted sense signal /VDOL, the control signal LgcVrefL(M), and the signal Sig3. The AND gate 81M outputs the signal AM2 indicating the result of the AND operation to the OR gate 82M.

The OR gate 82M performs an OR operation of the signal AM1 and the signal AM2. The OR gate 82M outputs the signal CLKMb indicating the result of the OR operation.

The middle bit latch circuit 85M, i.e., the D-type flip-flop 85M, receives the signal CLKMb.

In the event that the signal level of the signal CLKMb turns from the "L" level to the "H" level, the middle bit latch circuit (D-type flip-flop) 85M takes the "H" level signal CLKMb into its CLK node. According to the taking in of the signal CLKMb, the signal level of the Q node of the middle bit latch circuit (D-type flip-flop) 85M is changed.

If the signal level of the signal CLKMb is "L", the middle bit latch circuit (D-type flip-flop) 85M does not take this "L" level signal CLKMb into its CLK node. Without the signal CLKMb taken into the CLK node, the signal level of the Q node of the middle bit latch circuit (D-type flip-flop) 85M is maintained.

Accordingly, the middle bit latch circuit (D-type flip-flop) 85M retains the middle bit of the 3-bit data stored in the memory cell MC.

The upper bit judge circuit 147U receives the signal SigZ, the inverted sense signal /VDOH, the inverted sense signal /VDOL, the control signal LgcVrefH(U), the control signal LgcVrefL(U), and the control signal ValidHigh.

The AND gate 80U performs an AND operation of the signal SigZ, the inverted sense signal /VDOH, and the control signal LgcVrefH(U). The AND gate 80U outputs the signal AU1 indicating the result of the AND operation to the OR gate 82U.

The AND gate 81U performs an AND operation of the control signal ValidHigh, the inverted sense signal /VDOL, and the control signal LgcVrefL(U). The AND gate 81U outputs the signal AU2 indicating the result of the AND operation to the OR gate 82U.

The OR gate 82U performs an OR operation of the signal AU1 and the signal AU2. The OR gate 82U outputs the signal CLKUb indicating the result of the OR operation.

The upper bit latch circuit 85U, i.e., the D-type flip-flop 85U, receives the signal CLKUb.

In the event that the signal level of the signal CLKUb turns from the "L" level to the "H" level, the upper bit latch circuit (D-type flip-flop) 85U takes the "H" level signal CLKUb into its CLK node. According to the taking in of the signal CLKUb, the signal level of the Q node of the upper bit latch circuit (D-type flip-flop) 85U is changed.

If the signal level of the signal CLKUb is "L", the upper bit latch circuit (D-type flip-flop) 85U does not take this "L" level signal CLKUb into its CLK node. Without the signal CLKUb taken into the CLK node, the signal level of the Q node of the upper bit latch circuit (D-type flip-flop) 85U is maintained.

Accordingly, the upper bit latch circuit (D-type flip-flop) 85U retains the upper bit of the 3-bit data stored in the memory cell MC.

<Reading of Data "101">

FIGS. 50 to 59 will be referred to for describing an operation of the sense amplification circuit SA for a memory cell (selected cell) MC that stores data "101". A memory cell MC that stores data "101" has the resistance state RS1.

FIG. 50 sets forth a timing chart of an operation of the sense amplification circuit SA in the memory device 1 according to the embodiment, in the instance of reading data "101". In FIG. 50, the horizontal axis represents time and the vertical axis represents the bit line voltage VBL and the signal levels of the respective control signals.

Each of FIGS. 51 to 59 is a schematic diagram showing a state of signal levels of the respective signals supplied to the sense amplification circuit SA at a given time in the memory device 1 according to the embodiment.

(Time t2)

As shown in FIG. 50, the signal level (potential) of the signal line 79 at the start of the sensing operation is set to the "H" level as the initial state. Accordingly, in the initial state, the "H" level signal SigZ is supplied to the AND gate 80 in each judge circuit 147.

At time t2, the bit line voltage VBL is set to the voltage Vread higher than the reference voltages VrefH and VrefL. The operation amplifier 41 outputs the "H" level sense signal VDOH. The operation amplifier 42 outputs the "H" level sense signal VDOL.

In the control circuit 148, the NAND gate 70 receives the "L" level inverted sense signal /VDOH. Accordingly, the NAND gate 70 sends the "H" level signal SigX to the NAND gate 71.

The NAND gate 71 sends the "L" level signal SigY to the NAND gate 72 according to the result of the NAND operation of the "H" level signal SigX and the "H" level signal SigZ.

The NAND gate 72 sends the "H" level signal SigZ to each judge circuit 147 via the signal line 79, according to the result of the NAND operation of the "L" level signal SigY and the "H" level reset signal NANDrst.

The control signal ValidHigh has the signal level "H".

For the period T1 up to the time point at which the bit line voltage VBL for a memory cell MC in the resistance state RS4 becomes equal to or lower than the reference voltage VrefH, the control signal LgcVrefH(L) has the signal level "L". The control signal LgcVrefH(M) has the signal level "H" for the period T1. The control signal LgcVrefH(U) has the signal level "L" for the period T1.

In the control circuit 149, the NAND gate 74 receives the "L" level inverted sense signal /VDOL. Accordingly, the NAND gate 74 sends the "H" level signal Sig1 to the NAND gate 75.

The NAND gate 75 sends the "L" level signal Sig2 to the NAND gate 76 according to the result of the NAND operation of the "H" level signal Sig1 and the "H" level signal Sig3.

The NAND gate 76 sends the "H" level signal Sig3 to the AND gate 81M in the middle bit judge circuit 147M, according to the result of the NAND operation of the "L" level signal Sig2 and the "H" level reset signal NANDrst.

(Time tx1)

As seen from FIGS. 50 and 51, the bit line voltage VBL becomes equal to or lower than the reference voltage VrefH at time tx1 in the period T1. The operation amplifier 41 outputs the "L" level sense signal VDOH. Accordingly, the "H" level inverted sense signal /VDOH is supplied to each judge circuit 147 and the control circuit 148.

The NAND gate 70 receives the "H" level inverted sense signal /VDOL, the "H" level inverted signal /LgcVrefH(L), the "H" level control signal LgcVrefH(M), and the "H" level inverted control signal /LgcVrefH(U). The NAND gate 70 sends the "L" level signal SigX to the NAND gate 71 according to the NAND operation of the four "H" level signals received.

The NAND gate 71 sends the "H" level signal SigY to the NAND gate 72 according by the NAND operation of the "L" level signal SigX and the "H" level signal SigZ.

The NAND gate 72 receives the "H" level the signal SigY and the "H" level signal NANDrst. The NAND gate 72 performs a NAND operation of the two "H" level signals SigY and NANDrst. Accordingly, the NAND gate 72 outputs the "L" level signal SigZ to the signal line 79.

The signal level of the signal line 79 turns from the "H" level to the "L" level.

Note that, at time tx1, the inverted sense signal /VDOL has the "L" level. Accordingly, the signal Sig3 output from the control circuit 149 is kept at the "H" level.

In the lower bit judge circuit 147L, the AND gates 80L and 81L, the OR gate 82L, and the lower bit latch circuit (D-type flip-flop) 85L operate as follows.

The AND gate 80L receives the "L" level control signal SigZ, the "H" level inverted sense signal /VDOH, and the control signal LgcVrefH(L). At time tx1, the control signal LgcVrefH(L) has the signal level "L". The AND gate 80L sends the "L" level signal AL1 to the OR gate 82L according to the result of the AND operation of the three signals SigZ, /VDOH, and LgcVrefH(L).

The AND gate 81L receives the "H" level control signal ValidHigh, the "L" level inverted sense signal /VDOL, and the "H" level control signal LgcVrefL(L). The AND gate 81L sends the "L" level signal AL2 to the OR gate 82L according to the result of the AND operation of the three signals ValidHigh, /VDOL, and LgcVrefL(L).

The OR gate 82L sends the "L" level signal CLKLb to the lower bit latch circuit (D-type flip-flop) 85L according to the result of the OR operation of the "L" level signal AL1 and the "L" level signal AL2.

The lower bit latch circuit (D-type flip-flop) 85L does not take the "L" level signal CLKLb into its CLK node. Thus, the lower bit latch circuit (D-type flip-flop) 85L is kept in the initial state. The lower bit latch circuit (D-type flip-flop) 85L for the lower bit retains the "L" level signal (data "0") in the Q node.

In the middle bit judge circuit 147M, the AND gates 80M and 81M, the OR gate 82M, and the middle bit latch circuit (D-type flip-flop) 85M operate as follows.

The AND gate 80M receives the "L" level signal SigZ, the "H" level inverted sense signal /VDOH, and the control signal LgcVrefH(M). At time tx1, the control signal LgcVrefH(M) has the signal level "H". The AND gate 80M sends the "L" level signal AM1 to the OR gate 82M according to the result of the AND operation of the three signals SigZ, /VDOH, and LgcVrefH(M).

The AND gate 81M receives the "H" level control signal ValidHigh, the "L" level inverted sense signal /VDOL, the "H" level control signal LgcVrefL(M), and the "H" level signal Sig3. The AND gate 81M sends the "L" level signal AM2 to the OR gate 82M according to the result of the AND operation of the four signals ValidHigh, /VDOL, LgcVrefL (M), and Sig3.

The OR gate 82M sends the "L" level signal CLKMb to the middle bit latch circuit (D-type flip-flop) 85M according to the result of the OR operation of the "L" level signal AM1 and the "L" level signal AM2.

The middle bit latch circuit (D-type flip-flop) 85M does not take the "L" level signal CLKMb into its CLK node. Thus, the middle bit latch circuit (D-type flip-flop) 85M is kept in the initial state. The middle bit latch circuit (D-type flip-flop) 85M for the middle bit retains the "L" level signal in the Q node.

In the upper bit judge circuit 147U, the AND gates 80U and 81U, the OR gate 82U, and the upper bit latch circuit (D-type flip-flop) 85U operate as follows.

The AND gate 80U receives the "L" level signal SigZ, the "H" level inverted sense signal /VDOH, and the control signal LgcVrefH(U). At time tx1, the control signal LgcVrefH(U) has the signal level "L". The AND gate 80U sends the "L" level signal AU1 to the OR gate 82U according to the result of the AND operation of the three signals SigZ, /VDOH, and LgcVrefH(U).

The AND gate 81U receives the "H" level control signal ValidHigh, the "L" level inverted sense signal /VDOL, and the "H" level control signal LgcVrefL(U). The AND gate 81U sends the "L" level signal AU2 to the OR gate 82U according to the result of the AND operation of the three signals ValidHigh, /VDOL, and LgcVrefL(U).

The OR gate 82U sends the "L" level signal CLKUb to the upper bit latch circuit (D-type flip-flop) 85U according to the result of the OR operation of the "L" level signal AU1 and the "L" level signal AU2.

The upper bit latch circuit (D-type flip-flop) 85U does not take the "L" level signal CLKUb into its CLK node. Thus, the upper bit latch circuit (D-type flip-flop) 85U is kept in the initial state. The upper bit latch circuit (D-type flip-flop) 85U for the upper bit retains the "L" level signal in the Q node.

As described above, in the case where the bit line voltage VBL becomes equal to or lower than the reference voltage VrefH at time tx1 in the period T1, the data retaining states of the latch circuits (D-type flip-flops) 85L, 85M, and 85U are each kept in the initial state.

(Time t61)

As shown in FIG. 50, the sequencer 180 changes the signal level of the control signal LgcVrefL(M) from the "H" level to the "L" level at time t61.

At time t61, the bit line voltage VBL is higher than the reference voltage VrefL and equal to or lower than the reference voltage VrefH. The operation amplifier 41 outputs the "L" level sense signal VDOH. The operation amplifier 42 outputs the "H" level sense signal VDOL.

At time t61, the control signal LgcVrefH(L) has the signal level "L". At time t61, the control signal LgcVrefH(M) has the signal level "H". At time t61, the control signal LgcVrefH(U) has the signal level "L".

In the control circuit 148, the NAND gate 70 outputs the "L" level signal SigX.

The NAND gate 71 outputs the "H" level signal SigY according to the result of the NAND operation of the "L" level signal SigX and the "L" level signal SigZ.

The NAND gate 71 receives the "H" level the signal SigY and the "H" level reset signal NANDrst. Accordingly, the NAND gate 72 outputs the "L" level signal SigZ to the signal line 79 as in the operation at time tx1.

Each of the judge circuits 147 receives the "L" level signal SigZ.

The control circuit 149 receives the "L" level inverted sense signal /VDOL. Accordingly, the control circuit 149 sends the "H" level signal Sig3 to the AND gate 81M as in the operation at time tx1.

As shown in FIG. 52, in the lower bit judge circuit 147L, the AND gates 80L and 81L, the OR gate 82L, and the lower bit latch circuit (D-type flip-flop) 85L operate as follows.

The AND gate 80L performs an AND operation of the "L" level signal SigZ, the "H" level inverted sense signal /VDOH, and the "L" level control signal LgcVrefH(L). The AND gate 80L outputs the "L" level signal AL1 according to the result of the AND operation of the three signals SigZ, /VDOH, and LgcVrefH(L).

The AND gate 81L performs an AND operation of the "H" level control signal ValidHigh, the "L" level inverted sense signal /VDOL, and the "H" level control signal LgcVrefL(L). The AND gate 81L outputs the "L" level signal AL2 according to the result of the AND operation of the three signals ValidHigh, /VDOL, and LgcVrefL(L).

The OR gate 82L outputs the "L" level signal CLKLb according to the result of the OR operation of the "L" level signal AL1 and the "L" level signal AL2. The signal level of the signal CLKLb is kept at the "L" level.

The lower bit latch circuit (D-type flip-flop) 85L keeps the initial state (state of retaining data "0") without taking the "L" level signal CLKLb into its CLK node.

In the middle bit judge circuit 147M, the AND gates 80M and 81M, the OR gate 82M, and the middle bit latch circuit (D-type flip-flop) 85M operate as follows.

The AND gate 80M performs an AND operation of the "L" level signal SigZ, the "H" level inverted sense signal /VDOH, and the "H" level control signal LgcVrefH(M). The AND gate 80M outputs the "L" level signal AM1 according to the result of the AND operation of the signals received.

The AND gate 81M performs an AND operation of the "H" level control signal ValidHigh, the "L" level inverted sense signal /VDOL, the "L" level control signal LgcVrefL(M), and the "H" level signal Sig3. The AND gate 81M outputs the "L" level signal AM2 according to the result of the AND operation of the signals received.

The OR gate 82M outputs the "L" level signal CLKMb according to the result of the OR operation of the "L" level signal AM1 and the "L" level signal AM2. The signal level of the signal CLKMb is kept at the "L" level.

The middle bit latch circuit (D-type flip-flop) 85M keeps the initial state (state of retaining data "0") without taking the "L" level signal CLKMb into its CLK node.

In the upper bit judge circuit 147U, the AND gates 80U and 81U, the OR gate 82U, and the upper bit latch circuit (D-type flip-flop) 85U operate as follows.

The AND gate 80U performs an AND operation of the "L" level signal SigZ, the "H" level inverted sense signal /VDOH, and the "L" level control signal LgcVrefH(U). The AND gate 80U outputs the "L" level signal AU1 according to the result of the AND operation of the three signals SigZ, /VDOH, and LgcVrefH(U).

The AND gate 81U performs an AND operation of the "H" level control signal ValidHigh, the "L" level inverted sense signal /VDOL, and the "H" level control signal LgcVrefL(U). The AND gate 81U outputs the "L" level signal AU2 according to the result of the AND operation of the three signals ValidHigh, /VDOL, and LgcVrefL(U).

The OR gate 82U outputs the "L" level signal CLKUb according to the result of the OR operation of the "L" level signal AU1 and the "L" level signal AU2. The signal level of the signal CLKUb is kept at the "L" level.

The upper bit latch circuit (D-type flip-flop) 85U keeps the initial state (state of retaining data "0") without taking the "L" level signal CLKUb into its CLK node.

(Time tx2)

As shown in FIG. 50, the bit line voltage VBL becomes equal to or lower than the reference voltage VrefL at time tx2. The operation amplifier 42 outputs the "L" level sense signal VDOL.

Accordingly, as shown in FIG. 53, the "H" level inverted sense signal /VDOL and the "H" level inverted sense signal /VDOH are supplied to each of the judge circuits 147 and to the respective control circuits 148 and 149.

In the control circuit 149, the NAND gate 74 receives the "H" level inverted sense signal /VDOL. Here, the signal level of the control signal LgcVrefL(M) has been set to the "L" level.

Thus, the NAND gate 74 receives the "H" level inverted sense signal /VDOL and the "H" level control signal (inverted signal) /LgcVrefL(M). The NAND gate 74 then sends the "L" level signal Sig1 to the NAND gate 75 according to the result of the NAND operation of the two signals /VDOL and /LgcVrefL(M).

The NAND gate 75 sends the "H" level signal Sig2 to the NAND gate 76 according to the result of the NAND operation of the "L" level signal Sig1 and the "H" level signal Sig3.

The NAND gate 76 sends the "L" level signal Sig3 to the AND gate 81M in the middle bit judge circuit 147M, according to the result of the NAND operation of the "H" level signal Sig2 and the "H" level reset signal NANDrst.

The control circuit 148 here outputs the "L" level signal SigZ.

In the lower bit judge circuit 147L, the AND gates 80L and 81L, the OR gate 82L, and the lower bit latch circuit (D-type flip-flop) 85L operate as follows.

The AND gate 80L performs an AND operation of the "L" level signal SigZ, the "H" level inverted sense signal /VDOH, and the "L" level control signal LgcVrefH(L). Accordingly, the AND gate 80L outputs the "L" level signal AL1.

The AND gate 81L receives the "H" level control signal ValidHigh, the "H" level inverted sense signal /VDOL, and the "H" level control signal LgcVrefL(L). The AND gate 81L performs an AND operation of the three "H" level signals ValidHigh, /VDOL, and LgcVrefL(L). The AND gate 81L accordingly outputs the "H" level signal AL2.

The OR gate 82L performs an OR operation of the "L" level signal AL1 and the "H" level signal AL2. Accordingly, the OR gate 82L outputs the "H" level signal CLKLb. The signal level of the signal CLKLb output from the OR gate 82L turns from the "L" level to the "H" level.

The lower bit latch circuit (D-type flip-flop) 85L takes, according to the "L" to "H" level change of the signal CLKLb, the "H" level signal CLKLb into its CLK node.

The lower bit latch circuit (D-type flip-flop) 85L thus takes an "H" level signal into its D node. Accordingly, the signal level of the Q node of the lower bit latch circuit (D-type flip-flop) 85L turns from the "L" level to the "H" level. The lower bit latch circuit (D-type flip-flop) 85L retains the "H" level signal (data "1") in the Q node.

In the middle bit judge circuit 147M, the AND gates 80M and 81M, the OR gate 82M, and the middle bit latch circuit (D-type flip-flop) 85M operate as follows.

The AND gate 80M performs an AND operation of the "L" level signal SigZ, the "H" level inverted sense signal /VDOH, and the "H" level control signal LgcVrefH(M). Accordingly, the AND gate 80M outputs the "L" level signal AM1.

The AND gate 81M performs an AND operation of the "H" level control signal ValidHigh, the "H" level inverted sense signal /VDOL, the "L" level control signal LgcVrefL (M), and the "L" level signal Sig3. The AND gate 81M outputs the "L" level signal AM2 according to the result of the AND operation of the four signals ValidHigh, /VDOL, LgcVrefL(M), and Sig3.

The OR gate 82M performs an OR operation of the "L" level signal AM1 and the "L" level signal AM2. Accordingly, the OR gate 82M outputs the "L" level signal CLKMb. The signal level of the signal CLKMb is kept at the "L" level.

The middle bit latch circuit (D-type flip-flop) 85M keeps the state of retaining data "0" without taking the "L" level signal CLKMb into its CLK node.

In the upper bit judge circuit 147U, the AND gates 80U and 81U, the OR gate 82U, and the upper bit latch circuit (D-type flip-flop) 85U operate as follows.

The AND gate 80U performs an AND operation of the "L" level signal SigZ, the "H" level inverted sense signal /VDOH, and the "L" level control signal LgcVrefH(U). Accordingly, the AND gate 80U outputs the "L" level signal AU1.

The AND gate 81U receives the "H" level control signal ValidHigh, the "H" level inverted sense signal /VDOL, and the "H" level control signal LgcVrefL(U). The AND gate 81U performs an AND operation of the three "H" level signals ValidHigh, /VDOL, and LgcVrefL(U). The AND gate 81U accordingly outputs the "H" level signal AU2.

The OR gate 82U performs an OR operation of the "L" level signal AU1 and the "H" level signal AU2. Accordingly, the OR gate 82U outputs the "H" level signal CLKUb. The signal level of the signal CLKUb output from the OR gate 82U turns from the "L" level to the "H" level.

The upper bit latch circuit (D-type flip-flop) 85U takes, according to the "L" to "H" level change of the signal CLKUb, the "H" level signal CLKUb into its CLK node.

The upper bit latch circuit (D-type flip-flop) 85U thus takes an "H" level signal into its D node. Accordingly, the signal level of the Q node of the upper bit latch circuit (D-type flip-flop) 85U turns from the "L" level to the "H" level. The upper bit latch circuit (D-type flip-flop) 85U retains the "H" level signal in the Q node.

As a result, the latch circuits (D-type flip-flops) 85L, 85M, and 85U at time tx2 retain data as follows. The lower bit latch circuit (D-type flip-flop) 85L retains data "1". The middle bit latch circuit (D-type flip-flop) 85M retains data "0". The upper bit latch circuit (D-type flip-flop) 85U retains data "1".

Therefore, the 3-bit data indicated by the three latch circuits (D-type flip-flops) 85L, 85M, and 85U at the timing of the bit line voltage VBL becoming equal to or lower than the low-potential-side reference voltage VrefL (i.e., at time tx2) is data "101".

(Time t62)

As seen from FIGS. 50 and 54, the sequencer 180 at time t62 changes the signal level of the control signal LgcVrefH (L) from the "L" level to the "H" level. Accordingly, the signal level of the control signal /LgcVrefH(L) turns to the level "L".

In the control circuit 148, the NAND gate 70 receives the "H" level inverted sense signal /VDOH, the "L" level signal /LgcVrefH(L), the "H" level signal LgcVrefH(M), and the "H" level signal /LgcVrefH(U). The NAND gate 70 performs a NAND operation of the four signals /VDOH, /LgcVrefH(L), LgcVrefH(M), and /LgcVrefH(U). Accordingly, the signal level of the signal SigX output from the NAND gate 70 turns from the "L" level to the "H" level.

The NAND gate 71 outputs the "H" level signal SigY according to the result of the NAND operation of the "H" level signal SigX and the "L" level signal SigZ.

The NAND gate 72 outputs the "L" level control signal SigZ according to the result of the NAND operation of the "H" level signal SigY and the "H" level signal NANDrst.

The control circuit 149 here outputs the "L" level signal Sig3.

In the lower bit judge circuit 147L, the AND gates 80L and 81L, the OR gate 82L, and the lower bit latch circuit (D-type flip-flop) 85L operate as follows.

The AND gate 80L receives the "L" level control signal SigZ, the "H" level inverted sense signal /VDOH, and the "H" level control signal LgcVrefH(L). The AND gate 80L sends the "L" level signal AL1 to the OR gate 82L according to the result of the AND operation of the three signals SigZ, /VDOH, and LgcVrefH(L).

The AND gate 81L sends the "H" level signal AL2 to the OR gate 82L according to the result of the AND operation of the "H" level control signal ValidHigh, the "H" level inverted sense signal /VDOL, and the "H" level control signal LgcVrefL(L).

The OR gate 82L sends the "H" level signal CLKLb to the lower bit latch circuit (D-type flip-flop) 85L according to the result of the OR operation of the "L" level signal AL1 and the "H" level signal AL2.

The lower bit latch circuit (D-type flip-flop) 85L keeps its data retaining state without taking the signal CLKLb kept at the "H" level into its CLK node. As such, the lower bit latch circuit (D-type flip-flop) 85L retains the "H" level signal in its Q node.

In the middle bit judge circuit 147M, the AND gates 80M and 81M, the OR gate 82M, and the middle bit latch circuit (D-type flip-flop) 85M operate as follows.

The AND gate 80M sends the "L" level signal AM1 to the OR gate 82M according to the AND operation of the "L" level control signal SigZ, the "H" level inverted sense signal /VDOH, and the "H" level control signal LgcVrefH(M).

The AND gate 81M sends the "L" level signal AM2 to the OR gate 82M according to the result of the AND operation of the "H" level control signal ValidHigh, the "H" level inverted sense signal /VDOL, the "L" level control signal LgcVrefL(M), and the "L" level signal Sig3.

The OR gate 82M sends the "L" level signal CLKMb to the middle bit latch circuit (D-type flip-flop) 85M according to the result of the OR operation of the "L" level signal AM1 and the "L" level signal AM2.

The middle bit latch circuit (D-type flip-flop) 85M keeps the state of retaining data "0" in its Q node without taking in the "L" level signal CLKMb.

In the upper bit judge circuit 147U, the AND gates 80U and 81U, the OR gate 82U, and the upper bit latch circuit (D-type flip-flop) 85U operate as follows.

The AND gate 80U sends the "L" level signal AU1 to the OR gate 82U according to the AND operation of the "L" level control signal SigZ, the "H" level inverted sense signal /VDOH, and the "L" level control signal LgcVrefH(U).

The AND gate 81U sends the "H" level signal AU2 to the OR gate 82U according to the AND operation of the "H" level control signal ValidHigh, the "H" level inverted sense signal /VDOL, and the "H" level control signal LgcVrefL (U).

The OR gate 82U sends the "H" level signal CLKUb to the upper bit latch circuit (D-type flip-flop) 85U according to the result of the OR operation of the "L" level signal AU1 and the "H" level signal AU2.

The upper bit latch circuit (D-type flip-flop) 85U keeps its data retaining state without taking the signal CLKUb kept at the "H" level into its CLK node. As such, the upper bit latch circuit (D-type flip-flop) 85U retains the "H" level signal in its Q node.

(Time t63)

As seen from FIGS. 50 and 55, the sequencer 180 at time t63 changes the signal level of the control signal LgcVrefL (L) from the "H" level to the "L" level.

The control circuit 148 outputs the "L" level signal SigZ.

The control circuit 149 outputs the "L" level signal Sig3.

In the lower bit judge circuit 147L, the AND gates 80L and 81L, the OR gate 82L, and the lower bit latch circuit (D-type flip-flop) 85L operate as follows.

The AND gate 80L sends the "L" level signal AL1 to the OR gate 82L according to the result of the AND operation of the "L" level control signal SigZ, the "H" level inverted sense signal /VDOH, and the "H" level control signal LgcVrefH(L).

The AND gate 81L receives the "H" level control signal ValidHigh, the "H" level inverted sense signal /VDOL, and the "L" level control signal LgcVrefL(L). The AND gate 81L sends the "L" level signal AL2 to the OR gate 82L according to the result of the AND operation of the three signals ValidHigh, /VDOL, and LgcVrefL(L). In this manner, the signal level of the signal output from the AND gate 81L turns from the "H" level to the "L" level.

The OR gate 82L sends the "L" level signal CLKLb to the lower bit latch circuit (D-type flip-flop) 85L according to result of the OR operation of the "L" level signal AL1 and the "L" level signal AL2. In this manner, the signal level of the signal CLKLb turns from the "H" level to the "L" level.

The lower bit latch circuit (D-type flip-flop) 85L keeps the state of retaining the "H" level signal in its Q node without taking in the signal CLKLb shifted to the "L" level.

In the middle bit judge circuit 147M, the AND gates 80M and 81M, the OR gate 82M, and the middle bit latch circuit (D-type flip-flop) 85M operate as follows.

The AND gate 80M sends the "L" level signal AM1 to the OR gate 82M according to the result of the AND operation of the "L" level control signal SigZ, the "H" level inverted sense signal /VDOH, and the "H" level control signal LgcVrefH(M).

The AND gate 81M sends the "L" level signal AM2 to the OR gate 82M according to the result of the AND operation of the "H" level control signal ValidHigh, the "H" level inverted sense signal /VDOL, the "L" level control signal LgcVrefL(M), and the "L" level signal Sig3.

The OR gate 82M sends the "L" level signal CLKMb to the middle bit latch circuit (D-type flip-flop) 85M according to the result of the OR operation of the "L" level signal AM1 and the "L" level signal AM2.

The middle bit latch circuit (D-type flip-flop) 85M keeps the state of retaining the "L" level signal in its Q node without taking in the "L" level signal CLKMb.

In the upper bit judge circuit 1470, the AND gates 80U and 81U, the OR gate 82U, and the upper bit latch circuit (D-type flip-flop) 85U operate as follows.

The AND gate 80U sends the "L" level signal AU1 to the OR gate 82U according to the result of the AND operation of the "L" level control signal SigZ, the "H" level inverted sense signal /VDOH, and the "L" level control signal LgcVrefH(U).

The AND gate 81U sends the "H" level signal AU2 to the OR gate 82U according to the result of the AND operation of the "H" level control signal ValidHigh, the "H" level inverted sense signal /VDOL, and the "H" level control signal LgcVrefL(U).

The OR gate 82U sends the "H" level signal CLKUb to the upper bit latch circuit (D-type flip-flop) 85U according to the result of the OR operation of the "L" level signal AU1 and the "H" level signal AU2.

The upper bit latch circuit (D-type flip-flop) 85U keeps the state of retaining the "H" level signal in its Q node without taking the signal CLKUb kept at the "H" level into its CLK node.

(Time t64)

As seen from FIGS. 50 and 56, the sequencer 180 at time t64 changes the signal levels of the control signal LgcVrefH(M) and the control signal LgcVrefL(M). The sequencer 180 changes the signal level of the control signal LgcVrefH(M) from the "H" level to the "L" level. The sequencer 180 changes the signal level of the control signal LgcVrefL(M) from the "L" level to the "H" level.

Accordingly, in the control circuit 148, the NAND gate 70 receives the "H" level inverted sense signal /VDOH, the "L" level signal /LgcVrefH(L), the "L" level signal LgcVrefH (M), and the "H" level signal /LgcVrefH(U). The NAND gate 70 performs a NAND operation of the four signals /VDOH, /LgcVrefH(L), LgcVrefH(M), and /LgcVrefH(U). The NAND gate 70 accordingly sends the "H" level signal SigX to the NAND gate 71.

The NAND gate 71 sends the "H" level signal SigY to the NAND gate 72 according to the result of the NAND operation of the "H" level signal SigX and the "L" level signal SigZ.

The NAND gate 72 outputs the "L" level signal SigZ according to the result of the NAND operation of the "H" level signal SigY and the "H" level reset signal NANDrst.

In the control circuit 149, the NAND gate 74 receives the "H" level inverted sense signal /VDOL and the "L" level signal /LgcVrefL(M). The NAND gate 74 sends the "H" level signal Sig1 to the NAND gate 75 according to the result of the NAND operation of the two signals /VDOL and /LgcVrefL(M).

The NAND gate 75 sends the "H" level signal Sig2 to the NAND gate 75 according to the result of the NAND operation of the "H" level signal Sig1 and the "L" level signal Sig3.

The NAND gate 76 outputs the "L" level signal Sig3 according to the result of the NAND operation of the "H" level signal Sig2 and the "H" level reset signal NANDrst.

In the lower bit judge circuit 147L, the AND gates 80L and 81L, the OR gate 82L, and the lower bit latch circuit (D-type flip-flop) 85L operate as follows.

The AND gate 80L sends the "L" level signal AL1 to the OR gate 82L according to the result of the AND operation of the "L" level control signal SigZ, the "H" level inverted sense signal /VDOH, and the "H" level control signal LgcVrefH(L).

The AND gate 81L sends the "L" level signal AL2 to the OR gate 82L according to the result of the AND operation of the "H" level control signal ValidHigh, the "H" level inverted sense signal /VDOL, and the "L" level control signal LgcVrefL(L).

The OR gate 82L sends the "L" level signal CLKLb to the lower bit latch circuit (D-type flip-flop) 85L according to the result of the OR operation of the "L" level signal AL1 and the "L" level signal AL2. The signal level of the signal CLKLb is kept at the "L" level.

The lower bit latch circuit (D-type flip-flop) 85L keeps the state of retaining the "H" level signal in its Q node without taking in the "L" level signal CLKLb.

In the middle bit judge circuit 147M, the AND gates 80M and 81M, the OR gate 82M, and the middle bit latch circuit (D-type flip-flop) 85M operate as follows.

The AND gate 80M receives the "L" level control signal SigZ, the "H" level inverted sense signal /VDOH, and the "L" level control signal LgcVrefH(M). The AND gate 80M sends the "L" level signal AM1 to the OR gate 82M according to the result of the AND operation of the signals SigZ, /VDOH, and LgcVrefH(M).

The AND gate 81M receives the "H" level control signal ValidHigh, the "H" level inverted sense signal /VDOL, the "H" level control signal LgcVrefL(M), and the "L" level signal Sig3. The AND gate 81M performs an AND operation of the four signals ValidHigh, /VDOL, LgcVrefL(M), and Sig3. Accordingly, the AND gate 81M sends the "L" level signal AM2 to the OR gate 82M.

The OR gate 82M sends the "L" level signal CLKMb to the middle bit latch circuit (D-type flip-flop) 85M according to the result of the OR operation of the "L" level signal AM1 and the "L" level signal AM2. The signal level of the signal CLKMb is kept at the "L" level.

The middle bit latch circuit (D-type flip-flop) 85M, according to the signal CLKMb kept at the "L" level, does not take this "L" level signal CLKMb into its CLK node. Thus, no signal is taken into the D node of the middle bit latch circuit (D-type flip-flop) 85M here.

The middle bit latch circuit (D-type flip-flop) 85M therefore retains the "L" level signal (data "0") in its Q node.

As described above, in the event that the signal level of the sense signal VDOL turns to the "L" level during the period where the control signal LgcVrefL(M) is set to the signal level "L", the data retained in the middle bit latch circuit (D-type flip-flop) 85M is kept at data "0" by the presence of the "L" level signal Sig3 even with the "L" to "H" signal level change of the control signal LgcVrefL(M).

In the upper bit judge circuit 147U, the AND gates 80U and 81U, the OR gate 82U, and the upper bit latch circuit (D-type flip-flop) 85U operate as follows.

The AND gate 80U sends the "L" level signal AU1 to the OR gate 82U according to the result of the AND operation of the "L" level control signal SigZ, the "H" level inverted sense signal /VDOH, and the "L" level control signal LgcVrefH(U).

The AND gate 81U sends the "H" level signal AU2 to the OR gate 82U according to the result of the AND operation of the "H" level control signal ValidHigh, the "H" level inverted sense signal /VDOL, and the "H" level control signal LgcVrefL(U).

The OR gate 82U sends the "H" level signal CLKUb to the upper bit latch circuit (D-type flip-flop) 85U according to the result of the OR operation of the "L" level signal AU1 and the "H" level signal AU2.

The upper bit latch circuit (D-type flip-flop) 85U continues to retain the "H" level signal in its Q node according to the signal CLKUb kept at the "H" level.

(Time t65)

As seen from FIGS. 50 and 57, the sequencer 180 at time t65 changes the signal level of the control signal LgcVrefL (U) from the "H" level to the "L" level.

The control circuit 148 outputs the "L" level signal SigZ.

The control circuit 149 outputs the "L" level signal Sig3.

In the lower bit judge circuit 147L, the AND gates 80L and 81L, the OR gate 82L, and the lower bit latch circuit (D-type flip-flop) 85L operate as follows.

The AND gate 80L sends the "L" level signal AL1 to the OR gate 82L according to the result of the AND operation of the "L" level control signal SigZ, the "H" level inverted sense signal /VDOH, and the "H" level control signal LgcVrefH(L).

The AND gate 81L sends the "L" level signal AL2 to the OR gate 82L according to the result of the AND operation of the "H" level control signal ValidHigh, the "H" level inverted sense signal /VDOL, and the "L" level control signal LgcVrefL(L).

The OR gate 82L sends the "L" level signal CLKLb to the lower bit latch circuit (D-type flip-flop) 85L according to the result of the OR operation of the "L" level signal AL1 and the "L" level signal AL2.

The lower bit latch circuit (D-type flip-flop) 85L keeps the state of retaining the "H" level signal in its Q node according to the signal CLKLb kept at the "L" level.

In the middle bit judge circuit 147M, the AND gates 80M and 81M, the OR gate 82M, and the middle bit latch circuit (D-type flip-flop) 85M operate as follows.

The AND gate 80M sends the "L" level signal AM1 to the OR gate 82M according to the result of the AND operation of the "L" level control signal SigZ, the "H" level inverted sense signal /VDOH, and the "L" level control signal LgcVrefH(M).

The AND gate 81M sends the "L" level signal AM2 to the OR gate 82M according to the result of the AND operation of the "H" level control signal ValidHigh, the "H" level inverted sense signal /VDOL, the "H" level control signal LgcVrefL(M), and the "L" level signal Sig3.

The OR gate 82M sends the "L" level signal CLKMb to the middle bit latch circuit (D-type flip-flop) 85M according to the result of the OR operation of the "L" level signal AM1 and the "L" level signal AM2.

The middle bit latch circuit (D-type flip-flop) 85M keeps the state of retaining the "L" level signal in its Q node according to the signal CLKMb kept at the "L" level.

In the upper bit judge circuit 147U, the AND gates 80U and 81U, the OR gate 82U, and the upper bit latch circuit (D-type flip-flop) 85U operate as follows.

The AND gate 80U sends the "L" level signal AU1 to the OR gate 82U according to the result of the AND operation of the "L" level signal SigZ, the "H" level inverted sense signal /VDOH, and the "L" level control signal LgcVrefH (U).

The AND gate 81U receives the "H" level control signal ValidHigh, the "H" level inverted sense signal /VDOL, and the "L" level control signal LgcVrefL(U). The AND gate 81U sends the "L" level signal AU2 to the OR gate 82U according to the result of the AND operation of the three signals ValidHigh, /VDOL, and LgcVrefL(U).

The OR gate 82U sends the "L" level signal CLKUb to the upper bit latch circuit (D-type flip-flop) 85U according to the result of the OR operation of the "L" level signal AU1 and the "L" level signal AU2. The signal level of the signal CLKUb turns from the "H" level to the "L" level.

The upper bit latch circuit (D-type flip-flop) 85U keeps the state of retaining the "H" level signal in its Q node according to the "L" level signal CLKUb.
(Time t66)

As seen from FIGS. 50 and 58, the sequencer 180 at time t66 changes the signal level of the control signal LgcVrefH (L) from the "H" level to the "L" level. Accordingly, the signal level of the signal /LgcVrefH(L) turns from the "L" level to the "H" level.

In the control circuit 148, the NAND gate 70 receives the "H" level inverted sense signal /VDOH, the "H" level signal /LgcVrefH(L), the "L" level signal LgcVrefH(M), and the "H" level signal /LgcVrefH(U). The NAND gate 70 outputs the "H" level signal SigX according to the result of the NAND operation of the four signals /VDOH, /LgcVrefH(L), LgcVrefH(M), and /LgcVrefH(U).

The NAND gate 71 outputs the "H" level signal SigY according to the result of the NAND operation of the "H" level signal SigX and the "L" level signal SigZ.

The NAND gate 72 outputs the "L" level control signal SigZ according to the result of the NAND operation of the "H" level signal SigY and the "H" level signal NANDrst.

The control circuit 149 outputs the "L" level signal Sig3.

In the lower bit judge circuit 147L, the AND gates 80L and 81L, the OR gate 82L, and the lower bit latch circuit (D-type flip-flop) 85L operate as follows.

The AND gate 80L receives the "L" level signal SigZ, the "H" level inverted sense signal /VDOH, and the "L" level control signal LgcVrefH(L). The AND gate 80L outputs the "L" level signal AL1 according to the result of the AND operation of the three signals SigZ, /VDOH, and LgcVrefH (L).

The AND gate 81L sends the "L" level signal AL2 to the OR gate 82L according to the result of the AND operation of the "H" level control signal ValidHigh, the "H" level inverted sense signal /VDOL, and the "L" level control signal LgcVrefL(L).

The OR gate 82L sends the "L" level signal CLKLb to the lower bit latch circuit (D-type flip-flop) 85L according to the result of the OR operation of the "L" level signal AL1 and the "L" level signal AL2.

The lower bit latch circuit (D-type flip-flop) 85L keeps the state of retaining the "H" level signal in its Q node according to the signal CLKLb kept at the "L" level.

In the middle bit judge circuit 147M, the AND gates 80M and 81M, the OR gate 82M, and the middle bit latch circuit (D-type flip-flop) 85M operate as follows.

The AND gate 80M sends the "L" level signal AM1 to the OR gate 82M according to the result of the AND operation of the "L" level control signal SigZ, the "H" level inverted sense signal /VDOH, and the "L" level control signal LgcVrefH(M).

The AND gate 81M sends the "L" level signal AM2 to the OR gate 82M according to the result of the AND operation of the "H" level control signal ValidHigh, the "H" level inverted sense signal /VDOL, the "H" level control signal LgcVrefL(M), and the "L" level signal Sig3.

The OR gate 82M sends the "L" level signal CLKMb to the middle bit latch circuit (D-type flip-flop) 85M according to the result of the OR operation of the "L" level signal AM1 and the "L" level signal AM2.

The middle bit latch circuit (D-type flip-flop) 85M keeps the state of retaining the "L" level signal in its Q node according to the signal CLKMb kept at the "L" level.

In the upper bit judge circuit 147U, the AND gates 80U and 81U, the OR gate 82U, and the upper bit latch circuit (D-type flip-flop) 85U operate as follows.

The AND gate 80U sends the "L" level signal AU1 to the OR gate 82U according to the result of the AND operation of the "L" level signal SigZ, the "H" level inverted sense signal /VDOH, and the "L" level control signal LgcVrefH (U).

The AND gate 81U sends the "L" level signal AU2 to the OR gate 82U according to the result of the AND operation of the "H" level control signal ValidHigh, the "H" level inverted sense signal /VDOL, and the "L" level control signal LgcVrefL(U).

The OR gate 82U sends the "L" level signal CLKUb to the upper bit latch circuit (D-type flip-flop) 85U according to the result of the OR operation of the "L" level signal AU1 and the "L" level signal AU2.

The upper bit latch circuit (D-type flip-flop) 85U keeps the state of retaining the "H" level signal in its Q node according to the signal CLKUb kept at the "L" level.
(Time t67)

As seen from FIGS. 50 and 59, the sequencer 180 at time t67 changes the signal level of the control signal ValidHigh from the "H" level to the "L" level.

The control circuit 148 outputs the "L" level signal SigZ.

The control circuit 149 outputs the "L" level signal Sig3.

In the lower bit judge circuit 147L, the AND gates 80L and 81L, the OR gate 82L, and the lower bit latch circuit (D-type flip-flop) 85L operate as follows.

The AND gate 80L receives the "L" level signal SigZ, the "H" level inverted sense signal /VDOH, and the "L" level control signal LgcVrefH(L). The AND gate 80L sends the "L" level signal AL1 to the OR gate 82L according to the result of the AND operation of the three signals SigZ, /VDOH, and LgcVrefH(L).

The AND gate 81L receives the "L" level control signal ValidHigh, the "H" level inverted sense signal /VDOL, and the "L" level control signal LgcVrefL(L). The AND gate 81L sends the "L" level signal AL2 to the OR gate 82L according to the result of the AND operation of the three signals ValidHigh, /VDOL, and LgcVrefL(L).

The OR gate 82L outputs the "L" level signal CLKLb according to the result of the OR operation of the "L" level signal AL1 and the "L" level signal AL2.

Thus, the lower bit latch circuit (D-type flip-flop) 85L maintains the "H" level signal retained in its Q node, according to the signal CLKLb kept at the "L" level.

In the middle bit judge circuit 147M, the AND gates 80M and 81M, the OR gate 82M, and the middle bit latch circuit (D-type flip-flop) 85M operate as follows.

The AND gate 80M sends the "L" level signal AM1 to the OR gate 82M according to the result of the AND operation of the "L" level control signal SigZ, the "H" level inverted sense signal /VDOH, and the "L" level control signal LgcVrefH(M).

The AND gate 81M receives the "L" level control signal ValidHigh, the "H" level inverted sense signal /VDOL, the "H" level control signal LgcVrefL(M), and the "L" level signal Sig3. The AND gate 81M outputs the "L" level signal AM2 according to the result of the AND operation of the four signals ValidHigh, /VDOL, LgcVrefL(M), and Sig3.

The OR gate 82M outputs the "L" level signal CLKMb according to the result of the OR operation of the "L" level signal AM1 and the "L" level signal AM2.

Thus, the middle bit latch circuit (D-type flip-flop) 85M maintains the "L" level signal retained in its Q node, according to the signal CLKMb kept at the "L" level.

In the upper bit judge circuit 147U, the AND gates 80U and 81U, the OR gate 82U, and the upper bit latch circuit (D-type flip-flop) 85U operate as follows.

The AND gate 80U sends the "L" level signal AU1 to the OR gate 82U according to the result of the AND operation of the "L" level signal SigZ, the "H" level inverted sense signal /VDOH, and the "L" level control signal LgcVrefH(U).

The AND gate 81U receives the "L" level control signal ValidHigh, the "H" level inverted sense signal /VDOL, and the "L" level control signal LgcVrefL(U). The AND gate 81U sends the "L" level signal AU2 to the OR gate 82U according to the result of the AND operation of the three signals ValidHigh, /VDOL, and LgcVrefL(U).

The OR gate 82U outputs the "L" level signal CLKUb according to the result of the OR operation of the "L" level signal AU1 and the "L" level signal AU2.

Thus, the upper bit latch circuit (D-type flip-flop) 85U maintains the "H" level signal retained in its Q node, according to the signal CLKUb kept at the "L" level.

As described above, in the case where the selected cell MC stores data "101", the data retained in each of the latch circuits (D-type flip-flops) 85 is not changed even with the signal level change of the control signal ValidHigh.

At time t3, the sense amplification circuit SA terminates the sensing operation.

The latch circuits (D-type flip-flops) 85L, 85M, and 85U at time t3 stand in the following data retaining states. The upper bit latch circuit (D-type flip-flop) 85U retains data "1". The middle bit latch circuit (D-type flip-flop) 85M retains data "0". The lower bit latch circuit (D-type flip-flop) 85L retains data "1". As a result, the 3-bit data indicated by the three latch circuits (D-type flip-flops) 85 is data "101".

The sense amplification circuit SA sends the data in the latch circuits (D-type flip-flops) 85 to the data register 150. The data "101" is thus transferred from the sense amplification circuit SA to the data register 150.

In the manner as described above, data "101" is read from the selected cell MC through the sensing operation by the sense amplification circuit SA shown in FIG. 48 in the memory device according to the embodiment.

<Reading of Data "011">

FIGS. 60 to 69 will be referred to for describing an operation of the sense amplification circuit SA for a memory cell (selected cell) MC that stores data "011". A memory cell MC that stores data "011" has the resistance state RS5.

FIG. 60 sets forth a timing chart of an operation of the sense amplification circuit SA in the memory device 1 according to the embodiment, in the instance of reading data "011". In FIG. 60, the horizontal axis represents time and the vertical axis represents the bit line voltage VBL and the signal levels of the respective control signals.

Each of FIGS. 61 to 69 is a schematic diagram showing a state of signal levels of the respective signals supplied to the sense amplification circuit SA at a given time in the memory device 1 according to the embodiment.
(Time t61)

As seen from FIGS. 60 and 61, the sequencer 180 at time t61 changes, as in the above example, the signal level of the control signal LgcVrefL(M) from the "H" level to the "L" level.

In the case where the selected cell MC stores data "011", the sense signals VDOH and VDOL each have the signal level "H" at time t61. Accordingly, each of the signal levels of the inverted sense signals /VDOH and /VDOL is the "L" level.

In the control circuit 148, the NAND gate 70 receives the "L" level inverted sense signal /VDOH, the "H" level control signal /LgcVrefH(L), the "H" level control signal LgcVrefH(M), and the "H" level control signal /LgcVrefH (U). The NAND gate 70 outputs the "H" level signal SigX according to the result of the NAND operation of the signals received.

The NAND gate 71 outputs the "L" level signal SigY according to the result of the NAND operation of the "H" level signal SigX and the "H" level signal SigZ.

The NAND gate 72 outputs the "H" level signal SigZ according to the result of the NAND operation of the "L" level signal SigY and the "H" level reset signal NANDrst.

In the control circuit 149, the NAND gate 74 sends the "H" level signal Sig1 to the NAND gate 75 according to the result of the NAND operation of the "L" level inverted sense signal /VDOL and the "H" level control signal /LgcVrefL (M).

The NAND gate 75 sends the "L" level signal Sig2 to the NAND gate 76 according to the result of the NAND operation of the "H" level signal Sig1 and the "H" level signal Sig3.

The NAND gate 76 sends the "H" level signal Sig3 to the AND gate 81M in the middle bit judge circuit 147M, based on the "L" level signal Sig2 and the "H" level reset signal NANDrst.

In the lower bit judge circuit 147L, the AND gates 80L and 81L, the OR gate 82L, and the lower bit latch circuit (D-type flip-flop) 85L operate as follows.

The AND gate 80L receives the "H" level control signal SigZ, the "L" level inverted sense signal /VDOH, and the "L" level control signal LgcVrefH(L). The AND gate 80L sends the "L" level signal AL1 to the OR gate 82L according to the result of the AND operation of the signals SigZ, /VDOH, and LgcVrefH(L).

The AND gate 81L receives the "H" level control signal ValidHigh, the "L" level inverted sense signal /VDOL, and the "H" level control signal LgcVrefL(L). The AND gate 81L sends the "L" level signal AL2 to the OR gate 82L according to the result of the AND operation of the signals ValidHigh, /VDOL, and LgcVrefL(L).

The OR gate 82L sends the "L" level signal CLKLb to the lower bit latch circuit (D-type flip-flop) 85L according to the result of the OR operation of the "L" level signal AL1 and the "L" level signal AL2.

The lower bit latch circuit (D-type flip-flop) 85L keeps its initial state without taking the "L" level signal CLKLb into its CLK node.

In the middle bit judge circuit 147M, the AND gates 80M and 81M, the OR gate 82M, and the middle bit latch circuit (D-type flip-flop) 85M operate as follows.

The AND gate 80M receives the "H" level control signal SigZ, the "L" level inverted sense signal /VDOH, and the "H" level control signal LgcVrefH(M). The AND gate 80M sends the "L" level signal AM1 to the OR gate 82M according to the result of the AND operation of the signals SigZ, /VDOH, and LgcVrefH(M).

The AND gate 81M receives the "H" level control signal ValidHigh, the "L" level inverted sense signal /VDOL, the "L" level control signal LgcVrefL(M), and the "H" level signal Sig3. The AND gate 81M sends the "L" level signal AM2 to the OR gate 82M according to the result of the AND operation of the signals ValidHigh, /VDOL, LgcVrefL(M), and Sig3.

The OR gate 82M sends the "L" level signal CLKMb to the middle bit latch circuit (D-type flip-flop) 85M according to the result of the OR operation of the "L" level signal AM1 and the "L" level signal AM2.

The middle bit latch circuit (D-type flip-flop) 85M keeps its initial state without taking the "L" level signal CLKMb into its CLK node.

In the upper bit judge circuit 147U, the AND gates 80U and 81U, the OR gate 82U, and the upper bit latch circuit (D-type flip-flop) 85U operate as follows.

The AND gate 80U receives the "H" level control signal SigZ, the "L" level inverted sense signal /VDOH, and the "L" level control signal LgcVrefH(U). The AND gate 80U sends the "L" level signal AU1 to the OR gate 82U according to the result of the AND operation of the signals SigZ, /VDOH, and LgcVrefH(U).

The AND gate 81U receives the "H" level control signal ValidHigh, the "L" level inverted sense signal /VDOL, and the "H" level control signal LgcVrefL(U). The AND gate 81U sends the "L" level signal AU2 to the OR gate 82U according to the result of the AND operation of the received signals ValidHigh, /VDOL, and LgcVrefL(U).

The OR gate 82U sends the "L" level signal CLKUb to the upper bit latch circuit (D-type flip-flop) 85U according to the result of the OR operation of the "L" level signal AU1 and the "L" level signal AU2.

The upper bit latch circuit (D-type flip-flop) 85U keeps its initial state without taking the "L" level signal CLKUb into its CLK node.

(Time t62)

As seen from FIGS. 60 and 62, the sequencer 180 at time t62 changes the signal level of the control signal LgcVrefH (L) from the "L" level to the "H" level.

If the selected cell MC stores data "011", the inverted sense signals /VDOH and /VDOL each have the signal level "L" at time t62, as at time t61.

In the control circuit 148, the NAND gate 70 sends the "H" level signal SigX to the NAND gate 71 according to the result of the NAND operation of the "L" level inverted sense signal /VDOH, the "L" level control signal /LgcVrefH(L), the "H" level control signal LgcVrefH(M), and the "H" level control signal /LgcVrefH(U).

The NAND gate 71 sends the "L" level signal SigY to the NAND gate 72 according to the result of the NAND operation of the "H" level signal SigX and the "H" level signal SigZ.

The NAND gate 72 outputs the "H" level signal SigZ to the signal line 79 according to the result of the NAND operation of the "L" level signal SigY and the "H" level signal NANDrst.

The control circuit 149 sends the "H" level signal Sig3 to the AND gate 81M in the middle bit judge circuit 147M according to the "L" level inverted sense signal /VDOL and the "H" level control signal /LgcVrefL(M) supplied to the NAND gate 74.

In the lower bit judge circuit 147L, the AND gates 80L and 81L, the OR gate 82L, and the lower bit latch circuit (D-type flip-flop) 85L operate as follows.

The AND gate 80L receives the "H" level control signal SigZ, the "L" level inverted sense signal /VDOH, and the "H" level control signal LgcVrefH(L). The AND gate 80L sends the "L" level signal AL1 to the OR gate 82L according to the result of the AND operation of the signals SigZ, /VDOH, and LgcVrefH(L).

The AND gate 81L sends the "L" level signal AL2 to the OR gate 82L according to the result of the AND operation of the "H" level control signal ValidHigh, the "L" level inverted sense signal /VDOL, and the "H" level control signal LgcVrefL(L).

The OR gate 82L sends the "L" level signal CLKLb to the lower bit latch circuit (D-type flip-flop) 85L according to the result of the OR operation of the "L" level signal AL1 and the "L" level signal AL2.

The lower bit latch circuit (D-type flip-flop) 85L keeps the initial state according to the "L" level signal CLKLb.

In the middle bit judge circuit 147M, the AND gates 80M and 81M, the OR gate 82M, and the middle bit latch circuit (D-type flip-flop) 85M operate as follows.

The AND gate 80M sends the "L" level signal AM1 to the OR gate 82M according to the result of the AND operation of the "H" level control signal SigZ, the "L" level inverted sense signal /VDOH, and the "H" level control signal LgcVrefH(M).

The AND gate 81M sends the "L" level signal AM2 to the OR gate 82M according to the result of the AND operation of the "H" level control signal ValidHigh, the "L" level inverted sense signal /VDOL, the "L" level control signal LgcVrefL(M), and the "H" level signal Sig3.

The OR gate 82M sends the "L" level signal CLKMb to the middle bit latch circuit (D-type flip-flop) 85M according to the result of the OR operation of the "L" level signal AM1 and the "L" level signal AM2.

The middle bit latch circuit (D-type flip-flop) 85M keeps the initial state according to the "L" level signal CLKMb.

In the upper bit judge circuit 147U, the AND gates 80U and 81U, the OR gate 82U, and the upper bit latch circuit (D-type flip-flop) 85U operate as follows.

The AND gate 80U sends the "L" level signal AU1 to the OR gate 82U according to the result of the AND operation of the "H" level control signal SigZ, the "L" level inverted sense signal /VDOH, and the "L" level control signal LgcVrefH(U).

The AND gate 81U sends the "L" level signal AU2 to the OR gate 82U according to the result of the AND operation of the "H" level control signal ValidHigh, the "L" level inverted sense signal /VDOL, and the "H" level control signal LgcVrefL(U).

The OR gate 82U sends the "L" level signal CLKUb to the upper bit latch circuit (D-type flip-flop) 85U according to the result of the OR operation of the "L" level signal AU1 and the "L" level signal AU2.

Thus, the upper bit latch circuit (D-type flip-flop) 85U keeps the initial state according to the "L" level signal CLKUb.

(Time t63)

As seen from FIGS. 60 and 63, the sequencer 180 at time t63 changes the signal level of the control signal LgcVrefL (L) from the "H" level to the "L" level.

At time t63, the inverted sense signals /VDOH and /VDOL each have the signal level "L" as at time t62.

The control circuit 148 outputs the "H" level signal SigZ to the signal line 79.

The control circuit 149 sends the "H" level signal Sig3 to the middle bit judge circuit 147M.

In the lower bit judge circuit 147L, the AND gates 80L and 81L, the OR gate 82L, and the lower bit latch circuit (D-type flip-flop) 85L operate as follows.

The AND gate 80L sends the "L" level signal AL1 to the OR gate 82L according to the result of the AND operation of the "H" level control signal SigZ, the "L" level inverted sense signal /VDOH, and the "H" level control signal LgcVrefH(L).

The AND gate 81L receives the "H" level control signal ValidHigh, the "L" level inverted sense signal /VDOL, and the "L" level control signal LgcVrefL(L). The AND gate 81L sends the "L" level signal AL2 to the OR gate 82L according to the result of the AND operation of the signals ValidHigh, /VDOL, and LgcVrefL(L).

The OR gate 82L sends the "L" level signal CLKLb to the lower bit latch circuit (D-type flip-flop) 85L according to the result of the OR operation of the "L" level signal AL1 and the "L" level signal AL2.

The lower bit latch circuit (D-type flip-flop) 85L keeps the initial state according to the "L" level signal CLKLb.

In the middle bit judge circuit 147M, the AND gates 80M and 81M, the OR gate 82M, and the middle bit latch circuit (D-type flip-flop) 85M operate as follows.

The AND gate 80M sends the "L" level signal AM1 to the OR gate 82M according to the result of the AND operation of the "H" level control signal SigZ, the "L" level inverted sense signal /VDOH, and the "H" level control signal LgcVrefH(M).

The AND gate 81M sends the "L" level signal AM2 to the OR gate 82M according to the result of the AND operation of the "H" level control signal ValidHigh, the "L" level inverted sense signal /VDOL, and the "L" level control signal LgcVrefL(M), and the "H" level signal Sig3.

The OR gate 82M sends the "L" level signal CLKMb to the middle bit latch circuit (D-type flip-flop) 85M according to the result of the OR operation of the "L" level signal AM1 and the "L" level signal AM2.

The middle bit latch circuit (D-type flip-flop) 85M keeps the initial state according to the "L" level signal CLKMb.

In the upper bit judge circuit 147O, the AND gates 80U and 81U, the OR gate 82U, and the upper bit latch circuit (D-type flip-flop) 85U operate as follows.

The AND gate 80U sends the "L" level signal AU1 to the OR gate 82U according to the result of the AND operation of the "H" level control signal SigZ, the "L" level inverted sense signal /VDOH, and the "L" level control signal LgcVrefH(U).

The AND gate 81U sends the "L" level signal AU2 to the OR gate 82U according to the result of the AND operation of the "H" level control signal ValidHigh, the "L" level inverted sense signal /VDOL, and the "H" level control signal LgcVrefL(U).

The OR gate 82U sends the "L" level signal CLKUb to the upper bit latch circuit (D-type flip-flop) 85U according to the result of the OR operation of the "L" level signal AU1 and the "L" level signal AU2.

The upper bit latch circuit (D-type flip-flop) 85U keeps the initial state according to the "L" level signal CLKUb.

(Time tq1)

As seen from FIGS. 60 and 64, the bit line voltage VBL becomes equal to or lower than the reference voltage VrefH at time tq1 between times t63 and t64.

The operation amplifier 41 outputs the "L" level sense signal VDOH. The "H" level inverted sense signal /VDOH is sent to each judge circuit 147.

Note that, at time tq1, the bit line voltage VBL is higher than the reference voltage VrefL. The operation amplifier 42 outputs the "H" level sense signal VDOL. The "L" level inverted sense signal /VDOL is thus sent to each judge circuit 147 and the control circuit 149.

In the control circuit 148, the NAND gate 70 sends the "H" level signal SigX to the NAND gate 71 according to the result of the NAND operation of the "H" level inverted sense signal /VDOH, the "L" level control signal /LgcVrefH(L), the "H" level control signal LgcVrefH(M), and the "H" level control signal /LgcVrefH(U).

The NAND gate 71 sends the "L" level signal SigY to the NAND gate 72 according to the result of the NAND operation of the "H" level signal SigX and the "H" level signal SigZ.

The NAND gate 72 outputs the "H" level signal SigZ to the signal line 79 according to the result of the NAND operation of the "L" level signal SigY and the "H" level signal NANDrst.

The control circuit 149 sends the "H" level signal Sig3 to the middle bit judge circuit 147M.

In the lower bit judge circuit 147L, the AND gates 80L and 81L, the OR gate 82L, and the lower bit latch circuit (D-type flip-flop) 85L operate as follows.

The AND gate 80L receives the "H" level signal SigZ, the "H" level inverted sense signal /VDOH, and the "H" level control signal LgcVrefH(L). Thus, the AND gate 80L sends the "H" level signal AL1 to the OR gate 82L according to the result of the AND operation of the three "H" level signals SigZ, /VDOH, and LgcVrefH(L).

The AND gate 81L sends the "L" level signal AL2 to the OR gate 82L according to the result of the AND operation of the "H" level control signal ValidHigh, the "L" level inverted sense signal /VDOL, and the "L" level control signal LgcVrefL(L).

The OR gate 82L outputs the "H" level signal CLKLb according to the result of the OR operation of the "H" level signal AL1 and the "L" level signal AL2. The signal level of the signal CLKLb turns from the "L" level to the "H" level.

The lower bit latch circuit (D-type flip-flop) 85L takes, according to the "L" to "H" signal level change of the signal CLKLb, the "H" level signal CLKLb into its CLK node. The lower bit latch circuit (D-type flip-flop) 85L takes the "H" level signal into its D node. The signal level of the Q node of the lower bit latch circuit (D-type flip-flop) 85L turns from the "L" level to the "H" level.

In the middle bit judge circuit 147M, the AND gates 80M and 81M, the OR gate 82M, and the middle bit latch circuit (D-type flip-flop) 85M operate as follows.

The AND gate 80M receives the "H" level signal SigZ, the "H" level inverted sense signal /VDOH, and the "H" level control signal LgcVrefH(M). The AND gate 80M sends the "H" level signal AM1 to the OR gate 82M according to the result of the AND operation of the three "H" level signals SigZ, /VDOH, and LgcVrefH(M).

The AND gate 81M sends the "L" level signal AM2 to the OR gate 82M according to the result of the AND operation of the "H" level control signal ValidHigh, the "L" level inverted sense signal /VDOL, the "L" level control signal LgcVrefL(M), and the "H" level signal Sig3.

The OR gate 82M outputs the "H" level signal CLKMb according to the result of the OR operation of the "H" level signal AM1 and the "L" level signal AM2. The signal level of the signal CLKMb turns from the "L" level to the "H" level.

The middle bit latch circuit (D-type flip-flop) 85M takes, according to the "L" to "H" signal level change of the signal CLKMb, the "H" level signal CLKMb into its CLK node. The middle bit latch circuit (D-type flip-flop) 85M takes the "H" level signal into its D node. The signal level of the Q node of the middle bit latch circuit (D-type flip-flop) 85M turns from the "L" level to the "H" level.

In the upper bit judge circuit 147U, the AND gates 80U and 81U, the OR gate 82U, and the upper bit latch circuit (D-type flip-flop) 85U operate as follows.

The AND gate 80U receives the "H" level signal SigZ, the "H" level inverted sense signal /VDOH, and the "L" signal LgcVrefH(U). Thus, the AND gate 80U sends the "L" level signal AU1 to the OR gate 82U according to the result of the AND operation of the signals SigZ, /VDOH, and LgcVrefH (U).

The AND gate 81U sends the "L" level signal AU2 to the OR gate 82U according to the result of the AND operation of the "H" level control signal ValidHigh, the "L" level inverted sense signal /VDOL, and the "H" level control signal LgcVrefL(U).

The OR gate 82U outputs the "L" level signal CLKUb according to the OR operation of the "L" level signal AU1 and the "L" level signal AU2. In this manner, the signal level of the signal CLKUb is kept at the "L" level.

The upper bit latch circuit (D-type flip-flop) 85U does not take the "L" level signal CLKUb into its CLK node. As such, no signal is taken into the D node of the upper bit latch circuit (D-type flip-flop) 85U, either. The signal level of the Q node of the upper bit latch circuit (D-type flip-flop) 85U is therefore kept at the "L" level.

In the manner as described above, each of the lower bit latch circuit (D-type flip-flop) 85L and the middle bit latch circuit (D-type flip-flop) 85M retains data "1". The upper bit latch circuit (D-type flip-flop) 85U retains data "0". Therefore, the 3-bit data indicated by the three latch circuits (D-type flip-flops) 85 is data "011".
(Time t64)

As seen from FIGS. 60 and 65, the sequencer 180 at time t64 changes the signal levels of the control signal LgcVrefH (M) and the control signal LgcVrefL(M). The sequencer 180 changes the signal level of the control signal LgcVrefH(M) from the "H" level to the "L" level. The sequencer 180 changes the signal level of the control signal LgcVrefL(M) from the "L" level to the "H" level.

In the control circuit 148, the NAND gate 70 sends the "H" level signal SigX to the NAND gate 71 according to the result of the NAND operation of the "H" level inverted sense signal /VDOH, the "L" level control signal /LgcVrefH(L), the "L" level control signal LgcVrefH(M), and the "H" level control signal /LgcVrefH(U).

The NAND gate 71 sends the "L" level signal SigY to the NAND gate 72 according to the result of the NAND operation of the "H" level signal SigX and the "H" level signal SigZ.

The NAND gate 72 outputs the "H" level signal SigZ to the signal line 79 according to the result of the NAND operation of the "L" level signal SigY and the "H" level reset signal NANDrst.

In the control circuit 149, the NAND gate 74 sends the "H" level signal Sig1 to the NAND gate 75 according to the result of the NAND operation of the "L" level inverted sense signal /VDOL and the "L" level signal /LgcVrefL(M).

The NAND gate 75 sends the "L" level signal Sig2 to the NAND gate 76 according to the result of the NAND operation of the "H" level signal Sig1 and the "H" level signal Sig3.

The NAND gate 76 sends the "H" level signal Sig3 to the middle bit judge circuit 147M according to the result of the NAND operation of the "L" level signal Sig2 and the "H" level reset signal NANDrst.

In the lower bit judge circuit 147L, the AND gates 80L and 81L, the OR gate 82L, and the lower bit latch circuit (D-type flip-flop) 85L operate as follows.

The AND gate 80L sends the "H" level signal AL1 to the OR gate 82L according to the result of the AND operation of the "H" level control signal SigZ, the "H" level inverted sense signal /VDOH, and the "H" level control signal LgcVrefH(L).

The AND gate 81L sends the "L" level signal AL2 to the OR gate 82L according to the result of the AND operation of the "H" level control signal ValidHigh, the "L" level inverted sense signal /VDOL, and the "L" level control signal LgcVrefL(L).

The OR gate 82L sends the "H" level signal CLKLb to the lower bit latch circuit (D-type flip-flop) 85L according to the result of the OR operation of the "H" level signal AL1 and the "L" level signal AL2. The signal level of the signal CLKLb is kept at the "H" level.

The lower bit latch circuit (D-type flip-flop) 85L keeps the state of retaining the "H" level signal in its Q node according to the signal CLKLb kept at the "H" level.

In the middle bit judge circuit 147M, the AND gates 80M and 81M, the OR gate 82M, and the middle bit latch circuit (D-type flip-flop) 85M operate as follows.

The AND gate 80M receives the "H" level control signal SigZ, the "H" level inverted sense signal /VDOH, and the "L" level control signal LgcVrefH(M). The AND gate 80M sends the "L" level signal AM1 to the OR gate 82M according to the result of the AND operation of the signals SigZ, /VDOH, and LgcVrefH(M).

The AND gate 81M receives the "H" level control signal ValidHigh, the "L" level inverted sense signal /VDOL, the "H" level control signal LgcVrefL(M), and the "H" level signal Sig3. The AND gate 81M sends the "L" level signal AM2 to the OR gate 82M according to the result of the AND operation of the signals ValidHigh, /VDOL, LgcVrefL(M), and Sig3.

The OR gate 82M sends the "L" level signal CLKMb to the middle bit latch circuit (D-type flip-flop) 85M according to the result of the OR operation of the "L" level signal AM1 and the "L" level signal AM2. The signal level of the signal CLKMb turns from the "H" level to the "L" level.

The D-type flip-flop 85M constituting the middle bit latch circuit 85M keeps the state of retaining the "H" level signal in the Q node, without taking the "L" level signal CLKMb into the CLK node.

In the upper bit judge circuit 147U, the AND gates 80U and 81U, the OR gate 82U, and the upper bit latch circuit (D-type flip-flop) 85U operate as follows.

The AND gate 80U sends the "L" level signal AU1 to the OR gate 82U according to the result of the AND operation of the "H" level control signal SigZ, the "H" level inverted sense signal /VDOH, and the "L" level control signal LgcVrefH(U).

The AND gate 81U sends the "L" level signal AU2 to the OR gate 82U according to the result of the AND operation of the "H" level control signal ValidHigh, the "L" level inverted sense signal /VDOL, and the "H" level control signal LgcVrefL(U).

The OR gate 82U sends the "L" level signal CLKUb to the upper bit latch circuit (D-type flip-flop) 85U according to the result of the OR operation of the "L" level signal AU1 and the "L" level signal AU2.

The upper bit latch circuit (D-type flip-flop) 85U keeps the state of retaining the "L" level signal in its Q node according to the "L" level signal CLKUb.

(Time t65)

As seen from FIGS. 60 and 66, the sequencer 180 at time t65 changes the signal level of the control signal LgcVrefL (U) from the "H" level to the "L" level.

The control circuit 148 outputs the "H" level control signal SigZ to the signal line 79.

The control circuit 149 sends the "H" level control signal Sig3 to the middle bit judge circuit 147M.

In the lower bit judge circuit 147L, the AND gates 80L and 81L, the OR gate 82L, and the lower bit latch circuit (D-type flip-flop) 85L operate as follows.

The AND gate 80L sends the "H" level signal AL1 to the OR gate 82L according to the result of the AND operation of the "H" level control signal SigZ, the "H" level inverted sense signal /VDOH, and the "H" level control signal LgcVrefH(L).

The AND gate 81L sends the "L" level signal AL2 to the OR gate 82L according to the result of the AND operation of the "H" level control signal ValidHigh, the "L" level inverted sense signal /VDOL, and the "L" level control signal LgcVrefL(L).

The OR gate 82L sends the "H" level signal CLKLb to the lower bit latch circuit (D-type flip-flop) 85L according to the result of the OR operation of the "H" level signal AL1 and the "L" level signal AL2.

The lower bit latch circuit (D-type flip-flop) 85L keeps the state of retaining the "H" level signal in its Q node according to the signal CLKLb kept at the "H" level.

In the middle bit judge circuit 147M, the AND gates 80M and 81M, the OR gate 82M, and the middle bit latch circuit (D-type flip-flop) 85M operate as follows.

The AND gate 80M sends the "L" level signal AM1 to the OR gate 82M according to the result of the AND operation of the "H" level control signal SigZ, the "H" level inverted sense signal /VDOH, and the "L" level control signal LgcVrefH(M).

The AND gate 81M sends the "L" level signal AM2 to the OR gate 82M according to the result of the AND operation of the "H" level control signal ValidHigh, the "L" level inverted sense signal /VDOL, the "H" level control signal LgcVrefL(M), and the "H" level signal Sig3.

The OR gate 82M sends the "L" level signal CLKMb to the middle bit latch circuit (D-type flip-flop) 85M according to the result of the OR operation of the "L" level signal AM1 and the "L" level signal AM2.

The D-type flip-flop 85M constituting the middle bit latch circuit 85M keeps, according to the "L" level signal CLKMb, the state of retaining the "H" level signal in the Q node.

In the upper bit judge circuit 147U, the AND gates 80U and 81U, the OR gate 82U, and the upper bit latch circuit (D-type flip-flop) 85U operate as follows.

The AND gate 80U sends the "L" level signal AU1 to the OR gate 82U according to the result of the AND operation of the "H" level signal SigZ, the "H" level inverted sense signal /VDOH, and the "L" level control signal LgcVrefH (U).

The AND gate 81U receives the "H" level control signal ValidHigh, the "L" level inverted sense signal /VDOL, and the "L" level control signal LgcVrefL(U). The AND gate 81U sends the "L" level signal AU2 to the OR gate 82U according to the result of the AND operation of the signals ValidHigh, /VDOL, and LgcVrefL(U).

The OR gate 82U sends the "L" level signal CLKUb to the upper bit latch circuit (D-type flip-flop) 85U according to the result of the OR operation of the "L" level signal AU1 and the "L" level signal AU2.

The upper bit latch circuit (D-type flip-flop) 85U keeps the state of retaining the "L" level signal in its Q node according to the "L" level signal CLKUb.

(Time t66)

As seen from FIGS. 60 and 67, the sequencer 180 at time t66 changes the signal level of the control signal LgcVrefH (L) from the "H" level to the "L" level.

In the control circuit 148, the NAND gate 70 sends the "H" level signal SigX to the NAND gate 71 according to the result of the NAND operation of the "H" level inverted sense signal /VDOH, the "H" level control signal /LgcVrefH(L), the "L" level control signal LgcVrefH(M), and the "H" level control signal /LgcVrefH(U).

The NAND gate 71 sends the "L" level signal SigY to the NAND gate 72 according to the result of the NAND operation of the "H" level signal SigX and the "H" level signal SigZ.

The NAND gate 72 outputs the "H" level signal SigZ to the signal line 79 according to the result of the NAND operation of the "L" level signal SigY and the "H" level signal NANDrst.

The control circuit 149 sends the "H" level signal Sig3 to the middle bit judge circuit 147M.

In the lower bit judge circuit 147L, the AND gates 80L and 81L, the OR gate 82L, and the lower bit latch circuit (D-type flip-flop) 85L operate as follows.

The AND gate 80L receives the "H" level signal SigZ, the "H" level inverted sense signal /VDOH, and the "L" level control signal LgcVrefH(L). The AND gate 80L outputs the "L" level signal AL1 according to the result of the AND operation of the signals SigZ, /VDOH, and LgcVrefH(L).

The AND gate 81L sends the "L" level signal AL2 to the OR gate 82L according to the result of the AND operation of the "H" level control signal ValidHigh, the "L" level inverted sense signal /VDOL, and the "L" level control signal LgcVrefL(L).

The OR gate 82L sends the "L" level signal CLKLb to the lower bit latch circuit (D-type flip-flop) 85L according to the result of the OR operation of the "L" level signal AL1 and the "L" level signal AL2. The signal level of the signal CLKLb turns from the "H" level to the "L" level.

The lower bit latch circuit (D-type flip-flop) 85L keeps the state of retaining the "H" level signal in its Q node without taking the "L" level signal CLKLb into its CLK node.

In the middle bit judge circuit 147M, the AND gates 80M and 81M, the OR gate 82M, and the middle bit latch circuit (D-type flip-flop) 85M operate as follows.

The AND gate 80M sends the "L" level signal AM1 to the OR gate 82M according to the result of the AND operation of the "H" level control signal SigZ, the "H" level inverted sense signal /VDOH, and the "L" level control signal LgcVrefH(M).

The AND gate 81M sends the "L" level signal AM2 to the OR gate 82M according to the result of the AND operation of the "H" level control signal ValidHigh, the "L" level inverted sense signal /VDOL, the "H" level control signal LgcVrefL(M), and the "H" level signal Sig3.

The OR gate 82M sends the "L" level signal CLKMb to the middle bit latch circuit (D-type flip-flop) 85M according to the result of the OR operation of the "L" level signal AM1 and the "L" level signal AM2.

The D-type flip-flop 85M constituting the middle bit latch circuit 85M keeps, according to the signal CLKMb kept at the "L" level, the state of retaining the "H" level signal in the Q node.

In the upper bit judge circuit 147U, the AND gates 80U and 81U, the OR gate 82U, and the upper bit latch circuit (D-type flip-flop) 85U operate as follows.

The AND gate 80U sends the "L" level signal AU1 to the OR gate 82U according to the result of the AND operation of the "H" level signal SigZ, the "H" level inverted sense signal /VDOH, and the "L" level control signal LgcVrefH (U).

The AND gate 81U sends the "L" level signal AU2 to the OR gate 82U according to the result of the AND operation of the "H" level control signal ValidHigh, the "L" level inverted sense signal /VDOL, and the "L" level control signal LgcVrefL(U).

The OR gate 82U sends the "L" level signal CLKUb to the upper bit latch circuit (D-type flip-flop) 85U according to the result of the OR operation of the "L" level signal AU1 and the "L" level signal AU2.

The upper bit latch circuit (D-type flip-flop) 85U keeps the state of retaining the "L" level signal in its Q node according to the signal CLKUb kept at the "L" level.
(Time t67)

As seen from FIGS. 60 and 68, the sequencer 180 at time t67 changes the signal level of the control signal ValidHigh from the "H" level to the "L" level.

The control circuit 148 outputs the "H" level signal SigZ to the signal line 79.

The control circuit 149 sends the "H" level signal Sig3 to the middle bit judge circuit 147M.

In the lower bit judge circuit 147L, the AND gates 80L and 81L, the OR gate 82L, and the lower bit latch circuit (D-type flip-flop) 85L operate as follows.

The AND gate 80L outputs the "L" level signal AL1 according to the result of the AND operation of the "H" level signal SigZ, the "H" level inverted sense signal /VDOH, and the "L" level control signal LgcVrefH(L).

The AND gate 81L receives the "L" level control signal ValidHigh, the "L" level inverted sense signal /VDOL, and the "L" level control signal LgcVrefL(L). The AND gate 81L outputs the "L" level signal AL2 according to the result of the AND operation of the signals received.

The OR gate 82L outputs the "L" level signal CLKLb according to the result of the OR operation of the "L" level signal AL1 and the "L" level signal AL2.

The lower bit latch circuit (D-type flip-flop) 85L maintains the "H" level signal retained in its Q node, according to the "L" level signal CLKLb.

In the middle bit judge circuit 147M, the AND gates 80M and 81M, the OR gate 82M, and the middle bit latch circuit (D-type flip-flop) 85M operate as follows.

The AND gate 80M outputs the "L" level signal AM1 according to the result of the AND operation of the "H" level signal SigZ, the "H" level inverted sense signal /VDOH, and the "L" level control signal LgcVrefH(M).

The AND gate 81M receives the "L" level control signal ValidHigh, the "L" level inverted sense signal /VDOL, the "H" level control signal LgcVrefL(M), and the "H" level signal Sig3. The AND gate 81M outputs the "L" level signal AM2 according to the result of the AND operation of the signals ValidHigh, /VDOL, LgcVrefL(M), and Sig3.

The OR gate 82M outputs the "L" level signal CLKMb according to the result of the OR operation of the "L" level signal AM1 and the "L" level signal AM2.

The middle bit latch circuit (D-type flip-flop) 85M maintains the "H" level signal retained in its Q node, according to the signal CLKMb kept at the "L" level.

In the upper bit judge circuit 147U, the AND gates 80U and 81U, the OR gate 82U, and the upper bit latch circuit (D-type flip-flop) 85U operate as follows.

The AND gate 80U sends the "L" level signal AU1 to the OR gate 82U according to the result of the AND operation of the "H" level signal SigZ, the "H" level inverted sense signal /VDOH, and the "L" level control signal LgcVrefH (U).

The AND gate 81U receives the "L" level control signal ValidHigh, the "L" level inverted sense signal /VDOL, and the "L" level control signal LgcVrefL(U). The AND gate 81U sends the "L" level signal AU2 to the OR gate 82U according to the result of the AND operation of the signals ValidHigh, /VDOL, and LgcVrefL(U).

The OR gate 82U outputs the "L" level signal CLKUb according to the result of the OR operation of the "L" level signal AU1 and the "L" level signal AU2.

The upper bit latch circuit (D-type flip-flop) 85U maintains the "L" level signal retained in its Q node, according to the signal CLKUb kept at the "L" level.
(Time tq2)

As seen from FIGS. 60 and 69, the bit line voltage VBL becomes equal to or lower than the reference voltage VrefL at time tq2 between times t67 and t3.

The operation amplifier 42 outputs the "L" level sense signal VDOL. The "H" level inverted sense signal /VDOL is sent to each judge circuit 147.

At time tq2, the two inverted sense signals /VDOH and /VDOL both have the signal level "H".

The control circuit 148 outputs the "H" level signal SigZ to the signal line 79.

In the control circuit 149, the NAND gate 74 sends the "H" level signal Sig1 to the NAND gate 75 according to the result of the NAND operation of the "H" level inverted sense signal /VDOL and the "L" level signal /LgcVrefL (M).

The NAND gate 75 sends the "L" level signal Sig2 to the NAND gate 76 according to the result of the NAND operation of the "H" level signal Sig1 and the "H" level signal Sig3.

The NAND gate 76 sends the "H" level signal Sig3 to the middle bit judge circuit 147M according to the result of the NAND operation of the "L" level signal Sig2 and the "H" level reset signal NANDrst.

As described above, the control circuit 149 outputs the "H" level signal Sig3 as long as the control signal LgcVrefL (M) has the signal level "H". even with the "H" level inverted sense signal /VDOL.

In the lower bit judge circuit 147L, the AND gates 80L and 81L, the OR gate 82L, and the lower bit latch circuit (D-type flip-flop) 85L operate as follows.

The AND gate 80L sends the "L" level signal AL1 to the OR gate 82L according to the result of the AND operation of the "H" level signal SigZ, the "H" level inverted sense signal /VDOH, and the "L" level control signal LgcVrefH (L).

The AND gate 81L receives the "L" level control signal ValidHigh, the "H" level inverted sense signal /VDOL, and the "L" level control signal LgcVrefL(L). The AND gate 81L sends the "L" level signal AL2 to the OR gate 82L according to the result of the AND operation of the signals ValidHigh, /VDOL, and LgcVrefL(L).

The OR gate 82L sends the "L" level signal CLKLb to the lower bit latch circuit (D-type flip-flop) 85L according to the result of the OR operation of the "L" level signal AL1 and the "L" level signal AL2.

The lower bit latch circuit (D-type flip-flop) 85L keeps the state of retaining the "H" level signal in its Q node without taking the "L" level signal CLKLb into its CLK node.

In the middle bit judge circuit 147M, the AND gates 80M and 81M, the OR gate 82M, and the middle bit latch circuit (D-type flip-flop) 85M operate as follows.

The AND gate 80M sends the "L" level signal AM1 to the OR gate 82M according to the result of the AND operation of the "H" level control signal SigZ, the "H" level inverted sense signal /VDOH, and the "L" level control signal LgcVrefH(M).

The AND gate 81M receives the "L" level control signal ValidHigh, the "H" level inverted sense signal /VDOL, the "H" level control signal LgcVrefL(M), and the "H" level signal Sig3. The AND gate 81M sends the "L" level signal AM2 to the OR gate 82M according to the result of the AND operation of the signals ValidHigh, /VDOL, LgcVrefL(M), and Sig3.

The OR gate 82M sends the "L" level signal CLKMb to the middle bit latch circuit (D-type flip-flop) 85M according to the result of the OR operation of the "L" level signal AM1 and the "L" level signal AM2.

The middle bit latch circuit (D-type flip-flop) 85M keeps the state of retaining the "H" level signal in its Q node according to the "L" level signal CLKMb.

In the upper bit judge circuit 1470, the AND gates 80U and 81U, the OR gate 82U, and the upper bit latch circuit (D-type flip-flop) 85U operate as follows.

The AND gate 80U sends the "L" level signal AU1 to the OR gate 82U according to the result of the AND operation of the "H" level signal SigZ, the "H" level inverted sense signal /VDOH, and the "L" level control signal LgcVrefH (U).

The AND gate 81U receives the "L" level control signal ValidHigh, the "H" level inverted sense signal /VDOL, and the "L" level control signal LgcVrefL(U). The AND gate 81U sends the "L" level signal AU2 to the OR gate 82U according to the result of the AND operation of the signals ValidHigh, /VDOL, and LgcVrefL(U).

The OR gate 82U sends the "L" level signal CLKUb to the upper bit latch circuit (D-type flip-flop) 85U according to the result of the OR operation of the "L" level signal AU1 and the "L" level signal AU2.

The upper bit latch circuit (D-type flip-flop) 85U keeps the state of retaining the "L" level signal in its Q node according to the "L" level signal CLKUb.

At time t3, the sense amplification circuit SA terminates the sensing operation.

The latch circuits (D-type flip-flops) 85L, 85M, and 85U at time t3 stand in the following data retaining states. The upper bit latch circuit (D-type flip-flop) 85U retains data "0". The middle bit latch circuit (D-type flip-flop) 85M retains data "1". The lower bit latch circuit (D-type flip-flop) 85L retains data "1". As a result, the 3-bit data indicated by the three latch circuits (D-type flip-flops) 85 is data "011".

The sense amplification circuit SA sends the data in the latch circuits (D-type flip-flops) 85 to the data register 150. The data "011" is thus transferred from the sense amplification circuit SA to the data register 150.

In the manner as described above, data "011" is read from the selected cell MC through the read operation by the sense amplification circuit SA shown in FIG. 48 in the memory device according to the embodiment.

(c) In Sum

With the configurations and the operations of the sense amplification circuit SA described above, the memory device 1 according to the third embodiment can secure relatively wide sensing margins. The memory device 1 according to the third embodiment can accelerate read operations.

From the foregoing, the memory device 1 according to the third embodiment can realize improved characteristics in read operations.

(4) Fourth Embodiment

FIG. 70 will be referred to for describing a memory device according to the fourth embodiment.

FIG. 70 is a circuit diagram showing an exemplary configuration of a sense amplification circuit SA in the memory device 1 according to the embodiment.

As described above with reference to FIG. 8 for the first embodiment, the upper bit of each piece of data assigned to four relatively high resistance states RS4, RS5, RS6, and RS7 is data "0", and the upper bit of each piece of data assigned to four relatively low resistance states RS0, RS1, RS2, and RS3 is data "1".

The middle bit latch circuit (D-type flip-flop) 40M in the initial state retains the "L" level signal (data "0"), which serves as the signal Qmid, in its Q node.

In the case where the bit line voltage VBL is higher than the reference voltage VrefH in the period T1, the data stored in the memory cell MC corresponds to data assigned to one of the high-side resistance states RS4, RS5, RS6, and RS7.

Meanwhile, data "000" for the initial state is stored in the sense amplification circuit SA. Thus, the signal Qmid is data "0".

In the case where the bit line voltage VBL becomes equal to or lower than the reference voltage VrefH in the period T1, the data stored in the memory cell MC corresponds to data assigned to one of the low-side resistance states RS0, RS1, RS2, and RS3. In this case, tentative data "010" is temporarily stored in the sense amplification circuit SA. Thus, the signal Qmid is data "1".

As such, whether the upper bit of the data stored in a memory cell MC is data "0" or data "1" is determined in the period T1.

The signal Qmid determined in the period T1 can therefore be associated with the upper bit of the data stored in a memory cell MC.

As shown in FIG. 70, the signal Qmid is supplied to the D node of the D-type flip-flop 40U constituting the upper bit latch circuit 40U in the upper bit judge circuit 143U.

After the period T1 and according to the timing of the "H" level signal CLK taken into the CLK node of the upper bit latch circuit (D-type flip-flop) 40U, the signal Qmid supplied to the D node is taken into the upper bit latch circuit (D-type flip-flop) 40U. In this manner, the signal corresponding to the supplied signal Qmid is retained in the Q node of the upper bit latch circuit (D-type flip-flop) 40U in the upper bit judge circuit 143U.

Therefore, the upper bit having a prescribed value is retained in the upper bit latch circuit (D-type flip-flop) 40U according to the data stored in the memory cell MC.

Note that, instead of the signal Qmid, the control signal ValidHigh may be used as the select signal supplied to the multiplexer 49.

As described above, the memory device 1 according to the present embodiment can realize the same effects and advantages as in the preceding embodiments.

Additionally, the upper bit judge circuit 143U according to the present embodiment may omit the use of a control signal Lgc and a multiplexer. The memory device 1 according to the embodiment can consequently simplify the internal configuration of the sense amplification circuit SA.

(5) Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A memory device comprising:
a memory cell coupled to a bit line and a word line and configured to store first data including a first bit, a second bit, and a third bit; and
a sense amplification circuit configured to perform a first comparison between a bit line voltage of the bit line and a first reference voltage, and a second comparison between the bit line voltage and a second reference voltage lower than the first reference voltage, and to read the first data from the memory cell based on a result of the first comparison and a result of the second comparison,
wherein the sense amplification circuit is configured to retain second data having a first code in response to the bit line voltage becoming equal to or lower than the first reference voltage during a first period from a start of operation of the sense amplification circuit to a first time point, and
retain the first data after the first period.
2. The memory device according to claim 1, wherein the sense amplification circuit includes:
a first data retaining circuit configured to retain the first bit;
a second data retaining circuit configured to retain the second bit;
a third data retaining circuit configured to retain the third bit; and
a control circuit configured to control a data retaining state of the first data retaining circuit, a data retaining state of the second data retaining circuit, and a data retaining state of the third data retaining circuit according to a first signal from the second data retaining circuit.
3. The memory device according to claim 2, wherein the control circuit includes:
a first AND gate configured to perform a first AND operation of the first signal and a second signal, the second signal being based on the result of the first comparison;
a second AND gate configured to perform a second AND operation of a third signal and a fourth signal, the third signal being based on the result of the second comparison, the fourth signal being indicative of a period where the second comparison is valid; and
an OR gate configured to perform an OR operation of a result of the first AND operation and a result of the second AND operation and output a fifth signal based on a result of the OR operation to the first data retaining circuit, the second data retaining circuit, and the third data retaining circuit.
4. The memory device according to claim 2, wherein the sense amplification circuit includes:
a first multiplexer configured to output one of a first control signal and a second control signal to the first data retaining circuit, the first control signal being indicative of a value of the first bit at a given time point for the first reference voltage, the second control signal being indicative of a value of the first bit at a given time point for the second reference voltage;
a second multiplexer configured to output one of a third control signal and a fourth control signal to the second data retaining circuit, the third control signal being indicative of a value of the second bit at a given time point for the first reference voltage, the fourth control signal being indicative of a value of the second bit at a given time point for the second reference voltage; and
a third multiplexer configured to output one of a fifth control signal and a sixth control signal to the third data retaining circuit, the fifth control signal being indicative of a value of the third bit at a given time point for the first reference voltage, the sixth control signal being indicative of a value of the third bit at a given time point for the second reference voltage.

5. The memory device according to claim 4, wherein:

the first multiplexer is configured to select one of the first control signal and the second control signal according to a sixth signal complementary to the first signal;

the second multiplexer is configured to select one of the third control signal and the fourth control signal according to the sixth signal; and the third multiplexer is configured to select one of the fifth control signal and the sixth control signal according to the sixth signal.

6. The memory device according to claim 2, wherein:

the first bit is a most significant bit in the first data;

the second bit is between the first bit and the third bit in the first data;

the third bit is a least significant bit in the first data; and the first data retaining circuit retains, as the first bit, a sixth signal complementary to the first signal.

7. The memory device according to claim 2, wherein the second data retaining circuit is configured to retain the first signal and a sixth signal, the sixth signal being complementary to the first signal and associated with the second bit, the first signal having an initial value at a first signal level, the sixth signal having an initial value at a second signal level lower than the first signal level.

8. The memory device according to claim 1, wherein:

the memory cell is configured to store data "111" in the memory cell having a first resistance state;

the memory cell is configured to store data "101" in the memory cell having a second resistance state higher than the first resistance state;

the memory cell is configured to store data "100" in the memory cell having a third resistance state higher than the second resistance state;

the memory cell is configured to store data "110" in the memory cell having a fourth resistance state higher than the third resistance state;

the memory cell is configured to store data "010" in the memory cell having a fifth resistance state higher than the fourth resistance state;

the memory cell is configured to store data "011" in the memory cell having a sixth resistance state higher than the fifth resistance state;

the memory cell is configured to store data "001" in the memory cell having a seventh resistance state higher than the sixth resistance state;

the memory cell is configured to store data "000" in the memory cell having an eighth resistance state higher than the seventh resistance state; and the first code is "010".

* * * * *